(12) United States Patent
Wudl et al.

(10) Patent No.: US 11,245,077 B2
(45) Date of Patent: Feb. 8, 2022

(54) EFFICIENT SOLAR CELLS VIA SULFUR-FUSED HELICAL PERYLENE DIIMIDES DESIGN CONCEPT

(71) Applicant: The Regents of the University of California, Oakland, CA (US)

(72) Inventors: Fred Wudl, Montecito, CA (US); Yonghao Zheng, Sichuan (CN); Hengbin Wang, Santa Barbara, CA (US); Hidenori Nakayama, Goleta, CA (US); Michael Chabinyc, Santa Barbara, CA (US)

(73) Assignees: THE REGENTS OF THE UNIVERSITY OF CALIFORNIA, Oakland, CA (US); THE MITSUBISHI CHEMICAL CORPORATION, A JAPANESE CORPORATION, Tokyo (JP)

( * ) Notice: Subject to any disclaimer, the term of this patent is extended or adjusted under 35 U.S.C. 154(b) by 229 days.

(21) Appl. No.: 16/250,440

(22) Filed: Jan. 17, 2019

(65) Prior Publication Data
US 2019/0221748 A1 Jul. 18, 2019

Related U.S. Application Data

(60) Provisional application No. 62/618,179, filed on Jan. 17, 2018.

(51) Int. Cl.
*H01L 51/00* (2006.01)
*H01L 51/42* (2006.01)
*H01L 51/05* (2006.01)

(52) U.S. Cl.
CPC ...... *H01L 51/0067* (2013.01); *H01L 51/0026* (2013.01); *H01L 51/0052* (2013.01);
(Continued)

(58) Field of Classification Search
CPC ............ H01L 51/0067; H01L 51/0052; H01L 51/0074; H01L 51/0058; H01L 51/424;
(Continued)

(56) References Cited

U.S. PATENT DOCUMENTS

2017/0352812 A1* 12/2017 Hendsbee ........... H01L 51/0053

OTHER PUBLICATIONS

Guo et al, "Effect of Energy Alignment, Electron Mobility, and Film Morphology of Perylene Diimide Based Polymers as Electron Transport Layer on the Performance of Perovskite Solar Cells", Applied Materials and Interfaces, 2017.*
(Continued)

*Primary Examiner* — Matthew T Martin
(74) *Attorney, Agent, or Firm* — Gates & Cooper LLP

(57) ABSTRACT

Sulfur-fused perylene diimides (PDIs) having the formula 2PDI-nS, wherein n is an integer. Such sulfur-fused PDIs (e.g., 2PDI-2S, 2PDI-3S, and 2PDI-4S) are incorporated as electron acceptors in an active region of a bulk heterojunction solar cell and/or as an electron transport layer. Example solar cells exhibit a power conversion efficiency above 5% and a fill factor above 70% (a record high for non-fullerene bulk heterojunction solar cell devices) when 2PDI-nS is used as the electron acceptor. In addition, the solar cells exhibit low open circuit voltage ($V_{oc}$) loss.

22 Claims, 40 Drawing Sheets

(52) U.S. Cl.
CPC ...... *H01L 51/0058* (2013.01); *H01L 51/0068* (2013.01); *H01L 51/0074* (2013.01); *H01L 51/0545* (2013.01); *H01L 51/424* (2013.01); *H01L 51/4246* (2013.01); *H01L 51/4253* (2013.01)

(58) Field of Classification Search
CPC ............. H01L 51/4246; H01L 51/0068; H01L 51/4253; H01L 51/0026; H01L 51/0545; Y02E 10/549
See application file for complete search history.

(56) References Cited

OTHER PUBLICATIONS

Zhong, "Efficient Organic Solar Cells with Helical Perylene Diimide Electron Acceptors", J. Am. Chem. Soc. 2014.*

Nakayama, H., et al., "Sulfur-fused perylene diimide electron transport layers allow > 400 h operational lifetime of methylammonium lead iodide photovoltaics", Journal of Materials Chemistry C, 2019, pp. 11126-11133, vol. 7.

Zhao, W., et al., "Molecular Optimization Enables over 13% Efficiency in Organic Solar Cells", Journal of the American Chemical Society, 2017, pp. 7148-7151, vol. 139.

Meng, D., et al., "High-Performance Solution-Processed Non-Fullerene Organic Solar Cells Based on Selenophene-Containing Perylene Bisimide Acceptor", Journal of the American Chemical Society, 2016, pp. 375-380, vol. 138.

Liu, J., et al., "Fast charge separation in a non-fullerene organic solar cell with a small driving force", Nature Energy, Jul. 2016, pp. 1-7, vol. 1.

Burke, T.M., et al., "Beyond Langevin Recombination: How Equilibrium Between Free Carriers and Charge Transfer States Determines the Open-Circuit Voltage of Organic Solar Cells", Advanced Energy Materials, 2015, pp. 1-12, vol. 5, 1500123.

Sun, D., et al., "Non-Fullerene-Acceptor-Based Bulk-Heterojunction Organic Solar Cells with Efficiency over 7%", Journal of the American Chemical Society, 2015, pp. 11156-11162, vol. 137.

Li, S., et al., "Energy-Level Modulation of Small-Molecule Electron Acceptors to Achieve over 12% Efficiency in Polymer Solar Cells", Advanced Materials, 2016, pp. 9423-9429, vol. 28.

Zang, Y., et al., "Integrated Molecular, Interfacial, and Device Engineering towards High-Performance Non-Fullerene Based Organic Solar Cells", Advanced Materials, 2014, pp. 5708-5714, vol. 26.

Li, X., "Multi-Sulfur-Annulated Fused Perylene Diimides for Organic Solar Cells with Low Open-Circuit Voltage Loss", ACS Applied Energy Materials, 2019, pp. 3805-3814, vol. 2.

Nielsen, C.B., et al., "Non-Fullerene Electron Acceptors for Use in Organic Solar Cells", Accounts of Chemical Research, 2015, pp. 2803-2812, vol. 48.

McAfee, S.M., et al., "Key components to the recent performance increases of solution processed non-fullerene small molecule acceptors", Journal of Materials Chemistry A, 2015, pp. 16393-16408, vol. 3.

Liu, Z., et al., "Non-fullerene small molecule acceptors based on perylene diimides", Journal of Materials Chemistry A, 2016, pp. 17604-17622, vol. 4.

Li, C., et al., "Perylene Imides for Organic Photovoltaics: Yesterday, Today, and Tomorrow", Advanced Materials, 2012, pp. 613-636, vol. 24.

Zhang, H., et al., "New generation perovskite solar cells with solution-processed amino-substituted perylene diimide derivative as electron-transport layer", Journal of Materials Chemistry A, 2016, pp. 8724-8733, vol. 4.

Kim, S.S., et al., "A perylene diimide-based non-fullerene acceptor as an electron transporting material for inverted perovskite solar cells", RSC Advances, 2016, pp. 19923-19927, vol. 6.

Huang, J., et al., "Morphology control of planar heterojunction perovskite solar cells with fluorinated PDI films as organic electron transport layer", Solar Energy, 2016, pp. 331-338, vol. 133.

Akbulatov, A., et al., "Effect of Electron-Transport Material on Light-Induced Degradation of Inverted Planar Junction Perovskite Solar Cells", Advanced Energy Materials, 2017, pp. 1-7, vol. 7, 1700476.

* cited by examiner (c) 2PDI-4S (b) 2PDI-3S (a) 2PDI-2S (f) PCE10:2PDI-4S (e) PCE10:2PDI-3S (d) PCE10:2PDI-2S

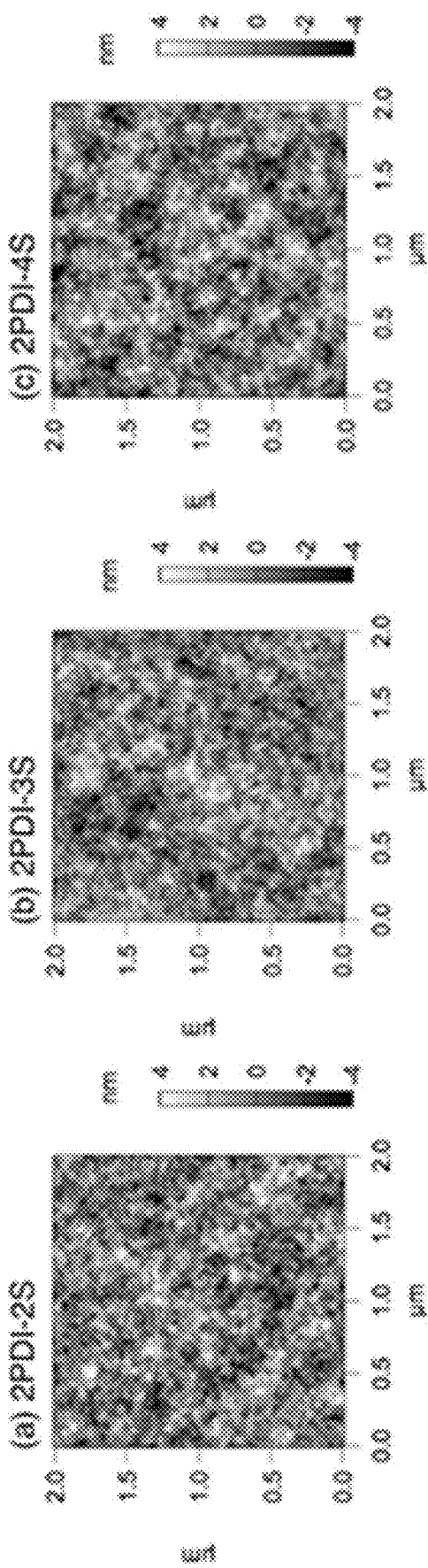
FIG. 9A FIG. 9B FIG. 9C

FIG. 18A
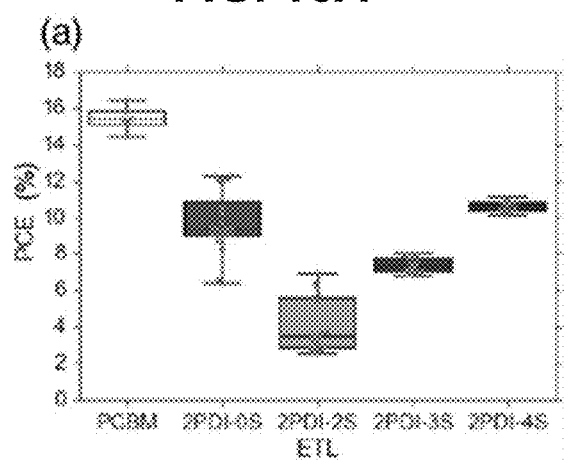
FIG. 18B
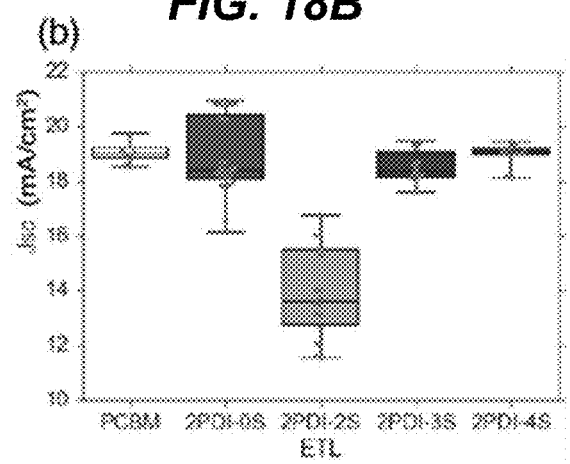
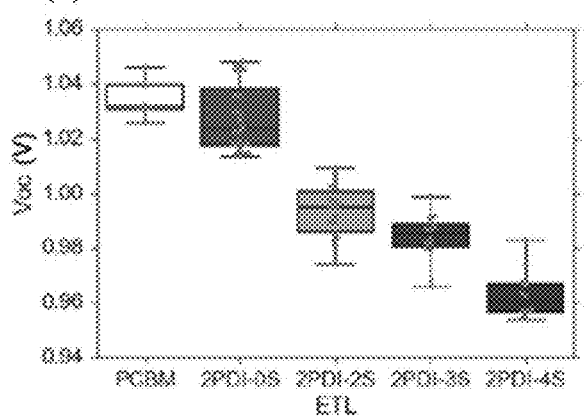
FIG. 18C
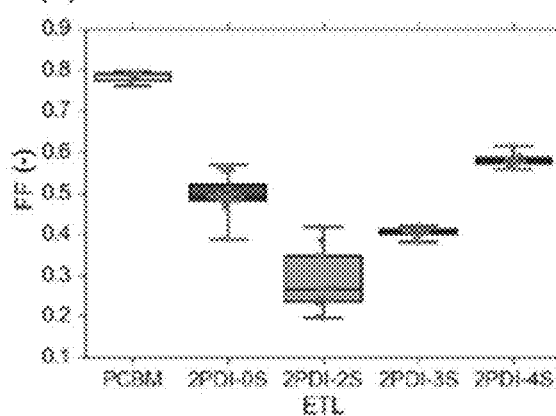
FIG. 18D

*FIG. 19A* 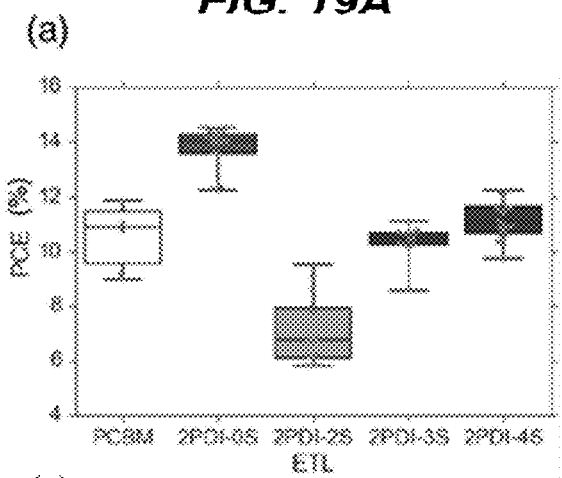 *FIG. 19B* 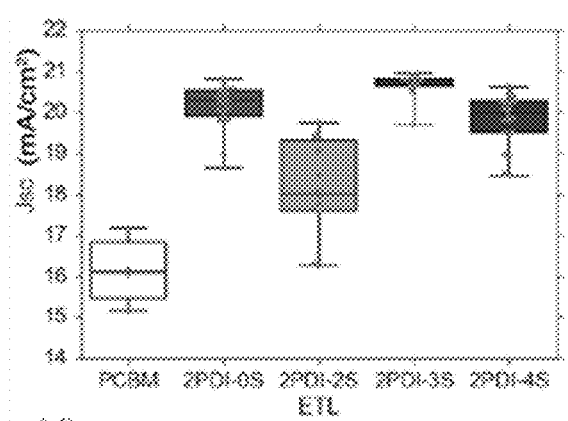
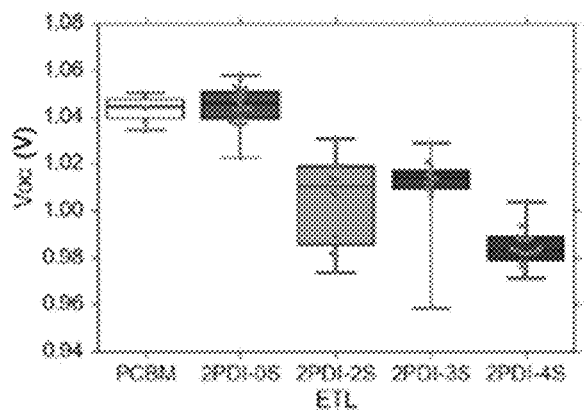 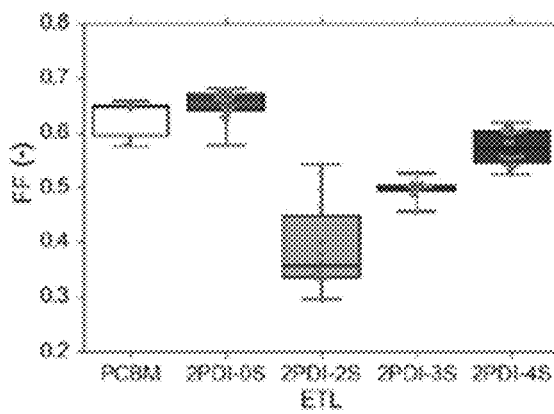
*FIG. 19C*  *FIG. 19D*

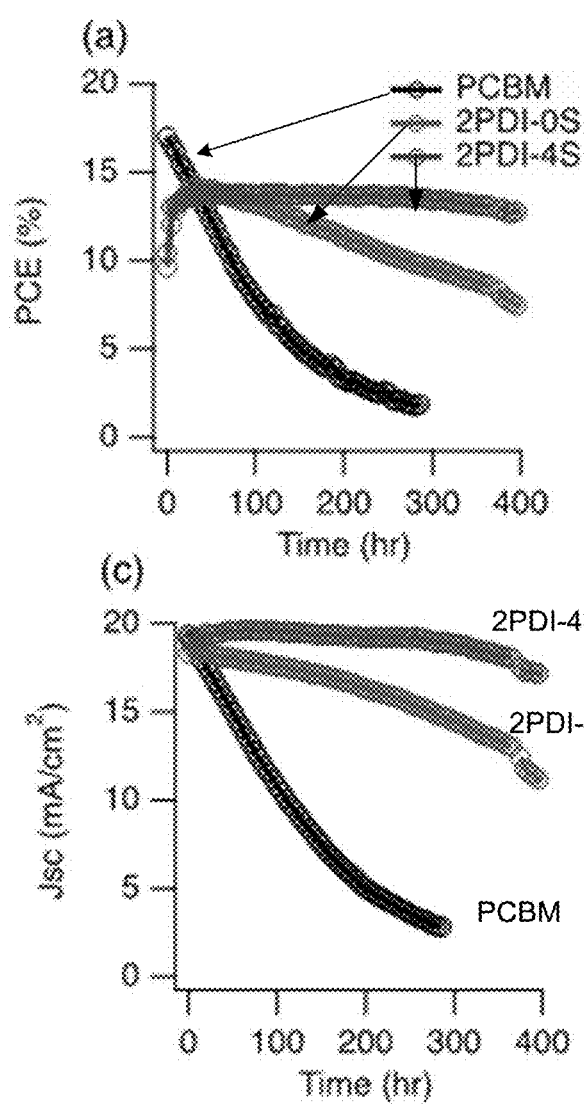
FIG. 24A
FIG. 24C
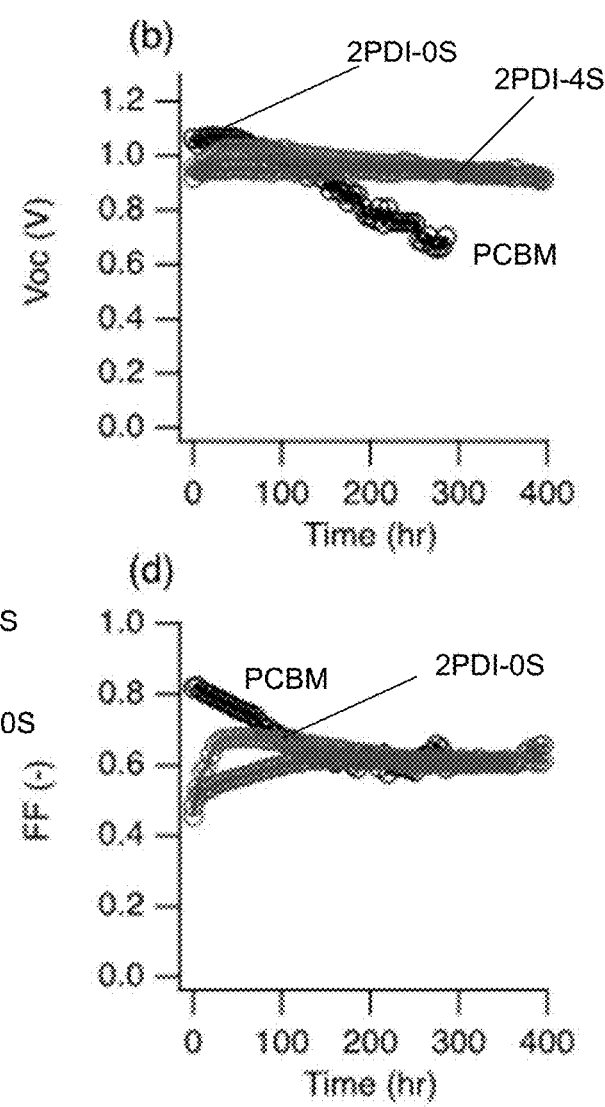
FIG. 24B
FIG. 24D

FIG. 25A
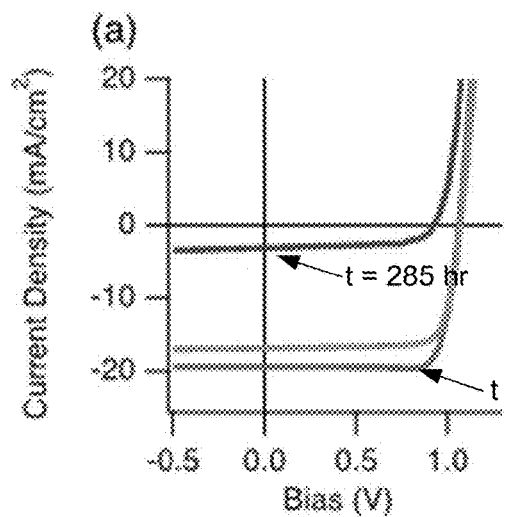
FIG. 25B
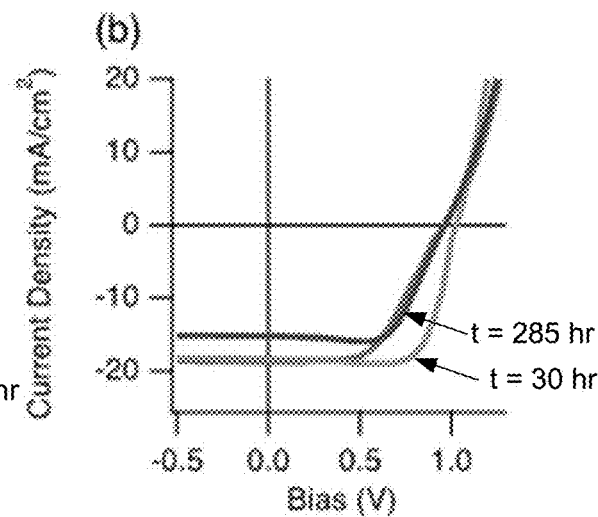
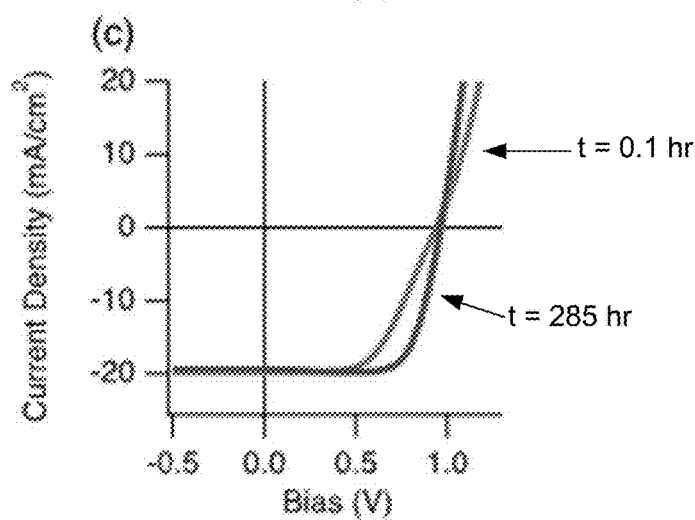
FIG. 25C

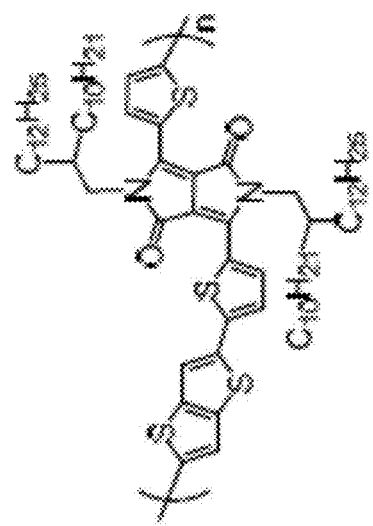
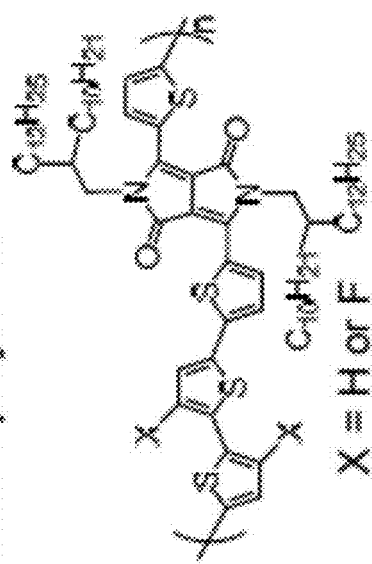
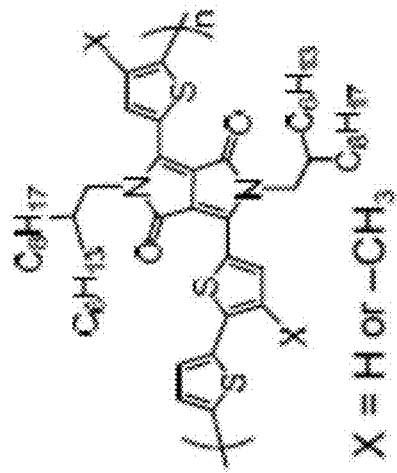
FIG. 28C

DTP based polymer

EFFICIENT SOLAR CELLS VIA SULFUR-FUSED HELICAL PERYLENE DIIMIDES DESIGN CONCEPT

CROSS REFERENCE TO RELATED APPLICATIONS

This application claims the benefit under 35 U.S.C. Section 119(e) of the following and commonly-assigned U.S. Provisional Patent Application No. 62/618,179, filed Jan. 17, 2018, by Fred Wudl, Yonghao Zeng, Hengbin Wang, Hidenori Nakayama, and Michael Chabinyc, entitled "EFFICIENT SOLAR CELLS VIA SULFUR-FUSED HELICAL PERYLENE DIIMIDES DESIGN CONCEPT," which application is incorporated by reference herein.

BACKGROUND OF THE INVENTION

1. Field of the Invention

The present invention relates to novel perylene diimide (PDI) compositions and devices comprising the same.

2. Description of the Related Art (Note: This application references a number of different publications as indicated throughout the specification by one or more reference numbers in superscripts, e.g., $^x$. A list of these different publications ordered according to these reference numbers can be found below in the section entitled "References." Each of these publications is incorporated by reference herein.)

In recent years, bulk heterojunction (BHJ) solar cells have attracted intensive attention owing to their advantages of being roll-to-roll processable at potentially low cost.[1-4] BHJs are blends of electron donating and electron accepting materials that form a bi-continuous morphology with nanoscale phase separation that allows for efficient charge generation and extraction.[5] The highest performance BHJs currently comprise blends of polymeric donors with molecular acceptors where the power conversion efficiency (PCE) of small area BHJ solar cells at 1 Sun illumination has increased to >12% in recent years.[6-10]

To improve BHJ solar cell performance, most researchers focused on device physics of organic photovoltaics that governs open circuit voltage ($V_{oc}$) and short circuit current ($J_{sc}$).[51-53]. However, fill factor (FF) is equally important in determining the power conversion efficiency and is often neglected. Fill factor is one of the key parameters of BHJ solar cells that determine the maximum efficiency of the cell, along with open-circuit voltage and short-circuit current density. In the past decade, the record fill factor of organic bulk heterojunction (BHJ) solar cells has reached over 76% for single junction cells[54] and more than 77% for ternary blend bulk heterojunction solar cells[55] based on fullerene derivatives, such as [6,6]-phenyl-C61/C71-butyric acid methyl ester ($PC_{61}BM$ and $PC_{71}BM$). One lagging area is the development of new electron acceptors for organic solar cells with high fill factor. Theoretical analysis suggests that the superiority of fullerene over non-fullerene electron acceptors is in the charge transfer properties.[56] Although efficiencies above 13% have been reported for fullerene-free BHJ solar cells, FF values for BHJ solar cells in most of the literature reports are still limited[57, 58]. Recently, several studies have reported solution-processed BHJ devices using non-fullerene acceptors that have achieved FF of 50-70%.[59-61]

Among the vast library of non-fullerene acceptors, perylene diimide (PDI) derivatives are widely investigated due to their good electron-accepting ability, high electron mobility, especially various feasible methods to modify the frontier molecular orbital levels.[62-64] Very promising results have been achieved with these PDI-based systems, reaching power conversion efficiencies (PCEs) over 9% by introducing heteroatoms to the PDI core (FIG. 1).[66] However, the fill factor of organic solar cells is still limited by the competition between recombination and extraction of free charges.

What is needed then, are novel PDI designs that improve FF while maintaining high PCE and external quantum efficiency (EQE). The present disclosure satisfies this need.

SUMMARY OF THE INVENTION

The present disclosure reports on the synthesis and characterization of a series of non-fullerene acceptors (NFAs) based on a core comprising fused perylene diimides (PDIs) units with sulfur atoms fused at the bay position. The NFA has the formula 2PDI-nS, wherein n is an integer indicating the number of sulfur atoms. These materials have tunable electron affinities (EA) that are controlled by the number of sulfur atoms fused to the core of the PDI.

The compositions of matter can be embodied in many ways including, but not limited to, the following.

1. A composition of matter, comprising a compound including fused perylene diimides (PDIs) having the formula 2PDI-nS, wherein n is an integer.

2. The composition of matter of embodiment 1, wherein bay positions of each of the fused perylene diimides are bonded to a sulfur atom so as to form the fused perylene diimides including a plurality of annulated sulfur groups.

3. The composition of matter of claim 2, wherein the annulated sulfur groups comprise a plurality of sulfur moieties.

4. The composition of matter of any of the previous embodiments, comprising the fused PDIs having at least one the structure selected from:

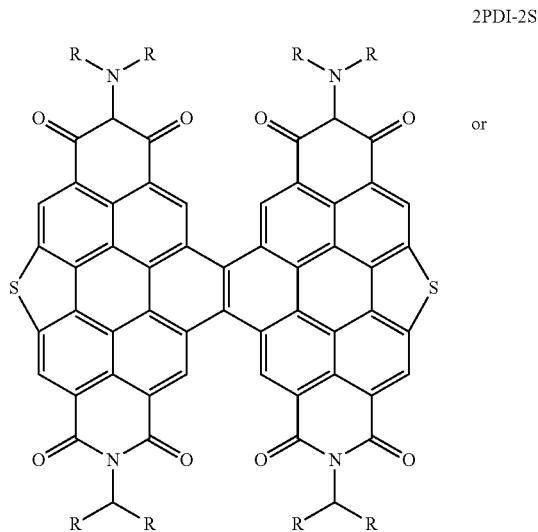

-continued

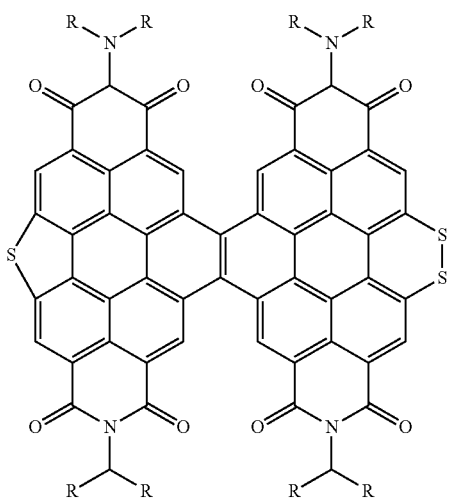

2PDI-3S

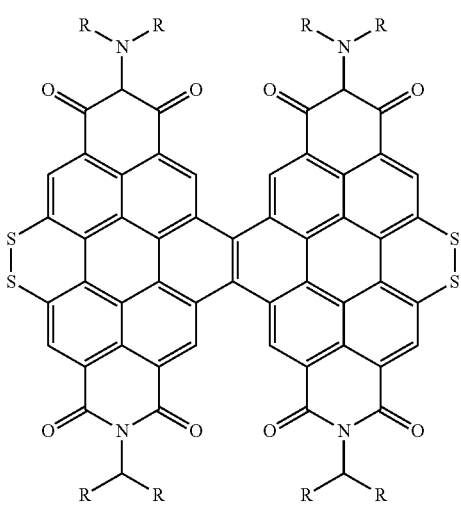

2PDI-4S wherein the R are independently hydrogen, an alkyl group, an aryl group, or a solubilizing chain.

The properties of the sulfur-fused PDI derivatives were investigated in various devices. For example, 2PDI-nS (n=0, 2,3,4) were used as electron acceptors in an organic solar cell or as an electron transporting layer (ETL) in a perovskite solar cell. These fused PDIs exhibited glassy structures but high electron mobility. As a result, bulk heterojunction solar cells using 2PDI-nS as acceptor demonstrated high device fill factor and low Voc loss in bulk heterojunction solar cells with a donor polymer (e.g., PTB7-Th). These acceptors also exhibit low loss to Voc relative to many NFAs demonstrating that it is possible to tune the EA without sacrificing low energetic losses. Moreover, 2PDI-nS as an electron transporting layer in perovskite solar cells led to improved device efficiency and stability.

Devices comprising the composition of matter can be embodied in many ways including, but not limited to, the following.

5. A device comprising the composition of matter of the embodiments 1-4 above combined with a donor molecule, wherein the fused PDIs are electron acceptors.

6. The device of embodiment 5, wherein the donor molecule is at least one compound selected from PTB7-Th or from the list of compounds illustrated in FIGS. 28A-28D.

7. The device of embodiment 5 or 6, wherein the device is a solar cell having an active region including the fused PDIs combined with the donor molecule.

8. A device comprising the composition of matter of any of the embodiments 1-4, or the device of embodiments 5-7, further comprising an electron transport layer including the fused PDIs.

9. The device of claim 8, further comprising an electromagnetic radiation absorbing active region coupled to the electron transport layer, wherein the active region comprises an organic-inorganic hybrid perovskite (PVSK).

10. The device of embodiment 9, wherein the device is a solar cell having a fill factor exceeding 57%.

11. The device of embodiment 10, wherein the solar cell has a PCE of at least 11% and an EQE of greater than 70%, when the active region of the solar cell absorbs the electromagnetic radiation having a wavelength in a range of 350-750 nm under 1 Sun irradiation.

13. The device of embodiment 5 or 6, wherein the device is a photodetector having a sensing element comprising the fused PDIs combined with the donor molecule.

14. A device comprising the composition of matter of any of the embodiments 1-4, wherein the device comprises an active layer or electron transport layer comprising the fused PDIs, and the active layer or the electron transport layer is amorphous and has a mobility greater than $10^{-2}$ $cm^2/Vs$.

15. The device of claim 14, wherein the device is an n-type field effect transistor.

Further device embodiments disclosed herein include, but are not limited to, the following.

16. A device including an electron transport layer comprising a compound including one or more perylene diimides (PDIs), wherein one or more of the bay positions of the one or more perylene diimides are bonded to annulated oxygen, annulated sulfur, annulated selenium, annulated nitrogen or annulated phosphorus, and one or more of the ortho-positions of the perylene diimides are functionalized with an alkyl group or an aromatic group.

17. The device of embodiment 16, or 8 or 9, wherein the device is a solar cell including a substrate; a transparent anode on the substrate; an anode interface/hole transport layer on the transparent anode; an active absorbing region comprising PVSK on the anode interface layer; the electron transport layer comprising the PDIs on the active absorbing region; and a cathode on the electron transport layer.

18. A solar cell device, comprising an anode; an anode interface/hole transport layer on the anode; an electron transport layer comprising a compound having at least one

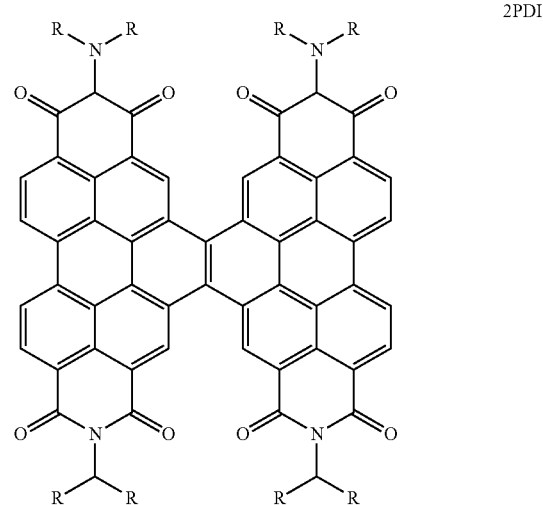

2PDI

-continued

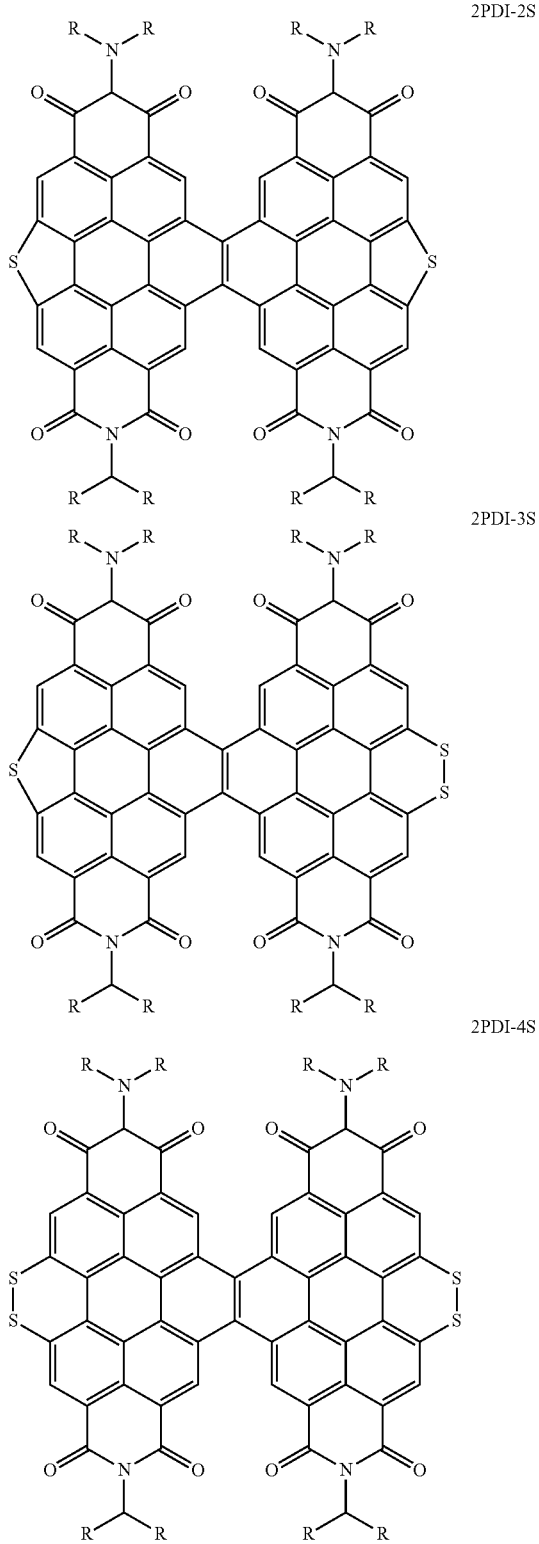

structure selected from:
wherein the R are independently hydrogen, an alkyl group, an aryl group, or a solubilizing chain;
a cathode on the electron transport layer;
an active absorbing region between the electron transport layer and the anode interface/hole transport layer, the active absorbing region comprising an organic-inorganic hybrid perovskite (PVSK), wherein, in response to electromagnetic radiation absorbed in the PVSK, the active absorbing region outputs electrons through the electron transport layer to the cathode, and outputs holes through the hole interface/hole transport layer to the anode, so as to generate a voltage across the cathode and the anode.

19. The device of embodiment 18, wherein the compound comprises 2PDI.

20. The device of embodiment 18, wherein the compound comprises 2PDI-4S.

21. The device of embodiment 18, wherein the compound in the electron transport layer has a composition such that a PCE, $J_{SC}$ and/or fill factor of the device do not decrease after 400 hours of continuous operation of the device under 1 Sun illumination, as compared to after 1 minute of operation.

22. The device of embodiment 18, wherein the electron transport layer has a composition such that the PCE, $J_{SC}$ and/or fill factor of the device increase after the 400 hours of continuous operation, as compared to after 1 minute of operation.

23. The device of embodiment 18, wherein the electron transport layer has a composition such that the PCE, $J_{SC}$ and/or fill factor of the device increase after the device is heated to at least 100 degrees Celsius.

BRIEF DESCRIPTION OF THE DRAWINGS

Referring now to the drawings in which like reference numbers represent corresponding parts throughout:

(FIG. 7B) 2PDI-3S; FIG. 7C (2PDI-4S), and BHJ blend films on ZnO for PCE10 with (FIG. 7D), 2PDI-2S, FIG. 7E (2PDI-3S); FIG. 7F (2PDI-4S). Images were obtained using the Stanford Synchrotron Radiation Light source (SSRL) beamline 11-3.

FIGS. 9A-9C. Atomic force microscopy (AFM) images of the BHJ blend films. PTB7-Th with 2PDI-2S (FIG. 9A), 2PDI-3S (FIG. 9B), and 2PDI-4S (FIG. 9C).

FIG. 15C: Representative IPCE spectra of 100° C. 10 min annealed devices. Black: PCBM, Red: 2PDI-0S, Orange: 2PDI-2S, Blue: 2PDI-3S, Purple: 2PDI-4S.

FIG. 18A-18D. Distribution of device performance characteristics for the devices without thermal annealing. The five lines in the boxplots show 0, 25, 50, 75, and 100 percentiles from the bottom to the top, respectively.

FIG. 19A-19D. Distribution of device performance characteristics for the devices after a thermal annealing at 100° C. 10 min. The five lines in the boxplots show 0, 25, 50, 75, and 100 percentiles from the bottom to the top, respectively. The 2PDI-0S (another name for 2PDI) and 2PDI-4S devices outperform the PCBM devices with the PCE of 14.03% and 11.73%, respectively. This contrast clearly indicates that the degradation of the PCBM devices is not due to decomposition of the MAPbI$_3$ layer, and controlling the morphology of the ETLs is critical in device optimization.

FIGS. 24A-24D. Device parameters of the glass cap encapsulated devices at 35° C. under continuous 1 sun illumination as a function of time. (FIG. 24A) Power Conversion Efficiency (PCE), (FIG. 24B) Voc, (FIG. 24C) Jsc, and fill factor (FF) (FIG. 24D). All of the devices were not annealed before the test. The loading for the circuit was fixed to the maximum power point under 1 sun illumination before the test.

FIG. 25 Development of J-V characteristics of (FIG. 25A) PCBM, (FIG. 25B) 2PDI-0S, and (FIG. 25C) 2PDI-4S under light-soaking test. Blue: t=0.1 hour (hr), green: t=30 hr, and red: t=285 hr. Note that, for 2PDI-4S, the characteristics of t=30 and 285 hr are almost identical.

FIGS. 28A-28D. Example donor molecules.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

Figure 2A:
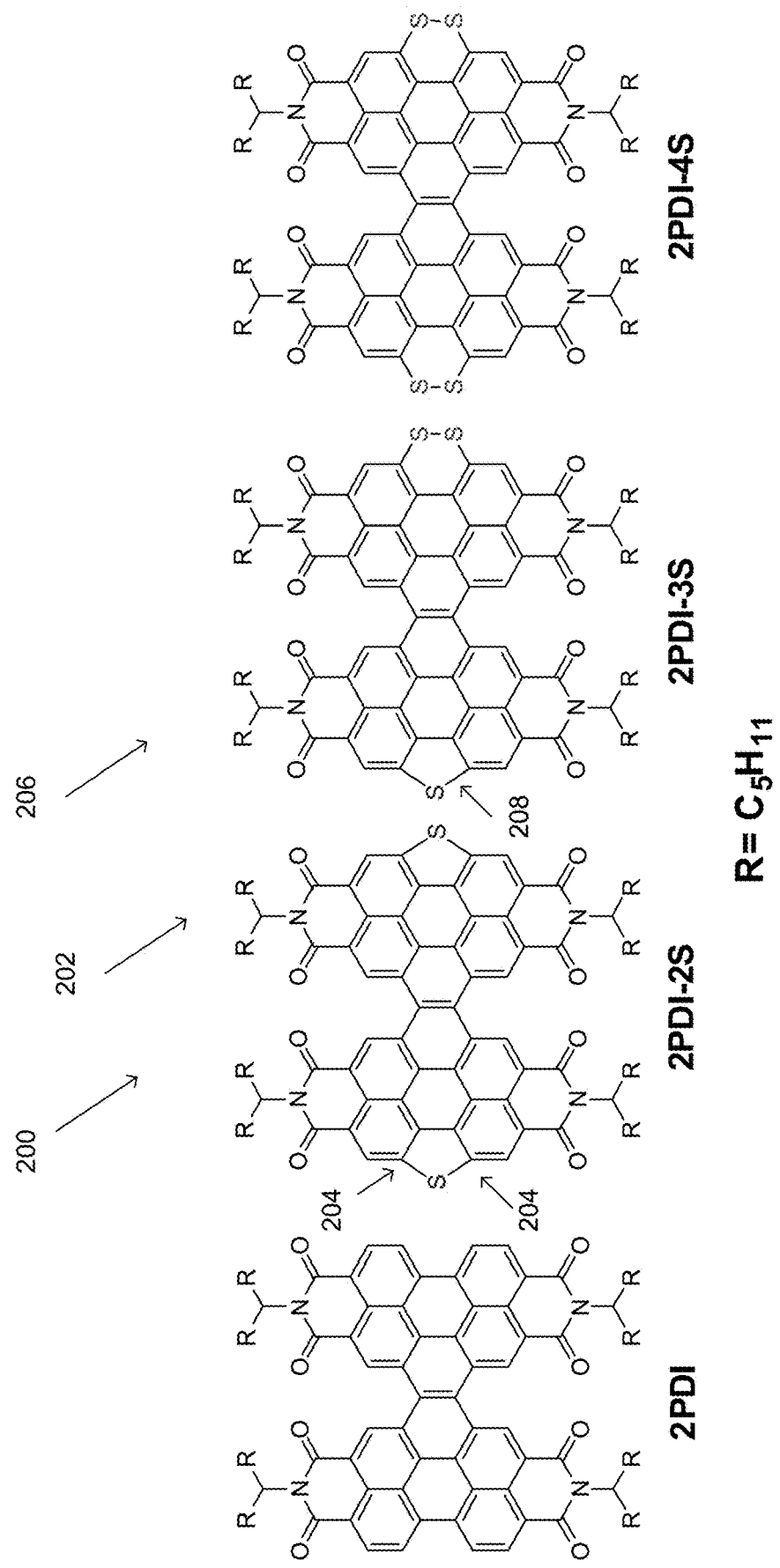
FIG. 2A. Chemical structures of 2PDI, 2PDI-2S, 2PDI-3S, and 2PDI-4S.

The present disclosure reports on the synthesis and characterization of multisulfur-fused PDI molecules. FIG. 2A illustrates example compositions (2PDI-2S, 2PDI-3S, and 2PDI-4S). The weak electron-donating sulfur atoms were introduced into the fused double PDI core so as to change the intermolecular π-π interactions to some extent and adjust the lowest unoccupied molecular orbital (LUMO) level of the conjugated system. (i.e., the contribution to the π-system could be tuned by switching from single sulfur substitution on each side to addition of two sulfur atoms on each side).

I. Example 1

Figure 2B:
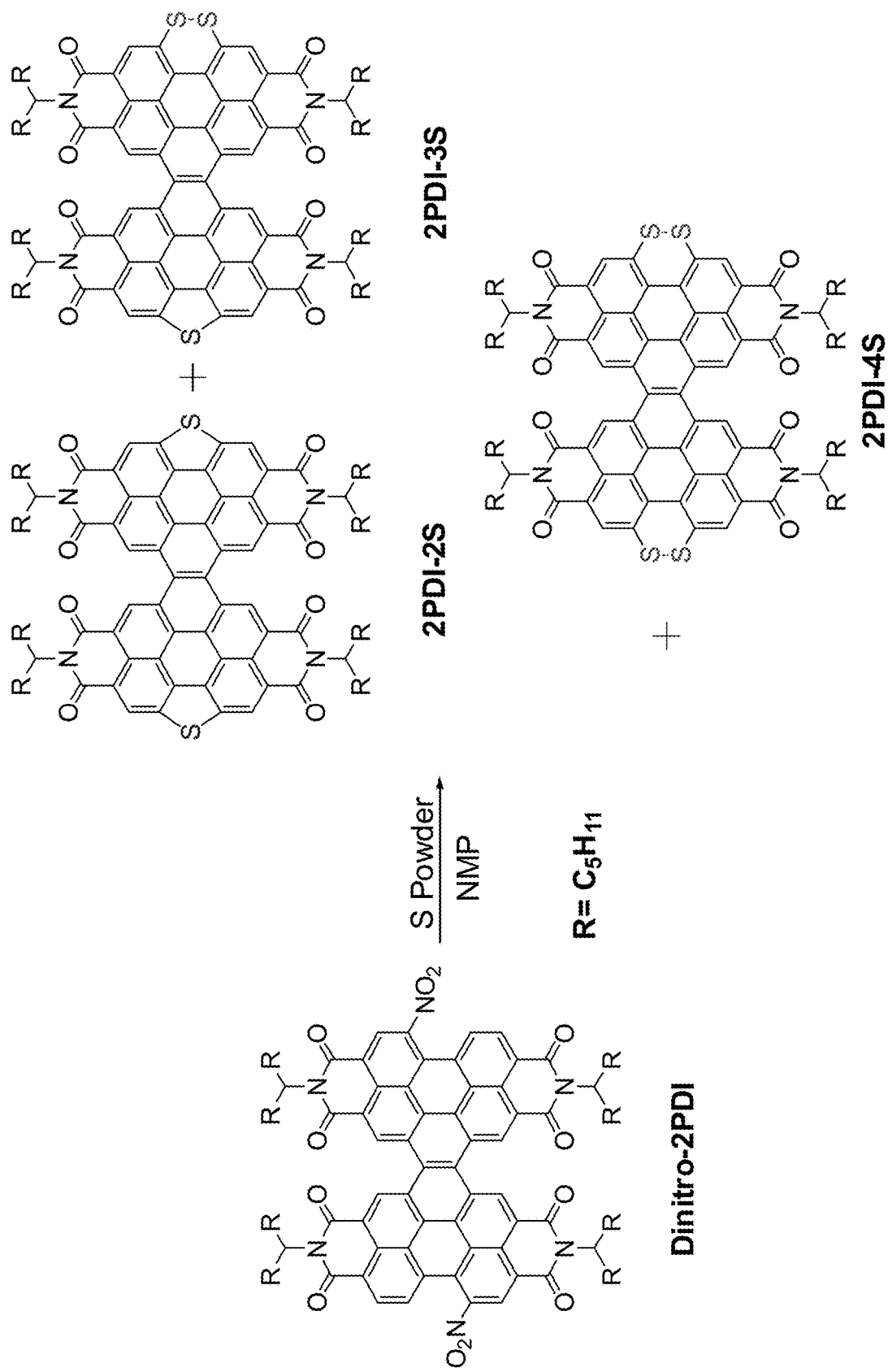
FIG. 2B. The synthetic route for fabrication of 2PDI-2S, 2PDI-3S, and 2PDI-4S.

Synthesis, Absorption and Electronic Properties of Sulfur-Fused PDIs a. Synthesis The synthetic route for compounds 2PDI-2S, 2PDI-3S, and 2PDI-4S is shown in Scheme 1 in FIG. 2B. Compound Dinitro-2PDI was synthesized in 98% yield by reacting parent 2PDI[23, 24] and fuming nitric acid in dichloromethane (DCM) (dry $CH_2Cl_2$) at room temperature for 3 hours (h). The following reaction of Dinitro-2PDI with sulfur powder in boiling N-methylpyrrolidone (NMP) unprecedentedly obtained a mixture of multi-sulfur fused PDIs with a reasonable yield, which were subsequently identified as 2PDI-2S, 2PDI-3S, and 2PDI-4S. This is the first time all three possible derivatives of multi-sulfur fused PDI were obtained in a one-pot reaction.[25-27] Meanwhile, we noticed that compound 2PDI-3S, and 2PDI-4S can be easily converted to 2PDI-2S by a longer reaction heating time. Finally, the resulting compounds were successfully characterized with mass spectroscopy, $^1H$ and $^{13}C$ nuclear magnetic resonance (NMR) spectroscopy and can be easily dissolved in common organic solvents at room temperature.

b. Absorption

Figure 3:
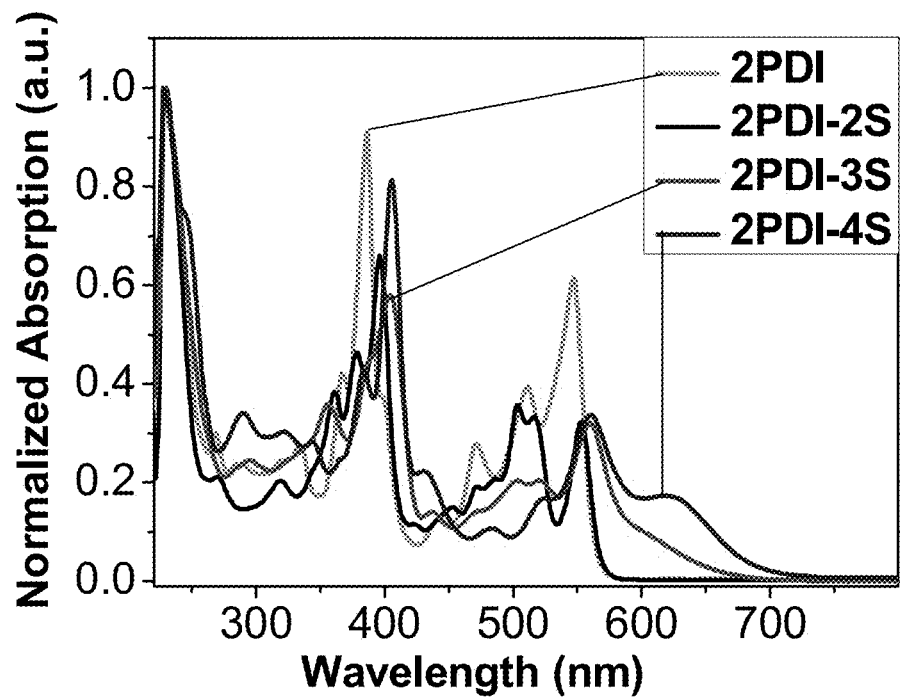
FIG. 3. Normalized UV-Vis absorption spectra of 2PDI, 2PDI-2S, 2PDI-3S, and 2PDI-4S measured in dichloromethane (DCM) solution showing the effect of multi-sulfur annulation. The compounds exhibit strong absorption bands near 400 nm, indicative of their fused core. With sulfur-annulation, however, comes a weakening in the typical split absorption bands of the perylene core, expected between 450 and 550 nm. The observed broadening of the optical onsets as a result of the introduction of increasing sulfur atoms signifies changes to the rigid perylene core and a resulting narrowing of the optical gap (Table 1).

The UV-vis absorption spectra of 2PDI, 2PDI-2S, 2PDI-3S, and 2PDI-4S in dilute DCM solution exhibit broad absorptions in the wavelength range of 230-680 nm. As shown in FIG. 3, all of the absorption spectra showed an intense π-π* absorption peak at about 230 nm. The absorption spectra of these PDI derivatives show intense absorption bands between 300 and 450 nm and typical vibronic splitting due to the rigid π-conjugated perylene core. The absorption onset of 2PDI-2S is almost identical to the parent 2PDI. On the other hand, the UV-vis absorption spectra of 2PDI-3S and 2PDI-4S are significantly red-shifted as compared to 2PDI-2S, in agreement with the calculated narrowing of their HOMO-LUMO gap. The observed broadening of the optical onsets as a result of the introduction of increasing sulfur atoms signifies changes to the rigid perylene core and a resulting narrowing of the optical gap (Table 1).

c. Cyclic Voltammetry

Figure 4A:
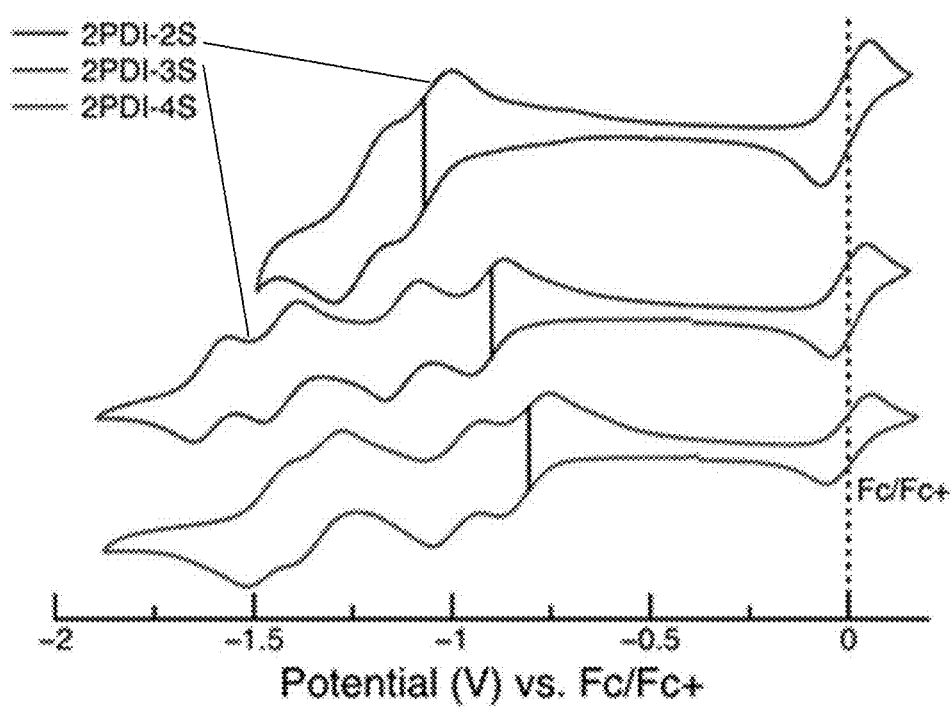
FIG. 4A Cyclic voltammograms of 2PDI-2S, 2PDI-3S, and 2PDI-4S with Fc/Fc$^+$ as an internal standard. (DCM/ 0.1M TBAPF$_6$ vs. Ag/Ag$^+$ at 100 mV/sec)

Electrochemical cyclic voltammetry (CV) was used to evaluate the energy levels (Table 1 and FIG. 4A). All of the 2PDI-nS compounds display multiple fully reversible reductions and electron affinities (EA) that vary with the number of annulated sulfur atoms (Table 1 and FIG. 4A). The EA of 2PDI-2S extracted from the $E_{1/2}$ in the cyclic voltammogram is 3.7 eV, slightly lower than the reported value for parent 2PDI. As we increase the number of sulfur atoms, however, the EA increases up to 4.0 eV for 2PDI-4S. All the compounds can easily accept multiple electrons and the voltage offsets between the first and second reductions give a clear picture of the molecules' symmetry. The symmetrical 2PDI-2S and 2PDI-4S both have closely spaced first and second reductions (0.16 V and 0.17 V, respectively) while in 2PDI-3S a 0.22 V difference is observed between the first and second reductions. The addition of multi-sulfur atoms to the 2PDI core did not lead to significant changes in the estimated ionization energies (IE) of ≈5.8 eV, based on an estimate using the optical gaps. Hence, the 2PDI-nS series provides a means to rationally alter the EA in order to study their behavior as non-fullerene acceptors in BHJs.

The LUMO energy level of 2PDI-2S extracted from its onset reduction potential is close to −3.76 eV, which is similar to the parent 2PDI. In contrast, the LUMO energy level of the 2PDI-4S is 0.29 eV lower than 2PDI-2S. However, the addition of multi-sulfur atoms to the 2PDI core did not provide any significant changes in terms of the highest occupied molecular orbital (HOMO) energy level, which stays around −5.90 eV. Hence, we have a very interesting system for studying the influence of altering the LUMO level of the molecule in organic solar cells as non-fullerene acceptors.

TABLE 1

The optoelectronic properties of 2PDI, 2PDI-2S, 2PDI-3S, and 2PDI-4S.

| | $\lambda_{onset}$ (nm) | $E_{g,opt}$ (eV) | LUMO (eV)[a] | HOMO (eV)[b] | EA (eV) | est. IE |
|---|---|---|---|---|---|---|
| 2PDI | 572 | 2.17 | −3.81 | −5.99 | −3.8 | −6.0 |
| 2PDI-2S | 574 | 2.16 | −3.76 | −5.92 | −3.7 | −5.9 |
| 2PDI-3S | 644 | 1.93 | −3.98 | −5.91 | −3.9 | −5.8 |
| 2PDI-4S | 680 | 1.82 | −4.05 | −5.87 | −4.0 | −5.8 |

[a]Obtained from CV data. IE (eV) estimated from the LUMO (CV data) + optical gap ($E_{g,opt}$). EA obtained by cyclic voltammetry in dichloromethane from $E_{1/2}$ vs. Fc/Fc$^+$ assuming a redox potential of 4.80 eV.
[b]IE estimated from the EA determined by CV and the optical gap ($E_{g,opt}$) in solution with an uncertainty of the exciton binding energy.

d. Density Functional Theory

Figure 4B:
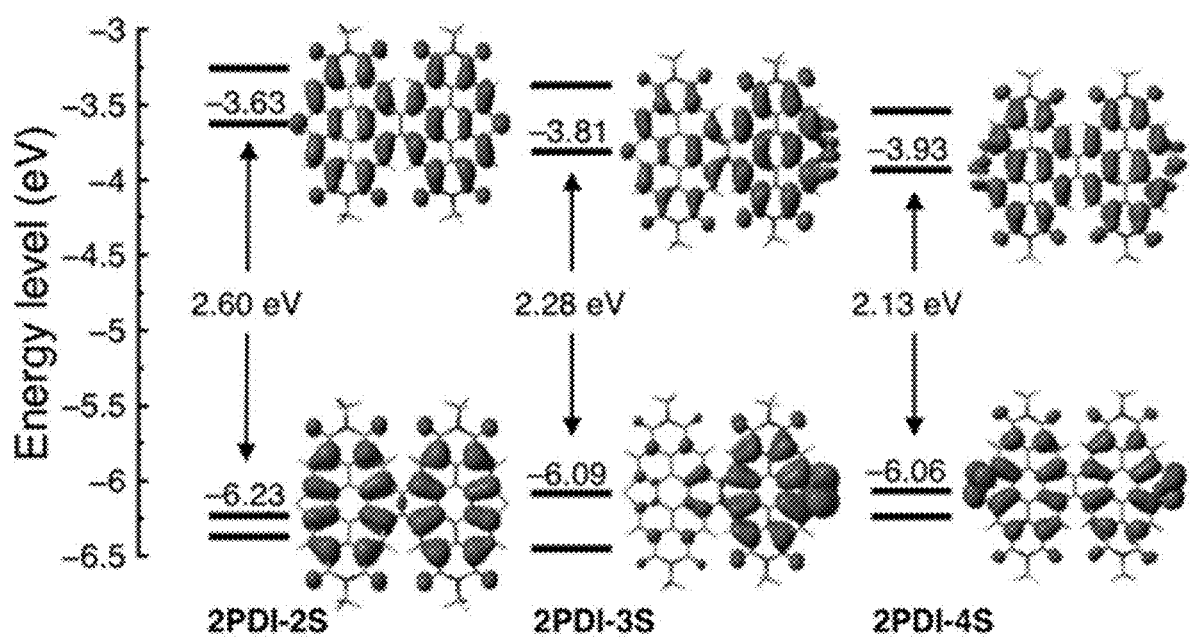
FIG. 4B. Frontier molecular orbitals and HOMO-LUMO gaps.

As evidenced by cyclic voltammetry, the electronic properties of 2PDI-2S, 2PDI-3S, and 2PDI-4S are significantly influenced by whether one or two sulfur atoms is annulated into the PDI core. Density Functional Theory (DFT) calculations at the B3LYP/6-31G* level of theory were performed on all the molecules to visualize the effects of the sulfur atoms on the frontier energy levels (FIG. 4B).

Addition of one sulfur atom on each side of the compound modifies the aromatic ring, essentially donating electron density into the core with little HOMO electron probability density located on the sulfur atoms themselves, as seen in 2PDI-2S. With two sulfur atoms in the ring, that aromaticity is lost and the sulfur atoms are purely electron rich substituents commanding significant electron density (see 2PDI-3S or 2PDI-4S). This imparts very symmetrical electron densities to 2PDI-2S and 2PDI-4S as exemplified by close HOMO and HOMO-1 energy levels (less than 0.2 eV difference in energy). 2PDI-3S, on the other hand, shows HOMO electron density predominantly on the side of the compound with two sulfur atoms and therefore has a larger energy difference between HOMO and HOMO-1 energy levels (~0.4 eV). This effect is seen to a much smaller extent in the LUMO and LUMO+1 energy levels of the molecules. It is worth noting that since 2PDI-4S has symmetrical delocalized HOMO and LUMO orbitals that cover both the PDI core and the sulfur atoms, it likely has the greatest HOMO/LUMO orbital overlap. The optimized geometries of the molecules show a significant twisting in the central core of ~20°, which likely prevents aggregation and contributes to the molecules' solubility and good film forming capabilities (FIG. S1 of Appendix B of the priority application).

II. Example 2

BHJ Solar Cells With the Sulfur-Fused PDIs of Example 1

To assess the performance of the 2PDI-nS series as NFAs, we made BHJ solar cells using a donor polymer with an appropriately matched EA and IE. We chose PTB7-Th as the donor polymer because of its optical gap of 1.58 eV (785 nm), IE of ~5.24 eV and EA smaller than ~3.7 eV.[31] This donor polymer has also been widely examined using fullerene-based acceptors and NFAs.[32-36]

Figure 5A:
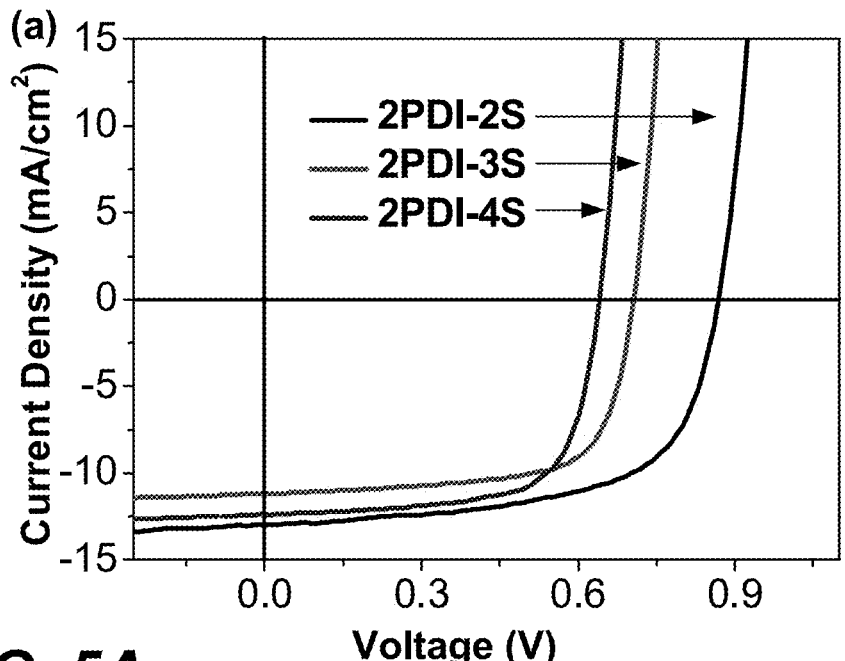
FIG. 5A J-V curves for PTB7-Th: 2PDI-2S, 2PDI-3S, and 2PDI-4S solar cells.
Figure 5B:
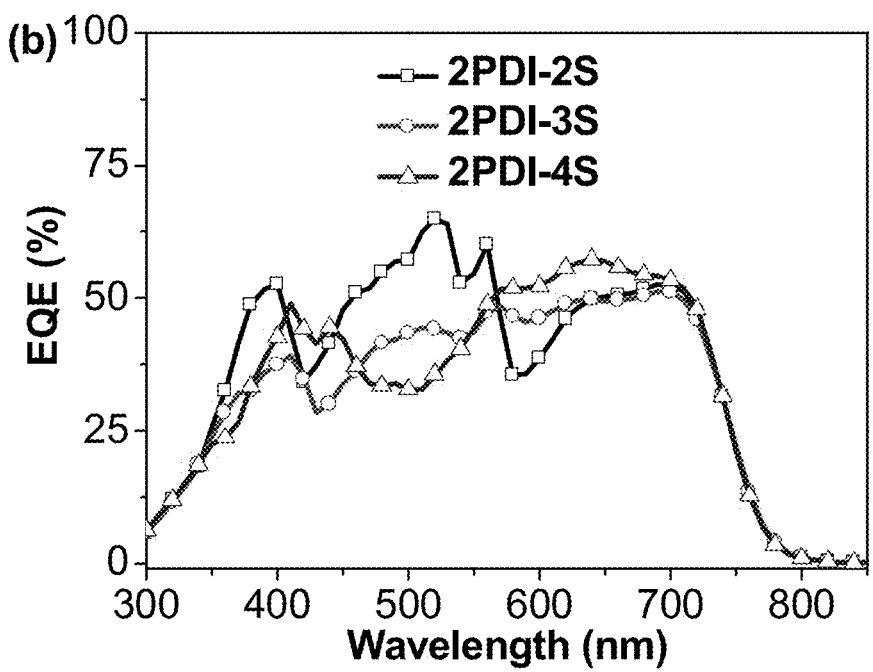
FIG. 5B EQE spectra of PTB7-Th: 2PDI-2S, 2PDI-3S, and 2PDI-4S devices.

Solution-processed BHJ organic solar cells using 2PDI-2S, 2PDI-3S, and 2PDI-4S as acceptors were fabricated and their device performances are shown in Table 2. Photovoltaic properties of the 2PDI-2S, 2PDI-3S, and 2PDI-4S as electron acceptor in bulk-heterojunction solar cells were investigated with an inverted device configuration of ITO/ZnO/PTB7-Th:2PDI-nS/MoO$_3$/Ag. A mixture of PTB7-Th and 2PDI-nS with a w/w ratio of 1:2 was dissolved in chlorobenzene with 1% of diiodooctane as processing additive with a total concentration of 20 mg mL$^{-1}$ for spin-coating of the active layer. The current density-voltage (J-V) characteristics of the primary devices are shown in FIG. 5A. The 2PDI-2S showed excellent (highest) open circuit voltages ($V_{OC}$) of 0.86 V, indicating good energy level pairing with the donor polymer, with decreasing values for increasing number of sulfur atoms in line with the EA of the compounds (Table 2). The lower $V_{OC}$ observed for the 2PDI-3S and 2PDI-4S, in line with their lower LUMO levels. These devices also showed broad responses to light, as seen in the external quantum efficiencies (EQE) (FIG. 5B).

Figure 5C:
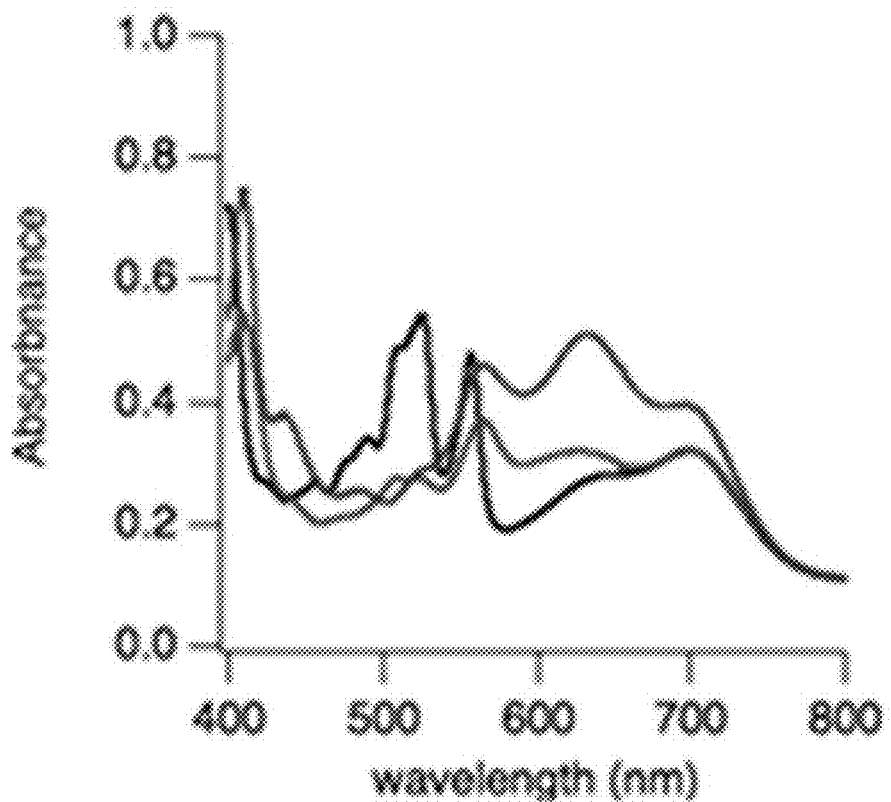
FIG. 5C. Absorption spectra of PTB7-Th:2PDI-nS on a glass/ITO/ZnO stack.

The short circuit currents ($J_{SC}$) in the BHJs were all comparable with changes near ~550 nm due to the blue shifted absorbance of 2PDI-2S relative to 2PDI-3S and 2PDI-4S that separates its absorbance from PTB7-Th (FIG. 5C).

The EQE of all the three devices are already over 50% for much of their absorbance range with integrated $J_{sc}$ of 11.7, 10.6, and 11.05 mA/cm$^2$ for 2PDI-2S, 2PDI-3S, and 2PDI-4S, respectively for 1 sun illumination and are within ~10% of the J-V characteristics under simulated solar illumination, indicating definite promise for these materials as NFAs in OPVs.

All three BHJs fill factors (FF) of 60% or higher with PTB7-Th:2PDI-4S having a FF of 70%, which are comparable to best reported rylene diimide molecular acceptors.[2] and the highest FF reported among PDI non-fullerene acceptors using a polymer as the donor material.

TABLE 2

Summary of device parameters of PTB7-Th:PDI-nS acceptor solar cells.

|  | $V_{oc}$ (V) | $J_{sc}$ (mA/cm$^2$) | FF (%) | PCE$^a$ (%) |
|---|---|---|---|---|
| 2PDI-2S | 0.863 ± 0.005 | 12.9 ± 0.3 | 62 ± 1 | 6.9 ± 0.1 |
| 2PDI-3S | 0.698 ± 0.003 | 11.4 ± 0.1 | 68 ± 1 | 5.4 ± 0.1 |
| 2PDI-4S | 0.639 ± 0.003 | 12.2 ± 0.4 | 70 ± 1 | 5.5 ± 0.1 |

$^a$Average PCE values were calculated from six devices fabricated using the same conditions.

III. Example 3

Light Intensity Dependency of the BHJ Solar Cells With the Sulfur-Fused PDIs of Example 1

Figure 6:
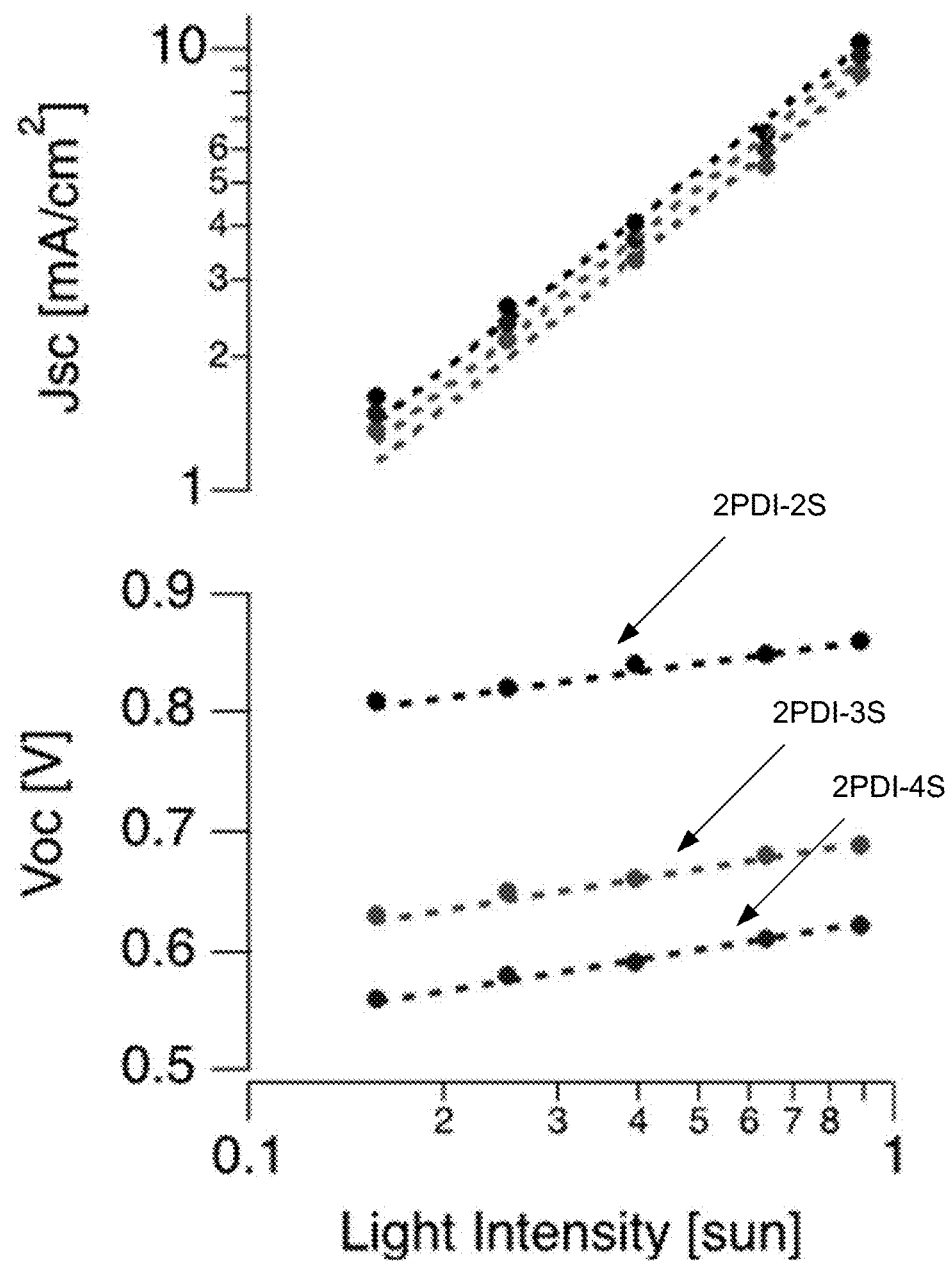
FIG. 6. Light Intensity dependency of short circuit current (Jsc) and open circuit voltage (Voc). Black, 2PDI-2S; red, 2PDI-3S; blue, 2PDI-4S.

FIG. 6 shows the Jsc and Voc of the three devices are plotted against light intensity to assess recombination dynamics. Fittings of the $J_{SC}$ plots with a simple power law, $J_{SC}=I^\alpha$, gives α=1.05 for all of the plots, indicating no carrier losses due to recombination under short-circuit condition. The slopes of the Voc plots are measured in a linear-log scale in the units of kT/q, where k is the Boltzmann constant, T temperature, and q the elemental charge. The slopes are 1.17, 1.42, and 1.37 for 2PDI-2S, 2PDI-3S and 2PDI-4S, respectively. When the bimolecular mode totally dominates the recombination dynamics, the slope is unity. A slope of >1 suggests monomolecular recombination such as trap-assisted recombination also plays some role under open-circuit condition.

IV. Example 4

Morphology Study of the Sulfur-Fused PDIs of Example 1

To obtain high photovoltaic performance, tuning the aggregation behavior of donor-acceptor molecules and the optimization of the morphology of blend films are essential.

Figure 7C:
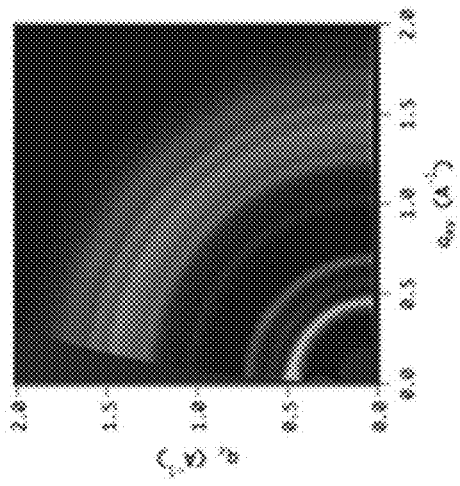
FIGS. 7A-7F. 2D GIWAXS images. Neat films on ZnO for (FIG. 7A) 2PDI-2S.
Figure 7B:
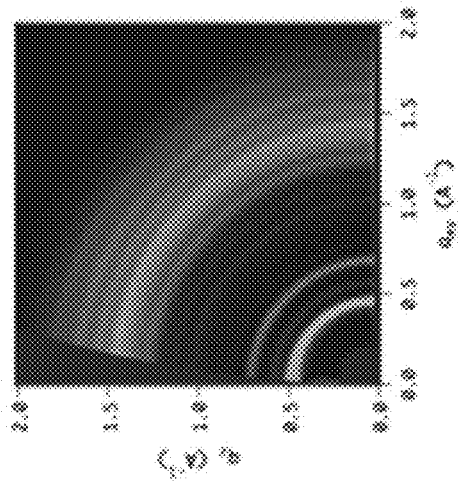
Figure 7A:
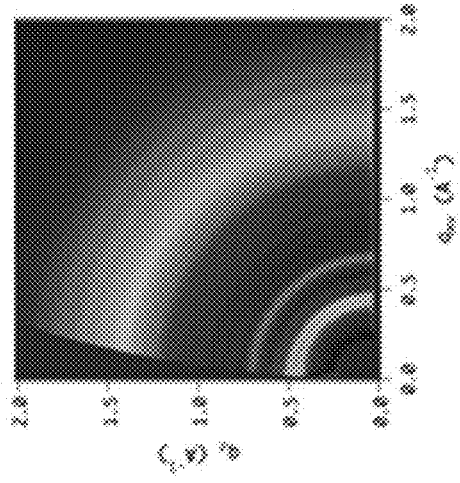
Figure 7F:
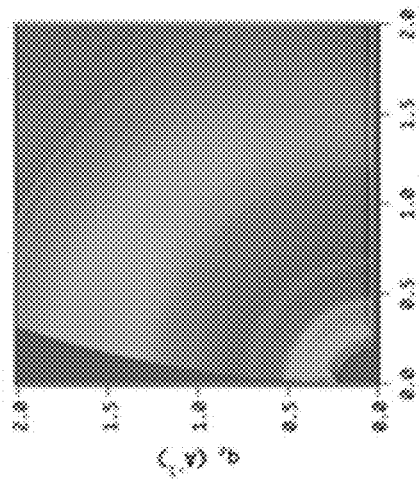
Figure 7E:
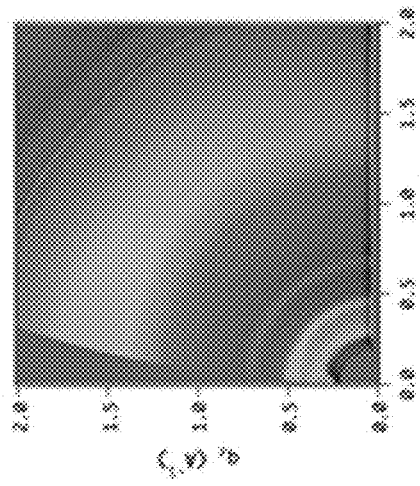
Figure 7D:
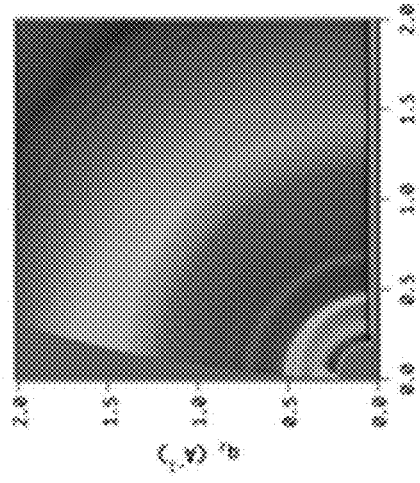
Figure 7G:
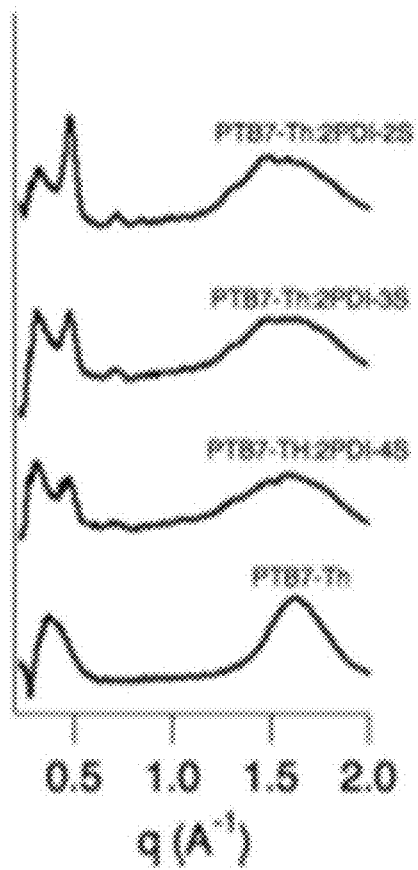
FIGS. 7G-7H GIWAXS line cuts of (FIG. 7G) out-of-plane scattering and (FIG. 7H) in-plane scattering of neat PTB7-Th and PTB7-Th:2PDI-nS thin films on ZnO. The vertical axis is the intensity in arbitrary units.
Figure 7H:
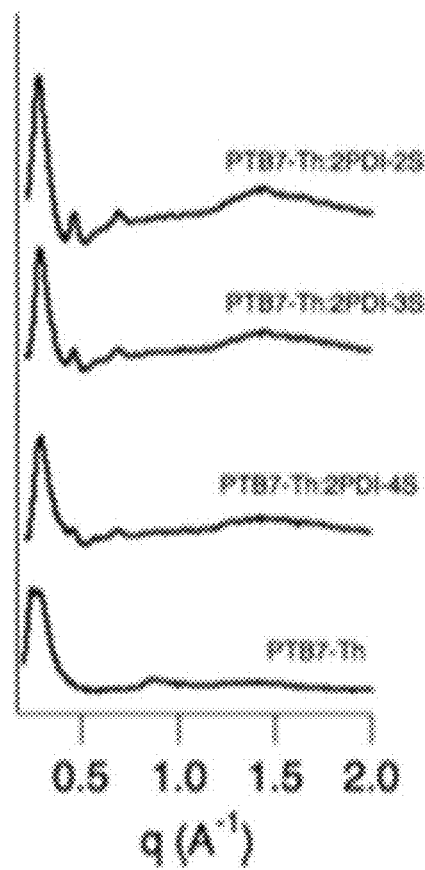
Figure 7I:
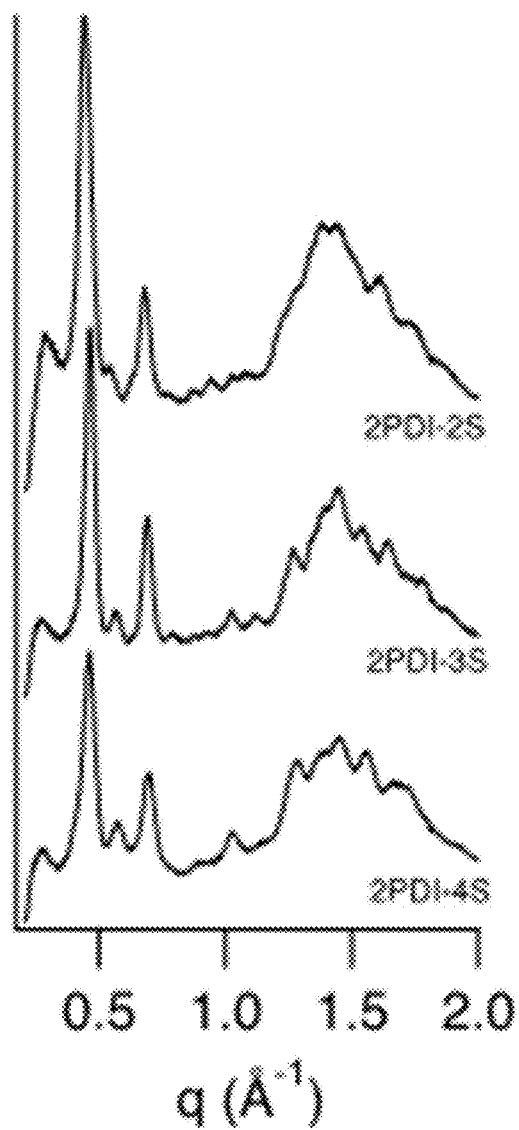
FIG. 7I GIWAXS azimuthally averaged scattering of neat 2PDI-nS thin films on ZnO. The vertical axis is the intensity in arbitrary units.

To reveal the structures of crystalline domains in the neat and BHJ blends, we performed grazing incidence wide-angle x-ray scattering (GIWAXS) (FIGS. 7A-7F). Two dimensional (2D) GIWAXS images for neat films of 2PDI-nS (FIGS. 7A-7C) revealed scattering features with no preferential orientation (multiple halos at q=0.45, 0.7, 1.2-1.8 Å$^{-1}$ indicating that the films are amorphous and widths of the peaks that are relatively broad (FWHM~0.06 Å$^{-1}$) suggesting significant structural disorder (FIG. 7G, 7H). The three compounds all share a prominent scattering feature near q=0.45 Å$^{-1}$, a spacing of ~14 Å that is comparable to ~½ of the distance from the end of one alkyl chain to the other across the core of the molecule (~28.2 Å by DFT). The other molecular dimension across the sulfur atoms is ~15 Å, which is larger than the observed spacing, particularly with the addition of a van der Waals separation of molecules.

The scattering from the BHJ films (FIGS. 7D-7F, 7I) has features from 2PDI-nS and PTB7-Th for a phase separated blend, showing the same halos but superimposed by a diffused out-of-plane scattering at q=1.6 Å$^{-1}$. Many of high-performing donor polymers including PTB7-Th are known to take a face-on orientation for their crystalline domains in a neat or BHJ blend film, showing a scattering near the q$_z$ axis at q~1.6 Å$^{-1}$ assigned to an out-of-plane π-π stacking. Strong lamella scatterings from the polymer in the in-plane direction is however not observed. We thus conclude that, similar to the neat films, the BHJ blend films are all mostly amorphous with some domains of the polymer having out-of-plane π-π stacking but no apparent preferential orientation of the acceptors in the BHJs. Overall, the intensity of the GIWAXS is relatively weak indicating that all of the blends are not highly ordered.

Figure 8:
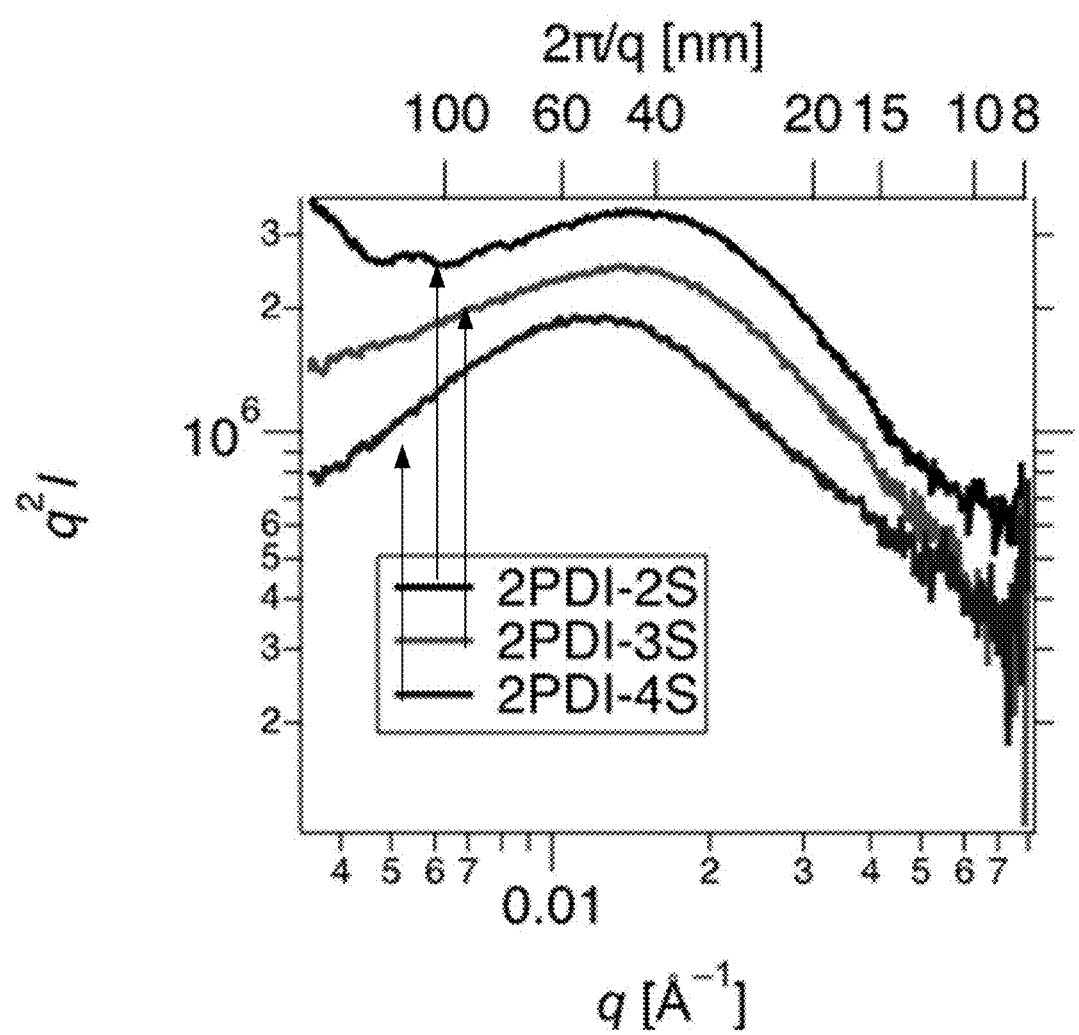
FIG. 8. RSoXS of the BHJ blend films. Lorentz-corrected scattering profiles (log-log scale) at the photon energy of 284.0 eV. Black, 2PDI-2S; red, 2PDI-3S; blue 2PDI-4S. RSoXS experiments were performed at Advanced Light Source (ALS) beamline 11.0.1.2.

Structure of films up to several hundreds of nanometers can be revealed by small-angle x-ray scattering. Conventional grading incidence small-angle x-ray scattering (GISAXS) is however not relevant to these blends because electron densities of the donor and the acceptors are similar. We therefore utilized resonant soft x-ray scattering (RSoXS), which can contrast scatterings from donor and acceptors by observing a difference in x-ray absorption. To ensure the morphologies of the BHJ blend films are consistent among different characterization methods, the films for the RSoXS studies were first deposited on glass/ITO/ZnO, and then transferred onto silicon nitride windows. 2D RSoXS patterns were measured by transmission through the films and reduced in 1D I-q plots by azimuthally averaging the intensity. We scanned the photon energy from 280.0 to 290.0 eV with a step of 0.1 eV, which is around the K absorption edge of carbon, and found that scattering was most prominent at 284.0 eV similar to literature results for BHJs with PTB7-Th with a variety of acceptors. FIG. 8 shows the RSoXS of the BHJ films. The primary scattering peaks at the Lorentz-corrected plots are at 0.01-0.02 Å$^{-1}$, which corresponds to 40-60 nm (e.g., q=0.015 Å$^{-1}$ (corresponding to ~40 nm) indicating that domain size of the BHJ blends films are all similar with the BHJ of 2PDI-4S having a smaller q feature than the others.

We also observed the morphology at the surface of the BHJ blend films with atomic force microscopy (AFM). FIG. 9 shows the AFM images. The surfaces are all smooth with height variation of ±5 nm, showing no large crystals or aggregates. The surface topologies are consisted from grains of 30-60 nm, which matches well with the result of RSoXS. As GIWAXS shows amorphousness of the entire films, those grains should be non-crystalline aggregates of the acceptors. Similar domain sizes have been observed for other twisted rylenediimide-based NFAs.[37-38] The EQE near the absorption edge of PTB7-Th is comparable at ~50% for the three compounds indicating that the domain sizes lead to similar charge generation and extraction near short circuit conditions.

V. Example 5

Transport Characteristics of the Example 1 Compositions

Fullerene acceptors have relatively high electron mobilities in BHJs that aid in carrier extraction. The fill factors of the BHJs of 2PDI-nS are relatively high for rylene diimide acceptors.[2] Many non-fullerene acceptors, including those that form highly efficient cells, have low mobility, e.g. values of ~10$^{-4}$ cm$^2$/Vs have been reported for ITIC based on space charge limited current (SLSC) measurements[28].

FIG. 6 discussed above showed the dependence of Jsc on light intensity of the three BHJs and revealed that charge extraction is efficient at the thicknesses studied. The slope of the V$_{oc}$ with respect to light intensity yields an ideality factor (n) greater than 1 for the devices suggesting that trap assisted recombination occurs in the devices. To understand the role of the 2PDI-nS on the behavior of the BHJs, we examined their electron mobility in blends.

Measuring the mobility of charge carriers is difficult due to questions about the validity of the carrier mobility from SCLC measurements given issues of injection barriers at the electrode and the potential for changes in morphology when forming thick samples for time-of-fight (ToF) measurements [32]. Here we use a combination of methods and find high electron mobility for the acceptors.

Figures 10A, 10B, 10C:
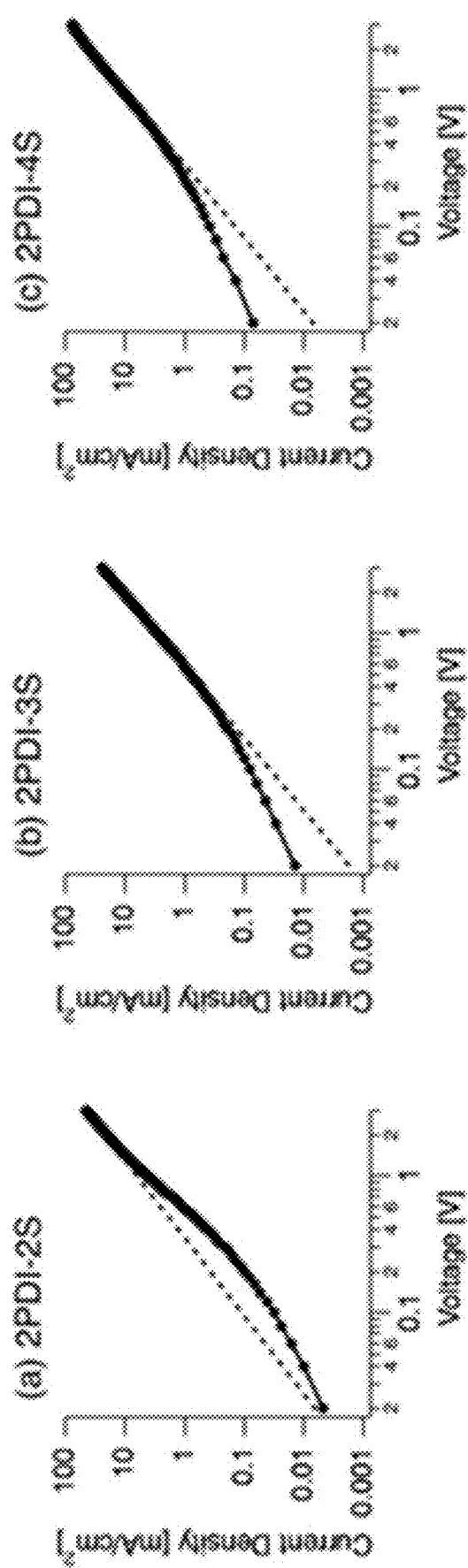
FIGS. 10A-10C. Current density vs. voltage plots (marked and solid line) taken in the dark for BHJ blend films of PTB7-Th with (FIG. 10A) 2PDI-2S, (FIG. 10B) 2PDI-3S, and (FIG. 10C) 2PDI-4S (electron-only device). Dashed lines show the results of the fitting to the Mott-Gurney law in the SCLC regime (slope=2).
Figure 10D:
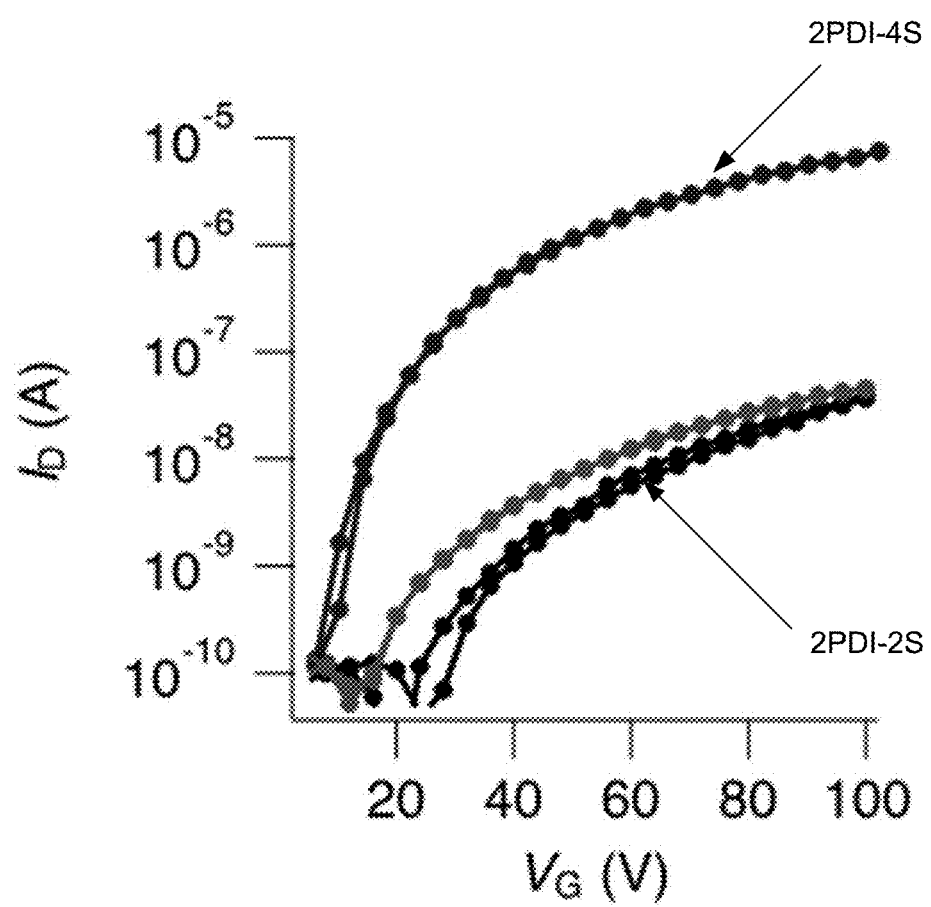
FIG. 10D Transfer characteristics of 2PDI-2S (black), 2PDI-3S (red), and 2PDI-4S (blue) at source-drain voltage of 80 V.
Figures 11A, 11B, 11C:
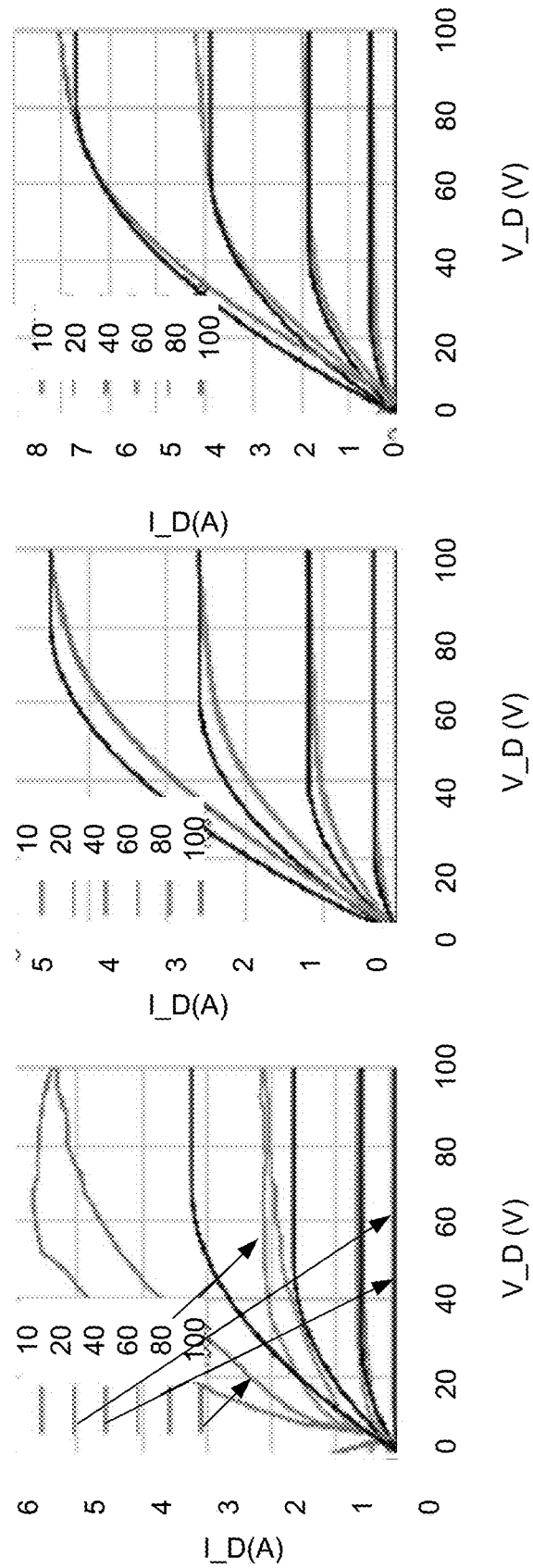
FIGS. 11A-11C. Output characteristics of field-effect transistors based on (FIG. 11A) 2PDI-2S, (FIG. 11B) 2PDI-3S, or (FIG. 11C) 2PDI-4S (drain current ID in Amps (A) vs. drain voltage VD in volts (V), as a function of gate voltages 0V, 20 V, 40 V, 60 V, 80 V, and 100 V (in each figure, curves going from bottom to top are for 0V, 20 V, 40 V, 60 V, 80 V, and 100 V, respectively (100 V top).

We examined the electron mobilities with SCLC on electron-only devices (EODs). The configuration of EODs is ITO/ZnO/PTB7-Th:2PDI-nS/Ca/Al. FIGS. 10A-10C show the log-log plots of the J-V characteristics. The slopes at the SCLC regime are fitted with the Mott-Gurney equation, $$J = \frac{9}{8}\varepsilon\varepsilon_0\mu\frac{V^2}{d^3},$$

where ε is relative permittivity, ε$_0$ the vacuum permittivity, μ mobility, V bias, and d the thickness of the film (~100 nm). Under an assumption of ε=3.8, we obtained the mobilities of 1.3×10$^{-5}$, 1.7×10$^{-5}$, and 2.4×10$^{-5}$ cm$^2$/Vs for 2PDI-2S, 2PDI-3S and 2PDI-4S, respectively. The J-V characteristics of 2PDI-3S and 2DPI-4S show a clear transition from the Ohmic to SCLC regime. In contrast, the J-V characteristic for 2PDI-2S has a curvature that suggests the presence of a trap level. The EA of the 2PDI-2S is ≈0.2 eV higher than that of 2PDI-3S and 2PDI-4S and is closer to the trap level observed in many materials.[40] In contrast to the comparable SCLC results, electron mobilities in thin film transistors of pristine films of the 2PDI-nS series show significant differences. We found that the mobility of 2PDI-4S was highest at 8×10$^{-2}$ cm$^2$/Vs while the electron mobilities of 2PDI-2S and 2PDI-3S were 6×10$^{-4}$ and 5×10$^{-4}$ cm$^2$/Vs, respectively (FIG. 10D and FIG. 11). While the mobility in TFTs is measured at higher carrier density than in OPVs, the results suggested that 2PDI-4S has a higher carrier mobility than 2PDI-2S and 2PDI-3S in neat films.

Figure 12A:
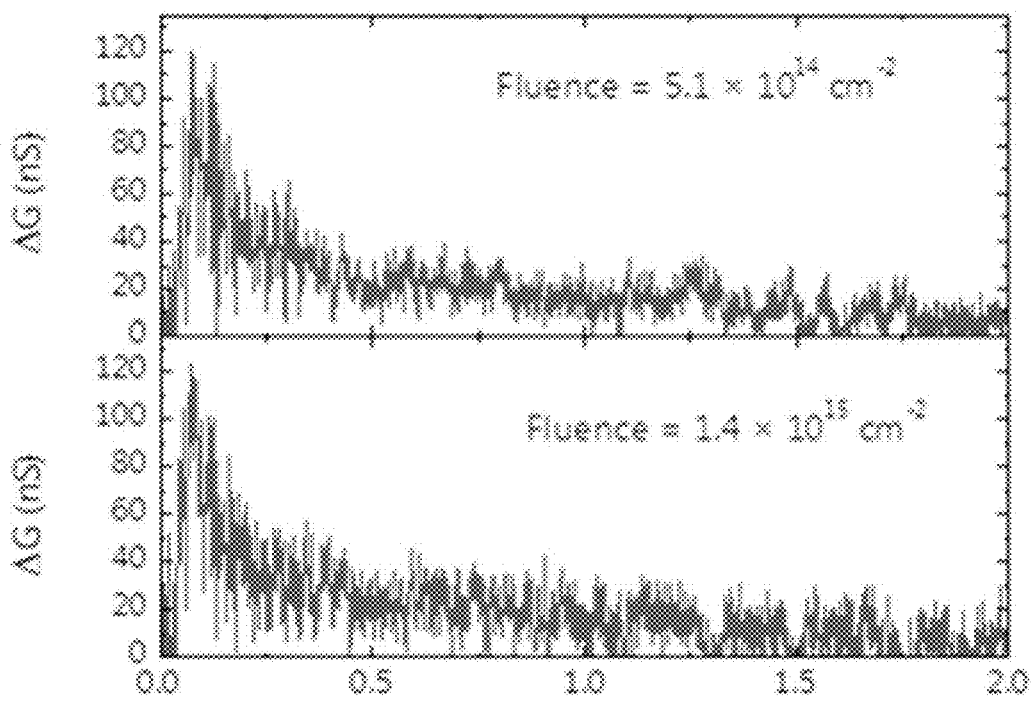
FIG. 12A Photoconductivity from time-resolved microwave conductivity (TRMC) for BHJs of PTB7:2PDI-4S at high incidence fluence.
Figure 12B:
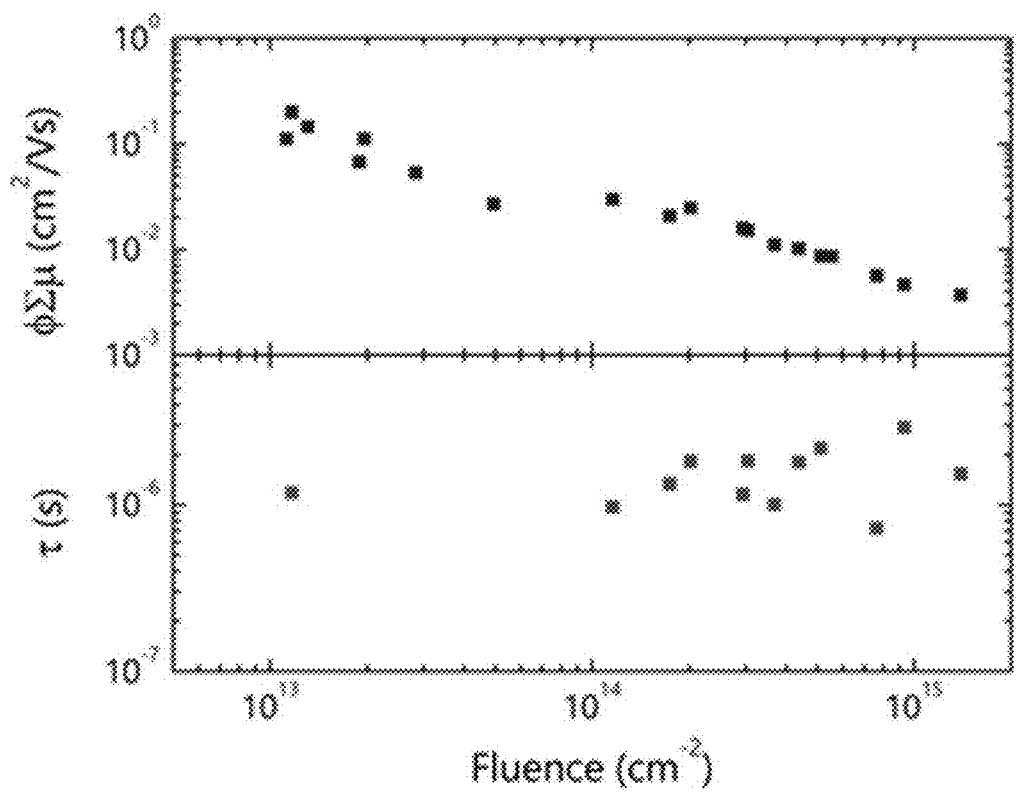
FIG. 12B. Maximum of the figure of merit from TRMC as a function of incident fluence.

FIGS. 12A and 12B illustrate the results of examining the photoconductivity and lifetime of carriers in BHJs of 2PDI-4S using time-resolved microwave conductivity (TRMC). TRMC reveals the photoconductivity of the blend that can be converted into a figure-of-merit: ϕΣμ, that is the product of the charge-generation yield ϕ, and the sum of electron and hole mobilities (Σμ=μ$_e$+μ$_h$). For organic semiconductors with relatively high exciton binding energies relative to k$_b$T, ϕ is <1 indicating that Σμ=μ$_e$+μ$_h$ is a lower bound to the sum of the carrier mobilities. TRMC reveals that (ϕΣμ)$_{max}$ is 0.1 cm$^2$/Vs for PTB7-Th:2PDI-4S BHJs and is as high as BHJs with PCBM as an acceptor at incident fluence of ~10$^{14}$ photons/cm$^2$ (FIG. 12B). In our system, we were unable to measure a signal for BHJs of 2PDI-2S or 2PDI-3S suggesting lower values of (ϕΣμ)$_{max}$ well-below 10$^{-3}$ cm$^2$/Vs. Such low values are consistent with the mobilities from SCLC measurements, but the high figure of merit for 2PDI-4S is not. Because TRMC is a high frequency measurement, it is likely probing transport within domains of 2PDI-4S, whereas the SCLC measurement provides transport through multiple domains of the BHJ.[41] The relatively higher mobility by TRMC is consistent with the observation from TFTs that 2PDI-4S has the highest mobility of the three compounds and the fill factor in BHJs.

VI. Example 6

2PDI-nS Acceptors Have Low V$_{oc}$ Loss

One of the most significant concerns for the performance of BHJ solar cells is the energy lost from the incident photons to the V$_{oc}$. Several methods have been discussed to describe the expected loss in BHJ solar cells. One metric of the energy loss of the solar cells is given by the difference between the linear onset of the optical gap and the V$_{oc}$ (Eq. 1).[42] A widely used metric compares the V$_{oc}$ to the energies of CT states observed by sensitive EQE and electroluminescence measurements.[16,43,44] The energy of the CT state, E$_{CT}$, observed by fitting the tail of the EQE measurement to a Marcus-type model (Eq 2).[16,17,44] With PC$_{61}$BM as an acceptor, many donors lead to a difference in energy of 0.6 eV.[12,17] An alternative method defines a loss using the Shockely-Quiesser limit that is common for inorganic solar cells.[23,45] This method partitions the energy loss into factors relative to the optical gap and non-radiative losses. This method uses a fit to the tail of the optical properties of the BHJ to extract the radiative and non-radiative components.[23,45] The most critical of these is the non-radiative loss, qΔV$_{nr}$, which is the difference in the voltage expected from integration of the absorption of the BHJ V$_{oc,rad}$ and the observed $V_{oc}$ (Eq. 3).[17,45,46] An increase in the broadening of the tail leads to larger losses in both models.

$$E_{loss} = E_{optical} - qV_{oc} \qquad (1)$$

$$q\Delta V_{oc} = E_{CT} - qV_{oc} \qquad (2)$$

$$q\Delta V_{nr} = qV_{oc,rad} - qV_{oc} \qquad (3)$$

Figure 13A:
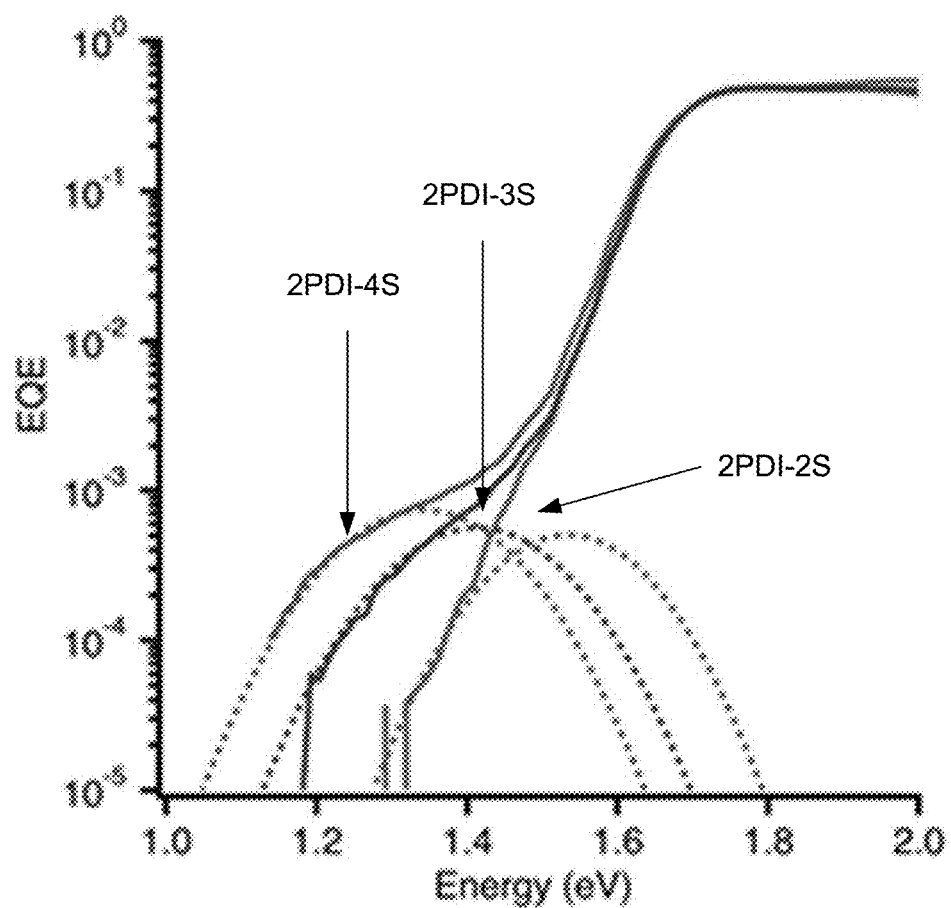
FIG. 13A. External quantum efficiency (solid lines) of the BHJs with 2PDI-2S (gold), 2PDI-3S (green) 2PDI-4S (blue) showing fits to Marcus-type model for the interfacial charge transfer FIG. 13B J-V characteristics of PIPCP:2PDI-2S solar cells.

We find that the 2PDI-nS acceptors all exhibit low $V_{oc}$ losses with respect to the interface states.[16,47] The optical gap of the BHJ is set by the absorption of PTB7-Th at 1.58 eV. The $E_{loss}$ varies with the acceptors, due to the shift in EA, but is still relatively low for 2PDI-2S (0.7 eV).[42] The BHJs all exhibit a tail of states due to the charge transfer (CT) state between PTB7-Th and 2PDI-nS that provides another metric for the energy loss. The $E_{CT}$ for the PTB7-Th:2PDI-nS BHJs varies systematically with the EA of the acceptor (from 1.15 to 1.37 eV), as observed by the shift of a low energy feature in EQE measurements (FIG. 13A). These shifts are consistent with the changes in EA for the acceptors with a fixed donor, PBT7-Th. Using these values of $E_{CT}$, the loss, $q\Delta V_{oc}$ defined by Eq. 2, is ~0.52 V for all of the acceptors in the 2PDI-nS series, which is lower than the typical value of 0.6 eV observed in a variety of BHJs.[11,16,17] More accurate values can be obtained with comparison of electroluminescence,[16] but we do not anticipate a substantial shift because of the clear feature in the EQE spectrum and the expected systematic shift between acceptors. As an alternative, we also examined the $V_{oc}$ loss using the S-Q method that separates the loss into radiative and non-radiative components (Eq. 3).[23,45] The observed values of $q\Delta V_{nr}$ are ≈0.3 eV for all three compounds (Table 3A) which is relatively small for polymer BHJs.[45,46]

Figure 13B:
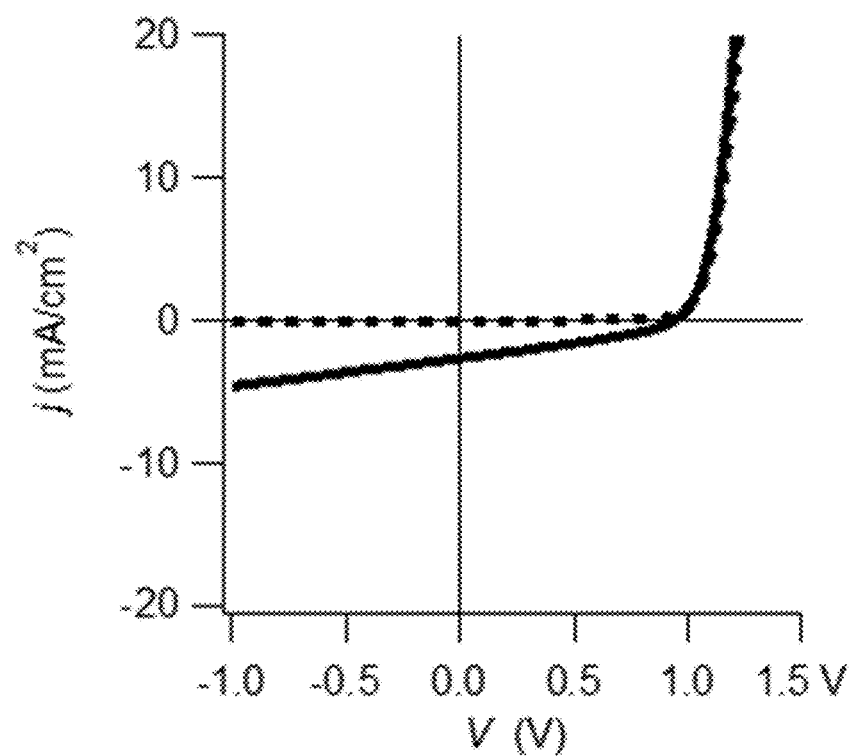

2PDI-nS provide a series of acceptors with varying EA and low $V_{oc}$ loss that can be matched to donor polymers. We have also tested the $V_{oc}$ loss using a different donor polymer, PIPCP, which is known to have a low loss with PCBM (FIG. 13B and Table 3B). BHJs were formed with PIPCP as a donor with 2PDI-2S as an acceptor (due to its well-matched EA) had relatively low performance (PCE ~0.8%) with EQE of ~0.1 (10%). The solar cells still allowed for extraction of the losses with $E_{loss}$=0.4 eV and $q\Delta V_{nr}$=0.31 eV, but are not further improved relative to the metrics for BHJs with PTB7-Th as the donor. The ability to examine the origin of losses in BHJ solar cells should be greatly improved by systematic studies to disentangle whether molecular design or disorder in BHJ blends dominates the energetic loss.

TABLE 3A

Open circuit voltage loss characteristics of PTB7-Th:PDI-nS acceptor solar cells.

| | $qV_{oc}$ (eV) | $E_{loss}$ (eV) | $E_{CT}$ (eV) | $q\Delta V_{oc}$ (eV) | $q\Delta V_{nr}$ (eV) |
|---|---|---|---|---|---|
| 2PDI-2S | 0.86 | 0.71 | 1.37 | 0.53 | 0.31 |
| 2PDI-3S | 0.70 | 0.87 | 1.22 | 0.52 | 0.32 |
| 2PDI-4S | 0.64 | 0.93 | 1.15 | 0.51 | 0.33 |

TABLE 3B

Device parameters of PIPCP:2PDI-2S solar cells.

| Voc (V) | Jsc (mA/cm$^2$) | FF (—) | PCE (%) |
|---|---|---|---|
| 0.94 | 2.64 | 0.32 | 0.81 |

A surprising feature of these results is that all three acceptors in the 2PDI-nS series are below a recent report of an apparent lower limit of $E_{CT}$ and $\Delta V_{nr}$, as a function of $E_{CT}$.[17] This limit was determined based on a series of dilute donor BHJs with a $C_{60}$ acceptor. The mechanism was attributed to intramolecular vibrations of the donors, particularly C—H modes. Here the donor has such modes in the backbone whereas less of a contribution is expected from the acceptor due to the large conjugated structure. Whether the origin of the low loss is due to reduced interfacial area is difficult to determine quantitatively; the domains sizes from RSoXS are not significantly reduced relative to other BHJs.[48]

In summary, Examples 1-6 illustrate design and synthesis of three new sulfur-fused fused PDI compounds, 2PDI-2S, 2PDI-3S, and 2PDI-4S, as non-fullerene acceptors for organic solar cells. BHJ with PTB7-Th as a donor with these acceptors exhibit good performance, with PCEs up to 6.9% and FFs up to 70%. These results demonstrate the utility of the twisted core design that inhibits formation of large ordered domains that limits charge generation while still providing good charge transport. The energetic losses to the open circuit voltage in these BHJs were found to also be relatively small across the whole series of acceptors. These results demonstrate that the EA of an NFA can be rationally tuned while maintain low energetic losses. NFAs with tunable energetics should help to elucidate the characteristics of the charge transfer state between donors and acceptors in BHJs that can improve their power conversion efficiency.[16,17,50]

VII. Materials and Methods For Examples 1-6

General Methods. Unless otherwise stated, all of the chemicals were purchased from Aldrich Chemical and used as received. When necessary, solvents and reagents were purified using standard procedures. All manipulations involving air-sensitive reagents were performed under an atmosphere of dry nitrogen. $^1$H and $^{13}$C NMR spectra were recorded on a Varian Inova600 spectrometer. Absorption spectra were taken on a Varian Cary 50 ultraviolet-visible spectrometer. The electrochemical measurements were carried out in 0.1 M tetrabutylammonium hexafluorophosphate in dichloromethane with platinum wires as the working and counter electrodes and silver wire as a pseudo-reference electrode. A ferrocene-ferrocenium (Fc/Fc$^+$) redox couple was used as an internal standard and its redox potential assumed to be −4.80 eV below vacuum level.

The synthetic route for compounds 2PDI-2S, 2PDI-3S, and 2PDI-4S is shown in Scheme 1. The parent 2PDI was easily nitrated to form dinitro-2PDI using cerium ammonium nitrate and fuming nitric acid in dichloromethane (DCM) at room temperature. Reacting Dinitro-2PDI with sulfur powder in boiling N-methylpyrrolidone (NMP) gave a mixture of multi-sulfur fused PDIs, identified as 2PDI-2S, 2PDI-3S, and 2PDI-4S, in excellent yields. The ratio of these products was dependent on reaction time and we note that compounds 2PDI-3S and 2PDI-4S could be easily converted to 2PDI-2S with longer heating. This formation of three possible derivatives of sulfur-annulation on fused PDI in a one-pot reaction in unprecedented, representing an excellent opportunity to study the effect of sulfur atoms in PDI-based acceptors.[27-30] All the compounds remain readily soluble in common organic solvents at room temperature.

Time Resolved Microwave Conductivity. Microwave conductivity experiments were conducted using a previously-described experimental system.[1,2] A microwave-frequency oscillatory electric signal is generated using a Sivers IMA VO4280X/00 voltage controlled oscillator (VCO). The signal has an approximate power of 16 dBm and a tunable frequency between 8 GHz and 15GHz. The oscillatory signal is then directed through coaxial cables to port 1 of an electronic circulator (Fairview Microwave SFC0712). The circulator acts as uni-directional device in which signals entering from port 1 exit through port 2 and signals entering from port 2 exit through port 3. The signal exiting the circulator from port 2 is then fed into a SMA to X-band waveguide adapter (equivalent to Fairview Microwave part 90AC206). This antenna is coupled to X-band cavity using a homebuilt coupling iris and tuning screw fabricated from a thin aluminum plate. The cavity is a TE103 mode formed by a short section of X-band waveguide and a homemade slotted copper plate (slots along the direction of current) that allows optical access to the sample. The antenna emits electromagnetic radiation (microwaves) which form a standing wave in the cavity. The tuning screw enabled over-, critical-, and under-coupling to the cavity and all experiments were performed in the under-coupled regime. The sample is mounted inside the cavity at a maximum of the electric-field component of the standing microwaves. Microwaves reflected from the cavity are then incident on port 2 of the circulator, exiting through port 3. Microwaves emitted from port 3 of the circulator—the power reflected from the cavity and sample—are then directed into a zero-bias Schottky diode detector (Fairview Microwave SMD0218 operating in the linear regime). The rectified signal is amplified by a homebuilt DC-coupled, wide-band amplifier built around a Texas Instruments THS3091 operational amplifier (battery powered, three stages of amplification). We note that the microwave power is split at the source allowing a second detector and amplification stage to monitor/normalize the reflected power from the cavity. The amplified signal (and reference) is detected by a Textronix TDS 3032C digital oscilloscope. A Minilite Continuum pulsed Nd:YaG laser is used to illuminate the sample. The laser pulse has a wavelength of 532 nm, a full-width at half-maxima of approximately 5 nm and a maximum fluence of ~$10^{15}$ cm$^{-2}$. An external trigger link is employed to trigger the oscilloscope 50 ns before the laser fires. The area exposed to the incident optical pulse is approximately 10% of the cross-sectional area of the cavity. Changes in the detector voltage under illumination can then be used to extract determine the photo-induced change in conductance as a function of time. The films were measured in ambient air conditions at room temperature, immediately after being removed from the glovebox.

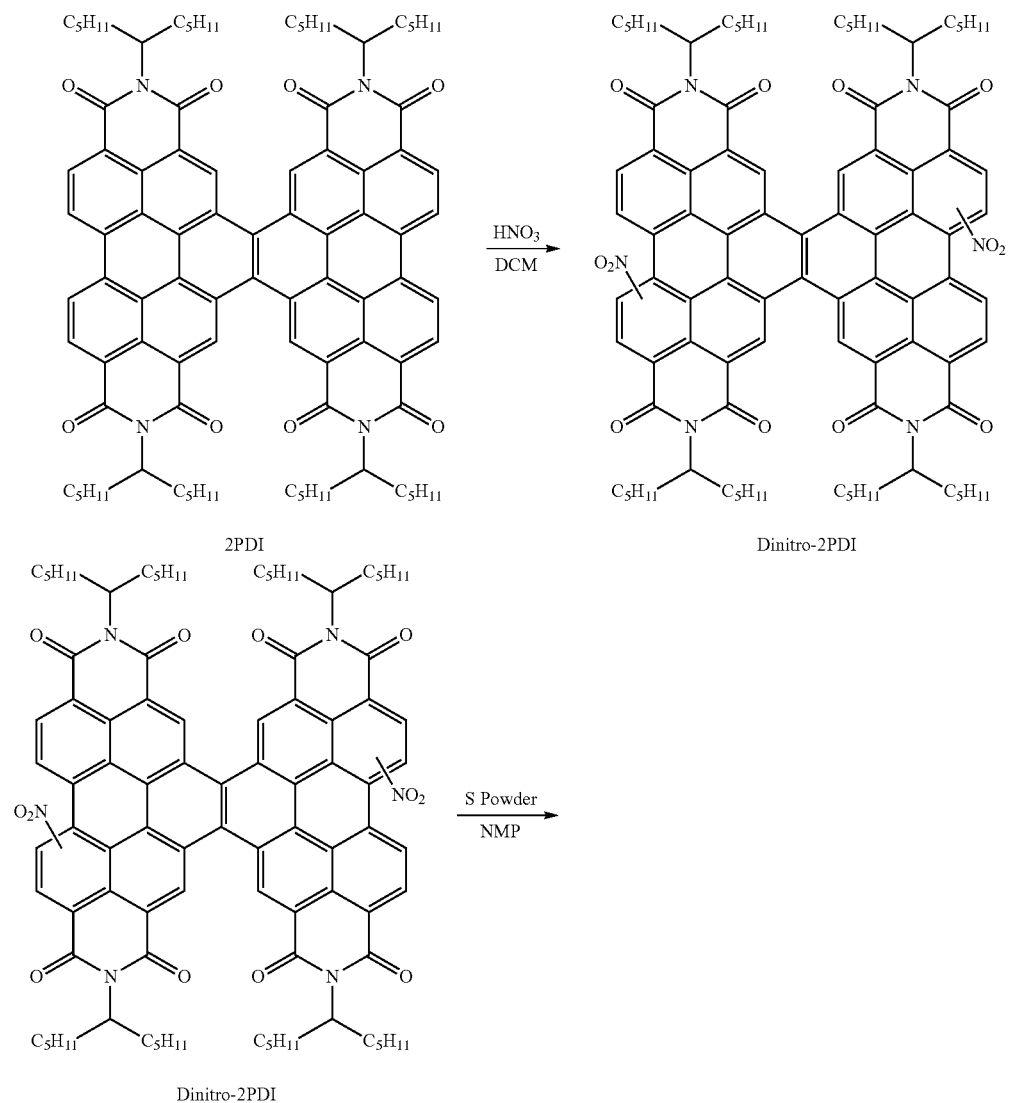

Synthetic procedures (Scheme 1)

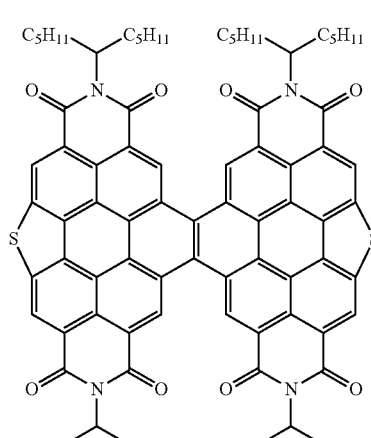
2PDI-2S

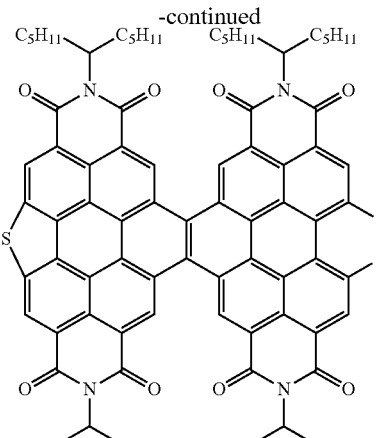
2PDI-3S

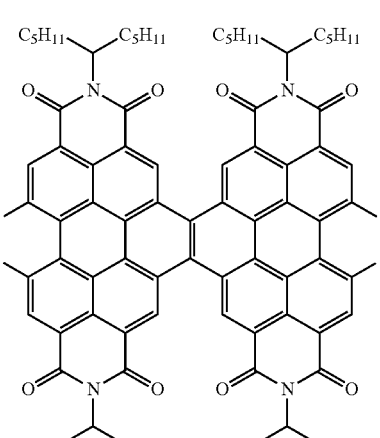
2PDI-4S

Dinitro-2PDI: (0.61 g, 0.43 mmol) and cerium (IV) ammonium nitrate (1.16 g, 2.12 mmol) were dissolved in dry CH$_2$Cl$_2$ (140 mL). Fuming nitric acid was then added dropwise in 0.2 ml increments every hour for a total of 1.4 ml over approximately 6 hours. The reaction's progress was monitored by TLC until no starting material or mononitrated intermediate was visible. The reaction mixture was then quenched with 10% KOH solution (20 mL) and poured into water (100 mL) The organics were extracted with CH$_2$Cl$_2$ (2×50 mL), dried over Na$_2$SO$_4$, and concentrated in vacuo. The residue was purified by column chromatography on silica gel (Hexane/CH$_2$Cl$_2$, 1:2 v/v) to afford compound Dinitro-2PDI as a red solid (0.59 g, 91%). Mp: >260° C. $^1$H NMR (CDCl$_3$, 600 MHz): 67 10.98 (d, J=36.0 Hz, 4H), 9.88 (d, J=38.4 Hz, 4H), 5.49 (s, 4H), 2.42 (d, J=31.6 Hz, 8H), 2.04 (d, J=4.7 Hz, 8H), 1.60-1.19 (m, 48H), 0.84 (s, 24H); $^{13}$C NMR (CDCl$_3$, 150 MHz): δ 165.6, 165.2, 164.5, 164.1, 139.9, 131.7, 130.9, 128.6, 127.7, 126.8, 126.4, 125.6, 124.8, 124.1, 123.2, 122.8, 122.0, 120.3, 55.3, 32.5, 31.8, 26.8, 22.5, 14.0; MS (m/z): Calcd for MS: 1506.76, Found: (M$^+$) 1506.63. Anal. Calcd for C$_{94}$H$_{100}$N$_4$O$_8$S$_2$: C, 76.39; H, 6.82; N, 3.79; S, 4.34. Found: C, 76.01; H, 6.14; N, 3.83; S, 4.48, UV-vis (DCM) λ$_{max}$ nm (ε): 228 (84195), 396 (54653), 504 (31019), and 555 (28065).

PDI-2S, PDI-3S, and PDI-4S: Sulfur (113 mg, 3.53 mmol) was dissolved in N-methylpyrrolidone (NMP, 10 mL) at heated under argon to 70° C. till dissolved. Dinitro-2PDI (100 mg, 0.07 mmol) was then added under positive pressure and the reaction mixture was immediately heated to 200° C. The reaction was stirred vigorously for 20 minutes exactly during which changed from red to purple. Upon cooling to room temperature, the reaction mixture was poured into 100 mL of 2 M HCl, and the resulting precipitate was collected by vacuum filtration, washed with water, and dried. The three products were isolated and purified by column chromatography on silica gel (Hexane/CH$_2$Cl$_2$, 1:2 v/v) to give 2PDI-2S (35 mg, 34%), 2PDI-3S (41 mg, 38%), and 2PDI-4S (28 mg, 26%).

2PDI-2S: Mp: >260° C. $^1$H NMR (CDCl$_3$, 600 MHz): δ 10.98 (d, J=36.0 Hz, 4H), 9.88 (d, J=38.4 Hz, 4H), 5.49 (s, 4H), 2.42 (d, J=31.6 Hz, 8H), 2.04 (d, J=4.7 Hz, 8H), 1.60-1.19 (m, 48H), 0.84 (s, 24H); $^{13}$C NMR (CDCl$_3$, 151 MHz): δ 165.6, 165.2, 164.5, 164.1, 139.9, 131.7, 130.9, 128.6, 127.7, 126.8, 126.4, 125.6, 124.8, 124.1, 123.2, 122.8, 122.0, 120.3, 55.3, 32.5, 31.8, 26.8, 22.5, 14.0; MS (m/z): Calcd for MS: 1476.70, Found: (M$^+$) 1476.57. Anal. Calcd for C$_{94}$H$_{100}$N$_4$O$_8$S$_2$: C, 76.39; H, 6.82; N, 3.79; S, 4.34. Found: C, 76.01; H, 6.14; N, 3.83; S, 4.48, UV-vis (DCM) λ$_{max}$ nm (ε): 228 (84195), 396 (54653), 504 (31019), and 555 (28065).

2PDI-3S: Mp: >260° C. $^1$H NMR (CDCl$_3$, 600 MHz): δ 10.61 (d, J=34.4 Hz, 4H), 9.88 (d, J=34.1 Hz, 2H), 9.03 (s, 2H), 5.45 (s, 2H), 5.31 (s, 2H), 2.37 (d, J=47.9 Hz, 8H), 1.99 (d, J=50.2 Hz, 8H), 1.64-1.09 (m, 48H), 0.84 (d, J=6.5 Hz, 24H); $^{13}$C NMR (CDCl$_3$, 151 MHz): δ 165.9, 165.3, 164.4, 163.6, 163.4, 162.5, 146.9, 140.0, 134.9, 134.6, 133.3, 132.7, 132.3, 131.5, 130.9, 129.6, 129.0, 128.6, 128.1, 128.0, 127.3, 126.7, 126.3, 125.0, 124.5, 124.5, 124.3, 123.3, 121.9, 121.7, 120.3, 59.9, 55.2, 40.5, 32.3, 31.7, 31.7, 26.7, 26.6, 22.5, 20.2, 14.0, 9.9; MS (m/z): Calcd for MS: 1508.67, Found: (M$^+$) 1508.53. Anal. Calcd for C$_{94}$H$_{100}$N$_4$O$_8$S$_3$: C, 74.77; H, 6.68; N, 3.71; S, 6.37. Found: C, 74.72; H, 6.70; N, 3.81; S, 6.42, UV-vis (DCM) λ$_{max}$ nm (ε): 229 (117825), 403 (67976), 501 (24169), and 560 (39275).

2PDI-4S: Mp: >260° C. $^1$H NMR (CDCl$_3$, 600 MHz): δ 10.19 (s, 4H), 9.00 (s, 4H), 5.27 (s, 4H), 2.30 (s, 8H), 1.93 (s, 8H), 1.32 (dd, J=46.4, 26.8 Hz, 48H), 0.84 (d, J=6.6 Hz, 24H); $^{13}$C NMR (CDCl$_3$, 151 MHz): δ 163.8, 163.6, 163.1, 162.5, 133.8, 132.8, 131.9, 131.5, 130.3, 130.0, 129.7, 127.4, 127.3, 127.1, 126.6, 126.3, 125.9, 124.6, 124.5, 123.4, 55.2, 46.9, 32.3, 31.6, 26.6, 24.6, 22.5, 14.0; MS (m/z): Calcd for MS: 1540.64, Found: (M$^+$) 1540.50. Anal. Calcd for C$_{94}$H$_{100}$N$_4$O$_8$S$_4$: C, 73.21; H, 6.54; N, 3.63; S, 8.32. Found: C, 73.35; H, 6.12; N, 3.81; S, 8.41, UV-vis (DCM) λ$_{max}$ nm (ε): 227 (67797), 406 (57011), 517 (12327), and 564 (21572).

VIII Example 7

Multisulfur Fused PDIs Used in an Electron Transport Layer

Organic-inorganic hybrid perovskites (PVSKs) such as methylammomium lead triiodide (MAPbI$_3$) are promising materials for the active layer of photovoltaics (PV) because of strong absorption at the visible range, low exciton binding energy, and long carrier diffusion length. The highest certificated power conversion efficiency (PCE) of this class of photovoltaics exceeded 22%. To fully harness this high performance, buffer layers, which filters off one of the carriers (holes or electrons) and transport them to the electrode should be carefully designed. These layers should also be solution-processable to take advantage of low-cost deposition methods. In the past, most high efficiency HOIP-PVs have used $TiO_2$ as the electron transporting layer (ETL), which necessitates high curing temperatures (~500° C.) from solution-based precursors.[2,5,6] Such high temperatures are not compatible with polymer based flexible substrates (i.e. PET and PEN) and some transparent electrodes (i.e. ITO), thereby restricting its applicability.

A promising solution for the ETL in HOIP PVs is the use of soluble organic semiconductors. Many organic semiconductors designed for n-type charge transport, or as acceptors in organic photovoltaics[8-16], already have the desired characteristics for HOIP ETLs. These compounds typically have electron affinities (EAs) between 3.6 and 4.2 eV that are well-matched for efficient extraction of electrons from methylammonium lead triiodide ($MAPbI_3$) perovskite active layers, whose conduction band lies at 3.9 eV. Organic semiconductors also have ionization energies (IEs) that are deep enough to block holes (>5.5 eV) and relatively good electron mobilities (>$10^{-4}$ cm$^2$/Vs) that can be improved with n-dopants.[7] Among them, fullerene derivatives, especially phenyl-$C_{61}$-butyric acid methyl ester (PCBM),[8-11] naphthalene-based polymers such as (P(NDIOD-T2),[12] and perylene diimide (PDI) derivatives[13-16] have been studied as ETLs with or without n-type dopants. The initial PCE of planar p-i-n $MAPbI_3$ devices is ~18% with PCBM, yet this material is notorious for having poor stability under air exposure and light soaking, likely due to oxygen or water absorption.[17,18] Recently, Akabulatov et al. has reported that ethylhexyl-substituted PDI ETLs provides relatively stable inverted structure HOIP-PVs when tested by light-soaking and dark storage compared to PCBM.[16] They observed less decomposition of $MAPbI_3$ into $PbI_2$ and less generation of AgI at the top Ag electrode, and thus concluded that suppression of diffusion of methylammonium iodide into the PDI layer plays a critical role in increasing the stability of the device.

Perylene diimides (PDIs) have a suitable energy alignment for an ETL because the HOMO level (>5.5 eV) is sufficiently deeper than valence band edge of PVSKs and the LUMO level (~4.0 eV) is close to the conduction band edge, allowing blocking holes and smooth transfer of electron from PVSK. While there have been some reports[13-16] of the application of PDIs as the ETL in PVSK-based PV, many of synthetically accessible structures have remained unexplored. Here we utilized our novel PDI-based compounds, 2PDI-nS, as the ETL.

Figure 14A:
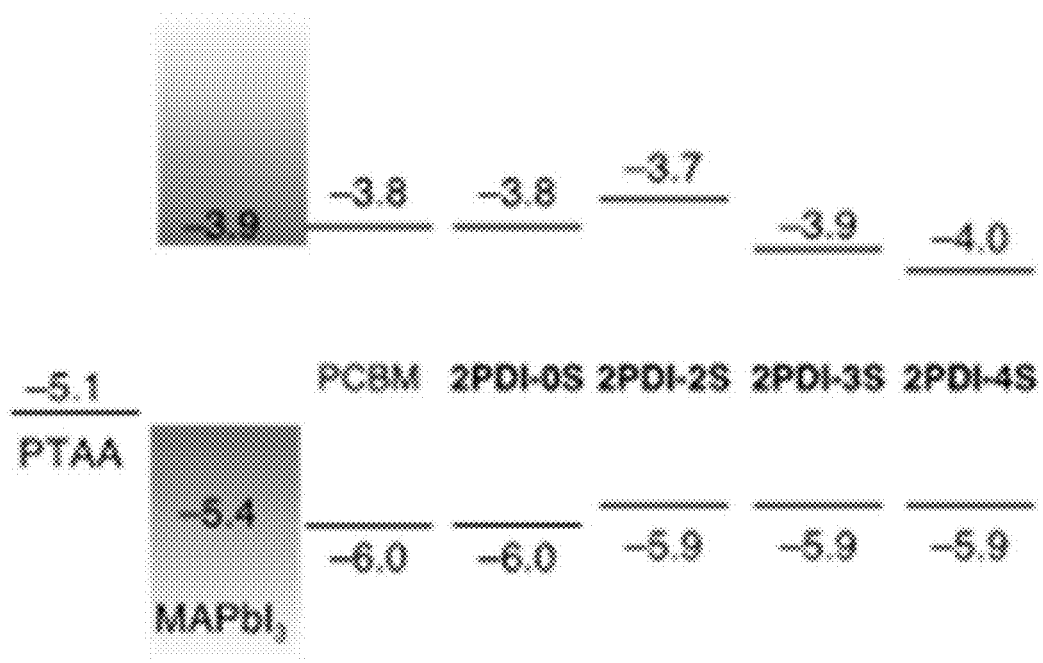
FIG. 14A. An energy diagram of PTAA/MAPbI$_3$/ETL stacks. R=C$_5$H$_{11}$.

The number of fused sulfurs bridging the bay positions of the PDI cores tunes the EA of the compounds resulting in compounds with varying EAs (3.7, 3.9, and 4.0 eV for 2PDI-2S, 2PDI-3S, and 2PDI-4S respectively) and relatively fixed IE (5.9 eV for all three compounds) (FIG. 14A). Due to the twisted core of the fused PDI dimers, the compounds all form glassy or weakly ordered films by spin-coating. Here, we report the application of 2PDI-nS (n=0, 2, 3, 4) as ETLs in planar-structure $MAPbI_3$-based PVs, especially as they compare to PCBM.

a. Device Structure and Fabrication

Figure 14B:
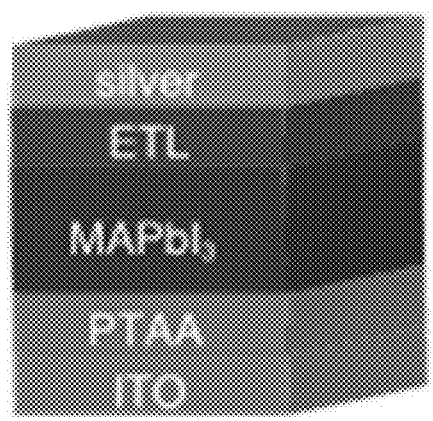
FIG. 14B Device structure of the photovoltaics.

FIG. 14B illustrates the inverted $MAPbI_3$ solar cell structure used to study 2PDI-nS as an ETL, comprising glass/ITO/polytriarylamine (PTAA, ~5 nm, Aldrich)/$MAPbI_3$ (~400 nm)/ETL/polyethyleneimine (PEIE, 80% ethoxylated, Aldrich)/Ag (80 nm). PTAA was chosen for the HTL because it has an IE of −5.1 eV and it induces relatively large grains in the $MAPbI_3$ active layer due to its hydrophobicity.[19] A PEIE layer was used to improve the electric contact between the ETL and the top electrode; PEIE reduces the work function of Ag from ca. 4.7 eV[20] to 3.8 eV and may also donate electrons from its amino groups to the surface of ETL.[21,22] All of the fabrication processes and measurements were conducted under a nitrogen atmosphere.

a. J-V and IPCE Characteristics

Figures 15A, 15B, 15C:
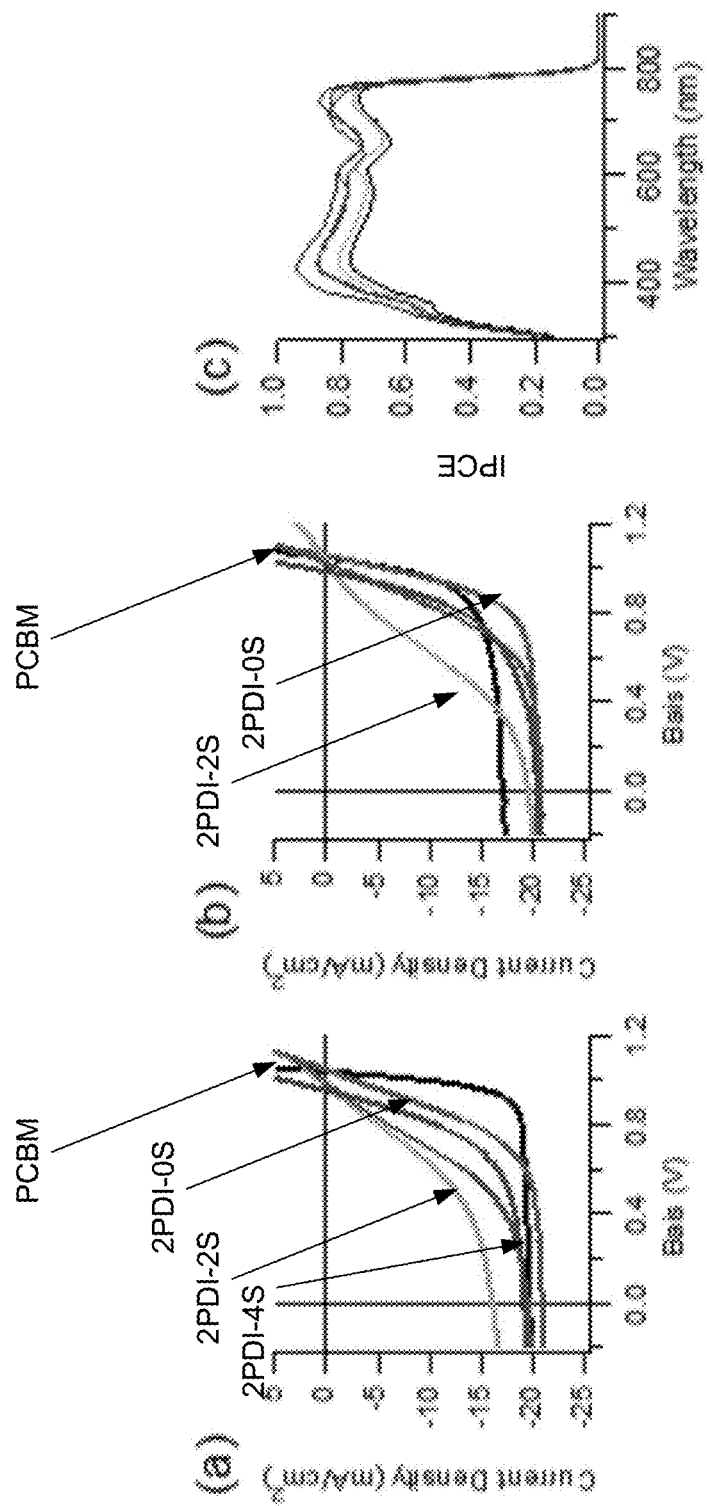
FIGS. 15A-15C. Representative J-V characteristics of the devices before (FIG. 15A) and after (FIG. 15B) 100° C., 10 min thermal annealing.
Figure 16A:
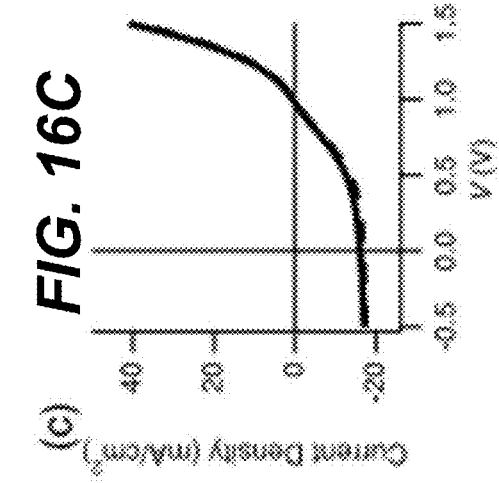
FIGS. 16A-16E. Representative J-V characteristics of not annealed device using (FIG. 16A) PCBM, (FIG. 16B) 2PDI-0S, (FIG. 16C) 2PDI-2S, (FIG. 16D) 2PDI-3S, and (FIG. 16E) 2PDI-4S as ETL. Solid lines: reverse (1.5 V to −0.5 V) scan, Dashed lines: forward scan (mostly overlapped with the solid lines).
Figure 16B:
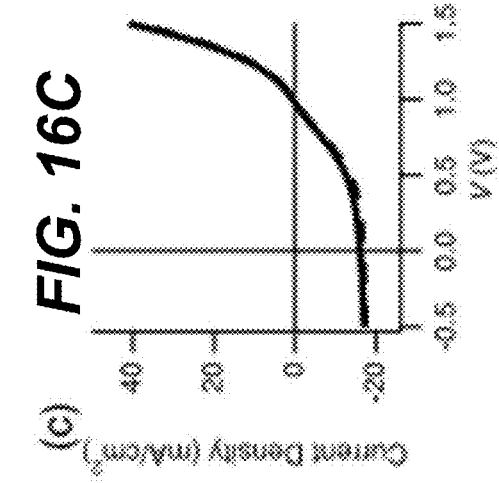
Figure 16C:
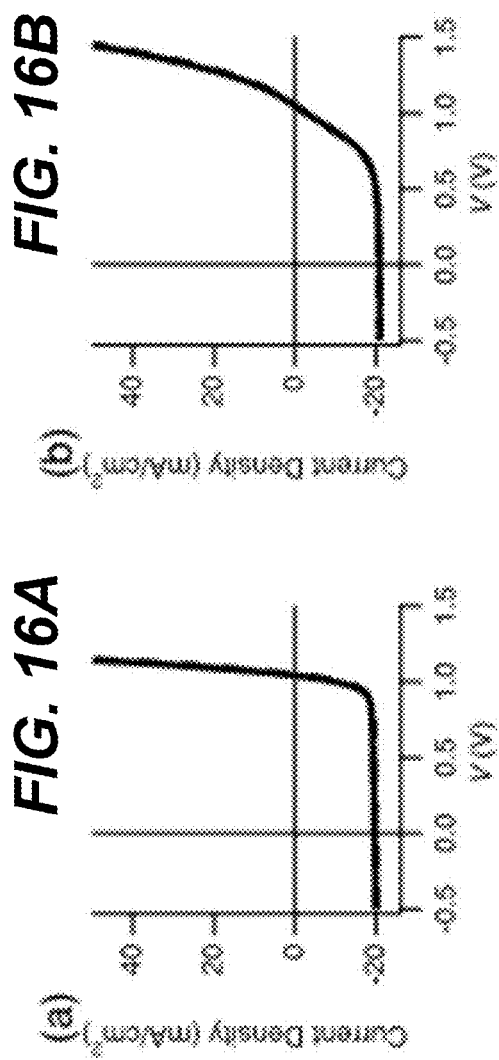
Figure 16D:
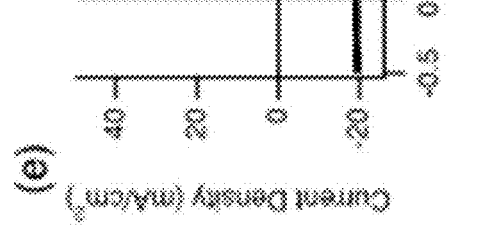
Figure 16E:
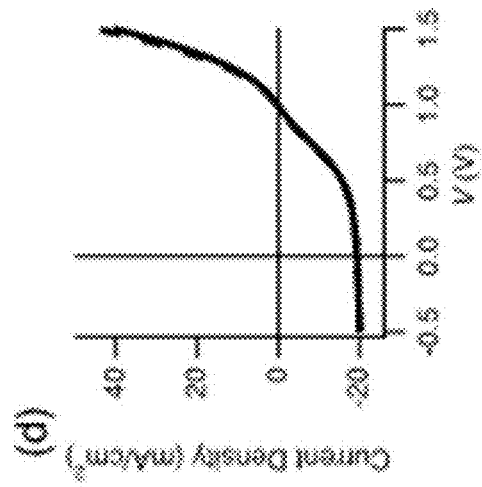
Figure 17A:
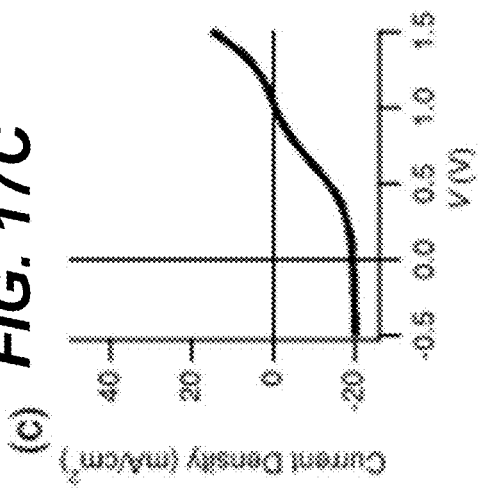
FIGS. 17A-17E. Representative J-V characteristics of annealed (100° C., 10 min) device using (FIG. 17A) PCBM, (FIG. 17B) 2PDI-0S, (FIG. 17C) 2PDI-2S, (FIG. 17D) 2PDI-3S, and (FIG. 17E) 2PDI-4S as ETL. Solid lines: reverse (1.5 V to −0.5 V) scan, Dashed lines: forward scan (mostly overlapped with the solid lines).
Figure 17B:
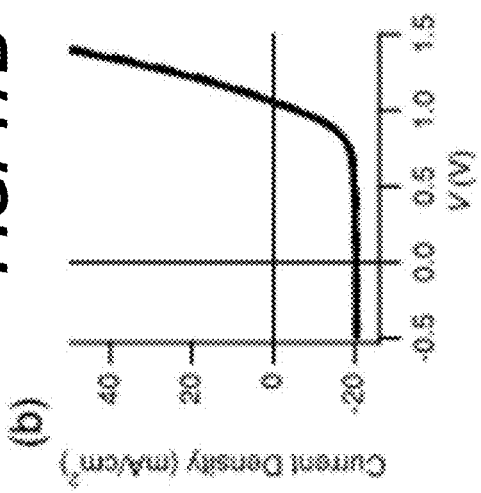
Figure 17C:
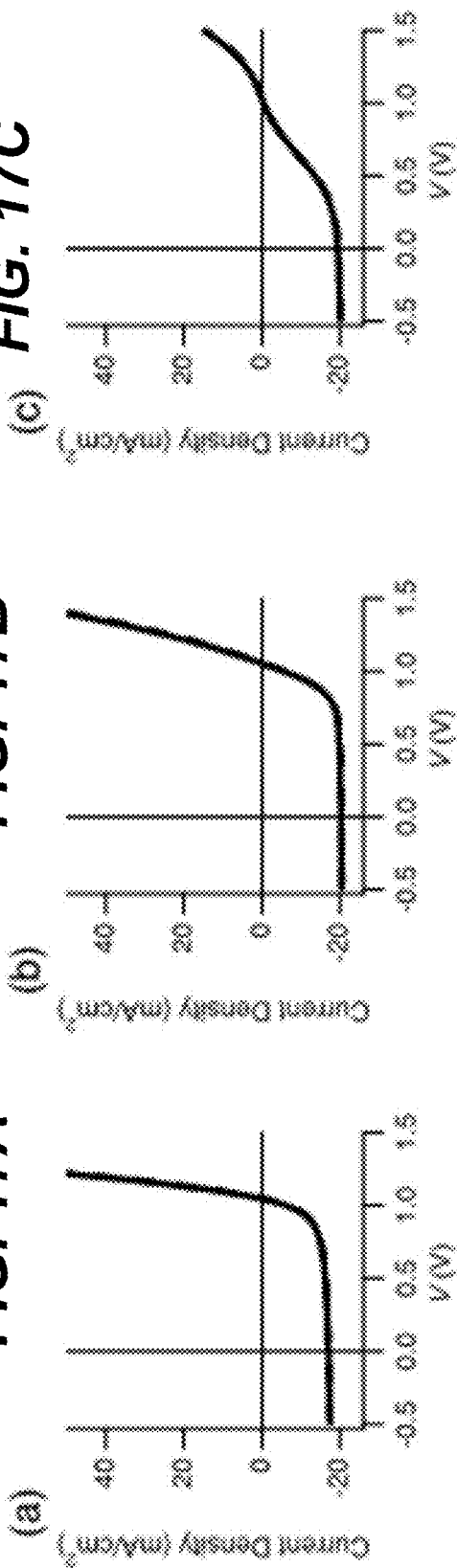
Figure 17D:
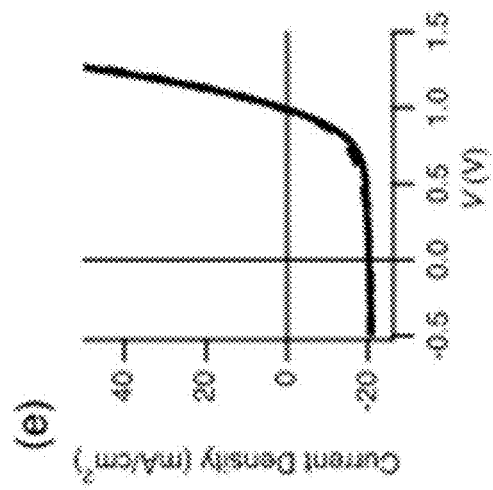
Figure 17E:
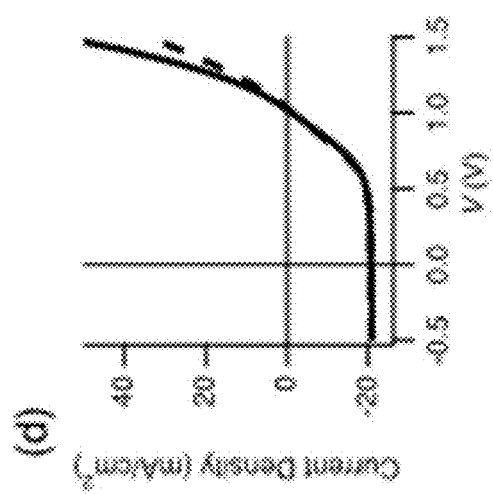

The 2PDI-nS series ETLs behaved similarly to PCBM with $MAPbI_3$ in as-deposited cells, but have significant differences upon thermal annealing. The 2PDI-nS devices all show a boost in PCE upon thermal annealing at 100° C. due to increases in fill factor (FF) and short-circuit currents ($J_{SC}$) up to ~20 mA/cm$^2$ (FIG. 15A, 15B, 16, and 17, Table 4. Statistical box plots for the parameters are shown in FIGS. 18 and 19) The PCE increases by 50%, 90%, 42%, and 4% for 2PDI-nS, where n=0-4, respectively. In contrast, PCBM-containing devices exhibit decreases in both FF and $J_{SC}$ leading to overall 30% drops in PCE under identical annealing conditions (FIG. 15A, 15B, Table 4). This difference in behavior indicates that degradation during annealing is not due to decomposition of the $MAPbI_3$ layer, but due to morphological reorganization in the PCBM layer that modifies its interface with the active layer and/or top electrode. The 2PDI-nS compounds, on the other hand, benefit from the annealing process resulting in improved carrier transport and thus higher $J_{SC}$ and FFs.

Incident photon to current efficiency (IPCE) was recorded as a function of wavelength (FIG. 15C) under the short circuit condition. The IPCE spectra are all almost identical except the strength. The calculated $J_{SC}$ are 18.4, 20.7, 19.1, 20.4, 21.5 mA/cm$^2$ for PCBM, 2PDI-0S, 2PDI-2S, 2PDI-3S, 2PDI-4S, respectively, which agree with those obtained from the J-V characteristics under 1 sun illumination.

Figure 20:
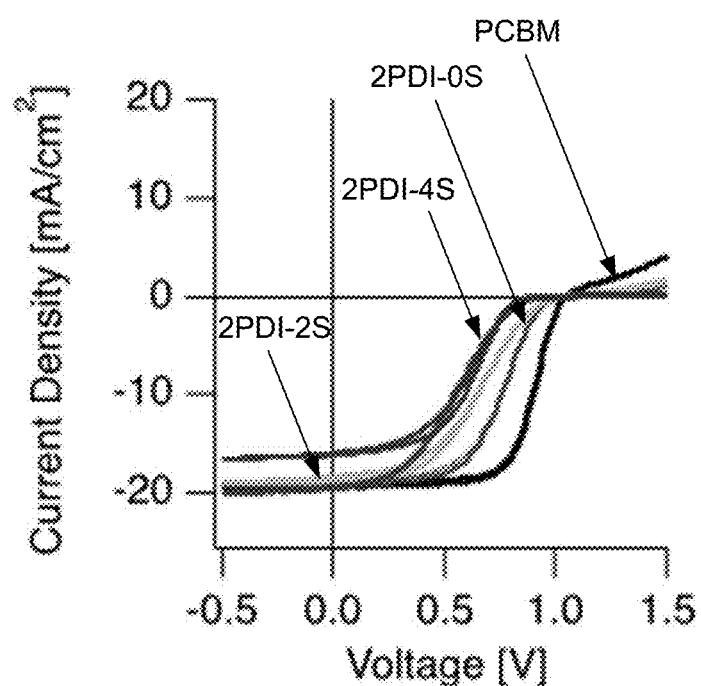
FIG. 20. Representative J-V characteristics of the devices without PEIE layer. PCBM (black), 2PDI-0S (red), 2PDI-2S (orange), 2PDI-3S (blue) and 2PDI-4S (purple) as the ETL.
Figure 21A:
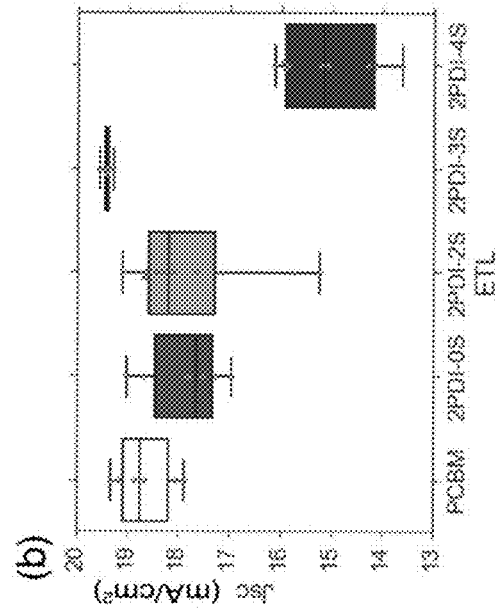
FIG. 21. Distribution of device performance characteristics for the devices without PEIE layer. The five lines in the boxplots show 0, 25, 50, 75, and 100 percentiles from the bottom to the top, respectively.
Figure 21B:
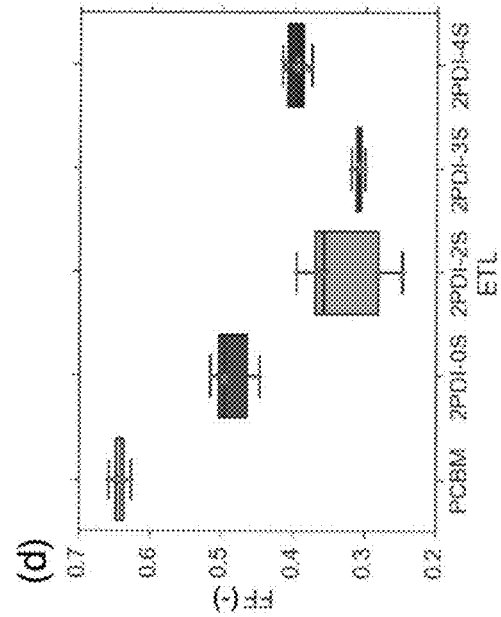
Figure 21C:
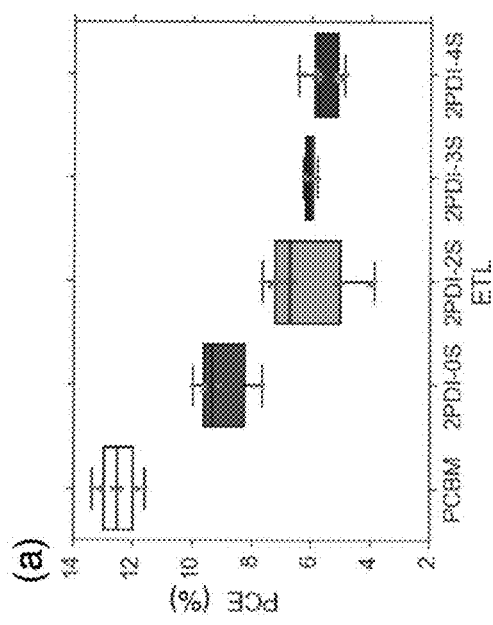
Figure 21D:
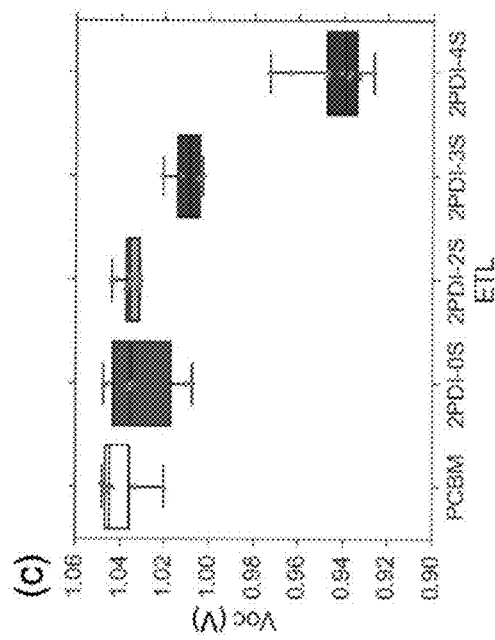

J-V characteristics of the devices without PEIE layer show a significant S-kink around V=$V_{OC}$ for all ETLs (FIG. 20), indicating that all the 2PDI-nS as well as PCBM require an interlayer to reduce the electron injection barrier.

TABLE 4 values of device performance characteristics and $J_{SC}$ calculated from IPCE spectra. 18.4, 20.7, 19.1, 20.4, 21.5 mA/cm$^2$ for PCBM, 2PDI-0S, 2PDI-2S, 2PDI-3S, 2PDI-4S

| | 100° C./10 min Thermal annealing | $J_{SC}$ (mA/cm$^2$) | $V_{OC}$ (V) | FF (-) | PCE (%) | $J_{SC}$ from IPCE (mA/cm$^2$) |
|---|---|---|---|---|---|---|
| PCBM | After | 16.11 | 1.04 | 0.65 | 10.91 | 18.4 |
| | Before | 19.01 | 1.03 | 0.79 | 15.40 | — |
| 2PDI-0S | After | 20.26 | 1.05 | 0.66 | 14.03 | 20.7 |
| | Before | 18.43 | 1.02 | 0.49 | 9.36 | — |
| 2PDI-2S | After | 18.01 | 1.01 | 0.36 | 6.78 | 19.1 |
| | Before | 13.60 | 0.99 | 0.27 | 3.50 | — |
| 2PDI-3S | After | 20.76 | 1.01 | 0.50 | 10.47 | 20.4 |
| | Before | 18.37 | 0.99 | 0.41 | 7.36 | — |
| 2PDI-4S | After | 19.99 | 0.98 | 0.57 | 11.07 | 21.5 |
| | Before | 19.04 | 0.96 | 0.58 | 10.60 | — |

It is noteworthy that the $V_{OC}$ of the devices are almost insensitive to the LUMO level of the ETLs. 2PDI-3S and 2PDI-4S have the LUMO level of −3.98 and −4.05 eV, respectively, which is about 0.3 eV lower than that of PCBM, 2PDI-0S and 2PDI-2S. The $V_{OC}$ of 2PDI-3S and 2PDI-4S devices are however, only about 0.07 V lower than those of the others. We confirmed that this discrepancy in offset between LUMO and $V_{OC}$ is not because of the surface doping with PEIE as we observed the same trend in the devices without it.

The 2PDI-nS films have a good physical and electric contact at the interface with MAPbI$_3$. Some organics passivate the defects at the HOIP surface by Lewis acid/base chemistry[23-25] or by supplying relevant halogen ions to the vacancy sites,[26,27] resulting in an increase in photoluminescence lifetime (decrease of recombination), diminishing the notorious hysteresis in the J-V characteristics and increasing the PCE. PCBM, for example, works as a Lewis acid which accepts excess negative charges at the Pb-I antisite.[24] Surprisingly, in all our 2PDI-nS devices, we do not see notable hysteresis in the J-V characteristics (FIGS. 15 and 16 and 17), showing that the compounds are passivating the surface of MAPbI$_3$.

c. Photo-Response at the Short-Circuit Condition

Figure 22:
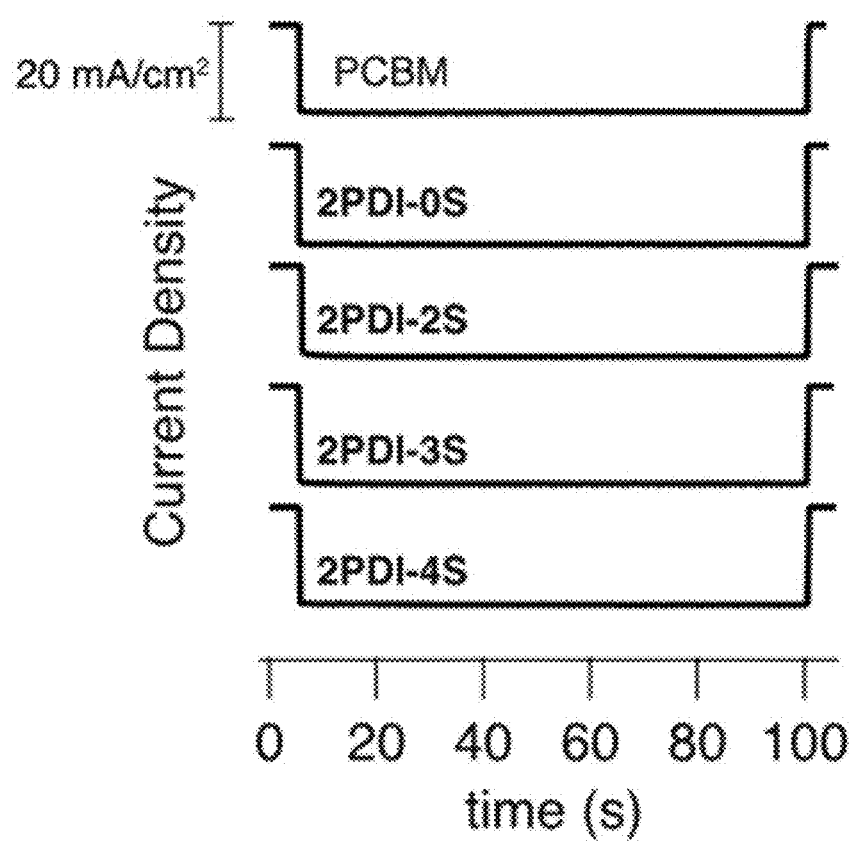
FIG. 22. TPCs of the devices under the short-circuit condition. 1 sun illumination was turned on at about 5 s, and off at around 100 s.

To further elucidate the response of the devices, transient photocurrents (TPCs) were measured and constantly recorded under 1 sun illumination and the short-circuit condition (FIG. 22). The lamp shutter was manually opened at around 5 s, and closed at around 100 s. All devices showed fast response against turning the light on/off and no decrease in photocurrent, indicating good stability of the devices at least for short term. Specifically, all of the photo-currents show rapid (<1 s) response upon turning the 1 sun illumination on or off with no obvious long time-scale ionic or capacitive contribution. The traces also show no immediate degradation in these devices with a stable current during ca. 95 s of continuous light illumination.

d. Time-Resolved Photoluminescence

We obtained time-resolved photoluminescence (TRPL) to quantify the efficiency of electron transfer by the quenching of the emission from MAPbI$_3$ (the TRPL measured the lifetime of the singlet excitation state (S$_1$) and electron transfer from photo-excited MAPbI$_3$ to the lowest unoccupied molecular orbital (LUMO) of an ETL decreases population of singlet excited state, reducing the lifetime). The lifetime is thus a good indicator of the electron transfer rate between a donor-acceptor couple.

Figure 23:
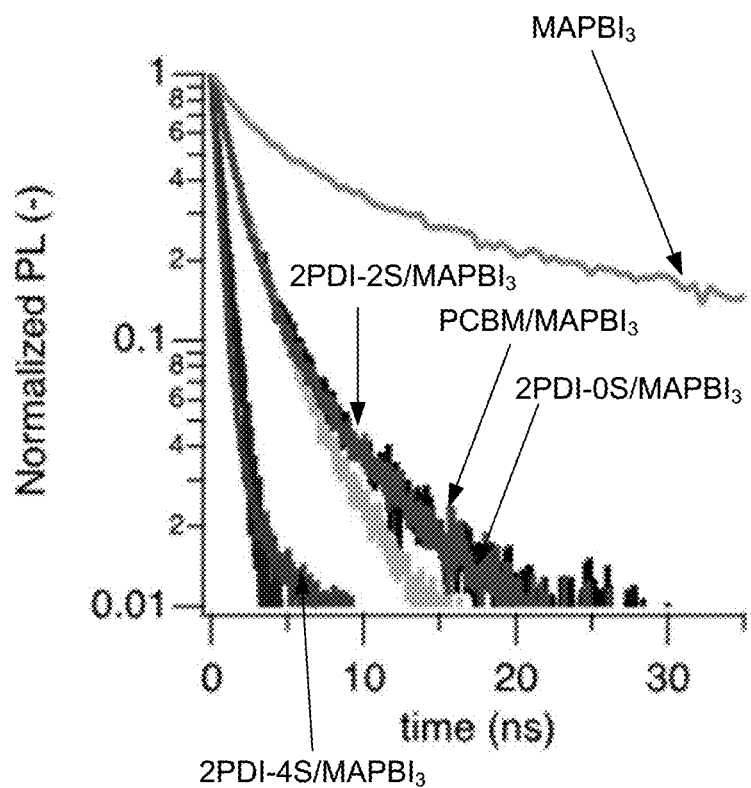
FIG. 23. Time-resolved photoluminescence curves of MAPbI$_3$/ETL stacks. The films are excited with a 400 nm laser of 50 nJ/cm$^2$ power density. Gray: MAPbI$_3$ only, Black: MAPbI$_3$/PCBM, Red: MAPbI$_3$/2PDI-0S, Orange: MAPbI$_3$/2PDI-2S, Blue: MAPbI$_3$/2PDI-3S, Purple: MAPbI$_3$/2PDI-4S. The detection wavelength was 760 nm.

The excitation fluence was ~0.05 μJ/cm$^2$ which sets a carrier concentration where monomolecular recombination is expected to dominate the decay.[25,28] The lifetime of the neat MAPbI$_3$ film made here at short time scales is 11.6 ns. (FIG. 23 shows the decay curves and Table 5 describes the time constants obtained by fitting the curves with a double exponential model.) When the MAPbI$_3$ layer is covered by PCBM, 2PDI-0S, or 2PDI-2S, the decay lifetime is greatly reduced to ~1.3 ns, indicating similar electron extraction efficiencies. The bilayers with 2PDI-3S and 2PDI-4S show even shorter lifetimes (~0.5 ns). This result suggests that electron extraction to these two compounds are more favorable than the others due to their lower lying LUMO. The overall trend is that the PL decays faster as the EA is increased.

A surprising feature of the use of 2PDI-nS as an ETL is the dramatic improvement in lifetimes of the solar cells compared to PCBM. We examined the stability of solar cells with the two best performing ETLs using under continuous 1 sun illumination at 35° C. These tests showed that as-deposited 2PDI-0S and 2PDI-4S-based devices are significantly more stable than ones using PCBM (FIGS. 24 and 25). The PCBM-based device shows rapid and monotonic degradation from 17% PCE to 2% PCE within 300 hr driven by decrease in J$_{SC}$. This short lifetime is consistent with the values from literatures on MAPbI$_3$/PCBM/Ag devices (Table 6).[16,29-32] In contrast, 2PDI-0S and 2PDI-4S-based devices show an increase, not a fall, in PCE to reach 14% in the first 30 hr. The increase is likely due to the same mechanism as that by thermal annealing (see above) because both are mainly driven by the improvement of FF. The PCE of the 2PDI-0S device then gradually falls mainly due to a fall in FF, while that of the 2PDI-4S device remains high till the end of the experiment at 400 hours.

Our results suggest a chemical pathway to the improvement in stability of MAPbI$_3$ solar cells using ETLs. The main degradation mechanism of MAPbI$_3$/PCBM/Ag devices is known to be the corrosion of the silver electrode by iodides migrated from MAPbI$_3$ through the ETL as confirmed by time-of-flight secondary ion mass spectrometry.[16,30] Improvement in lifetimes of HOIP solar cells have been achieved by incorporating additional cations and halogens to stabilize the HOIP layer (formamidinium, Cs),[29] inserting a protective metal oxide layer (Ti(Nb)O$_x$, CeO$_x$) between the ETL and the electrode,[30,33] passivating the surface of MAPbI$_3$[31], employing a non-halogen-corrosive material (ITO) as the electrode,[34] or adopting a non-fullerene organic semiconductor (NFA) as the ETL to reduce halogen migration rate (Table 6)[16]. Our findings here indicate that switching to 2PDI instead of PCBM increases the lifetime and that the addition of disulfide bridges yields a further improvement in light-soaking stability. The role of the disulfide bridges is elusive, but it does reduce the LUMO level under −4.0 eV, to within the electrochemical window of water, stabilizing negatively charged ETL itself under operation. Reactions with the disulfides could be preventing decomposition of the MAPbI$_3$ layer or the Ag electrode. And lastly, the smoother coverage of MAPbI$_3$ from 2PDI-4S, as shown in the AFM topographies (FIG. 26), could be helping to suppress ion migration.

TABLE 5

Fitted parameters of the time-resolved photoluminescence curves.
The fitting equation is y = y$_0$ + A$_1$exp(−t/τ$_1$) + A$_2$exp(−t/τ$_2$).

|  | y$_0$ | A$_1$ | τ$_1$ (ns) | A$_2$ | τ$_2$ (ns) |
| --- | --- | --- | --- | --- | --- |
| Neat | 0.0045 | 0.23 | 59.26 | 0.31 | 11.62 |
| PCBM | 0.0058 | 0.24 | 5.07 | 0.83 | 1.32 |
| 2PDI-0S | 0.0037 | 0.17 | 6.11 | 0.90 | 1.39 |
| 2PDI-2S | 0.0044 | 0.32 | 3.54 | 0.76 | 1.31 |
| 2PDI-3S | 0.0013 | 0.12 | 1.15 | 0.81 | 0.67 |
| 2PDI-4S | 0.0017 | 0.03 | 6.63 | 0.91 | 0.48 |

TABLE 6

Summary of light soaking test on MAPbI3/PCBM/Ag based inverted planer photovoltaics.

| device structure | Stabilizing Technology | Initial PCE | PCE after LS | Light Source | Atmosphere | Temperature | Circuit Loading | Ref |
| --- | --- | --- | --- | --- | --- | --- | --- | --- |
| FTO/PEDOT:PSS/Poly-TPD/perovskite/PCBM/BCP/Au | none | ~15% | ~0% @ 20 hr | AM 1.5 G | N$_2$ | NA | NA | Scientific reports (2018) 8:5977 |

TABLE 6-continued

Summary of light soaking test on MAPbI3/PCBM/Ag based inverted planer photovoltaics.

| device structure | Stabilizing Technology | Initial PCE | PCE after LS | Light Source | Atmosphere | Temperature | Circuit Loading | Ref |
|---|---|---|---|---|---|---|---|---|
| ITO/PEDOT:PSS/perovskite/PCBM/Ag | none | ~9% | <1% @ 30 hr | metal-halogen (a) | $N_2$ | 60-70° C. | NA | Adv. Energy Mater. 2017, 7, 1700476 |
| FTO/NiMgLiO/perovskite/PCBM/Ag | none | ~15% | ~6% @ 200 hr | White LED (b, c) | $N_2$ | room temperature | MPP | ACS Nano 2018, 12, 2403-2414 |
| FTO/NiMgLiO/perovskite/PCBM/BCP/Ag | none | ~17.5% | ~7% @ 600 hr | White LED (b, c) | $N_2$ | NA | MPP | J. Mater. Chem. A, 2018,6, 6255-6264 |
| ITO/PTAA/perovskite/PCBM/BCP/Ag | none | ~15% | ~10% @ 100 hr | Xenon (b) | $N_2$ (d) | 45-50° C. | SC | Adv. Energy Mater. 2017, 7, 1700763 |
| ITO/PTAA/perovskite/2PDI-45/PEIE/Ag | non-fulluerene ETL | ~10% | ~13% @ 400 hr | Xenon (b) | $N_2$ (d) | 35° C. | MPP (e) | This Work |
| ITO/PEDOT:PSS/perovskite/PDI-EH/Ag | non-fulluerene ETL | ~9% | ~7% @ 120 hr | White Light (a) | $N_2$ | 60-70° C. | NA | Adv. Energy Mater. 2017, 7, 1700476 |
| FTO/NiMgLiO/perovskite/PCBM/Ti(Nb)Ox/Ag | organic/inorganic bilayer ETL | ~16% | ~14.5% @ 1000 hr | AM1.5 (c) | $N_2$ | 45-50° C. | SC | Science 2015, 350, 944 |
| FTO/NiMgLiO/perovskite/PCBM/CeOx/Ag | organic/inorganic bilayer ETL | ~18% | ~18% @ 200 hr | White LED (b, c) | $N_2$ | room temperature | MPP | ACS Nano 2018, 12, 2403-2414 |
| FTO/NiMgLiO/perovskite/4-DMABA/PCBM/BCP/Ag | passivation layer | ~20% | ~18% @ 1000 hr | White LED (b, c) | $N_2$ | NA | MPP | J. Mater. Chem. A, 2018,6, 6255-6264 |
| ITO/PEDOT:PSS/perovskite/PCBM/Al:ZnO/ITO | stable cathode material | ~12% | ~13% @ 200 hr | sulfur plasma (b) | ambient | 35° C. | MPP | Adv. Mater. 2016, 28, 3937-3943 |

NA = not available,
SC = short circuit,
MPP = maximum power point
(a) P = 70 mW $cm^2$,
(b) P = 100 mW $cm^2$,
(c) with UV cut filter,
(d) glass capped with UV-curable adhesive,
(e) set to MPP loading for the initial performance.

e. AFM Topography Images

Figure 26:
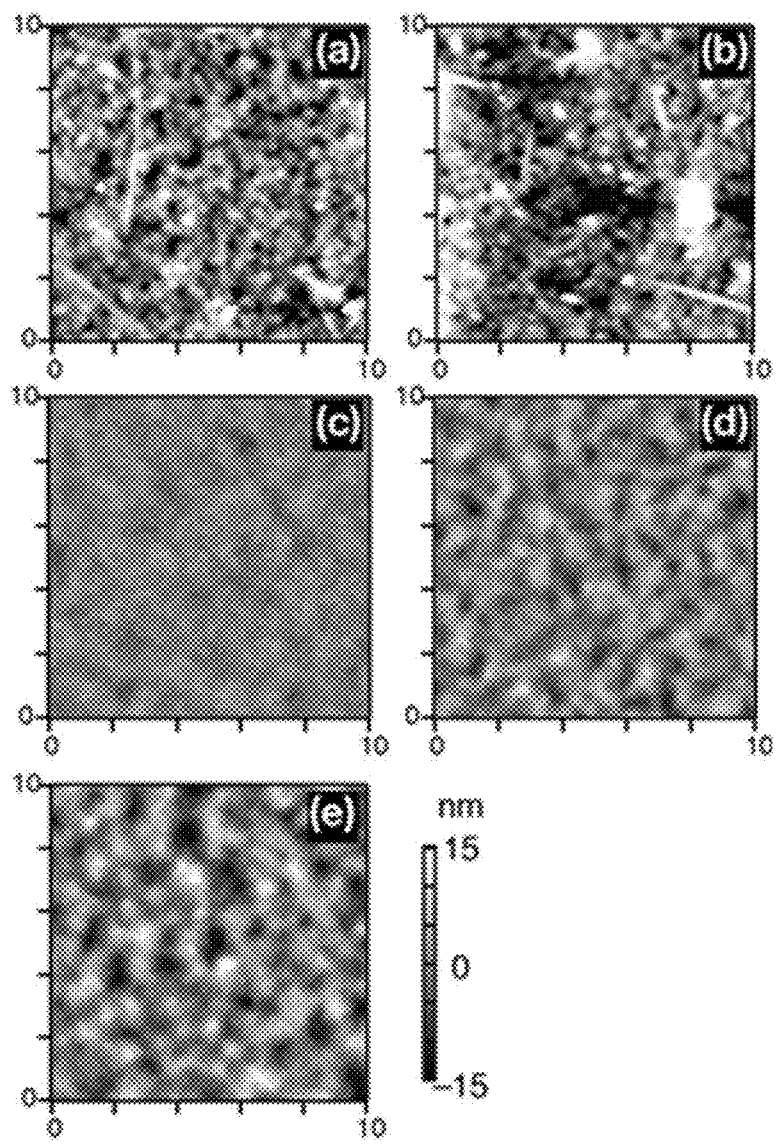
FIGS. 26A-26E. AFM topography images of ETL (FIG. 26A) PCBM, (FIG. 26B) 2PDI-0S, (FIG. 26C) 2PDI-2S, (FIG. 26D) 2PDI-3S, (FIG. 26E) 2PDI-4S on MAPbI$_3$. The films were not thermally annealed.

Surface topography of the ETLs was observed by atomic force microscopy (AFM) (FIG. 26). PCBM and 2PDI layers show grains of ~500 nm diameters, whereas the other layers have more continuous surface. We do not see any sharply edged structures on those surfaces, suggesting that the layers were all amorphous.

In summary, Example 7 illustrates fabrication of an inverted planar-structure $MAPbI_3$ based PV devices with 2PDI-nS (n=0, 2, 3, 4) as the ETL. All of the devices show no hysteresis in the J-V characteristics or slow delay time on photo current upon illumination, suggesting ideal electronic and physical contact between $MAPbI_3$ and the ETLs. AFM topography images show 2PDI-2S, 2PDI-3S and 2PDI-4S form smooth and grain-less films on $MAPbI_3$. The devices with 2PDI-0S and 2PDI-4S gave PCEs of 14.0% and 11.0%, respectively, after thermal annealing at 100° C. for 10 min, which outperform PCBM-based devices (10.9%). Light-soaking tests reveal that 2PDI-0S and 2PDI-4S devices have significantly higher stability than PCBM ones, especially 2PDI-4S devices, which after a jump up in the burn-in regime show almost no drop in PCE over 400 hrs. Our results suggest that 2PDI-nS compounds are suitable for realizing high performance and stable HOIP-PV.

IX Methods For Example 7

Sample Preparation

Photovoltaic devices were prepared as following. Glass substrates covered by ITO (Thin Film Devices) were sonicated in acetone and then isopropyl alcohol for 10 min each. The substrates were further cleaned with air-plasma under 300 mTorr. All of the processes hereafter were conducted under nitrogen. A 2 mg/mL solution of polytriarylamine (PTAA, Aldrich) in chlorobenzene (Aldrich) were spun-coat on the substrates at 6000 rpm. A $MAPbI_3$ precursor solution was formulated by dissolving a 1/1/1 (mol/mol/mol) mixture of methylammonium iodide (Dysol), lead iodide (Aldrich) and dimethyl sulfide (Aldrich) in anhydrous DMF (Aldrich). The DMF solution was spun coat on the PTAA layer at 1000 rpm for 10 s then 4000 rpm for 30 s. When 8 s passed after the spin turned 4000 rpm, 0.2 mL of anhydrous chlorobenzene (Aldrich) was dropped on the substrate. The films were transferred on a hotplate of 100° C. immediately, and thermally annealed for 10 min. A solution for the ETL layer (30 mg/mL for PCBM in chlorobenzene, 20 mg/mL in toluene for the other compounds) were spun coat on the $MAPbI_3$ layer at 1000 rpm, followed by a spin-coat of PEIE in isopropyl alcohol (0.02 wt %, diluted from 37% aqueous solution of PEIE from Aldrich) at 6000 rpm. The devices were finally capped with Ag (80 nm) by vacuum deposition.

For the samples for photoluminescence studies, a MAPbI$_3$ layer was spun coat on a quartz substrate. An ETL layer were then spun coat on the MAPbI$_3$.

Characterization

The J-V characteristics were measured at 1 sun illumination (AM 1.5G, 100 mW/cm$^2$) in a N2-filled glovebox with a solar simulator equipped with a Xenon lamp (Newport), a Keithley 2602 Source Meter and a calibrated silicon reference cell. The power conversion efficiency (PCE) was calculated with the following equation: PCE (%)=100× $V_{OC} \times J_{SC} \times FF/P_{inc}$ from the open circuit voltage, $V_{OC}$, the short circuit current, $J_{SC}$, the fill factor FF and the incident powder $P_{inc}$.

Light-soaking stability of encapsulated devices (filled with nitrogen) was examined at a maximum-power-point by using a fixed resistance under continuous full-sun illumination at 35° C. without UV cutting filter (SIGMAKOKI CO., LTD, SCF-50S-42L).

The incident photon to light efficiencies (IPCEs) were analyzed using a fully computerized measurement system consisting of a 300-W xenon lamp (Newport), a monochromator (Newport CS130), a chopper controller (Newport), two current preamplifiers (SRS SR570), and two lock-in amplifiers (SRS SR810).

Time-resolved photoluminescence measurements were performed using Time-Correlated Single Photon Counting (TCSPC) technique[1]. Approximately 100 femtosecond (fs) excitation pulses with wavelength 400 nm were generated by doubling the fundamental frequency of fs Ti:Sapphire laser (Spectraphysics Tsunami) pulses in a commercial optical harmonic generator (Inrad). The laser repetition rate was reduced to 2 MHz by a home-made acousto-optical pulse picker in order to avoid saturation of the chromophore. TCSPC system is equipped with thermoelectrically-cooled single-photon counting avalanche photodiode (Micro Photon Devices) and electronics board (Becker & Hickl SPC-630) and has instrument response time about 30-40 picoseconds. Triggering signal for the TCSPC board was generated by sending a small fraction of the laser beam onto a fast (400 MHz bandwidth) Si photodiode (Thorlabs Inc.). Fluorescence signal was dispersed in Acton Research SPC-500 monochromator after passing through a pump blocking, long wavelength-pass, autofluorescence-free, interference filter (Omega Filters, ALP series). In addition to the time-resolved detector, the monochromator is equipped with a CCD camera (Roper Scientific PIXIS-400) allowing for monitoring of the time-averaged fluorescence spectrum. Luminescence transients were not deconvolved with the instrument response function since their characteristic time-constants were much longer than the width of the system response to the excitation pulse.

Surface Topography of the ETLs

To reveal the morphology of the ETLs on top of the MAPbI$_3$ layer, we observed surface topographies of the layers with atomic force microscopy (AFM) (FIG. 26). Interestingly, 2PDI-0S and the rest of the 2PDI-nS series show different features despite small changes in their chemical structures. 2PDI-0S films have small (200-500 nm) grains, which resemble the morphology of PCBM. In contrast, the samples with annulated sulfur show relatively smooth surfaces without distinctive features from submicron grains. When the number of sulfur increases, the surface of the film starts to undulate in a micrometer order. Example 4 shows films of 2PDI-nS (n=2, 3, 4) on ZnO are amorphous based on GIWAXS measurements. Combining these observations, we conclude that the films of 2PDI-nS (n=2, 3, 4) are also amorphous on MAPbI$_3$. Note that every ETL covers MAPbI$_3$ without major pinholes, since we do not see significant drops in the device performances due to charge recombination at the MAPbI$_3$ and the top electrode interface.

X. Process Steps For Fabrication of Multisulfur Fused PDIs

Figure 27:
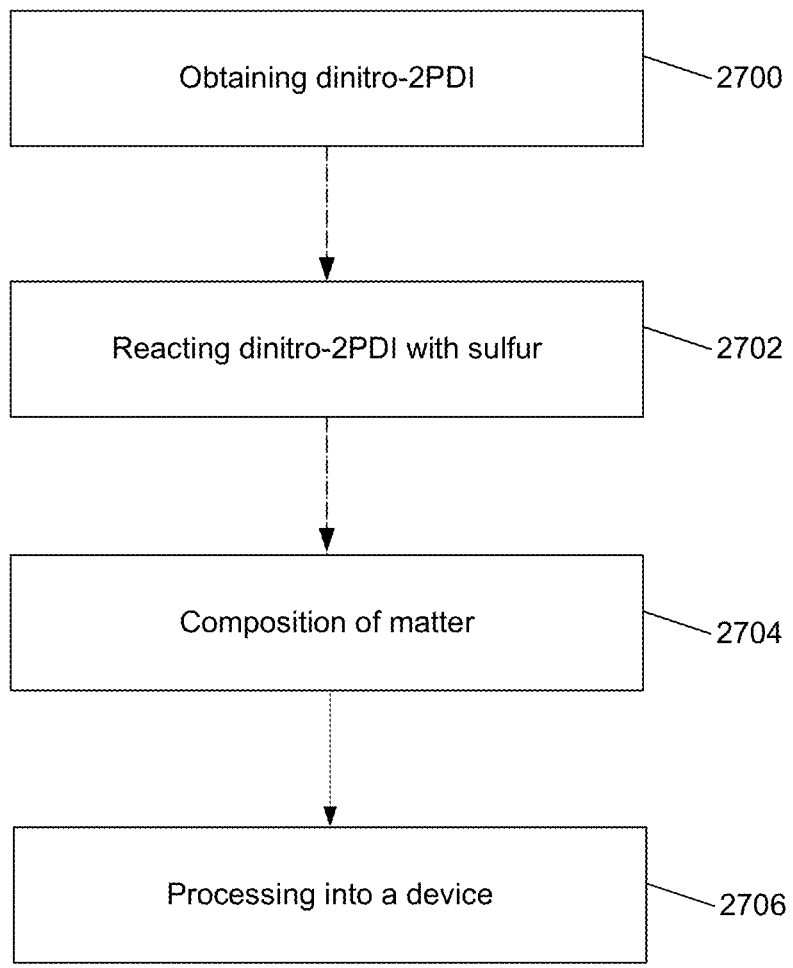
FIG. 27. Flowchart illustrating a method of making multisulfur PDIs and devices including the same.
Figure 28A:
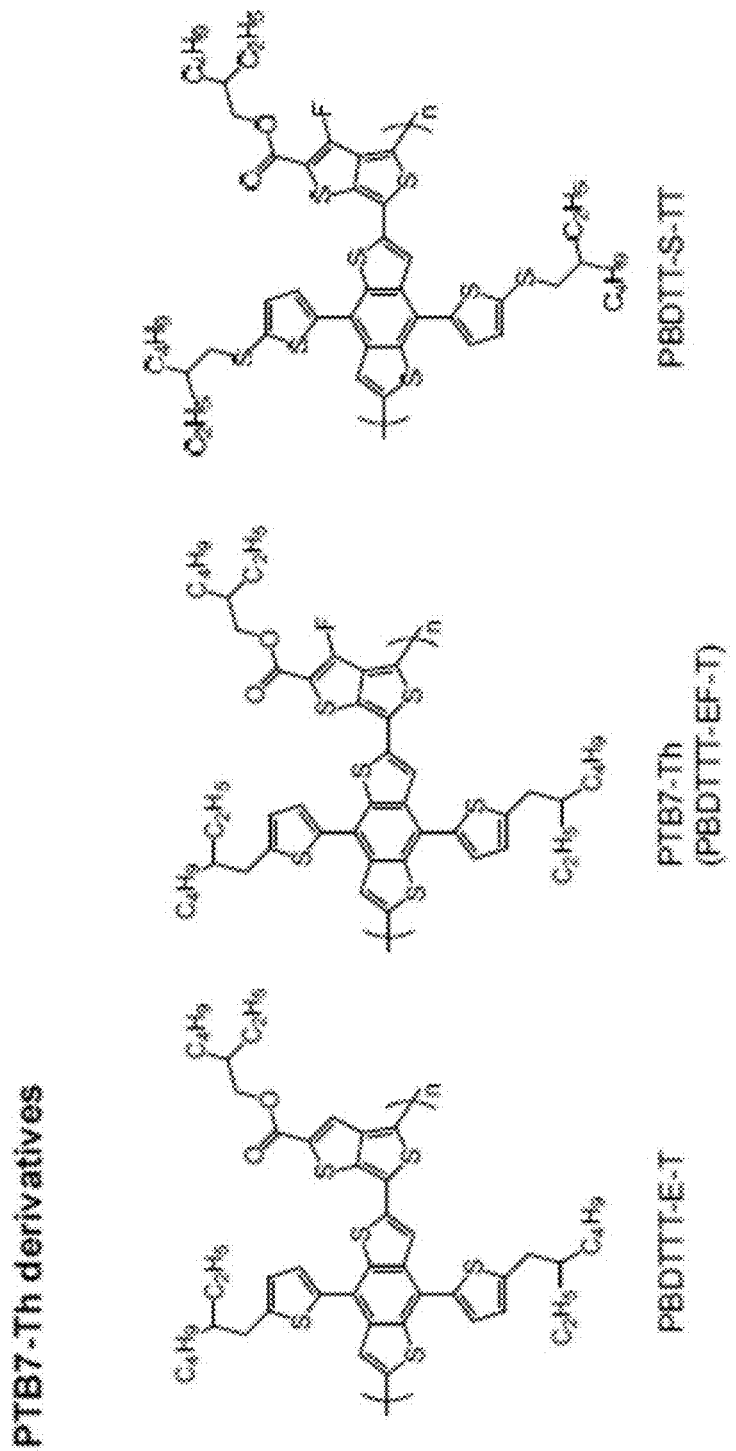
Figure 28B:
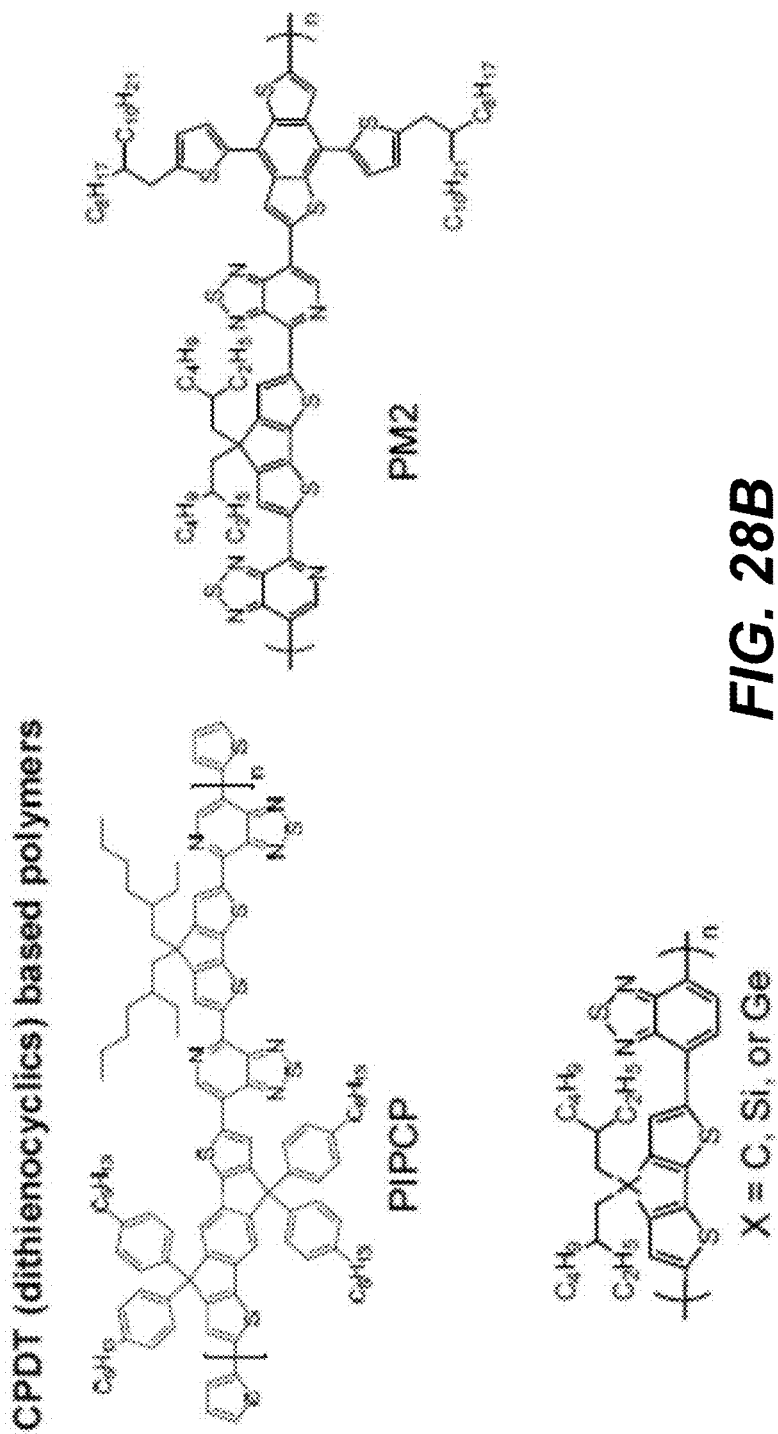
Figure 28D:
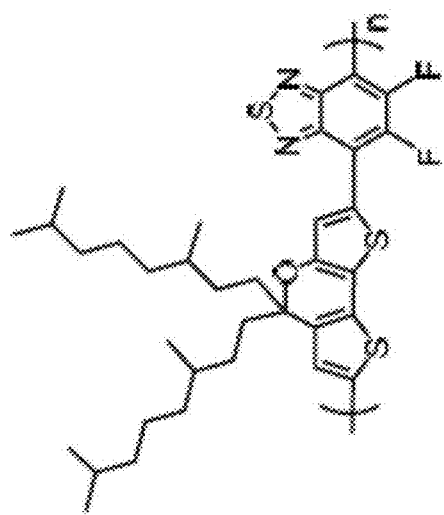

FIG. 27 is a flowchart illustrating a method of fabricating a composition of matter and/or device according to one or more embodiments of the present invention.

Block 2700 represents obtaining a dinitro-2PDI in a solution. In one or more examples, compound Dinitro-2PDI was synthesized in 98% yield by reacting parent 2PDI[23,24] and fuming nitric acid in dichloromethane (DCM) at room temperature for 3 hours (h). In one or more examples, the compound 2PDI was synthesized according to the procedure in reference[33]: referring to FIG. 1 and Scheme 1 in reference[33], starting from compound 1, compound 6 was obtained by bromination, then compound 9 was obtained by Stille coupling, then compound 2 (2PDI) was obtained by photocyclization.

Block 2702 represents reacting the dinitro-2PDI with sulfur powder in boiling N-methylpyrrolidone (NMP).

Block 2704 represents the end result, a composition of matter comprising a compound including fused perylene diimides (e.g., multisulfur PDIs) having the formula 2PDI-nS, where n is an integer (e.g., 1≤n≤10).

FIG. 2A illustrates examples of the composition of matter 200 including the compound 202 wherein bay positions 204 of each of the fused perylene diimides 206 are bonded to a sulfur atom S so as to form the fused perylene diimides including a plurality of annulated sulfur groups 208 The annulated sulfur group may comprise a plurality of sulfur moieties.

Examples include 2PDI-2S, 2PDI-3S, and 2PDI-4S comprising the fused PDIs having the structures as illustrated in FIG. 2A and wherein the R are independently hydrogen, an alkyl group, an aryl group, or a solubilizing chain, which can be a $C_1$-$C_{30}$ substituted or non-substituted alkyl chain, a $C_2$-$C_{30}$ substituted or non-substituted aryl chain —(CH$_2$CH$_2$O)n (n=2~20), C$_6$H5, —CnF$_{(2n+1)}$ (n=2~20), —(CH$_2$)$_n$N(CH$_3$)$_3$Br (n=2~20), —(CH$_2$)$_n$N(CH$_3$)$_3$OH (n=2·20), —(CH$_2$)$_n$N(CH$_3$)$_2$ (n=2~20), —(CH$_2$)$_n$N(C$_2$H$_5$)$_2$ (n=2~20), 2-ethylhexyl, PhC$_m$H$_{2m+1}$(m=1-20), —(CH$_2$)$_n$Si (C$_m$H$_{2m+1}$)$_3$ (m, n=1 to 20), or —(CH$_2$)$_n$Si(OSi(C$_m$H$_{2m+1}$)$_3$)$_x$(C$_p$H$_{2p+1}$)$_y$ (m, n, p=1 to 20, x+y=3). In one or more embodiments, R is —C$_2$H$_5$, —C$_3$H$_7$, —C$_4$H$_9$, —C$_5$H$_{11}$, —C$_6$H$_{13}$, —C$_7$H$_{15}$, —C$_8$H$_{17}$, —C$_9$H$_{19}$, or —C$_{10}$H$_{21}$.

The term "alkyl" refers to monovalent straight, branched, or cyclic aliphatic hydrocarbon groups having from 1 to 50 carbon atoms. The term "aryl" refers to a monovalent aromatic carbocyclic group of from 2 to 30 carbon atoms having a single ring (e.g., phenyl) or multiple condensed rings (e.g., naphthyl or anthryl) which condensed rings may or may not be aromatic provided that the point of attachment is at an aromatic carbon atom.

Block 2706 represents optionally solution processing the composition of matter of block 2704 in a device. Examples include, but are not limited to, devices wherein the composition of matter is as an active region or electron transport layer in the device, such as, but not limited to, an organic solar cell, a hybrid solar cell, a perovskite solar cell, an organic field-effect transistor (e.g., n-type transistor), or photodetector.

The device 3000 (see FIG. 30) can be embodied in many ways, including but not limited to, the following examples.

1. The device comprising the composition of matter combined with a donor molecule, wherein the fused PDIs are electron acceptors. Examples of donor molecules include, but are not limited to, PTB7-Th, DPP polymers, PIPCP, PBPCP, or donor molecules illustrated in FIGS. 28A-28D.

2. The device of embodiment 1, wherein the device is a solar cell device having an active region including the composition of matter (multi-sulfur fused PDIs) combined with the donor molecule.

3. A device comprising the composition of matter, further comprising an electron transport layer including the fused PDIs. Examples of the fused PDIs include, but are not limited to, 2PDI-2S, 2PDI-3S, and 2-PDI-4S as described herein.

4. The device of embodiment 3, further comprising an electromagnetic radiation absorbing active region coupled to the electron transport layer, wherein the active region comprises an organic-inorganic hybrid perovskite (PVSK).

5. The device of embodiments 3 or 4, wherein the device is a solar cell having a fill factor exceeding 57%.

6. The device of embodiments 3, 4, or 5, wherein the device is a solar cell having a PCE of at least 11%, and an EQE of greater than 70%, when the active region of the solar cell absorbs the electromagnetic radiation having a wavelength in a range of 350-750 nm under 1 Sun irradiation.

7. The device of embodiment 1, wherein the device 3000 is a photodetector having a sensing element comprising the fused PDIs combined with the donor molecule (example photodetector structure shown in FIG. 30A).

Figure 30A:
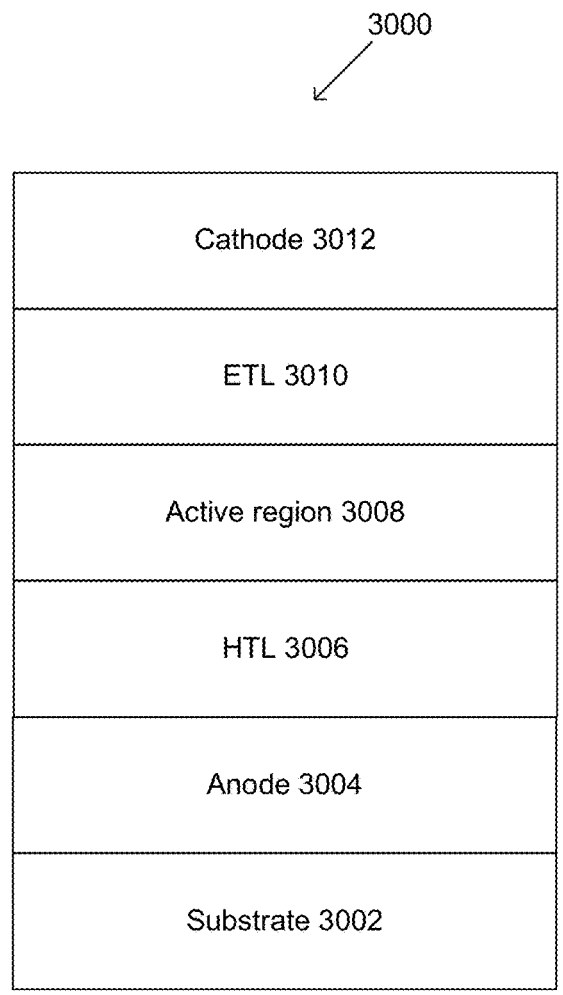
FIG. 30A. Example device structure for solar cell and photodetector.
Figure 30B:
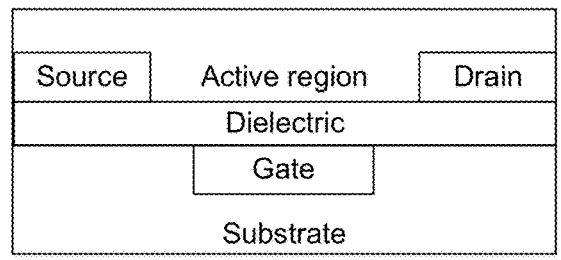
FIG. 30B. Example device structure for transistor.

8. A field effect transistor (e.g., n-type field effect transistor) comprising the composition of matter, e.g., in the active region, e.g., as illustrated in FIG. 30B.

9. The device of one or any combination of embodiments 1-8, wherein the device comprises an active layer or electron transport layer comprising the fused PDIs, and the active layer or the electron transport layer is amorphous and has a mobility greater than $10^{-2}$ cm$^2$/Vs.

10. The device 3000 of or any combination of the previous solar cell embodiments, wherein the solar cell comprises a substrate 3002; a (e.g., transparent) anode 3004 on the substrate; an anode interface layer or hole transport layer 3006; an absorbing active region 3008 (e.g., comprising the fused PDIs combined with the donor molecule or PVSK) on the anode interface layer; a cathode interface layer or electron transport layer 3010 (e.g., comprising the fused PDIs) on the absorbing region; and a cathode 3012 on the cathode interface layer, as illustrated in FIG. 30A.

11. In one or more solar cell embodiments, during operation, both the electron donor and the electron acceptor absorb photons to create electron-hole pairs, the (acceptor molecule interfacing with the donor molecule) receives the electron in the electron hole pair and transports the electron to the cathode interface layer and the cathode. The hole is transported by the donor to the anode interface layer and then the anode.

12. In one or more solar cell embodiments, the solar cell has a fill factor of more than 70%, an EQE over 50%, over 70%, over 45%, over 55% in the wavelength range of 400-700 nm, and a PCE of greater than 5%.

Figure 29:
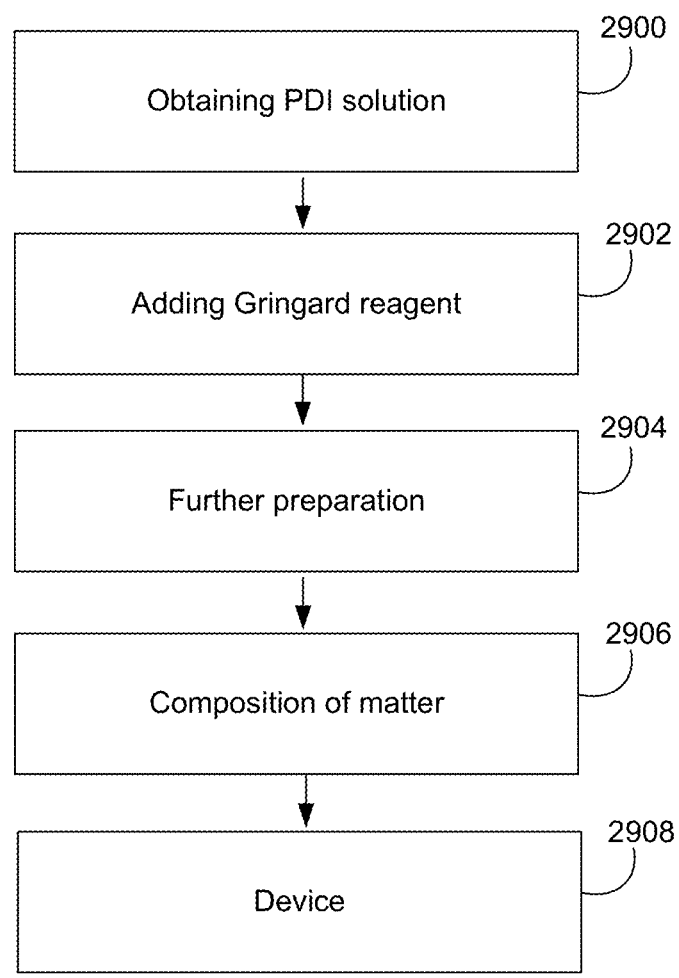
FIG. 29. Flowchart illustrating a method of making additional PDIs and devices including the same.

XI Process Steps For Fabrication of Additional PDI Compositions Useful as Electron Transport Layers FIG. 29 is a flowchart illustrating a method of fabricating a composition of matter and/or device according to one or more embodiments of the present invention. In one or more embodiments, the method comprises regioselectively preparing a 2,5,8,11-functionalized perylenediimide via 1,4-addition of a Grignard reagent.

Block 2900 represents obtaining a PDI in a solution. In one or more embodiments, the PDI has the structure:

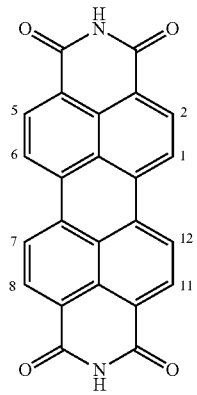 [SMILES: O=C1NC(=O)c2ccc3c4ccc5c6c(ccc(c7ccc1c2c73)c64)C(=O)NC5=O]

wherein the numbers indicate the ortho-positions (2,5,8,11) of the imide or bay (1,6,7,12) positions. In one or more embodiments, the H is replaced with R, wherein the R are each independently hydrogen, an alkyl group, or an aryl group.

In one or more embodiments, the PDI has the structure:

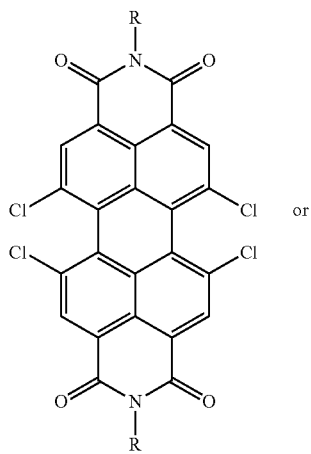

or

-continued

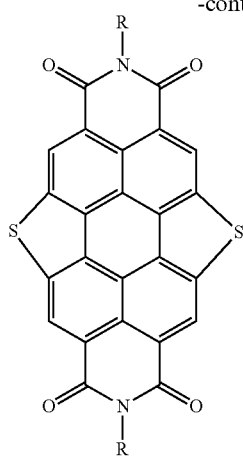

wherein the R are independently hydrogen, an alkyl group, or an aryl group. Cl can be replaced with other halogen atoms, such as, but not limited to, Br, I, F. Sulfur can be replaced with oxygen, selenium, nitrogen or phosphorus.

Block 2902 represents adding a Grignard reagent to the solution and mixing to form a mixture (at 0° C. or room temperature). Examples of Grignard reagents include, but are not limited to, mesitylmagnesium bromide and thienyl magnesium bromide. The molar ratio of the Grignard regent to the PDI could be from 1 to 10 or higher.

Block 2904 represents further preparation, if necessary. In one or more embodiments, the step comprises extracting the mixture in a solvent, drying/evaporating the mixture to form an organic compound, adding the Grignard reagent to the organic compound in a new solution and mixing to form a new mixture, extracting the new mixture in a solvent, drying/evaporating the new mixture to form a product, and purifying the product comprising e.g, the desired 2,5,8,11-functionalized PDI. Examples of solvents used in Blocks 2902-2904 include, but are not limited to, DCM and THF.

Block 2906 represents the resulting composition of matter, a functionalized PDI, e.g., a 2,5,8,11-functionalized PDI. In one or more embodiments, the composition of matter comprises a compound including one or more PDIs, wherein one or more of the bay positions of the one or more PDIs are bonded to at least one chemical group, element, or ring selected from annulated oxygen, annulated nitrogen, annulated phosphorus, annulated sulfur, and annulated selenium, and one or more of the ortho-positions (e.g., 2,5,8,11) of the PDIs are functionalized with at least one group selected from an alkyl group and an aromatic group.

Examples of the composition of matter according to embodiments of the present invention include, but are not limited to, functionalized mono PDIs such as, but not limited to, PDI-4Mes, PDI-4Th, PDI-2S-4Th, and PDI-2S-4Mes (ref[29] in section entitled "references for Examples 1-6"), and multi-perylene diimides with chalcogen or pnictogen functionalizations at the bay positions and alkyl or aryl functionalizations at the ortho-positions. In one or more embodiments, the one or more PDIs are (or comprise) at least one compound, structure, and/or formula selected from:

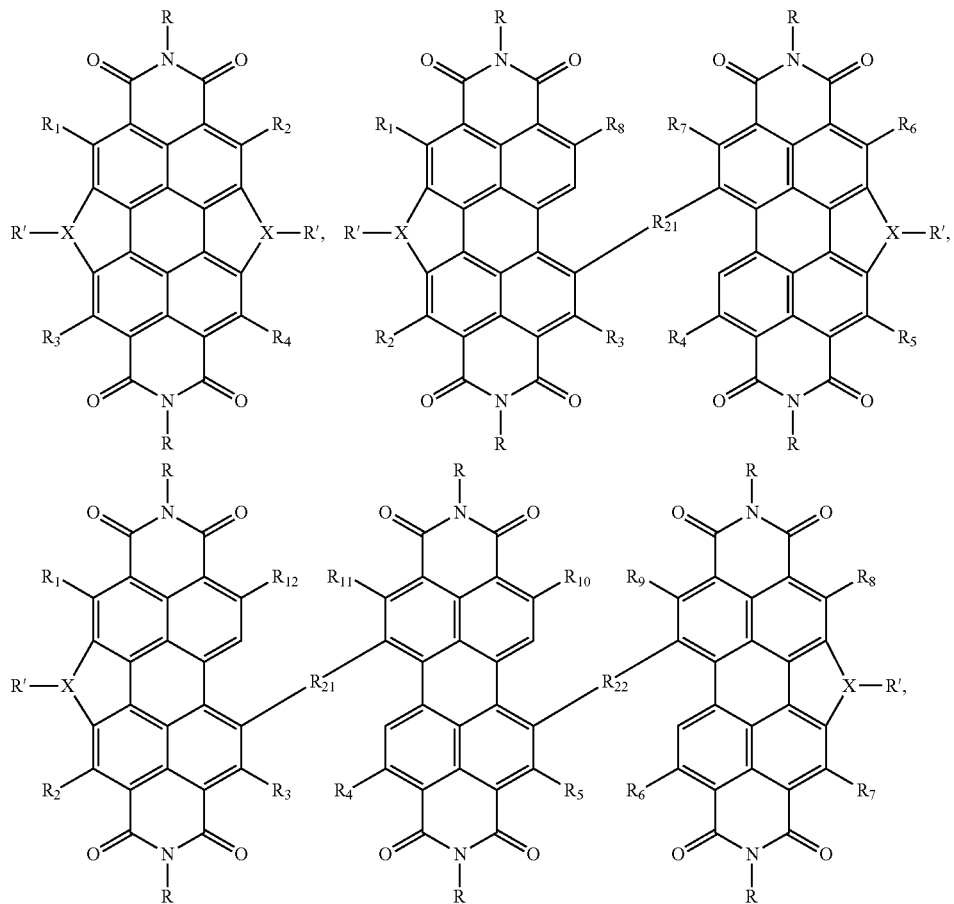

-continued
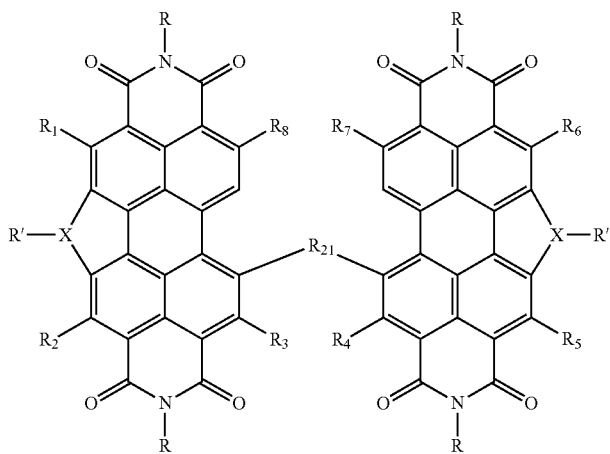
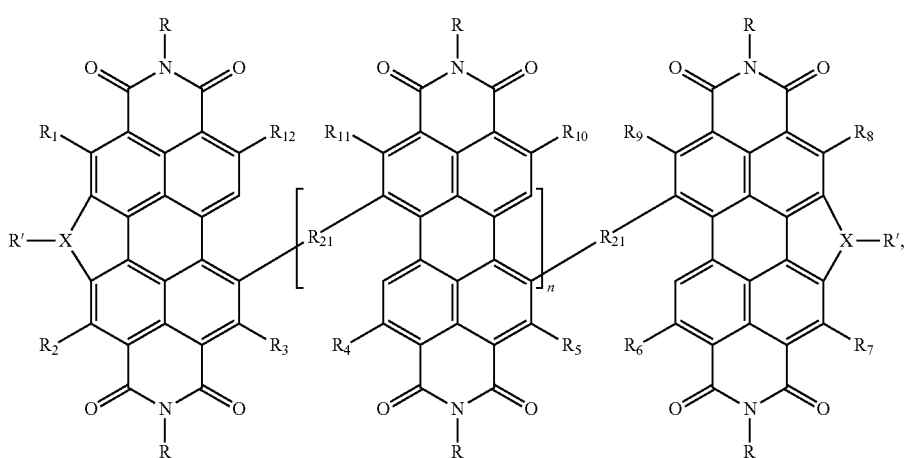
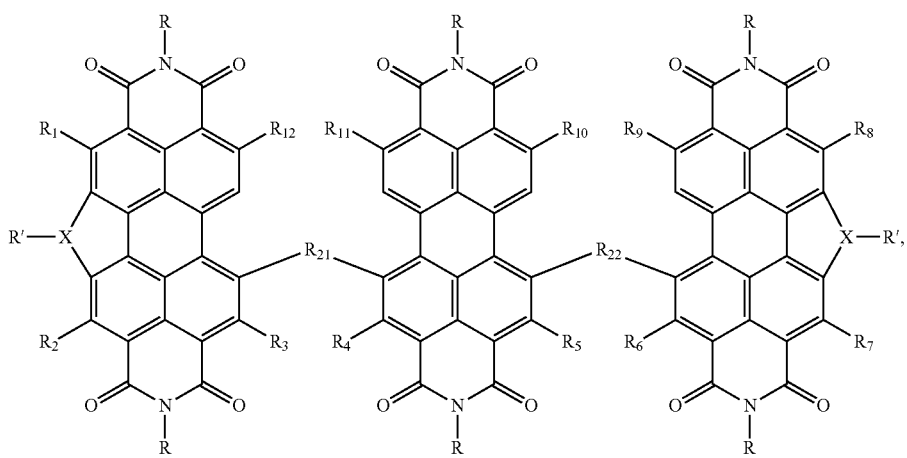

-continued
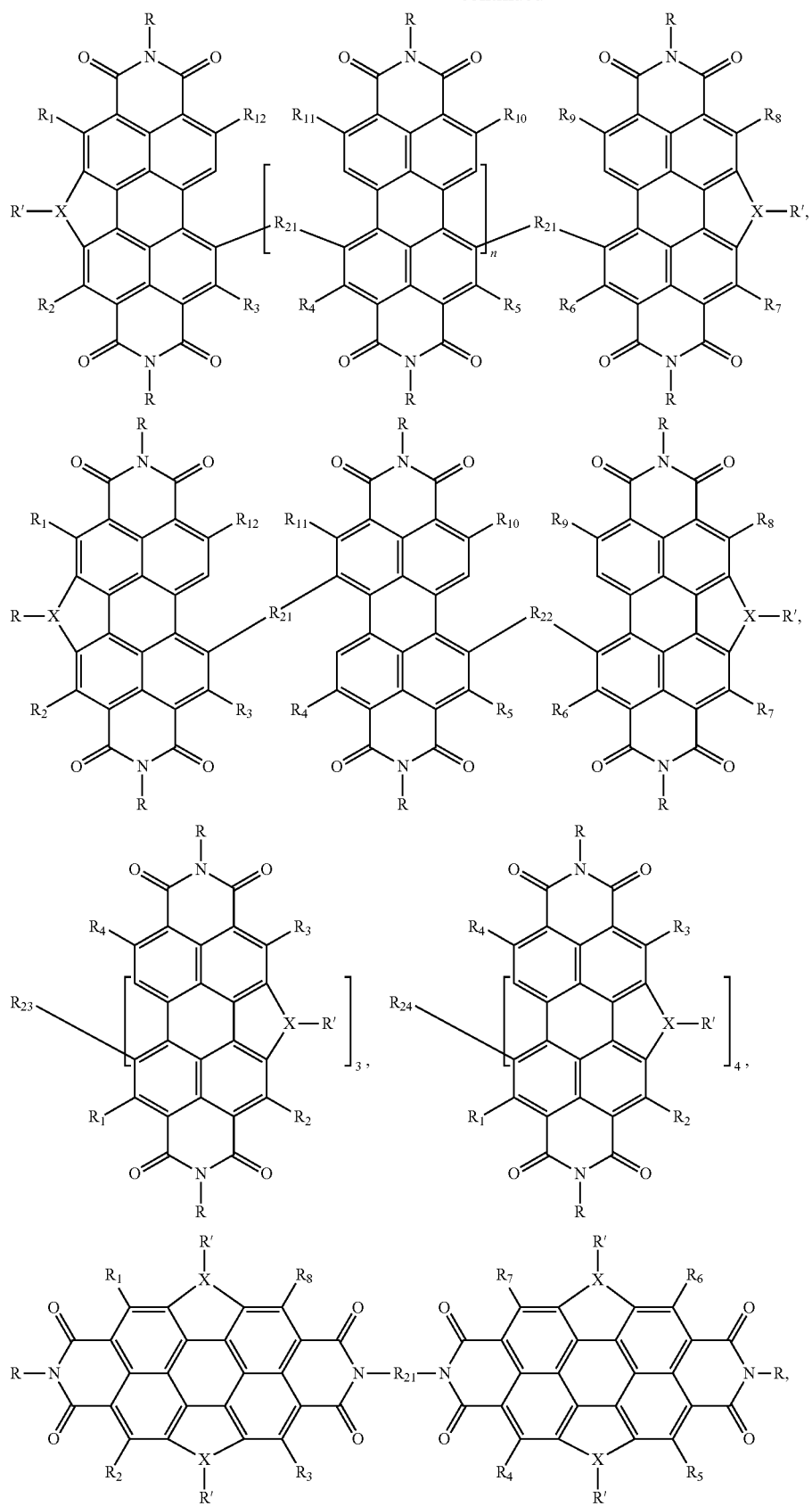

-continued
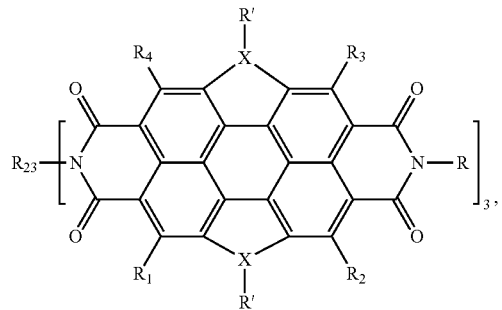
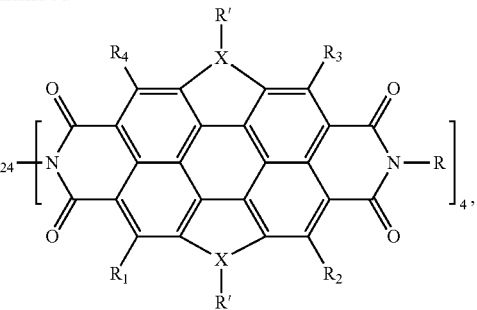
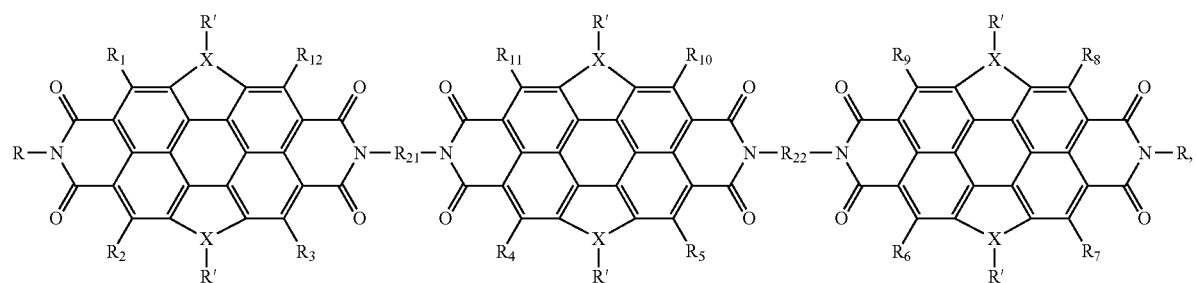
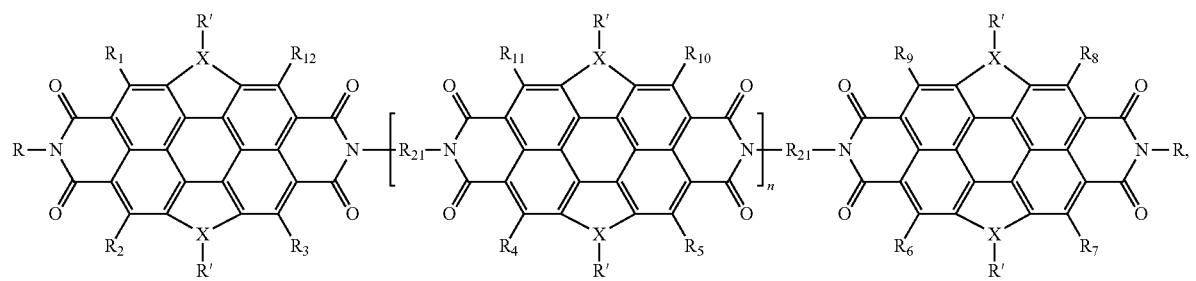
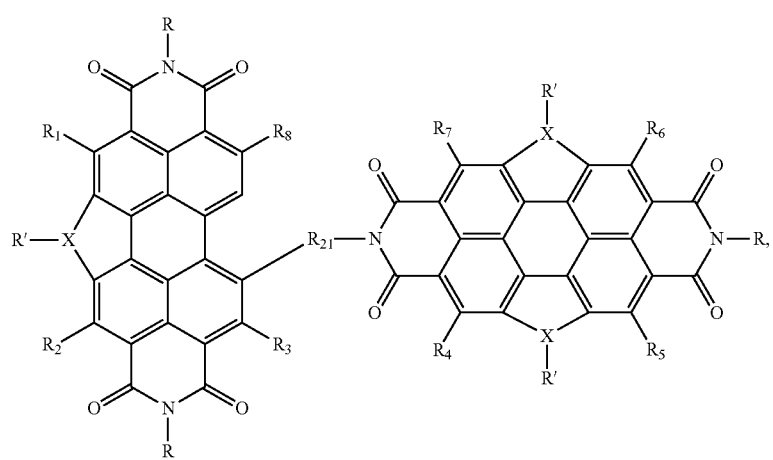

-continued
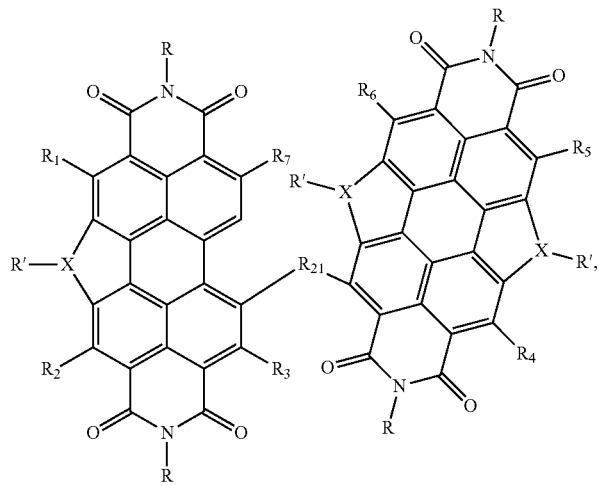
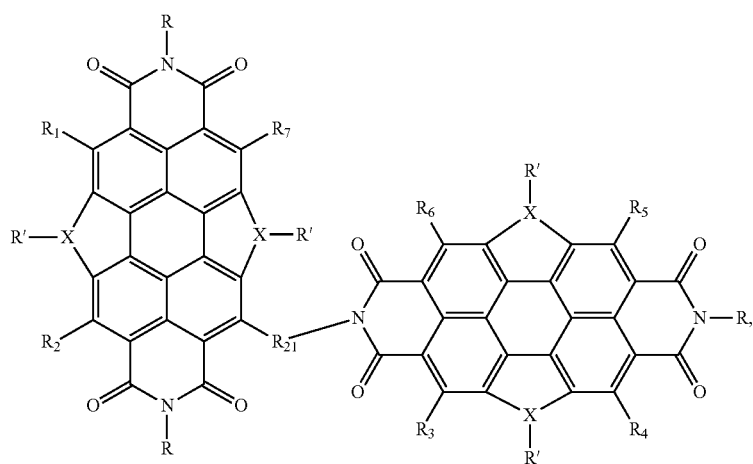
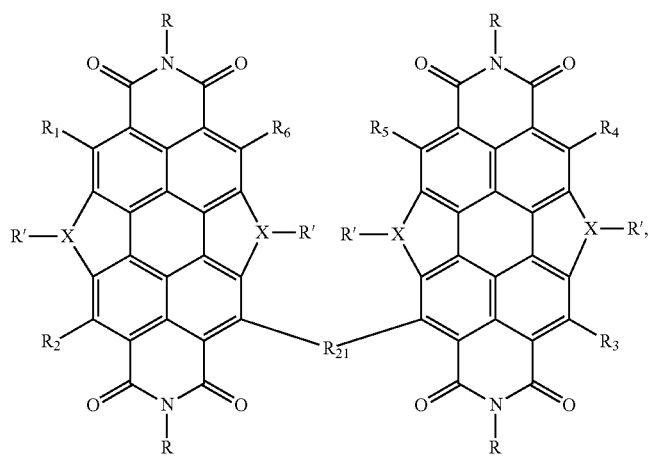

-continued
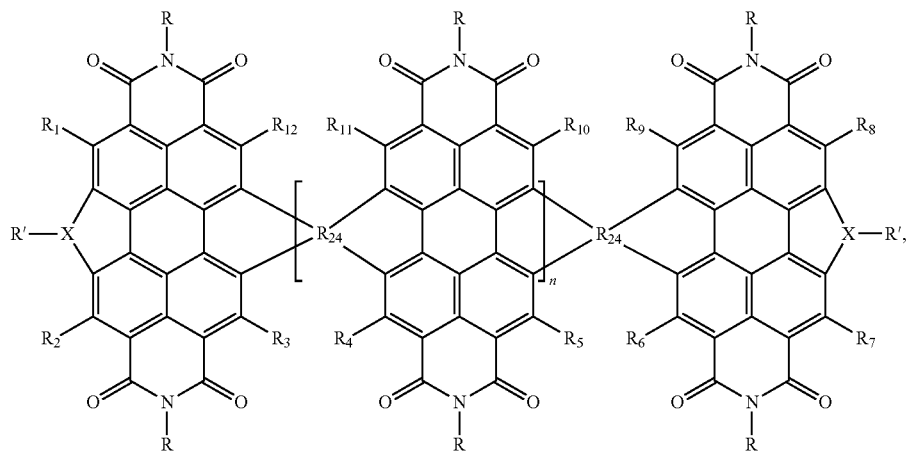
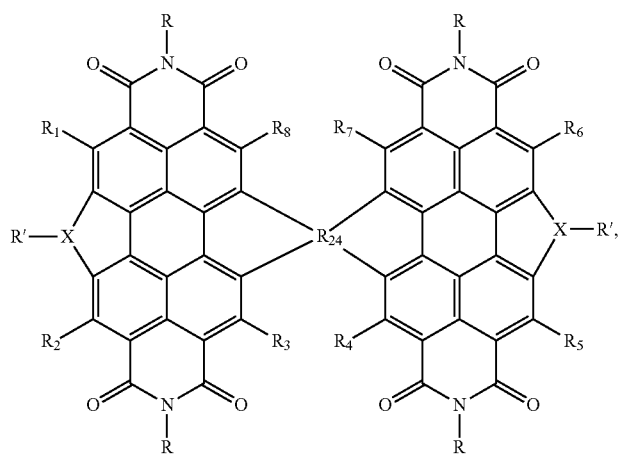
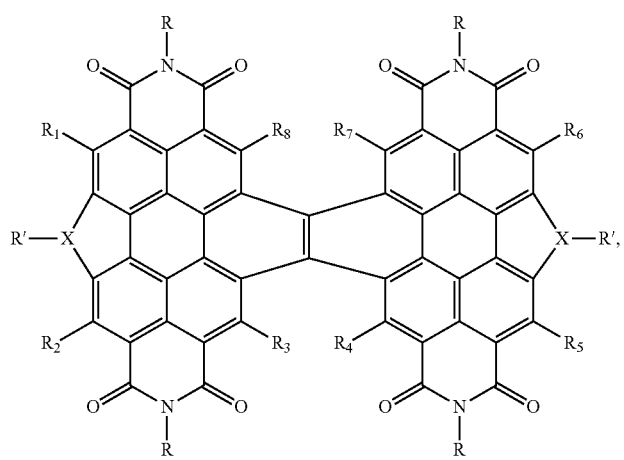

-continued
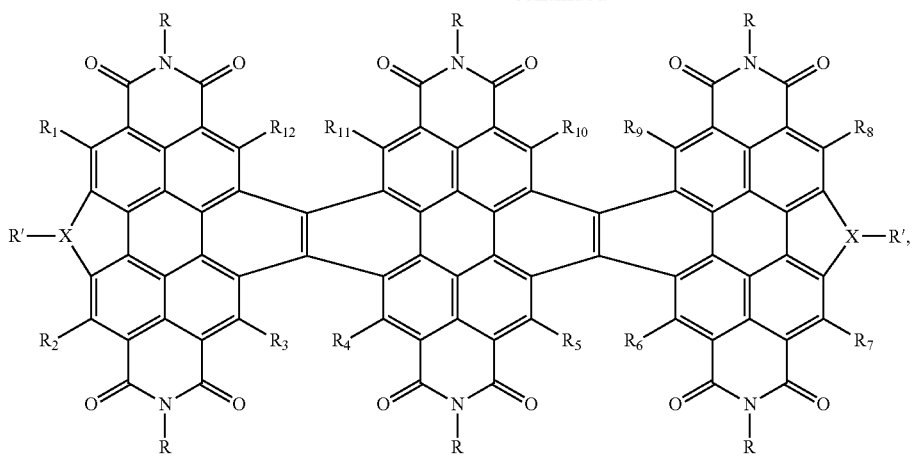
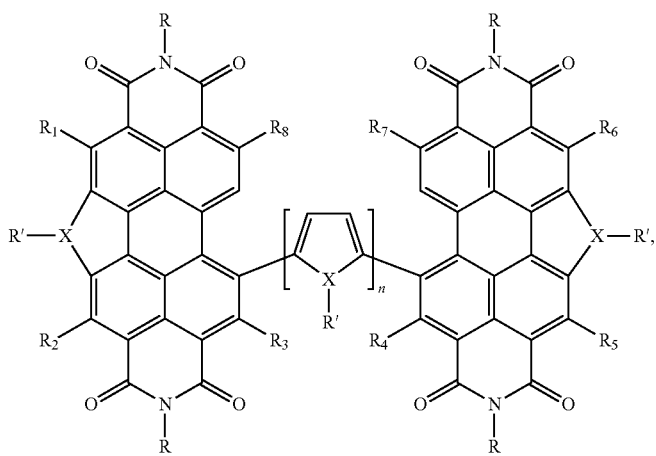
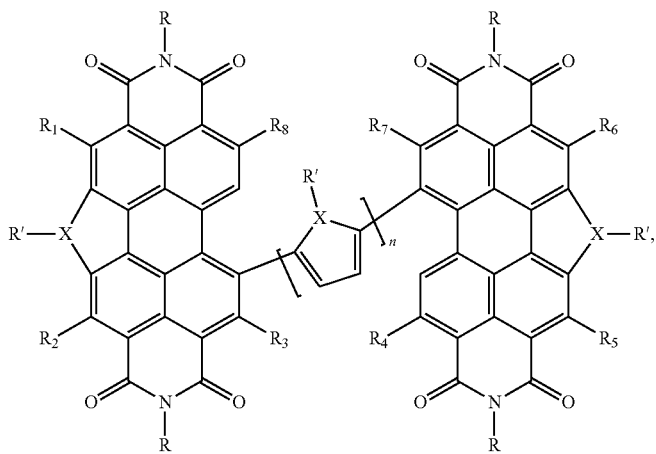

-continued
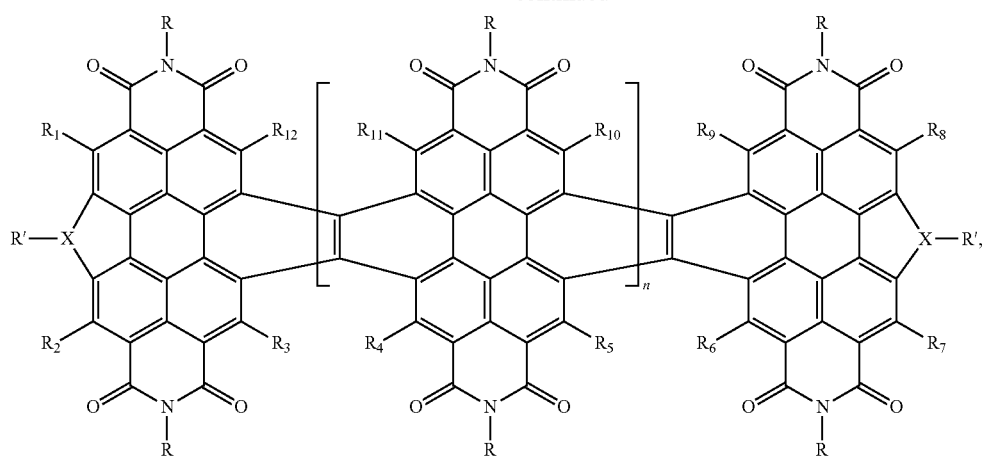
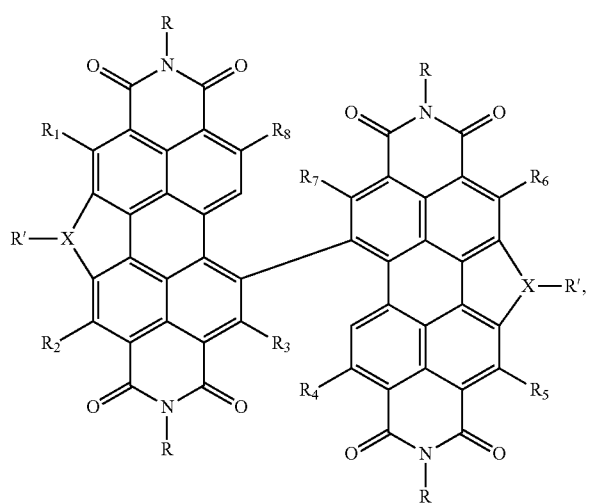
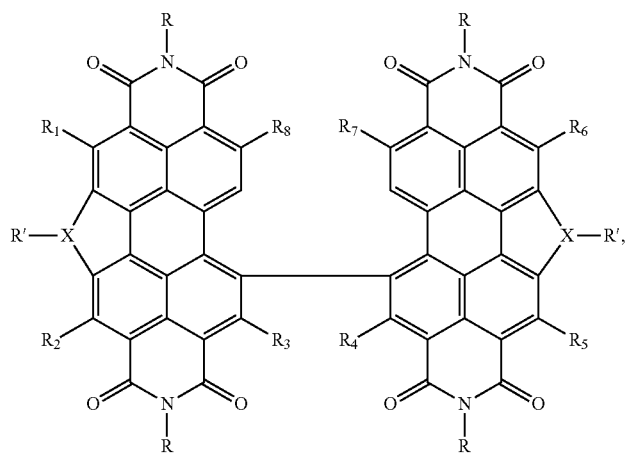

-continued
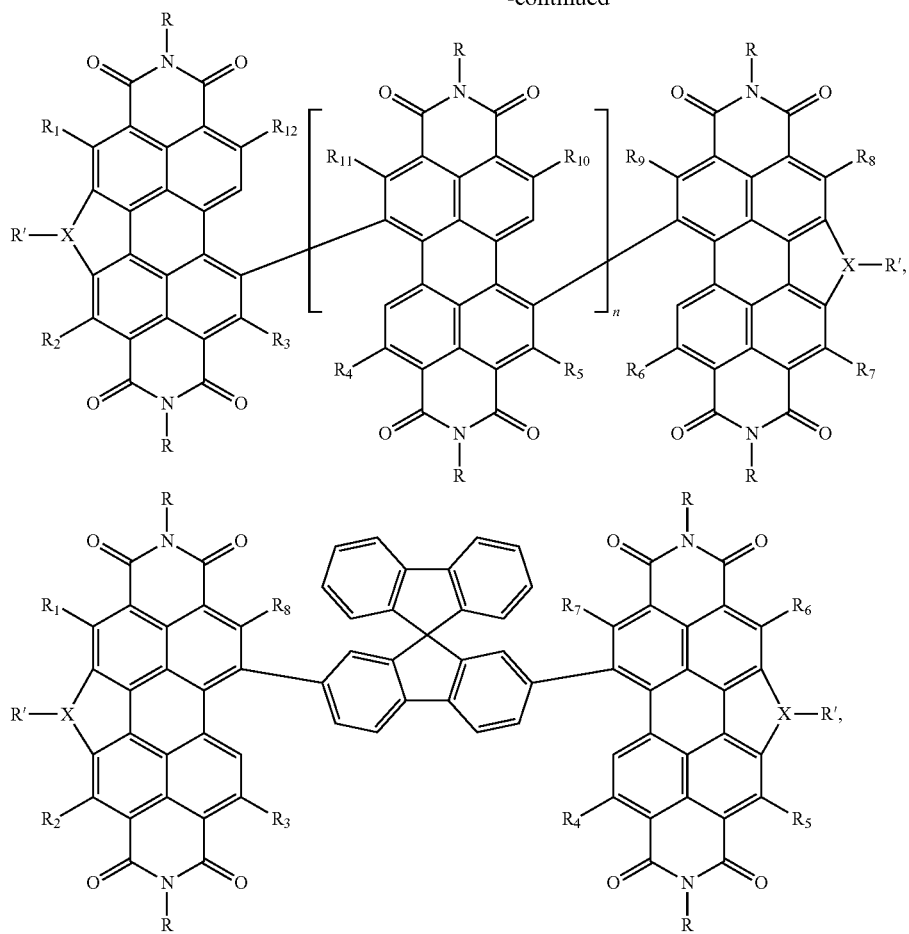
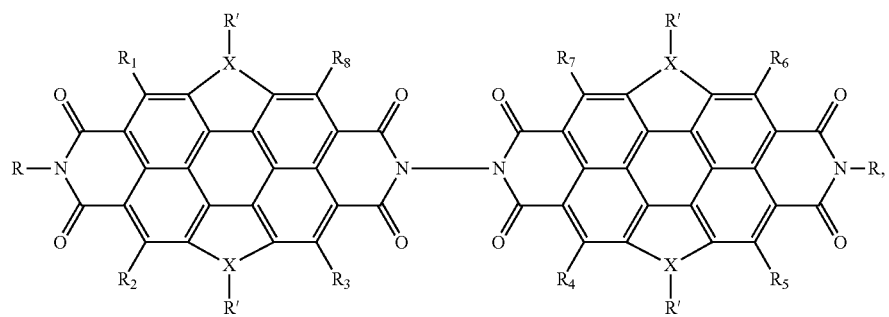
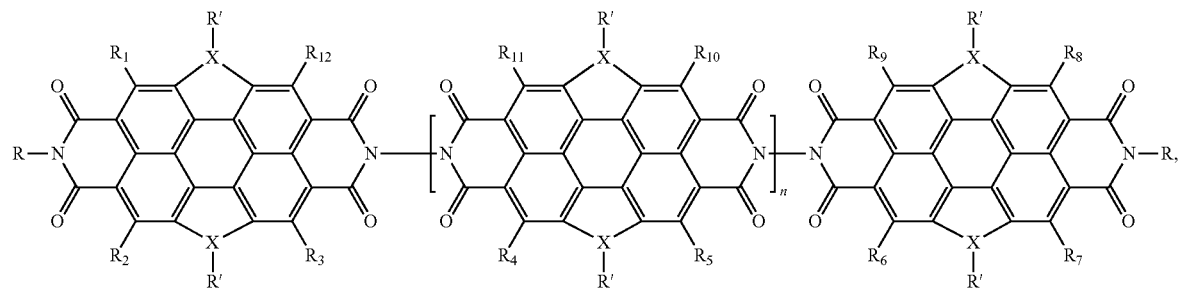

-continued
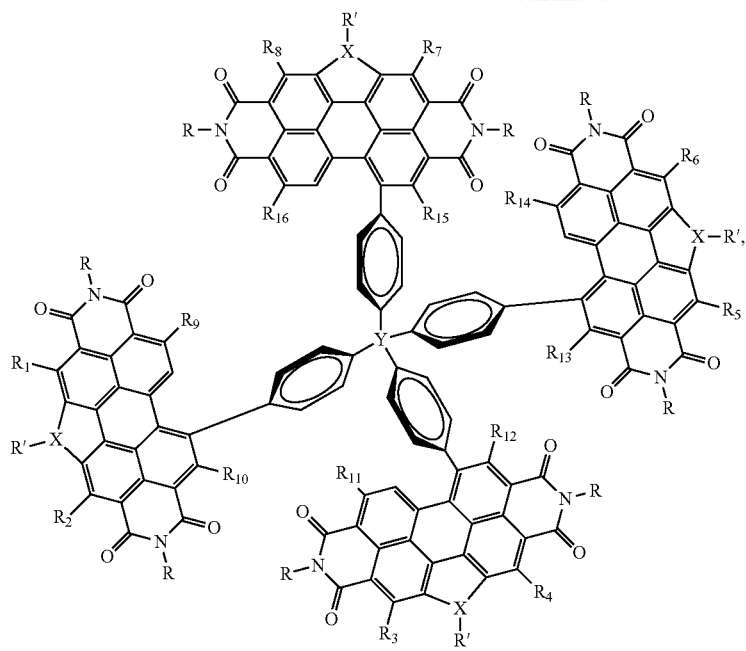
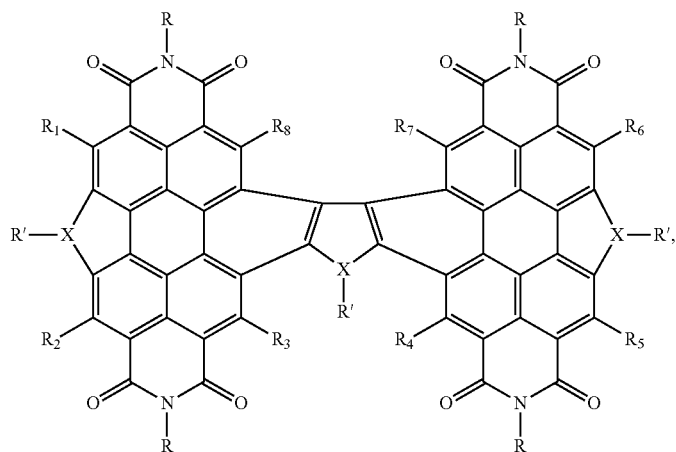
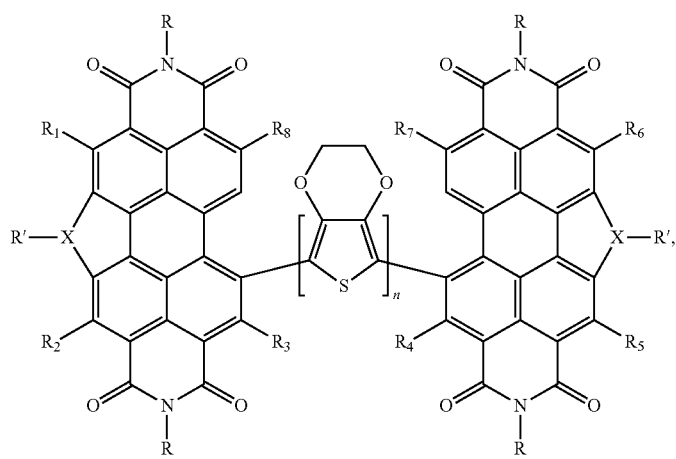

-continued
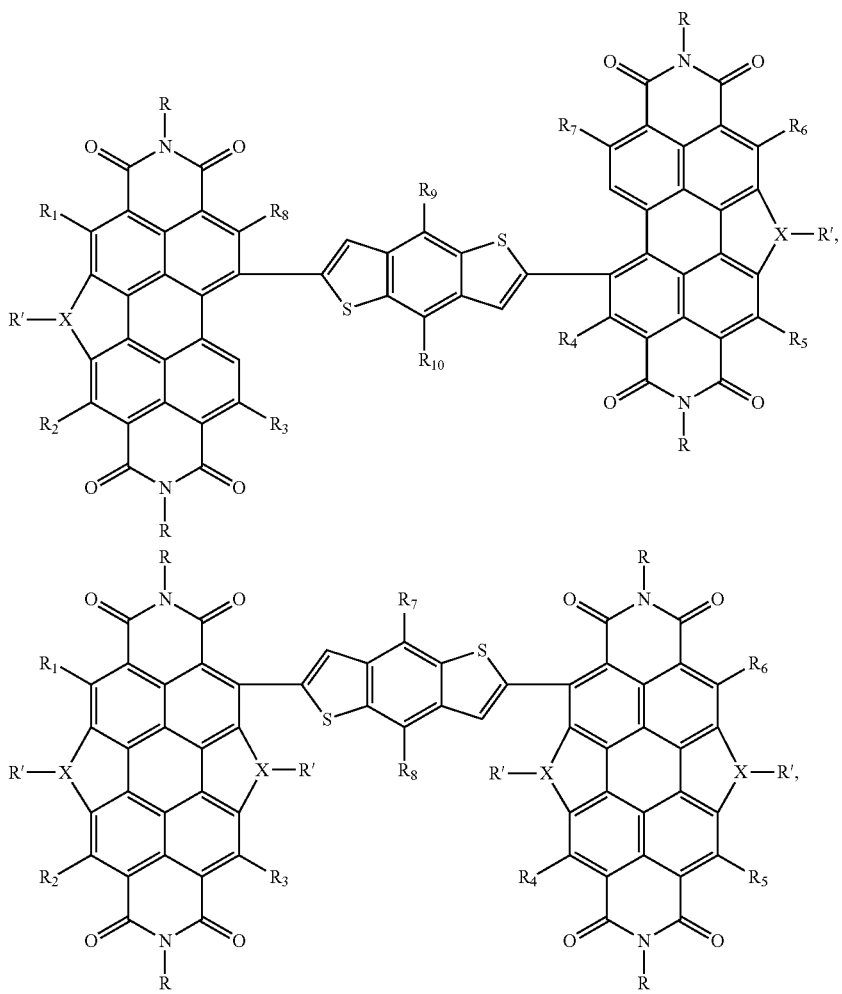
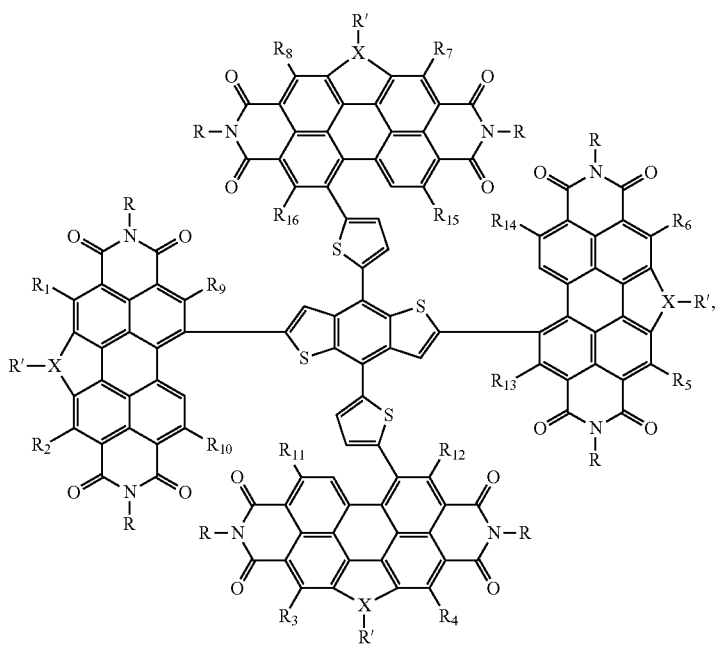

-continued
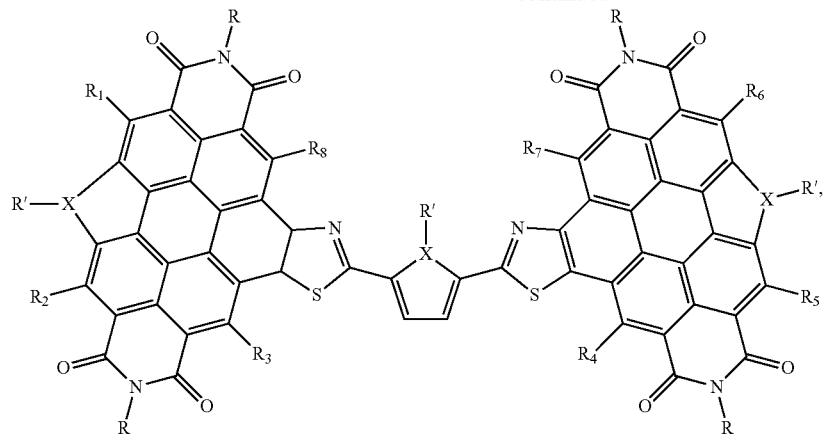
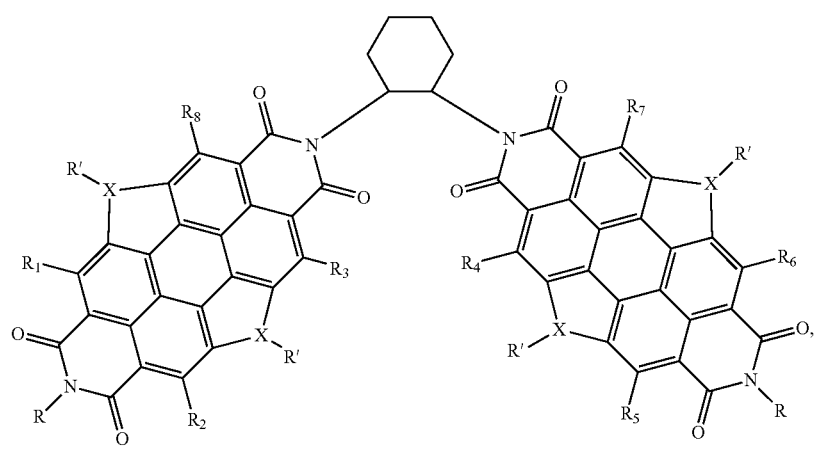
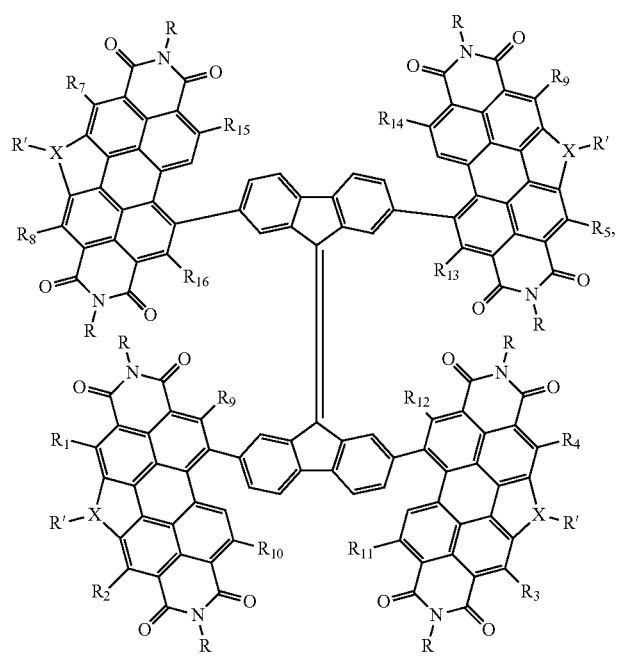

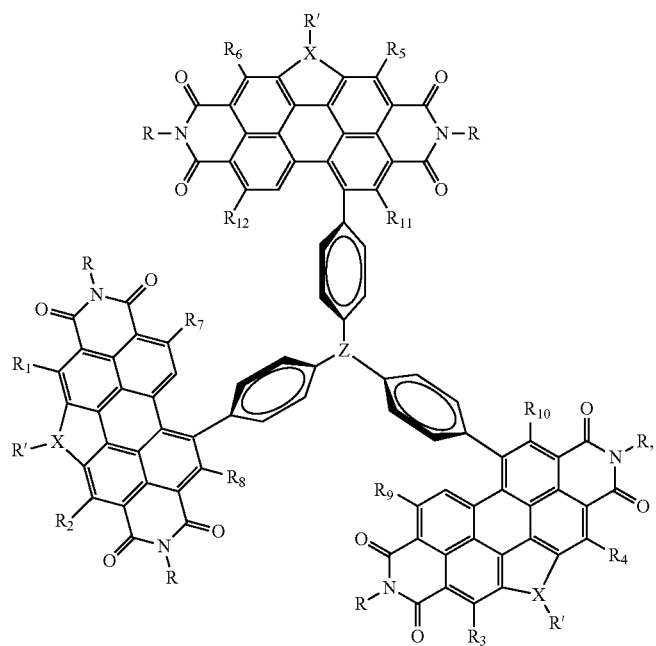
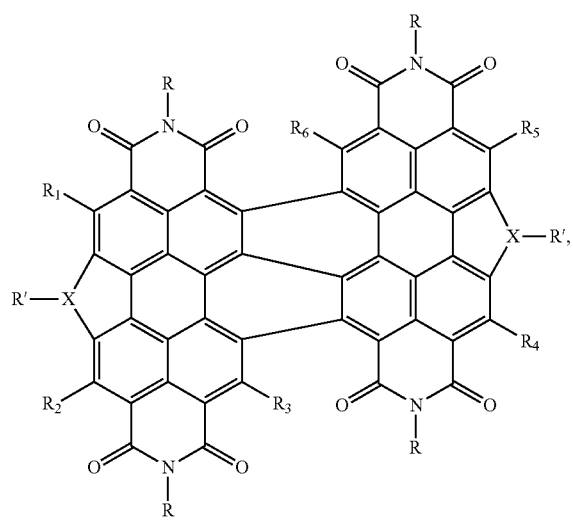

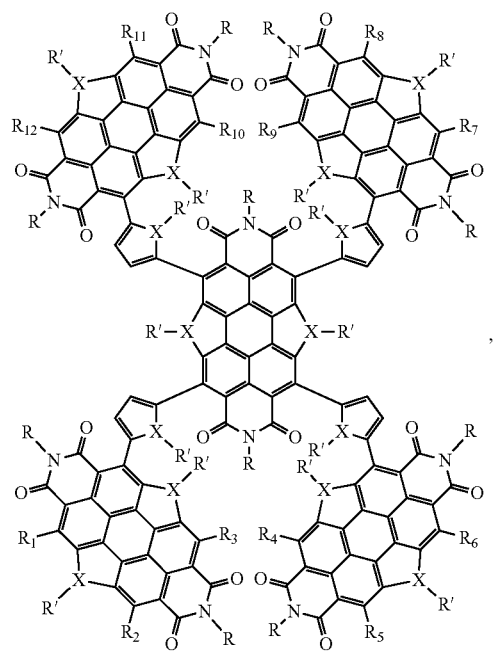
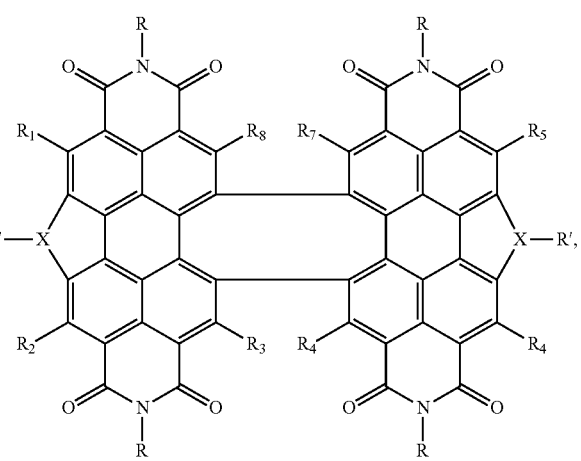
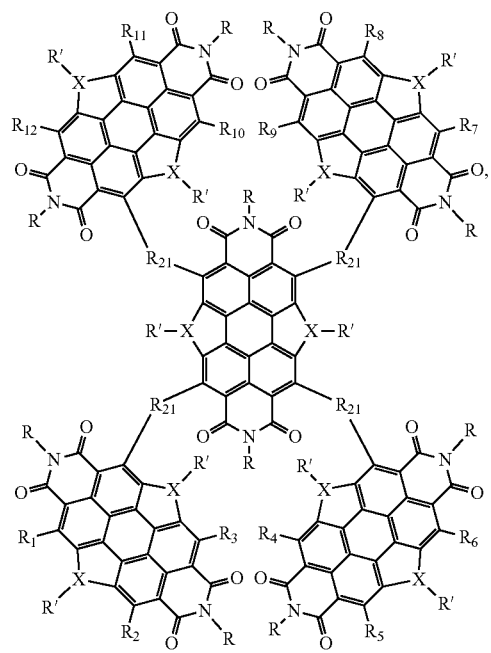
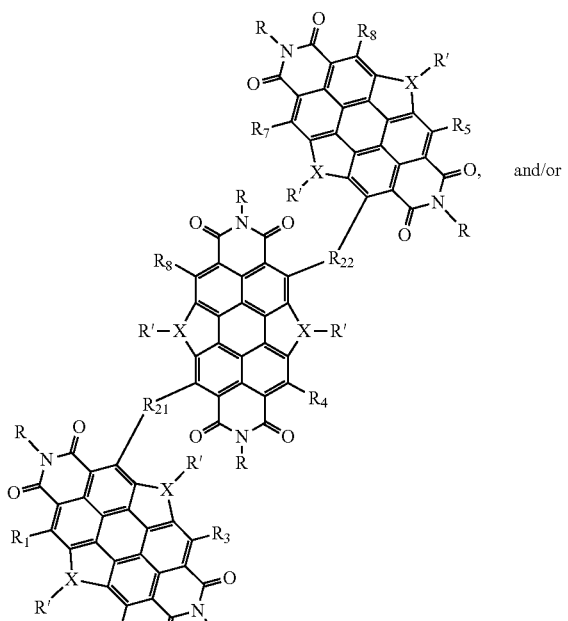
and/or wherein X is

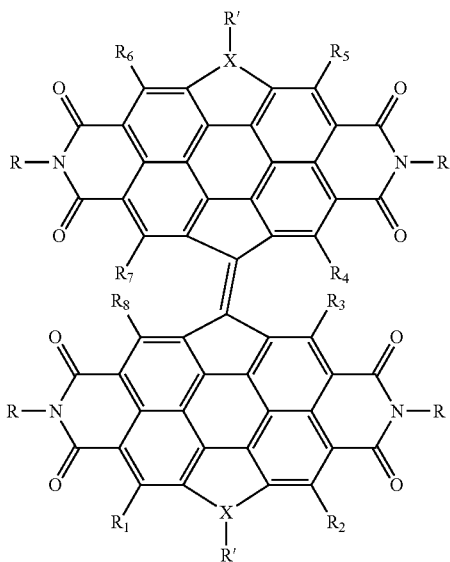

O, O—O, S, S—S, Se, or Se—Se, and R' is nothing; or X is N, P and R' is hydrogen, an alkyl group or an aryl group; Y is C, Si, or Ge; Z is N or P; R and $R_1$ to $R_{16}$ are each independently hydrogen, an alkyl group, or an aryl group ($R_1$ to $R_{16}$ can be the same or different); $R_{21}$ to $R_{22}$ are each independently nothing, an alkylene group, or an arylene group; $R_{23}$ is a trivalent aliphatic or a trivalent aromatic group; the $R_{24}$ are each independently a tetravalent aliphatic group or a tetravalent aromatic group; and n=0 to 10. If a substituent (e.g., X, Y, Z, R, R', $R_1$-$R_{24}$) occurs more than one time in a compound, it can be different or the same in each occurrence.

In the fused PDIs and multi-PDIs listed hereby, the available carbon atoms corresponding to the (1,6,7,12) carbons in the mono PDI structure are defined as the bay position carbons, or the bay positions. The available carbon atoms corresponding to the (2,5,8,11) carbons in the mono PDI structure are defined as the ortho-position carbons, or the ortho-positions.

The term "chalcogen" refers to a chemical element which is a member of the oxygen group, Group 16 of the periodic table. The term "pnictogen" refers to a chemical element which is a member of the nitrogen group, Group 15 of the periodic table.

The term "alkyl" refers to monovalent straight, branched, or cyclic aliphatic hydrocarbon groups having from 1 to 50 carbon atoms. The term "alkylene" refers to bivalent straight, branched, or cyclic aliphatic hydrocarbon groups having from 1 to 50 carbon atoms. The alkyl or alkylene groups may further contain heteroatoms, including but not limited to, boron, silicon, germanium, nitrogen, phosphorus, oxygen, sulfur, selenium, fluorine, chlorine, bromine, or iodine. The term "aryl" refers to a monovalent aromatic carbocyclic group of from 2 to 30 carbon atoms having a single ring (e.g., phenyl) or multiple condensed rings (e.g., naphthyl or anthryl) which condensed rings may or may not be aromatic provided that the point of attachment is at an aromatic carbon atom. The term "arylene" refers to a bivalent aromatic carbocyclic group of from 2 to 30 carbon atoms. The aryl or arylene groups may further contain heteroatoms, including but not limited to, boron, silicon, germanium, nitrogen, phosphorus, oxygen, sulfur, selenium, fluorine, chlorine, bromine, or iodine.

In order to obtain the desired alkyl or aryl functionalizations at the ortho-positions, the Grignard reagent is appropriately selected. In one or more embodiments, the Grignard reagent has the formula A-MgBr, where A is the alkyl or aryl to be substituted at the ortho-positions to form the desired alkyl or aryl functionalized PDI.

Block 2908 represents optionally solution processing the composition of matter of block 2906 as an electron transport layer in a device 3000 (referring to FIG. 30A), such as, but not limited to, a solar cell such as an organic or hybrid solar cell. In one or more embodiments, the solar cell comprises a substrate 3002; a transparent anode 3004 on the substrate; an anode interface/hole transport layer HTL (3006); the active absorbing region 3008 (active layer, e.g., PVSK) on the anode interface layer; the electron transport layer ETL 3010 comprising the PDI on the active absorbing region; and a cathode 3012 on the electron transport layer. The active absorbing region converts sunlight into electrons and holes, the electrons are transported by the electron transporting layer to the cathode.

The term "perovskite (PVSK)", as used herein refers to a material with a three-dimensional crystal structure related to that of $CaTiO_3$ or a material comprising a layer of material, wherein the layer has a structure related to that of $CaTiO_3$. The perovskite structure can be represented by the formula $AMX_3$, wherein A and M are cations of different sizes, typically A having a charge of +1 and M having a charge of +2 and X is an anion (charge −1). When A, M and X are varied, the different ion sizes may cause the structure of the perovskite material to distort away from the highly symmetric cubic structure adopted by $CaTiO_3$ to a lower-symmetry distorted structure. The symmetry will also be lower if the material comprises a layer that has a structure related to that of $CaTiO_3$. A perovskite material can be represented by the formula $AMX_3$, wherein A is at least one cation, M is at least one cation and X is at least one anion. When the perovskite comprises more than one A cation, the different A cations may be distributed over the A sites in an ordered or disordered way. When the perovskite comprises more than one M cation, the different M cations may be distributed over the M sites in an ordered or disordered way. When the perovskite comprises more than one X anion, the different X anions may be distributed over the X sites in an ordered or disordered way. In the optoelectronic device of the invention, the perovskite may comprise a first cation, a second cation, and at least one anion. As the skilled person will appreciate, the perovskite may comprise further cations or further anions. For instance, the perovskite may comprise two, three or four different first cations; two, three or four different second cations; and two, three or four different anions.

In one or more embodiments, A is at least one organic or inorganic cation, which may be selected from the group consisting of $H^+$, $H_3O^+$, $NH_4^+$, $H_3NOH^+$, $Li^+$, $Na^+$, $K^+$, $Rb^+$, $Cs^+$, $Cu^+$, $Ag^+$, $BiO^+$, methylammonium $CH_3NH_3^+$, ethylammonium $(C_2H_5)NH_3^+$, alkylammonium, formamidinium $NH_2(CH)NH_2^+$, guanidinium $C(NH_2)_3^+$, imidazolium $C_3N_2H_5^+$, hydrazinium $H_2N-NH3^+$, azetidinium $(CH_2)_3NH_2^+$, dimethylammonium $(CH_3)_2NH_2^+$, tetramethylammonium $(CH_3)_4N^+$, phenylammonium $C_6H_5NH_3^+$, arylammonium, and heteroarylammonium; In one or more embodiments, A is methylammonium $CH_3NH_3^+$ or formamidinium $NH_2(CH)NH_2^+$. M is at least one divalent metal cation, which may be selected from the group consisting of $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, Sn$^{2+}$, Pb$^{2+}$, Sn$^{2+}$, Yb$^+$ and Eu$^{2+}$; in one or more embodiments, M is preferably Pb$^{2+}$ or Sn$^{2+}$; X is a monovalent anion, including but not limited to a halide anion F$^-$, Cl$^-$, Br$^-$, I$^-$, a cyanide CN$^-$, or a formate HCOO$^-$; X can be a single kind of anion, or comprise two, three of four different kinds of anions.

In one or more embodiments, the active layer may comprise a material of the formula $A_aB_bM_mX_x$, wherein A represents a monovalent inorganic cation, a monovalent organic cation or mixture of different monovalent organic or inorganic cations; B represents a divalent inorganic cation, a divalent organic cation or mixture of different divalent organic or inorganic cations; M is Bi$^{3+}$ or Sb$^{3+}$; X represents a monovalent halide anion, or mixture of different monovalent halide anions; a, b represent 0 or any positive numbers, m, x represent any positive numbers, and a+2b+3m=x. In one or more embodiments, B is a divalent primary, secondary, tertiary, or quaternary organic ammonium cation with 1 to 100 carbons and 2 to 30 heteroatoms, wherein two of the heteroatoms are positively charged nitrogen atoms. In certain instances, B is selected from the group consisting of Mg$^{2+}$, Ca$^{2+}$, Sr$^{2+}$, Ba$^{2+}$, Sn$^{2+}$, Ti$^{2+}$, V$^{2+}$, Ni$^{2+}$, Cr$^{2+}$, Co$^{2+}$, Fe$^{2+}$, Cu$^+$, Zn$^{2+}$, Mn$^{2+}$, Ag$^{2+}$, NH$_3$CH$_2$CH$_2$NH$_3{}^{2+}$, NH$_3$(CH$_2$)$_6$NH$_3{}^{2+}$, NH$_3$(CH$_2$)$_8$NH$_3{}^{2+}$, and NH$_3$C$_6$H$_4$NH$_3{}^{2+}$ In one or more embodiments, the active layer may comprise a material selected from the group consisting of MX$_3$, AMX$_4$, A$_3$MX$_6$, A$_3$M$_2$X$_9$, perovskites, A$_2$A'MX$_6$ double perovskites, and A$_{n+1}$A'$_{n/2}$M$_{n/2}$X$_{3n+1}$ Ruddlesden-Popper phases. wherein A represents a monovalent inorganic cation, a monovalent organic cation; A' represents a second monovalent organic or inorganic cation; M is Bi$^{3+}$ or Sb$^{3+}$; X represents a monovalent halide anion, or mixture of different monovalent halide anions. As used herein, the term "double perovskite" refers to a compound which is closely related to the perovskite AMX$_3$ compound but has a unit cell twice that of perovskite and two different metals on the M sites, so the formula can be written as A$_2$A'MX$_6$. The term "Ruddlesden-Popper phase" as used herein refers to a form of layered perovskite structures which consist of two-dimensional perovskite slabs and additional cation interlayers. The general formula of those phases can be written as $A_{n+1}A'_{n/2}M_{n/2}X_{3n+1}$. In certain instances, the active layer is a bismuth halide selected from the group consisting of BiI$_3$, K$_3$Bi$_2$I$_9$, Rb$_3$Bi$_2$I$_9$, Cs$_3$Bi$_2$I$_9$, (CH$_3$NH$_3$)$_3$Bi$_2$I$_9$, (NH$_2$(CH)NH$_2$)$_3$Bi$_2$I$_9$, and (NH$_3$(CH$_2$)$_2$NH$_3$)$_2$Bi$_2$I$_{10}$.

The perovskite photovoltaic device may have a standard or inverted structure. It may further comprise a substrate, an first electrode deposited on the substrate, a second electrode, an electron conducting/hole blocking layer deposited either between the first electrode and the active layer, or between the active layer and the second electrode, and an optional hole conducting/electron blocking layer deposited either in between the first electrode and the active layer, or between the active layer and the second electrode.

The electron transporting layer may have a thickness of 2 nm to 500 nm, preferably a thickness of 20 nm to 200 nm, more preferably a thickness of 50 nm to 100 nm.

Figure 1:
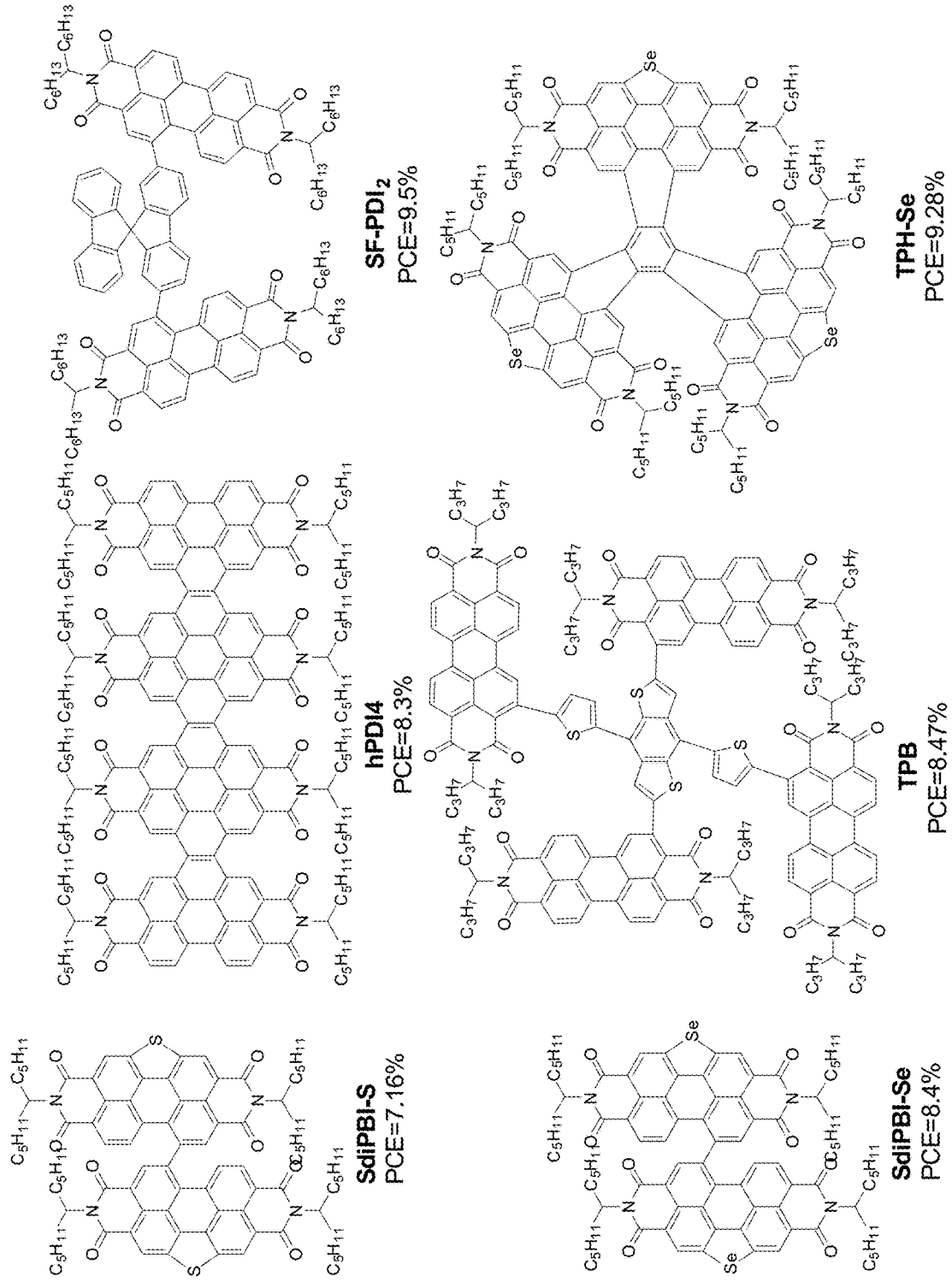
FIG. 1. Chemical structures of several PDI-based non-fullerene acceptors (SdiPBI-S,[21] hPDI4,[22] SF-PDI2,[23] SdiPBI-Se,[24] TPB,[25] and TPH-Se[26])

The hole transporting/conducting layer can be selected from but not limited to the group consisting of poly(3,4-ethylenedioxythiophene):polystyrene sulfonate (PEDOT:PSS), p-type organic small molecule semiconductors such as Spiro-MeOTAD, pentacene, biscarbazolylbenzene, oligomer semiconductors, polymer semiconductors such as PTAA, poly(3-hexylthiophene-2,5-diyl) (P3HT), donor-acceptor copolymer semiconductors such as PCPDTBT, PCDTBT, metal oxides such as CuI, CuBr, CuSCN, Cu$_2$O, CuO or CuS, VO$_x$, NbO$_x$, MoO$_x$, WO$_x$, NiO$_x$ where x is 3 or less than 3, or other main group or transition metal oxides and a compound as shown in FIG. 1 of U.S. Ser. No. 14/954,131.

The active layer, electron transporting/hole blocking layers, hole transporting/electron blocking layers of the electronic device may be deposited by solution casting or vapor deposition. Illustrative thin film deposition methods include a spin coating method, a casting method, a microgravure coating method, a gravure coating method, a bar coating method, a roll coating method, a blade coating method, a wire bar coating method, a dip coating method, a spray coating method, a free span coating method, a dye coating method, a screen printing method, a flexo printing method, an offset printing method, an inkjet printing method, a dispenser printing method, a nozzle coating method and a capillary coating method, for forming a film from a solution.

In one example, the device comprises a solar cell device 3000 (referring to FIG. 30A), comprising an anode 3004 (e.g., Indium Tin Oxide coated glass or PET); an anode interface or hole transport layer 3006 (e.g. PTAA) on the anode; an electron transport layer ETL 3010 comprising a compound having at least one the structure selected from:

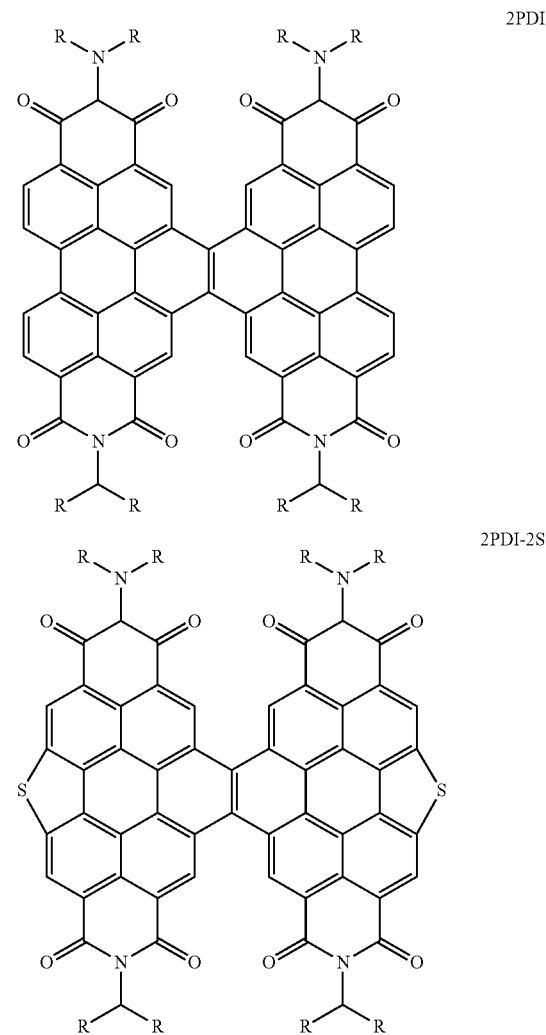

-continued

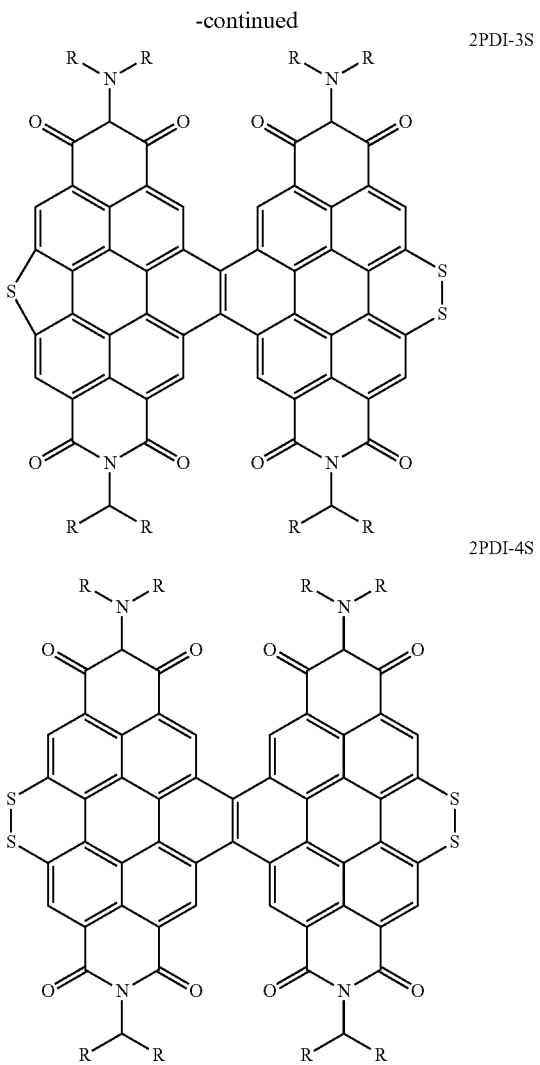

2PDI-3S

2PDI-4S wherein the R are independently hydrogen, an alkyl group, an aryl group, or a solubilizing chain; a cathode 3012 (e.g., silver) on the electron transport layer; and an active absorbing region 3008 between the electron transport layer and the anode interface/hole transport layer. The active absorbing region 3008 comprises an organic-inorganic hybrid perovskite (PVSK) (e.g., MAPbI$_3$), wherein, in response to electromagnetic radiation absorbed in the PVSK, the active absorbing region (1) generates electrons outputted through the electron transport layer to the cathode, and (2) generates holes outputted through the hole interface/transport layer to the anode, so as to generate a voltage across the cathode and the anode.

Surprisingly and unexpectedly, in one or more examples, the compound in the electron transport layer has a composition (e.g., 2PDI-4S, 2-PDI) such that a PCE, $J_{SC}$ and/or fill factor of the device do not decrease (or even the PCE, $J_{SC}$ and/or fill factor increase) after 400 hours of continuous operation of the device under 1 Sun illumination, as compared to when the device is first turned on (e.g., after 1 minute or 1 hour of operation). In one example the PCE does not fall below 15% after the 400 hours of continuous operation. In contrast, the device including PCBM as an electron transport layer shows rapid and monotonic degradation from 17% PCE to 2% PCE within 300 hours of operation, under the same operating conditions (FIG. 24).

In one or more examples, the device has surprising and unexpected thermal stability. For example, the electron transport layer may have a composition (e.g., 2-PDI, 2PDI-4S) such that a PCE increases (e.g., by at least 50%) after the device is heated to at least 100 degrees Celsius. In contrast, the PCE of the device comprising an electron transporting layer including PCBM decrease (by 30%) after heating the device to 100 degrees Celsius under the same conditions.

Advantages and Improvements

The power conversion efficiency of organic solar cells depends on their short circuit current ($J_{sc}$), open circuit voltage ($V_{oc}$) and fill factor (FF).[11,12] While design rules exist to maximize the $J_{sc}$ of BHJs by tuning their optical absorption, it is more challenging to optimize the FF and $V_{oc}$ relative to their limits for a given BHJ. In the past decade, the FF of organic bulk heterojunction (BHJ) solar cells has reached over 75% for single junction cells.[13,14] High carrier mobility of the donor and acceptor in blends is recognized as a critical factor in this gain,[15] along with electrode layers that do not cause parasitic series resistance.[11] The limit of the $V_{oc}$ of BHJ s is under investigation with clear evidence that the energetics of the interfacial charge transfer state between the donor and acceptor where charge generation and recombination occurs plays a key role.[11,16-18]

The design of acceptors, electron transporting materials, for BHJs has historically been difficult. The first efficient BHJs were formed with fullerenes due to their efficient and fast charge transfer with donor materials and glassy structure that allows nanoscale phase separation. However, synthetic methods to tune the electronic levels of fullerenes leading to energetic losses in many BHJs. The development of non-fullerene acceptors (NFAs), both small molecules and polymers, has led to advances.[2,3] NFAs have the advantages of increased optical absorption and ready chemical tuning of their electronic structure. PCE above 13% have been reported for fullerene-free BHJ solar cells.[3,3]

Rylene diimides are widely investigated as NFAs due to their good electron-accepting ability, high electron mobility, and substitutions that modify the frontier molecular orbital levels.[2,19,20] Early studies of perylene diimide (PDI) acceptors revealed efficient charge transfer with donors, but large scale phase separation due to fast crystallization of the PDI. Many of the most successful perylene diimide NFAs have a molecular design that inhibits fast crystallization by either linking multiple PDI groups to a central core or by fusing the PDI at the bay position (FIG. 1). The introduction of heteroatoms to PDI core allows for further tuning of the electronic levels by modifying the conjugated core.[18]

Thus, improvements in the molecular design of both the donor and acceptor along with improved control of self-assembly of the nanostructured BHJ[2,4,11] are required to reach the potential upper limits of the performance of BHJ solar cells. The present disclosure satisfies this need by disclosing a novel composition, 2PDI-nS, which can (in one or more examples) be synthesized in 5 steps with high overall yield. The sulfuration reaction can be applied to various PDI derivatives, producing compounds listed from page 36-48: three new sulfur-fused PDI dimers, 2PDI-2S, 2PDI-3S S, and 2PDI-4S have been designed and synthesized.

The fused PDIs have glassy structure and exhibit strong light absorption, high electron mobility close to 0.1 cm$^2$/Vs and higher than the mobility of PC$_{61}$BM, and a tunable LUMO which can match better with the donor materials in an organic bulk heterojuction solar cell or the perovskite material in a perovskite solar cell, help charge separation, and improve electron injection and transport. The results presented herein illustrate that the number of sulfur atoms have a remarkable, surprising, and unexpected influence on the properties of the 2PDI-nS as non-fullerene acceptors in an active layer of a solar cell, as an active layer of an n-type transistor, or as an ETL.

For example, the modified example molecule 2PDI-4S exhibited a highly ordered structure and proper scale phase separation, which facilitated the charge carrier separation and transport, leading to higher fill factor (FF) and PCE. More importantly, the device performances were all above 5.4% and the best PCE reached 6.89% (2PDI-2S) which is higher than the reported results for the non thio-substituted parent units (PCE=5.63%) under the same conditions.[23] Moreover, the highest FF exceeded 70%, which is one of the best results reported for PDI-based non-fullerene acceptor BHJ solar cells to date. Such an outstanding photovoltaic property indicates that sulfur-fused PDI-based small molecules are highly promising candidates for manufacturing high-performance, large-area BHJ solar cells through solution-processing techniques.

Perovskite solar cell devices with PDI based compounds as the electron transporting layer (ETL) showed superior thermal stability over devices with fullerene ($PC_{61}BM$) as ETL, the PCE of 2PDI-nS devices boost upon thermal annealing at 100° C. due to the increase in FF and retention or slight increase in $J_{SC}$ to over 20 mA/cm². The 2PDI compounds are expected to lead to better device air and photo stability too.

The term "aryl" refers to a monovalent aromatic carbocyclic group of from 2 to 30 carbon atoms having a single ring (e.g., phenyl) or multiple condensed rings (e.g., naphthyl or anthryl), where condensed rings may or may not be aromatic provided that the point of attachment is at an aromatic carbon atom. Examples of aryl include phenyl, biphenyl, terphenyl, quaterphenyl, naphthyl, tetrahydronaphthyl, anthracenyl, dihydroanthracenyl, benzanthracenyl, dibenzanthracenyl, phenanthrenyl, fluorenyl, pyrenyl, idenyl, azulenyl, chrysenyl. An aryl group may be optionally substituted by one or more optional substituents as herein defined.

The term "alkyl" refers to monovalent straight, branched, or cyclic aliphatic hydrocarbon groups having from 1 to 50 carbon atoms. Examples of straight, branched or cyclic alkyl chains include but not limited to methyl, ethyl, n-propyl, n-butyl, n-pentyl, n-hexyl, n-heptyl, octyl, nonyl, decyl, undecyl, dodecyl, tridecyl, tetradecyl, pentadecyl, hexadecyl, heptadecyl, octadecyl, nonoadecyl, eicosyl, isopropyl, sec-butyl, tent-butyl, 1,2-dimethylpropyl, 1,1-dimethylpropyl, 4-methylpentyl, 1-methylpentyl, 2-methylpentyl, 3-methylpentyl, 1,1-dimethylbutyl, 2,2-dimethylbutyl, 3,3-dimethylbutyl, 1,2-dimethylbutyl, 1,3-dimethylbutyl, 1,2,2-trimethylpropyl, 1,1,2-trimethylpropyl, 5-methylhexyl, 1-methylhexyl, 2,2-dimethylpentyl, 3,3-dimethylpentyl, 4,4-dimethylpentyl, 1,2-dimethylpentyl, 1,3-dimethylpentyl, 1,4-dimethylpentyl, 1,2,3-trimethylbutyl, 1,1,2-trimethylbutyl, 1,1,3-trimethylbutyl, 6-methylheptyl, 1-methylheptyl, 1,1,3,3-tetramethylbutyl, 1-, 2-, 3-, 4-, 5-, 6- or 7-methyloctyl, 1-, 2-, 3-, 4- or 5- ethylheptyl, 1-, 2- or 3-propylhexyl, 1-, 2-, 3-, 4-, 5-, 6-, 7- and 8-methylnonyl, 1-, 2-, 3-, 4-, 5- or 6-ethyloctyl, 1-, 2-, 3- or 4-propylheptyl, dimethyloctyl, 1-, 2-, 3-, 4-, 5-, 6-, 7-, 8- or 9-methyldecyl, 1-, 2-, 3-, 4-, 5-, 6- or 7-ethylnonyl, 1-, 2-, 3- or 4- or 5-propyloctyl, 1-, 2- or 3-butylheptyl, 1-pentylhexyl, 1-, 2-, 3-, 4-, 5-, 6-, 7-, 8-, 9- or 10-methylundecyl, 1-, 2-, 3-, 4-, 5-, 6-, 7- or 8-ethyldecyl, 1-, 2-, 3-, 4-, 5- or 6-propylnonyl, 1-, 2-, 3- or 4-butyloctyl, 1-, 2-pentylheptyl, branched butyl, pentyl, hexyl, heptyl, octyl, nonyl, decyl, undecyl, dodecyl, tridecyl, tetradecyl, pentadecyl, hexadecyl, heptadecyl, octadecyl, nonoadecyl, eicosyl with one or more branch points at any carbon of the alkyl chain, such as 2 (or 1, or 3, or 4)-ethylhexyl, 2 (or 1, or 3, or 4)-hexyldecyl, 2 (or 1, or 3, or 4)-octyldodecyl, 2 (or 1 or 3, or 4)-butyloctyl, 4 (or 1, or 2, or 3, or 5, or 6)-butyldecyl, 5 (or 1, or 2, or 3, or 4, or 6, or 7)-butylundecyl, 6 (or 1, or 2, or 3, or 4, or 5, or 7, or 8)-butyldodecyl, 12 (or 1, or 2, or 3, or 4, or 5, or 6, or 7, or 8, or 9, or 10, or 11, or 13, or 14)-butyloctadecyl, mono- or polycyclic alkyl groups such as cyclopropyl, cyclobutyl, cyclopentyl, cyclohexyl, cycloheptyl, cyclooctyl, cyclononyl, cyclodecyl, trifluoromethyl, 2,2,2-trifluoroethyl, pentafluoroethyl, and the like.

Moreover, while organic BHJ solar cells have achieved power conversion efficiencies above 13% through the design of electronic donating and electron accepting materials, a significant question remaining was whether the loss to the open circuit voltage can be reduced from the interface state energy between the donor and acceptor. The perylenediimide acceptors described herein are the first series of compounds with tunable electron affinities that all show reduced $V_{oc}$ loss and high fill factors.

REFERENCES

The following references are incorporated by reference herein.

References for Examples 1-6

[1] L. Dou, J. You, Z. Hong, Z. Xu, G. Li, R. A. Street, Y. Yang, *Adv. Mater.* 2013, 25, 6642.
[2] C. Yan, S. Barlow, Z. Wang, H. Yan, A. K.-Y. Jen, S. R. Marder, X. Zhan, *Nat. Rev. Mater.* 2018, 3, 18003.
[3] J. Hou, O. Inganäs, R. H. Friend, F. Gao, *Nat. Mater.* 2018, 17, 119.
[4] N. Li, I. McCulloch, C. J. Brabec, *Energy Environ. Sci.* 2018, 11, 1355.
[5] A. J. Heeger, *Adv. Mater.* 2014, 26, 10.
[6] W. Zhao, D. Qian, S. Zhang, S. Li, O. Inganäs, F. Gao, J. Hou, *Adv. Mater.* 2016, 28, 4734.
[7] W. Li, L. Ye, S. Li, H. Yao, H. Ade, J. Hou, *Adv. Mater.* 2018, 30, 1707170.
[8] Z. Zheng, O. M. Awartani, B. Gautam, D. Liu, Y. Qin, W. Li, A. Bataller, K. Gundogdu, H. Ade, J. Hou, *Adv. Mater.* 2017, 29, 1604241.
[9] W. Gao, T. Liu, R. Ming, Z. Luo, K. Wu, L. Zhang, J. Xin, D. Xie, G. Zhang, W. Ma, H. Yan, C. Yang, *Adv. Funct. Mater.* 2018, 1803128.
[10] W. Wang, B. Zhao, Z. Cong, Y. Xie, H. Wu, Q. Liang, S. Liu, F. Liu, C. Gao, H. Wu, Y. Cao, *ACS Energy Lett.* 2018, 1499.
[11] I. Ramirez, M. Causa', Y. Zhong, N. Banerji, M. Riede, *Adv. Energy Mater.* 2018, 1703551.
[12] R. A. J. Janssen, J. Nelson, *Adv. Mater.* 2013, 25, 1847.
[13] S. Li, L. Ye, W. Zhao, X. Liu, J. Zhu, H. Ade, J. Hou, *Adv. Mater.* 2017, 29, 1704051.
[14] X. Guo, N. Zhou, S. J. Lou, J. Smith, D. B. Tice, J. W. Hennek, R. P. Ortiz, J. T. L. Navarrete, S. Li, J. Strzalka, L. X. Chen, R. P. H. Chang, A. Facchetti, T. J. Marks, *Nat. Photonics* 2013, 7, 825.
[15] J. A. Bartelt, D. Lam, T. M. Burke, S. M. Sweetnam, M. D. McGehee, *Adv. Energy Mater.* 2015, 5, 1500577.
[16] K. Vandewal, *Annu. Rev. Phys. Chem.* 2016, 67, 113.
[17] J. Benduhn, K. Tvingstedt, F. Piersimoni, S. Ullbrich, Y. Fan, M. Tropiano, K. A. McGarry, O. Zeika, M. K.

[17 continued] Riede, C. J. Douglas, S. Barlow, S. R. Marder, D. Neher, D. Spoltore, K. Vandewal, *Nat. Energy* 2017, 2, 17053.

[18] T. M. Burke, S. Sweetnam, K. Vandewal, M. D. McGehee, *Adv. Energy Mater.* 2015, 5, 1500123.

[19] Z. Liu, Y. Wu, Q. Zhang, X. Gao, *J. Mater. Chem. A* 2016, 4, 17604.

[20] C. B. Nielsen, S. Holliday, H.-Y. Chen, S. J. Cryer, I. McCulloch, *Acc. Chem. Res.* 2015, 48, 2803.

[21] D. Sun, D. Meng, Y. Cai, B. Fan, Y. Li, W. Jiang, L. Huo, Y. Sun, Z. Wang, *J. Am. Chem. Soc.* 2015, 137, 11156.

[22] Y. Zhong, M. T. Trinh, R. Chen, G. E. Purdum, P. P. Khlyabich, M. Sezen, S. Oh, H. Zhu, B. Fowler, B. Zhang, W. Wang, C.-Y. Nam, M. Y. Sfeir, C. T. Black, M. L. Steigerwald, Y.-L. Loo, F. Ng, X.-Y. Zhu, C. Nuckolls, *Nat. Commun.* 2015, 6, DOI 10.1038/ncomms9242.

[23] J. Liu, S. Chen, D. Qian, B. Gautam, G. Yang, J. Zhao, J. Bergqvist, F. Zhang, W. Ma, H. Ade, O. Inganäs, K. Gundogdu, F. Gao, H. Yan, *Nat. Energy* 2016, 1, 16089:1.

[24] D. Meng, D. Sun, C. Zhong, T. Liu, B. Fan, L. Huo, Y. Li, W. Jiang, H. Choi, T. Kim, J. Y. Kim, Y. Sun, Z. Wang, A. J. Heeger, *J. Am. Chem. Soc.* 2016, 138, 375.

[25] Q. Wu, D. Zhao, A. M. Schneider, W. Chen, L. Yu, *J. Am. Chem. Soc.* 2016, 138, 7248.

[26] D. Meng, H. Fu, C. Xiao, X. Meng, T. Winands, W. Ma, W. Wei, B. Fan, L. Huo, N. L. Doltsinis, Y. Li, Y. Sun, Z. Wang, *J. Am. Chem. Soc.* 2016, 138, 10184.

[27] H. Qian, C. Liu, Z. Wang, D. Zhu, *Chem. Commun.* 2006, 4587.

[28] Y. Ma, Z. Shi, A. Zhang, J. Li, X. Wei, T. Jiang, Y. Li, X. Wang, *Dyes Pigments* 2016, 135, 41.

[29] X. Li, H. Wang, J. A. Schneider, Z. Wei, W.-Y. Lai, W. Huang, F. Wudl, Y. Zheng, *J. Mater. Chem. C* 2017, 5, 2781.

[30] R. A. Cormier, B. A. Gregg, *RSC Adv* 2014, 4, 2368.

[31] S. Zhang, L. Ye, W. Zhao, D. Liu, H. Yao, J. Hou, *Macromolecules* 2014, 47, 4653.

[32] P. Cheng, M. Zhang, T.-K. Lau, Y. Wu, B. Jia, J. Wang, C. Yan, M. Qin, X. Lu, X. Zhan, *Adv. Mater.* 2017, 29, 1605216.

[33] H. Zhong, C.-H. Wu, C.-Z. Li, J. Carpenter, C.-C. Chueh, J.-Y. Chen, H. Ade, A. K.-Y. Jen, *Adv. Mater.* 2016, 28, 951.

[34] Q. Wan, X. Guo, Z. Wang, W. Li, B. Guo, W. Ma, M. Zhang, Y. Li, *Adv. Funct. Mater.* 2016, 26, 6635.

[35] M. Li, Y. Liu, W. Ni, F. Liu, H. Feng, Y. Zhang, T. Liu, H. Zhang, X. Wan, B. Kan, Q. Zhang, T. P. Russell, Y. Chen, *J. Mater. Chem. A* 2016, 4, 10409.

[36] W. Huang, E. Gann, L. Thomsen, C. Dong, Y.-B. Cheng, C. R. McNeill, *Adv. Energy Mater.* 2015, 5, 1401259.

[37] T. Liu, D. Meng, Y. Cai, X. Sun, Y. Li, L. Huo, F. Liu, Z. Wang, T. P. Russell, Y. Sun, *Adv. Sci.* 2016, 3, 1600117.

[38] J. Zhang, Y. Li, J. Huang, H. Hu, G. Zhang, T. Ma, P. C. Y. Chow, H. Ade, D. Pan, H. Yan, *J. Am. Chem. Soc.* 2017, 139, 16092.

[39] Y. Lin, J. Wang, Z.-G. Zhang, H. Bai, Y. Li, D. Zhu, X. Zhan, *Adv. Mater.* 2015, 27, 1170.

[40] H. T. Nicolai, M. Kuik, G. A. H. Wetzelaer, B. de Boer, C. Campbell, C. Risko, J. L. Brédas, P. W. M. Blom, *Nat. Mater.* 2012, 11, 882.

[41] J. C. Aguirre, C. Arntsen, S. Hernandez, R. Huber, A. M. Nardes, M. Halim, D. Kilbride, Y. Rubin, S. H. Tolbert, N. Kopidakis, B. J. Schwartz, D. Neuhauser, *Adv. Funct. Mater.* 2014, 24, 784.

[42] W. Li, K. H. Hendriks, A. Furlan, M. M. Wienk, R. A. J. Janssen, *J. Am. Chem. Soc.* 2015, 137, 2231.

[43] K. Vandewal, S. Albrecht, E. T. Hoke, K. R. Graham, J. Widmer, J. D. Douglas, M. Schubert, W. R. Mateker, J. T. Bloking, G. F. Burkhard, A. Sellinger, J. M. J. Fréchet, A. Amassian, M. K. Riede, M. D. McGehee, D. Neher, A. Salleo, *Nat. Mater.* 2014, 13, 63.

[44] K. Vandewal, J. Benduhn, V. C. Nikolis, *Sustain. Energy Fuels* 2018, 2, 538.

[45] S. M. Tuladhar, M. Azzouzi, F. Delval, J. Yao, A. A. Y. Guilbert, T. Kirchartz, N. F. Montcada, R. Dominguez, F. Langa, E. Palomares, J. Nelson, *ACS Energy Lett.* 2016, 1, 302.

[46] J. Liu, S. Chen, D. Qian, B. Gautam, G. Yang, J. Zhao, J. Bergqvist, F. Zhang, W. Ma, H. Ade, O. Inganäs, K. Gundogdu, F. Gao, H. Yan, *Nat. Energy* 2016, 1, 16089.

[47] Y. L. Lin, M. A. Fusella, B. P. Rand, *Adv. Energy Mater.* 2018, 1702816.

[48] Z. Tang, J. Wang, A. Melianas, Y. Wu, R. Kroon, W. Li, W. Ma, M. R. Andersson, Z. Ma, W. Cai, W. Tress, O. Inganäs, *J. Mater. Chem. A* 2018, DOI 10.1039/C8TA01195H.

[49] U. Hörmann, J. Kraus, M. Gruber, C. Schuhmair, T. Linderl, S. Grob, S. Kapfinger, K. Klein, M. Stutzman, H. J. Krenner, W. Brütting, *Phys. Rev. B* 2013, 88, DOI 10.1103/PhysRevB.88.235307.

[50] D. Qian, Z. Zheng, H. Yao, W. Tress, T. R. Hopper, S. Chen, S. Li, J. Liu, S. Chen, J. Zhang, X.-K. Liu, B. Gao, L. Ouyang, Y. Jin, G. Pozina, I. A. Buyanova, W. M. Chen, O. Inganäs, V. Coropceanu, J.-L. Bredas, H. Yan, J. Hou, F. Zhang, A. A. Bakulin, F. Gao, *Nat. Mater.* 2018, 17, 703.

51. A. R. bin Mohd Yusoff, D. Kim, H. P. Kim, F. K. Shneider, W. J. da Silva and J. Jang, *Energ. Environ. Sci.*, 2015, 8, 303-316.

52. C. Poelking, M. Tietze, C. Elschner, S. Olthof, D. Hertel, B. Baumeier, F. Würthner, K. Meerholz, K. Leo and D. Andrienko, *Nat. Mater,* 2015, 14, 434-439.

53. Y Chen, Y. Zhu, D. Yang, Q. Luo, L. Yang, Y Huang, S. Zhao and Z. Lu, *Chem. Commun.*, 2015, 51, 6133-6136.

54. J.-L. Wang, K.-K. Liu, J. Yan, Z. Wu, F. Liu, F. Xiao, Z.-F. Chang, H.-B. Wu, Y Cao and T. P. Russell, *J. Am. Chem. Soc.*, 2016, 138, 7687-7697.

55. N. Gasparini, X. Jiao, T. Heumueller, D. Baran, G. J. Matt, S. Fladischer, E. Spiecker, H. Ade, C. J. Brabec and T. Ameri, *Nat. Energy,* 2016, 1, 16118.

56. D. Bartesaghi, I. del Carmen Pérez, J. Kniepert, S. Roland, M. Turbiez, D. Neher and L. J. A. Koster, *Nat. Commun.*, 2015, 6, 7083.

57. S. Li, L. Ye, W. Zhao, S. Zhang, S. Mukherjee, H. Ade and J. Hou, *Adv. Mater,* 2016, 28, 9423-9429.

58. W. Zhao, S. Li, H. Yao, S. Zhang, Y Zhang, B. Yang and J. Hou, *J. Am. Chem. Soc.*, 2017, 139, 7148-7151.

59. W. Zhao, S. Li, H. Yao, S. Zhang, Y Zhang, B. Yang and J. Hou, *J. Am. Chem. Soc.*, 2017, 139, 7148-7151.

60. D. Sun, D. Meng, Y. Cai, B. Fan, Y Li, W. Jiang, L. Huo, Y Sun and Z. Wang, *J. Am. Chem. Soc.*, 2015, 137, 11156-11162.

61. Y Zang, C. Z. Li, C. C. Chueh, S. T. Williams, W. Jiang, Z. H. Wang, J. S. Yu and A. K. Y. Jen, *Adv. Mater,* 2014, 26, 5708-5714.

62. D. Meng, D. Sun, C. Zhong, T. Liu, B. Fan, L. Huo, Y. Li, W. Jiang, H. Choi and T. Kim, *J. Am. Chem. Soc.,* 2015, 138, 375-380.

63. S. M. McAfee, J. M. Topple, I. G. Hill and G. C. Welch, *J. Mater. Chem. A,* 2015, 3, 16393-16408.

64. C. Li and H. Wonneberger, *Adv. Mater,* 2012, 24, 613-636.

65. C. B. Nielsen, S. Holliday, H.-Y. Chen, S. J. Cryer and I. McCulloch, *Accounts Chem. Res.*, 2015, 48, 2803-2812.
66. Z. Liu, Y. Wu, Q. Zhang and X. Gao, *J. Mater. Chem. A*, 2016, 4, 17604-17622.

References for Example 7

(1) Miyasaka, T. Perovskite Photovoltaics: Rare Functions of Organo Lead Halide in Solar Cells and Optoelectronic Devices. *Chem Lett* 2015, 44 (6), 720-729.
(2) Yang, W.; Noh, J.; Jeon, N.; Kim, Y.; Ryu, S.; Seo, J.; Seok, S. High-Performance Photovoltaic Perovskite Layers Fabricated through Intramolecular Exchange. *Science* 2015, 348 (6240), 1234-1237.
(3) Green, M.; Hishikawa, Y.; Warta, W.; Dunlop, E.; Levi, D.; Hohl-Ebinger, J.; Ho-Baillie, A. Solar Cell Efficiency Tables (Version 50). *Prog Photovoltaics Res Appl* 2017, 25 (7), 668-676.
(4) Park, N.; Grätzel, M.; Miyasaka, T.; Zhu, K.; Emery, K. Towards Stable and Commercially Available Perovskite Solar Cells. *Nat Energy* 2016, 1 (11), 16152.
(5) Giordano, F.; Abate, A.; J P C, B.; Saliba, M.; Matsui, T.; Im, S.; Zakeeruddin; Nazeeruddin, M.; Hagfeldt, A.; Graetzel, M. Enhanced Electronic Properties in Mesoporous TiO2 via Lithium Doping for High-Efficiency Perovskite Solar Cells. *Nat Commun* 2016, 7, 10379.
(6) Yang, G.; Tao, H.; Qin, P.; Ke, W.; Fang, G. Recent Progress in Electron Transport Layers for Efficient Perovskite Solar Cells. *Journal of Materials Chemistry A* 2016, 4 (11), 3970-3990.
(7) Quinn, J. T.; Zhu, J.; Li, X.; Wang, J.; Li, Y. Recent Progress in the Development of N-Type Organic Semiconductors for Organic Field Effect Transistors. *J Mater Chem C* 2017, 5 (34), 8654-8681.
(8) Lee, J.; Kim, J.; Lee, C.; Kim, G.; Kim, T.; Back, H.; Jung, S.; Yu, K.; Hong, S.; Lee, S.; et al. A Printable Organic Electron Transport Layer for Low-Temperature-Processed, Hysteresis-Free, and Stable Planar Perovskite Solar Cells. *Adv Energy Mater* 2017, 1700226.
(9) Wang, Z.; McMeekin, D.; Sakai, N.; Reenen, S.; Wojciechowski, K.; Patel, J.; Johnston; Snaith, H. Efficient and Air-Stable Mixed-Cation Lead Mixed-Halide Perovskite Solar Cells with N-Doped Organic Electron Extraction Layers. *Adv Mater* 2017, 29 (5).
(10) Heo, J.; Han, H.; Kim, D.; Ahn, T.; Im, S. Hysteresis-Less Inverted CH 3 NH 3 PbI 3 Planar Perovskite Hybrid Solar Cells with 18.1% Power Conversion Efficiency. *Energy Environ Sci* 2015, 8 (5), 1602-1608.
(11) You, J.; Y(, Y.; Hong, Z.; Song, T.; Meng, L.; Liu, Y.; Jiang, C.; Zhou, H.; Chang, W.; Li, G.; et al. Moisture Assisted Perovskite Film Growth for High Performance Solar Cells. *Appl Phys Lett* 2014, 105 (18), 183902.
(12) Guo, Y.; Sato, W.; Inoue, K.; Zhang, W.; Yu, G.; Nakamura, E. N-Type Doping for Efficient Polymeric Electron-Transporting Layers in Perovskite Solar Cells. *J Mater Chem* 2016, 4 (48), 18852-18856.
(13) Huang, J.; Gu, Z.; Zuo, L.; Ye, T.; Chen, H. Morphology Control of Planar Heterojunction Perovskite Solar Cells with Fluorinated PDI Films as Organic Electron Transport Layer. *Sol Energy* 2016, 133, 331-338.
(14) Kim, S.; Bae, S.; Jo, W. A Perylene Diimide-Based Non-Fullerene Acceptor as an Electron Transporting Material for Inverted Perovskite Solar Cells. *RSC Advances* 2016, 6 (24), 19923-19927.
(15) Zhang, H.; Xue, L.; Han, J.; Fu, Y.; Shen, Y.; Zhang, Z.; Li, Y.; Wang, M. New Generation Perovskite Solar Cells with Solution-Processed Amino-Substituted Perylene Diimide Derivative as Electron-Transport Layer. *J Mater Chem* 2016, 4 (22), 8724-8733.
(16) Akbulatov, A.; Frolova, L.; Griffin, M.; Gearba, I.; Dolocan, A.; Bout, D.; Tsarev, S.; Katz, E.; Shestakov, A.; Stevenson, K.; et al. Effect of Electron-Transport Material on Light-Induced Degradation of Inverted Planar Junction Perovskite Solar Cells. *Advanced Energy Materials* 2017, 1700476.
(17) You, J.; Meng, L.; Song, T.-B.; Guo, T.-F.; Yang, Y.; Chang, W.-H.; Hong, Z.; Chen, H.; Zhou, H.; Chen, Q.; et al. Improved Air Stability of Perovskite Solar Cells via Solution-Processed Metal Oxide Transport Layers. *Nat Nanotechnol* 2015, 11 (1), 75-81.
(18) Meng, L.; You, J.; Guo, T.-F.; Yang, Y. Recent Advances in the Inverted Planar Structure of Perovskite Solar Cells. *Accounts Chem Res* 2016, 49 (1), 155-165.
(19) Bi, C.; Wang, Q.; Shao, Y.; Yuan, Y.; Xiao, Z.; Huang, J. Non-Wetting Surface-Driven High-Aspect-Ratio Crystalline Grain Growth for Efficient Hybrid Perovskite Solar Cells. *Nat Commun* 2015, 6, 7747.
(20) Zhou, Y.; Fuentes-Hernandez, C.; Shim, J.; Meyer, J.; Giordano, A.; Li, H.; Winget, P.; Papadopoulos, T.; Cheun, H.; Kim, J.; et al. A Universal Method to Produce Low-Work Function Electrodes for Organic Electronics. *Science* 2012, 336 (6079), 327-332.
(21) Li, C.; Chueh, C.; Ding, F.; Yip, H.; Liang, P.; Li, X.; Jen, A. Doping of Fullerenes via Anion-Induced Electron Transfer and Its Implication for Surfactant Facilitated High Performance Polymer Solar Cells. *Advanced Materials* 2013, 25 (32), 4425-4430.
(22) Russ, B.; Robb, M.; Popere, B.; Perry, E.; Mai, C.; Fronk, S.; Patel, S.; Mates, T.; Bazan, G.; Urban, J.; et al. Tethered Tertiary Amines as Solid-State n-Type Dopants for Solution-Processable Organic Semiconductors. *Chemical Science* 2015, 7 (3), 1914-1919.
(23) deQuilettes, D.; Koch, S.; Burke, S.; Paranji, R.; Shropshire, A.; Ziffer, M.; Ginger, D. Photoluminescence Lifetimes Exceeding 8 Ms and Quantum Yields Exceeding 30% in Hybrid Perovskite Thin Films by Ligand Passivation. *Acs Energy Lett* 2016, 1 (2), 438-444
(24) Xu, J.; Buin, A.; Ip, A.; Li, W.; Voznyy, O.; Comin, R.; Yuan, M.; Jeon, S.; Ning, Z.; well, J.; et al. Perovskite-Fullerene Hybrid Materials Suppress Hysteresis in Planar Diodes. *Nature Communications* 2015, 6, 7081.
(25) Noel, N.; Abate, A.; Stranks, S.; Parrott, E.; Burlakov, V.; Goriely, A.; Snaith, H. Enhanced Photoluminescence and Solar Cell Performance via Lewis Base Passivation of Organic-Inorganic Lead Halide Perovskites. *Acs Nano* 2014, 8 (10), 9815-9821.
(26) Zheng, X.; Chen, B.; Dai, J.; Fang, Y.; Bai, Y.; Lin, Y.; Wei, H.; Zeng, X.; Huang, J. Defect Passivation in Hybrid Perovskite Solar Cells Using Quaternary Ammonium Halide Anions and Cations. *Nature Energy* 2017, 2, nenergy2017102.
(27) Aristidou, N.; Eames, C.; Sanchez-Molina, I.; Bu, X.; Kosco, J.; Islam; Haque, S. Fast Oxygen Diffusion and Iodide Defects Mediate Oxygen-Induced Degradation of Perovskite Solar Cells. *Nat Commun* 2017, 8, ncomms15218.
(28) Stranks, S. D.; Burlakov, V. M.; Leijtens, T.; Ball, J. M.; Goriely, A.; Snaith, H. J. Recombination Kinetics in Organic-Inorganic Perovskites: Excitons, Free Charge, and Subgap States. *Phys Rev Appl* 2014, 2 (3), 034007.
(29) Alsari, M.; Pearson, A. J.; Wang, J.; Wang, Z.; Montisci, A.; Greenham, N. C.; Snaith, H. J.; Lilliu, S.; Friend, R.

H. Degradation Kinetics of Inverted Perovskite Solar Cells. *Sci Reports* 2018, 8 (1), 5977.

(30) Fang, R.; Wu, S.; Chen, W.; Liu, Z.; Zhang, S.; Chen, R.; Yue, Y.; Deng, L.-L.; Cheng, Y.; Han, L.; et al. [6,6]-Phenyl-C61-Butyric Acid Methyl Ester/Cerium Oxide Bilayer Structure as Efficient and Stable Electron Transport Layer for Inverted Perovskite Solar Cells.

(31) Zhu, H.; Huang, B.; Wu, S.; Xiong, Z.; Li, J.; Chen, W. Facile Surface Modification of $CH_3NH_3 PbI_3$ Films Leading to Simultaneously Improved Efficiency and Stability of Inverted Perovskite Solar Cells. *J Mater Chem* 2018, 6 (15), 6255-6264.

(32) Zhou, Z.; Li, X.; Cai, M.; Xie, F.; Wu, Y.; Lan, Z.; Yang, X.; Qiang, Y.; Islam, A.; Han, L. Stable Inverted Planar Perovskite Solar Cells with Low-Temperature-Processed Hole-Transport Bilayer. *Adv Energy Mater* 2017, 7 (22), 1700763.

(33) Chen, W.; Wu, Y.; Yue, Y.; Liu, J.; Zhang, W.; Yang, X.; Chen, H.; Bi, E.; Ashraful, I.; Grätzel, M.; et al. Efficient and Stable Large-Area Perovskite Solar Cells with Inorganic Charge Extraction Layers. *Science* 2015, 350 (6263), 944-948.

(34) Bush, K. A.; Bailie, C. D.; Chen, Y.; Bowring, A. R.; Wang, W.; Ma, W.; Leijtens, T.; Moghadam, F.; McGehee, M. D. Thermal and Environmental Stability of Semi-Transparent Perovskite Solar Cells for Tandems Enabled by a Solution-Processed Nanoparticle Buffer Layer and Sputtered ITO Electrode. *Advanced Materials* 2016, 28 (20), 3937-3943.

35. J. Phys.: Condens. Matter 29 (2017) 205901.

36. Zhong et. al., Helical Ribbons for Molecular Electronics, J. Am. Chem. Soc. 2014, 136, 8122-8130.

37. J. Am. Chern. Soc., 2015, 137, 11156-11162.

38. J. Am. Chem. Soc., 2014, 136, 15215-15221.

39. J. Am. Chem. Soc., 2014, 136, 8122-8130.

40. Chem. Commun., 2006, 4587-4589.

41. Dyes and Pigments, 2016, 135, 41-48.

42. J. Mater. Chem. C, 2017, 5, 2781-2785.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A composition of matter, comprising:
    a compound including fused perylene diimides (PDIs) having the structure:

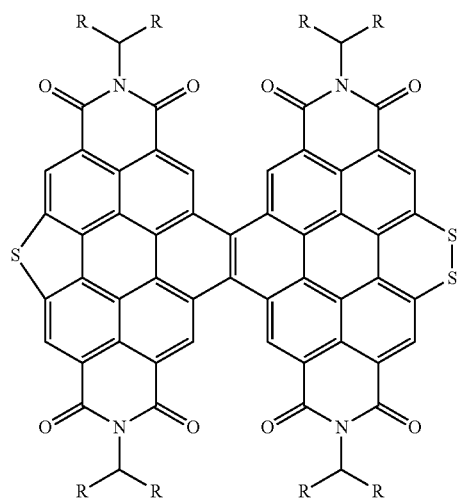

2PDI-3S or

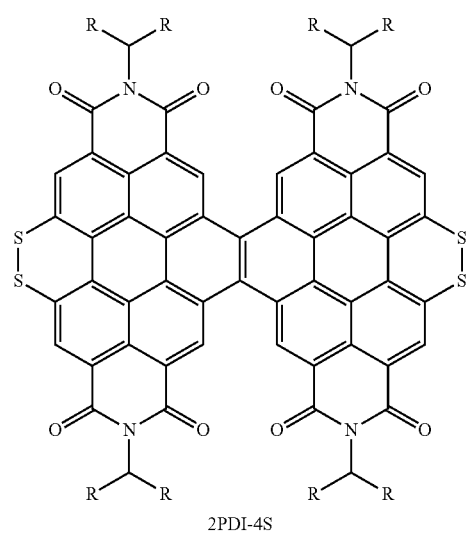

2PDI-4S or

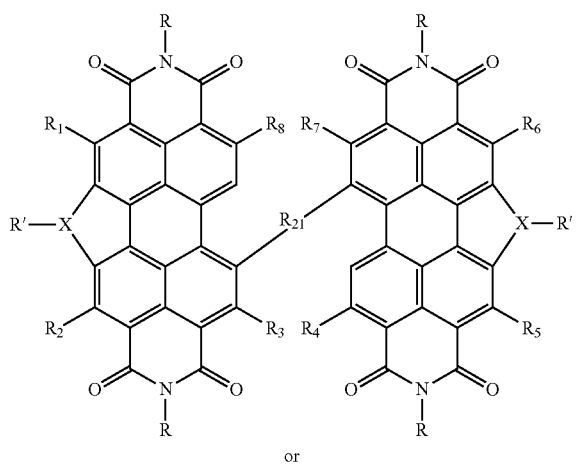

or

73
-continued
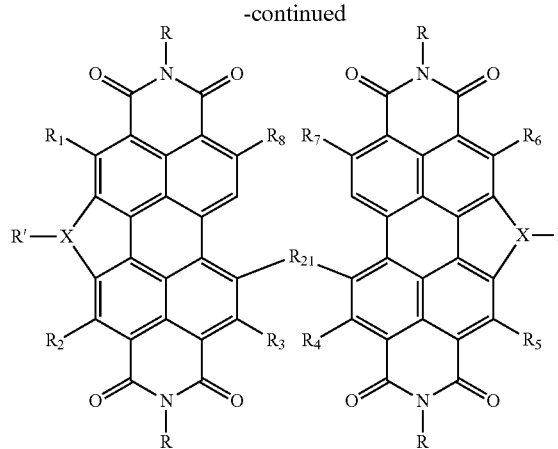
or
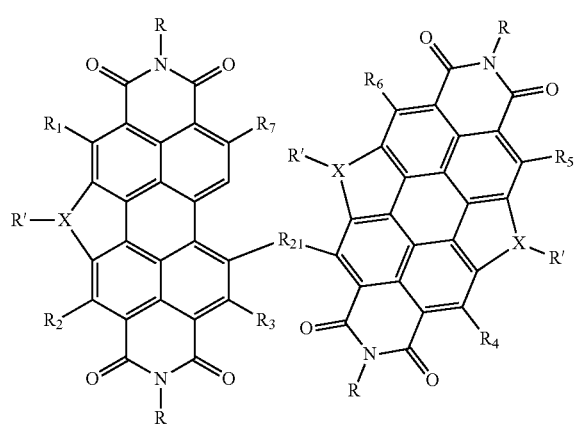
or
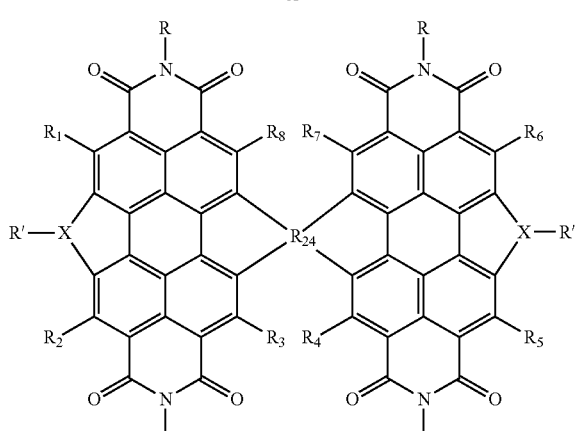
or
74
-continued
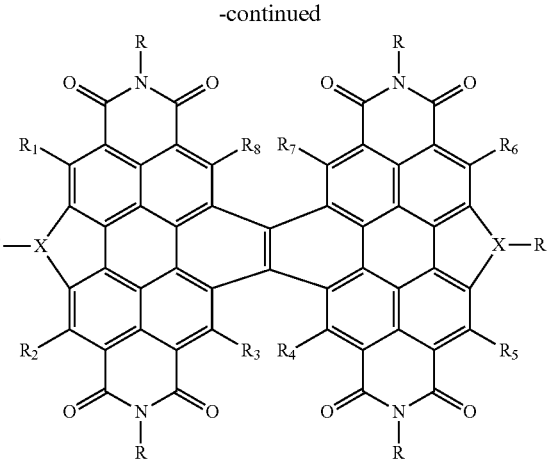
or
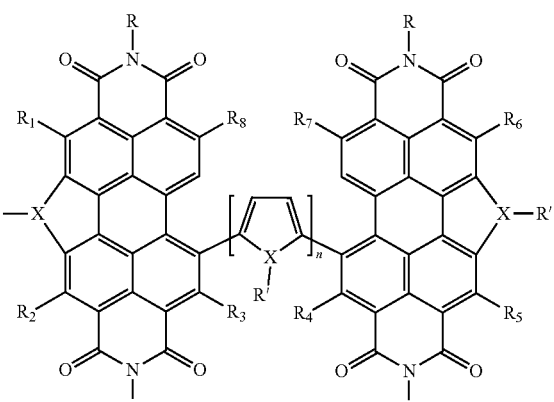
or
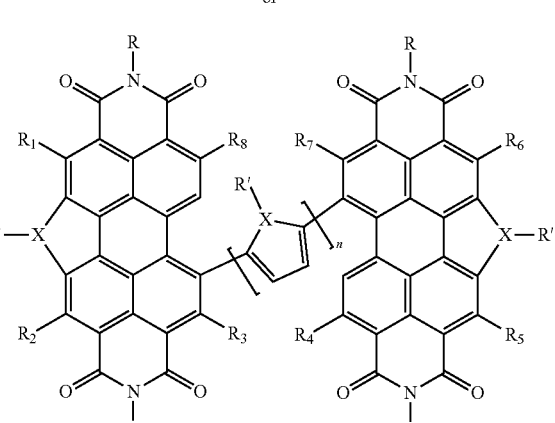
or 75
-continued
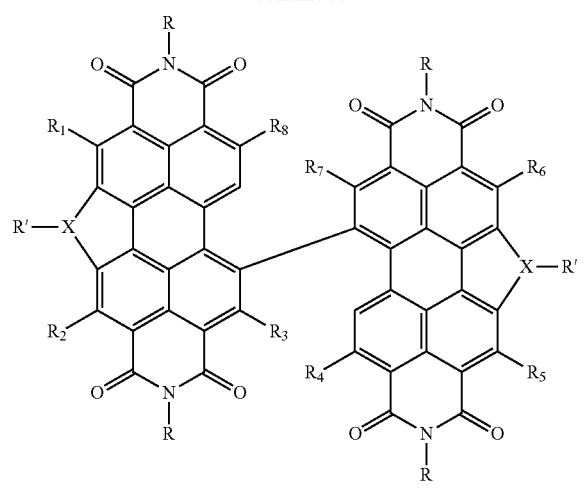
or
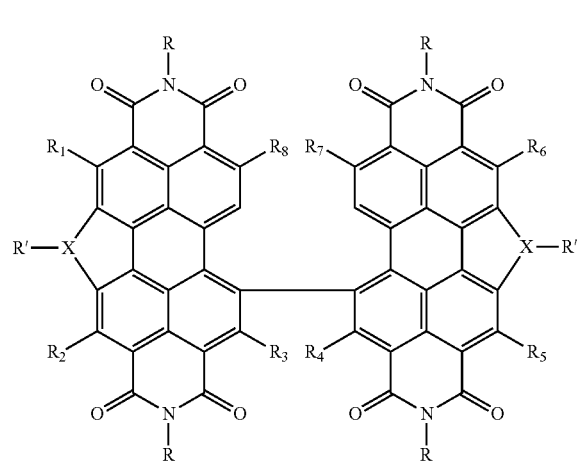
or
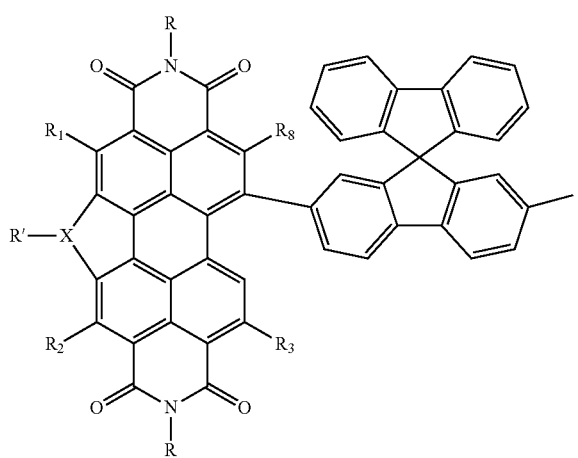
76
-continued
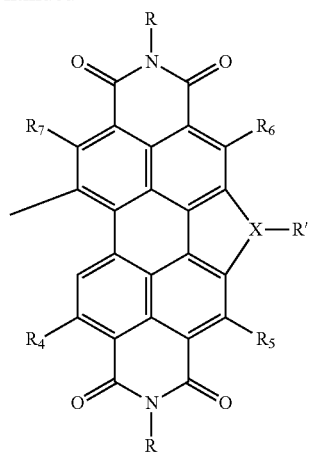
or
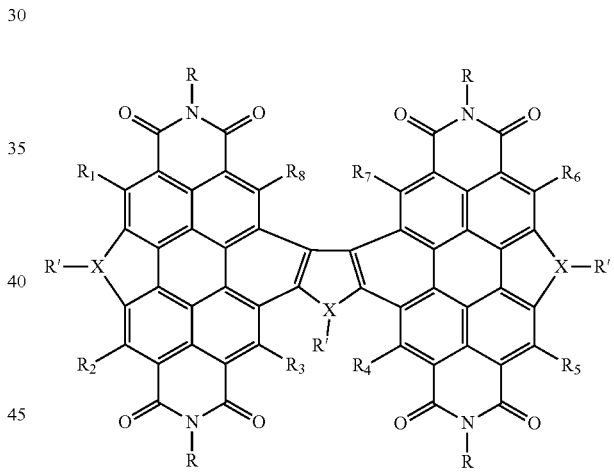
or
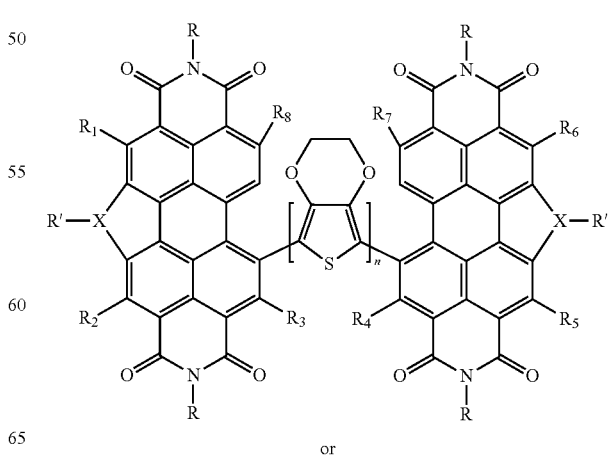

77
-continued
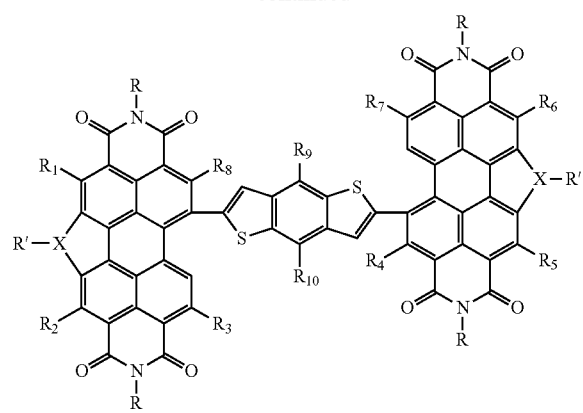
or
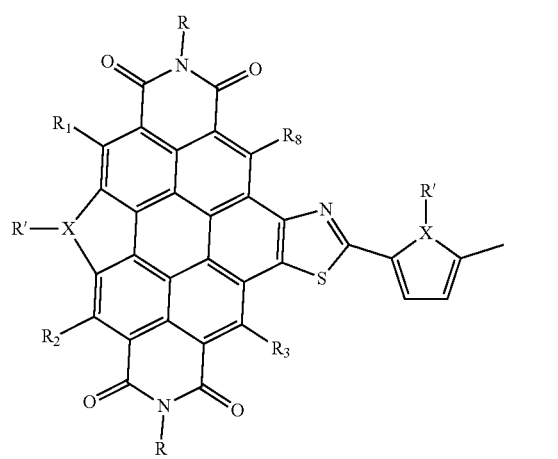
or
78
-continued
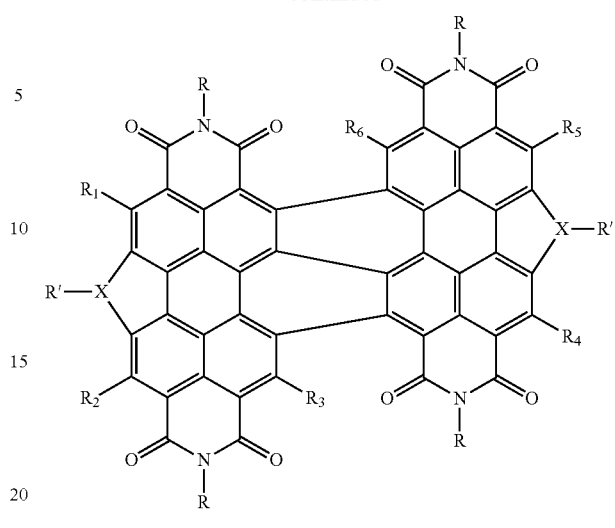
or
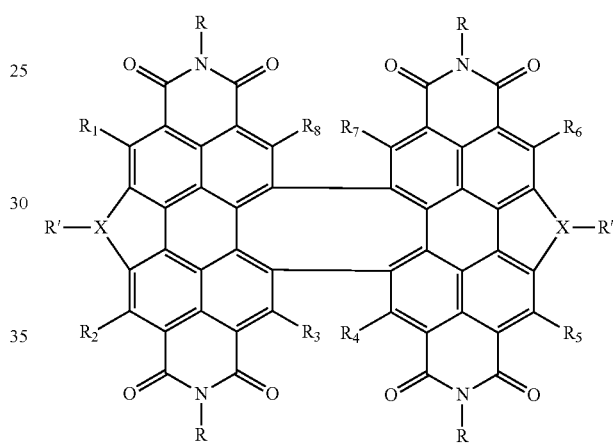
or
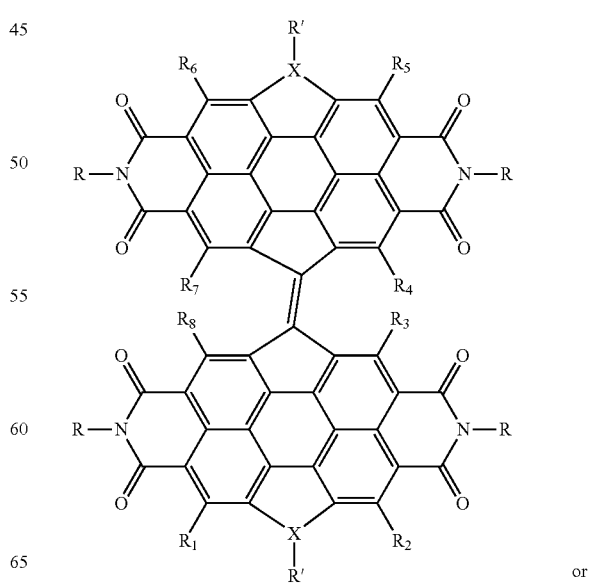
or -continued
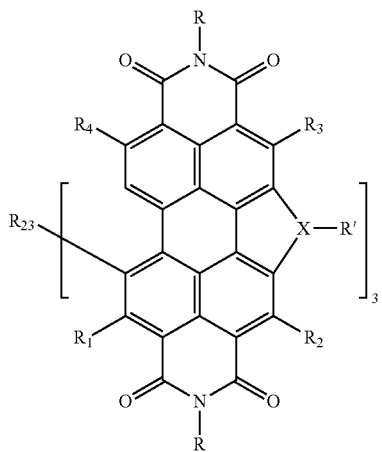
or
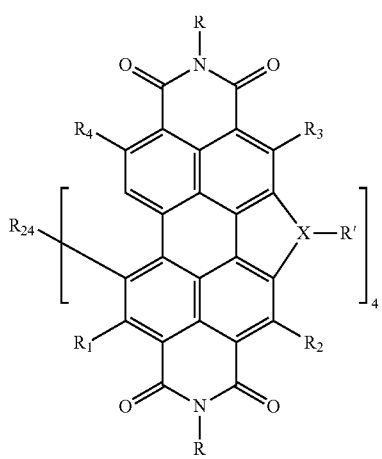
or
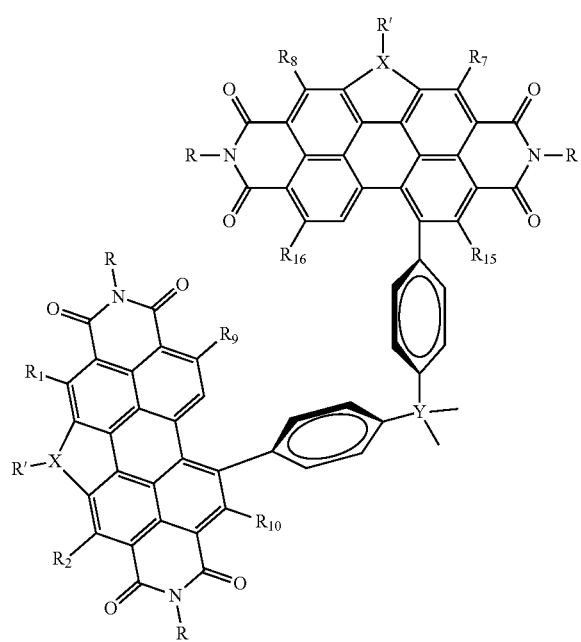
-continued
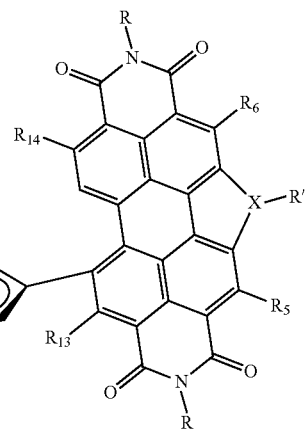
or
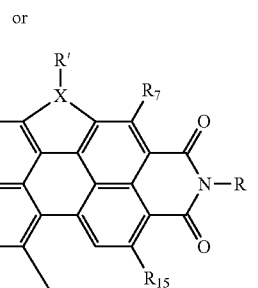
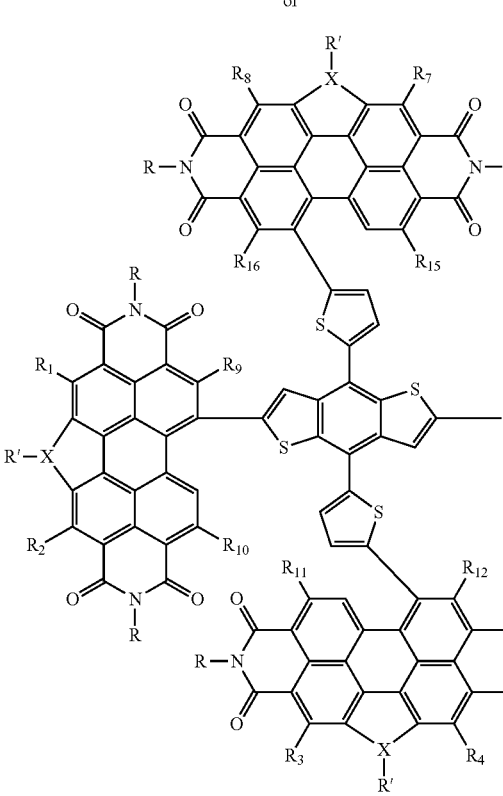

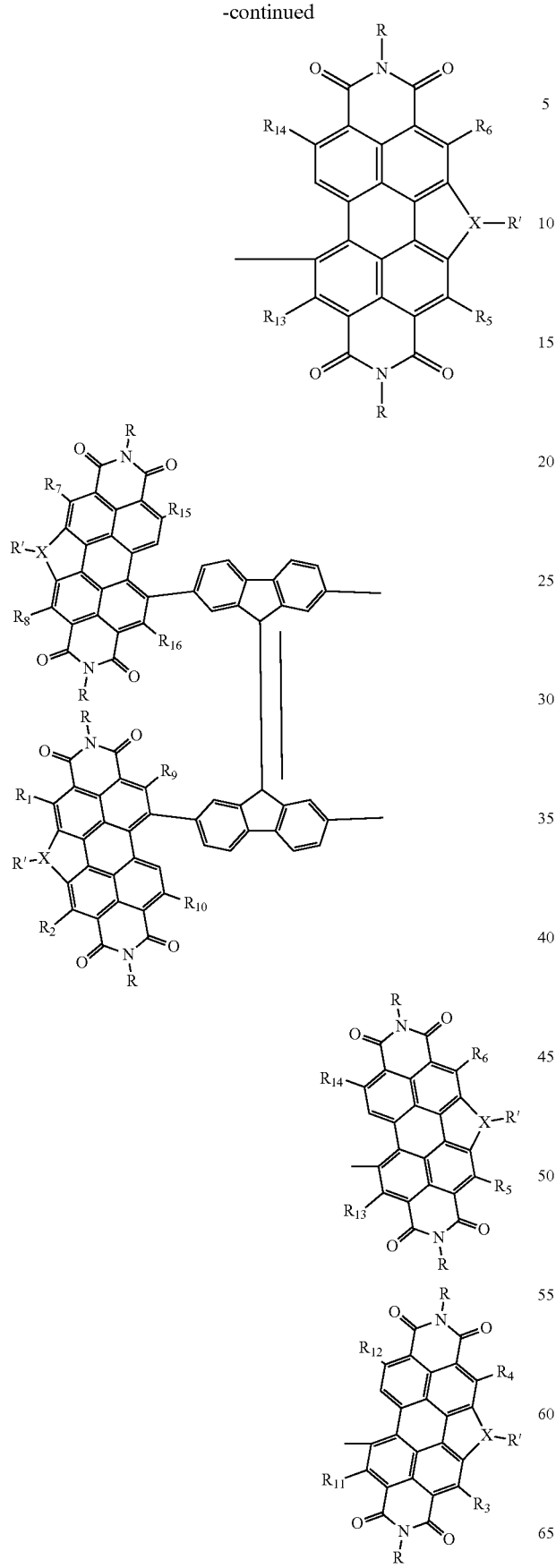
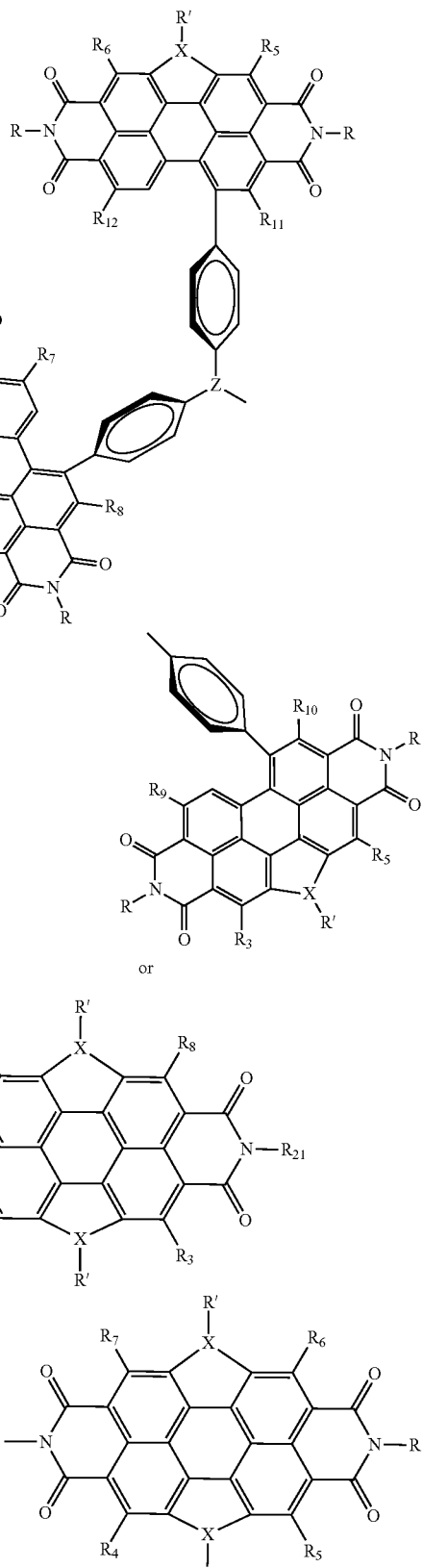

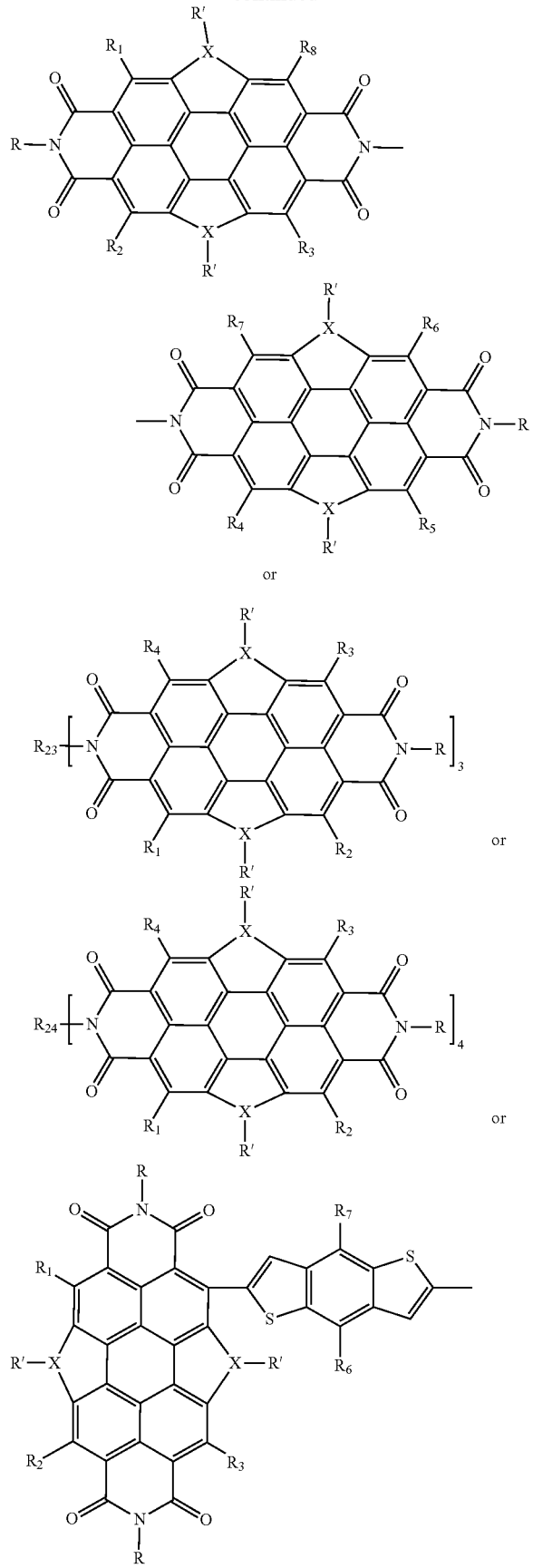
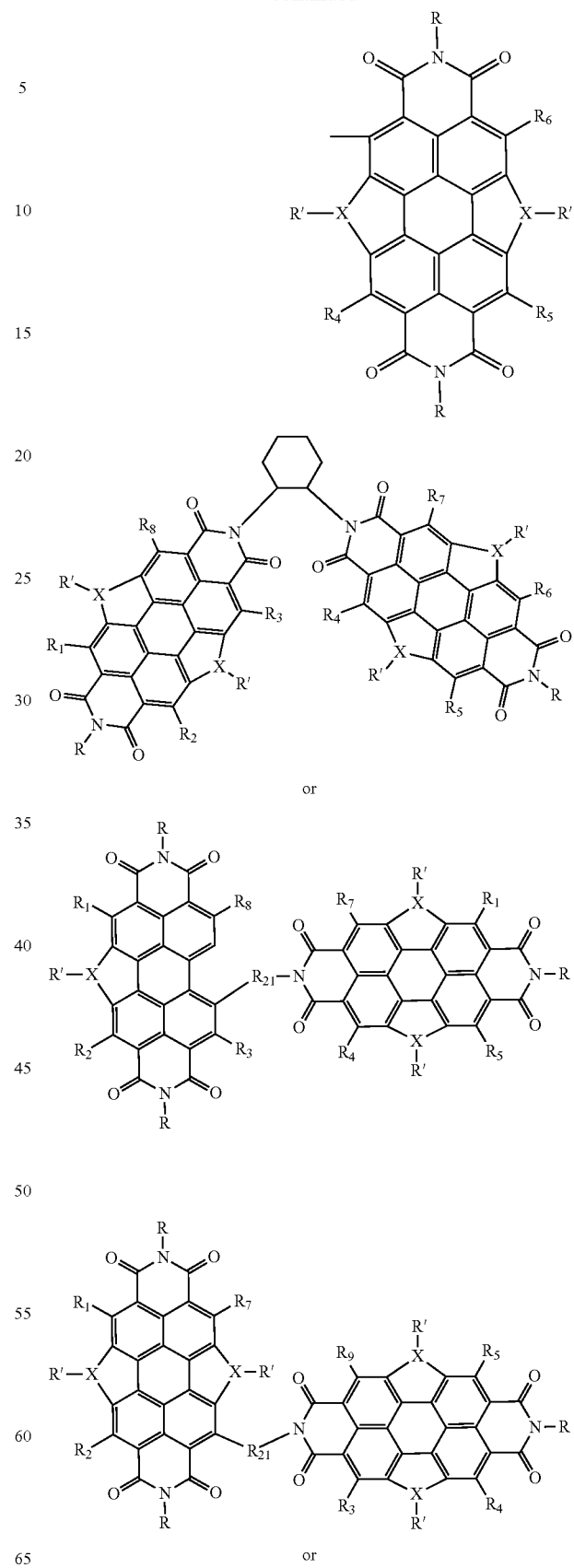

-continued

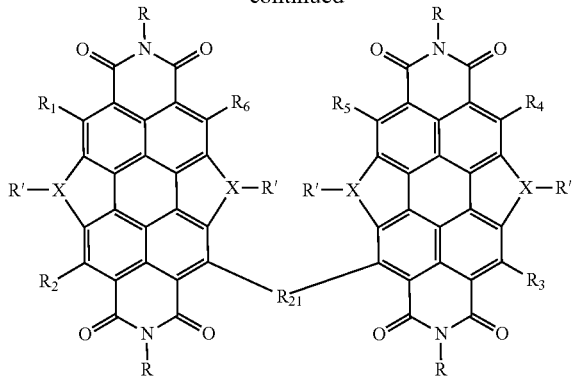

wherein the R are independently hydrogen, an alkyl group, an aryl group, or a solubilizing chain, and wherein, in each of the compounds comprising X, at least one X is S-S, the other X is S or S-S, R' is nothing, Y is C, Si, or Ge; Z is N or P; $R_1$ to $R_{16}$ are each independently hydrogen, an alkyl group, or an aryl group ($R_1$ to $R_{16}$ can be the same or different); $R_{21}$ is nothing, an alkylene group, or an arylene group; $R_{23}$ is a trivalent aliphatic or a trivalent aromatic group; the $R_{24}$ are each independently a tetravalent aliphatic group or a tetravalent aromatic group; n=0 to 10; and if a substituent (Y, Z, R, R', $R_1$-$R_{24}$) occurs more than one time in a compound, it can be different or the same in each occurrence.

2. The composition of matter of claim 1, wherein the compound comprises 2PDI-3S.

3. The composition of matter of claim 1, wherein the compound comprises 2PDI-4S.

4. A device comprising the composition of matter of claim 1 combined with a donor molecule, wherein the fused PDIs are electron acceptors.

5. The device of claim 4, wherein the donor molecule is at least one compound selected from PTB7-Th or from the list of compounds illustrated in FIGS. 28A-28D.

6. The device of claim 4, wherein the device is a solar cell having an active region including the fused PDIs combined with the donor molecule.

7. A device comprising the composition of matter of claim 1, further comprising an electron transport layer including the fused PDIs.

8. The device of claim 1, further comprising an electromagnetic radiation absorbing active region coupled to the electron transport layer, wherein the active region comprises an organic-inorganic hybrid perovskite (PVSK).

9. The device of claim 8, wherein the device is a solar cell having a fill factor exceeding 57%.

10. The device of claim 9, wherein:
the solar cell has a power conversion efficiency (PCE) of at least 11%, and
an external quantum efficiency (EQE) of greater than 70%,
when the active region of the solar cell absorbs the electromagnetic radiation having a wavelength in a range of 350-750 nm under 1 Sun irradiation.

11. The device of claim 4, wherein the device is a photodetector having a sensing element comprising the fused PDIs combined with the donor molecule.

12. A device comprising the composition of matter of claim 1, wherein:
the device comprises an active layer or electron transport layer comprising the fused PDIs, and
the active layer or the electron transport layer is amorphous and has a mobility greater than $10^{-2}$ cm$^2$/Vs.

13. The device of claim 12, wherein the device is an n-type field effect transistor.

14. A solar cell device, comprising:
an anode;
an anode interface/hole transport layer on the anode;
an electron transport layer comprising a compound having at least one structure selected from:

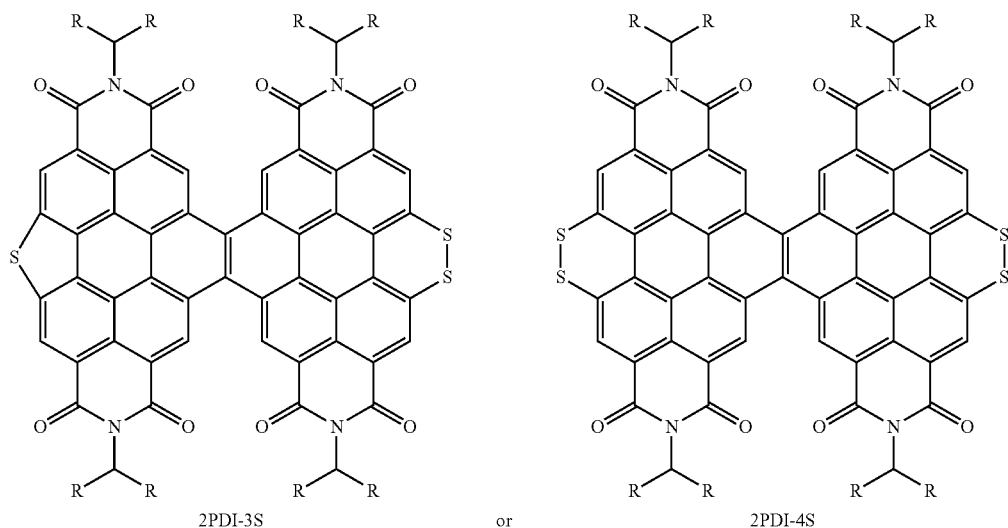

2PDI-3S or 2PDI-4S or

-continued
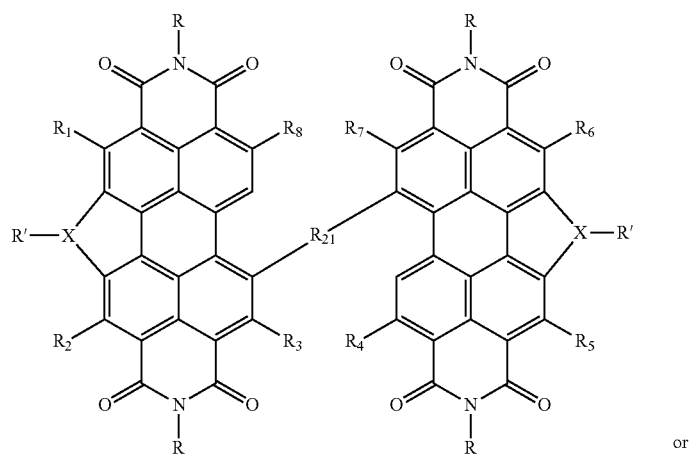
or
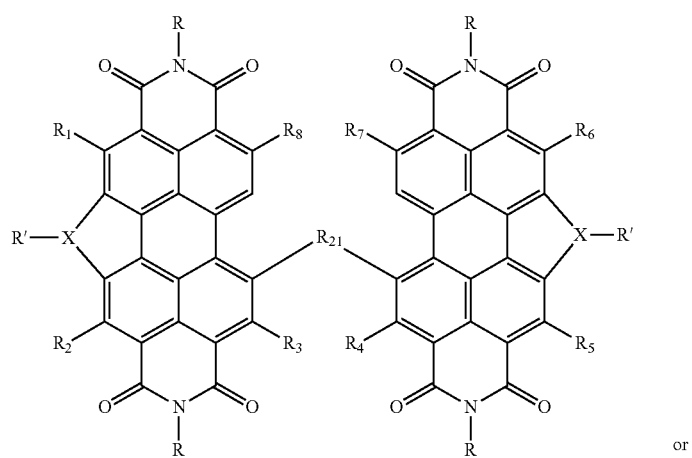
or
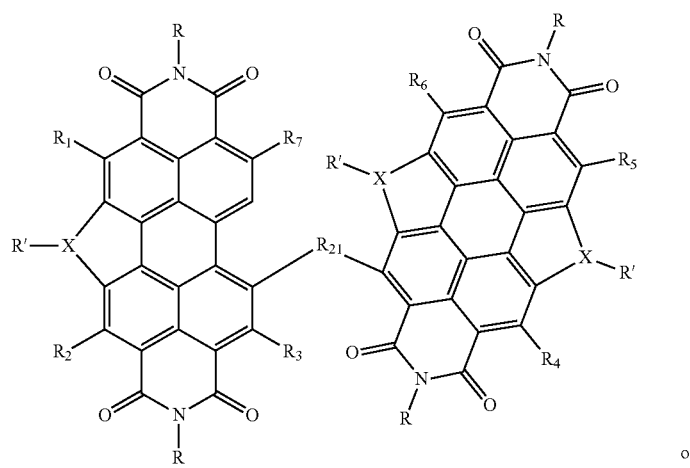
or

-continued
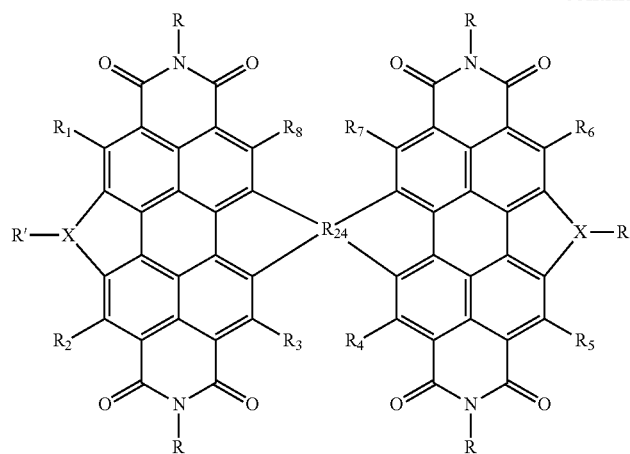
or
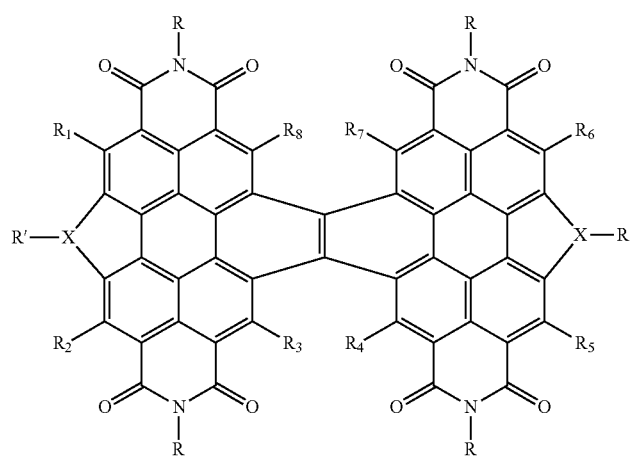
or
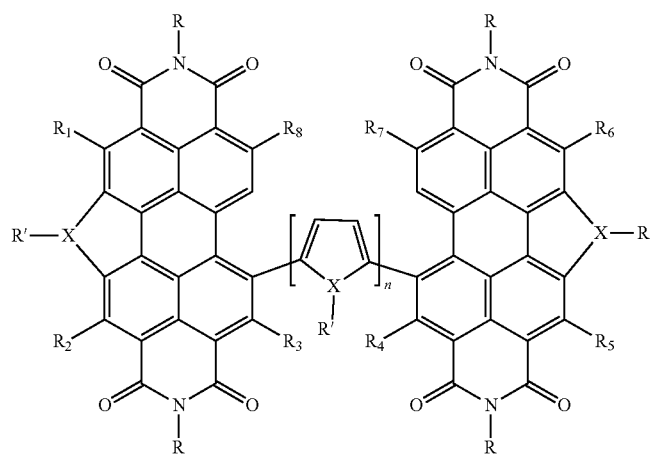
or

-continued
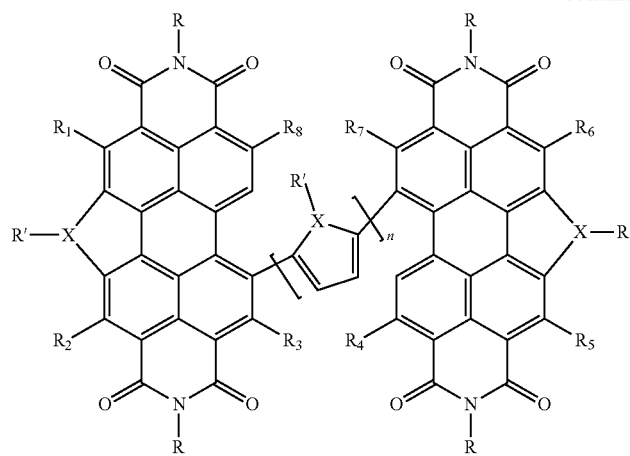
or
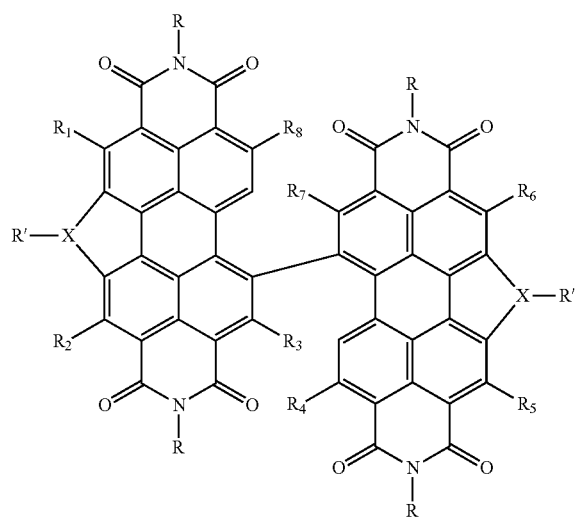
or
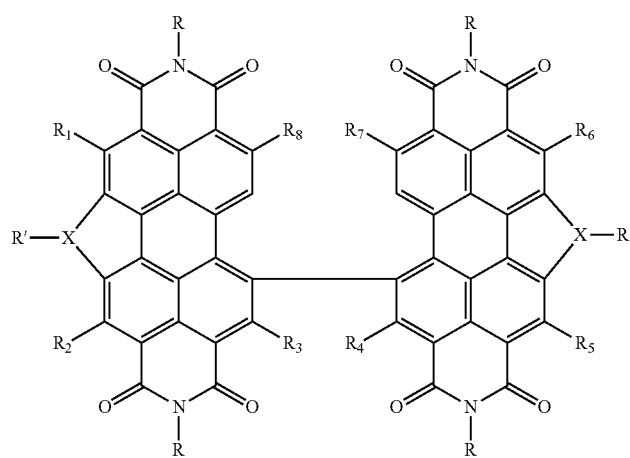
or

-continued
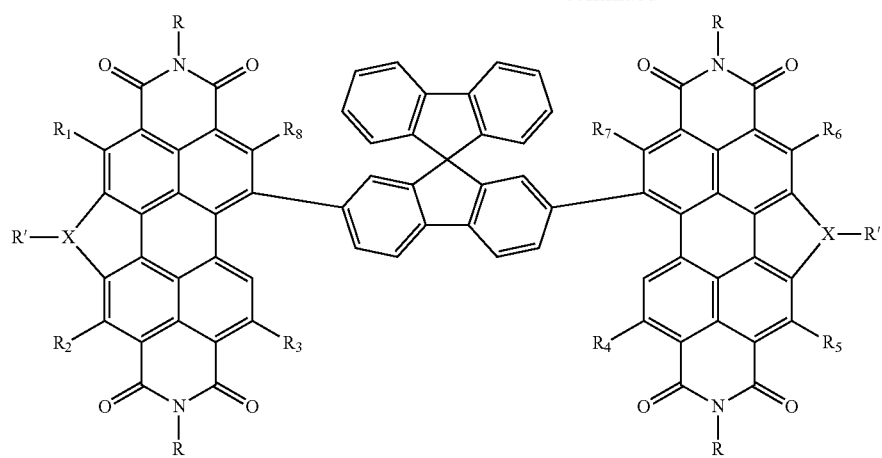
or
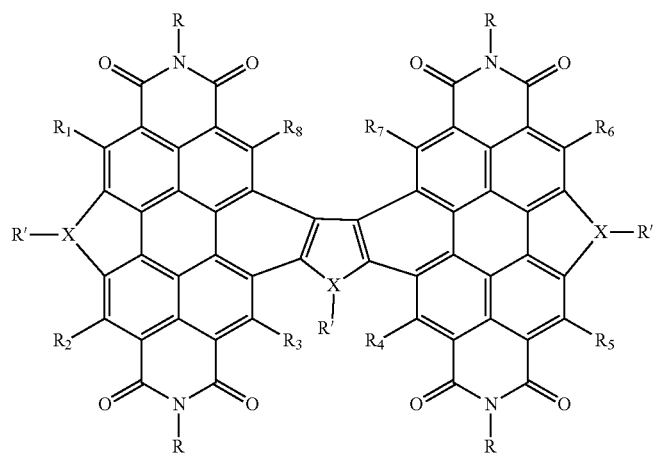
or
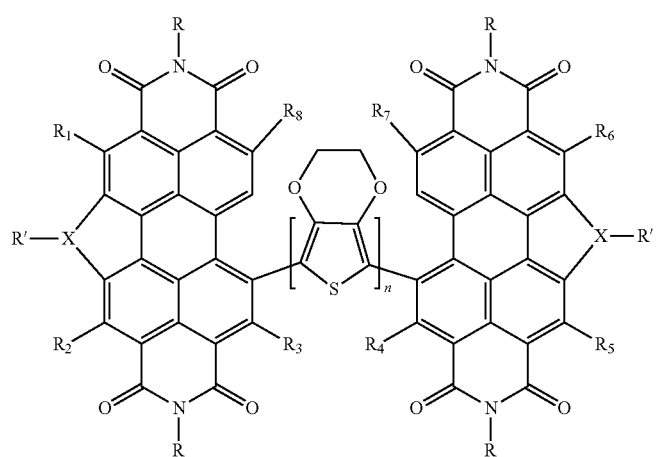
or

-continued
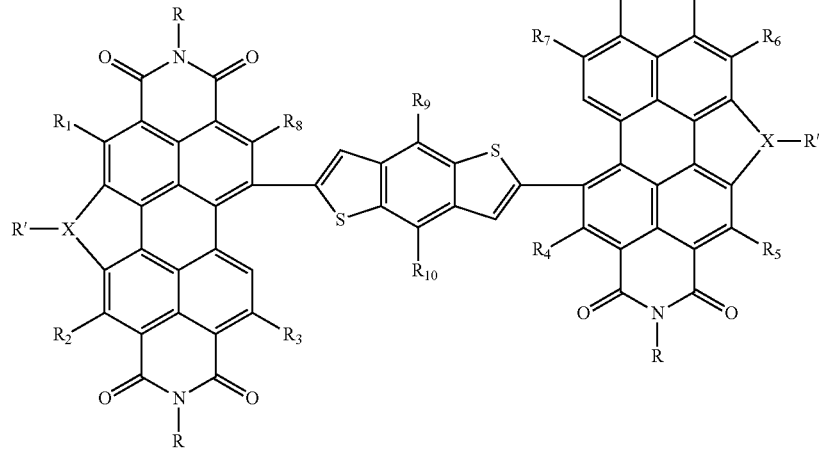
or
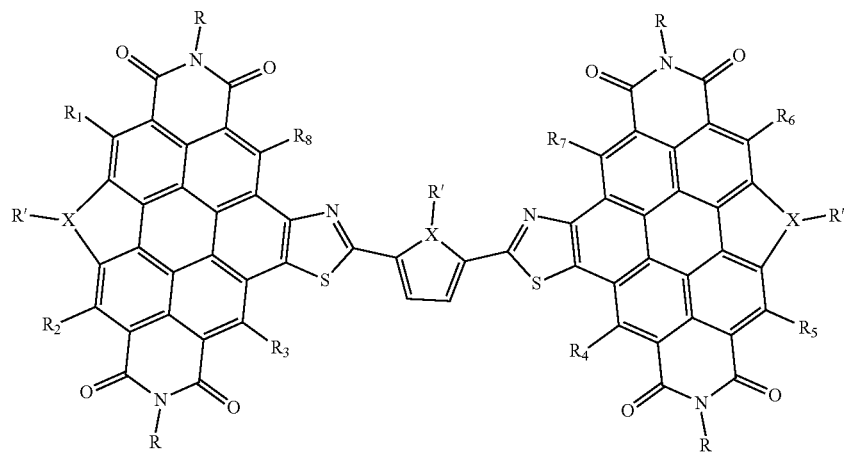
or
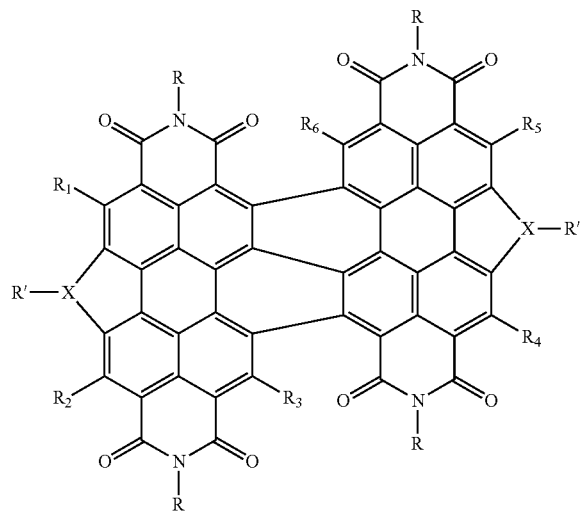
or

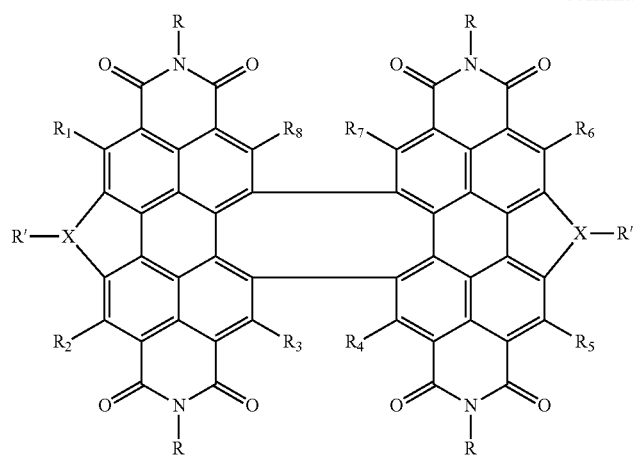
or
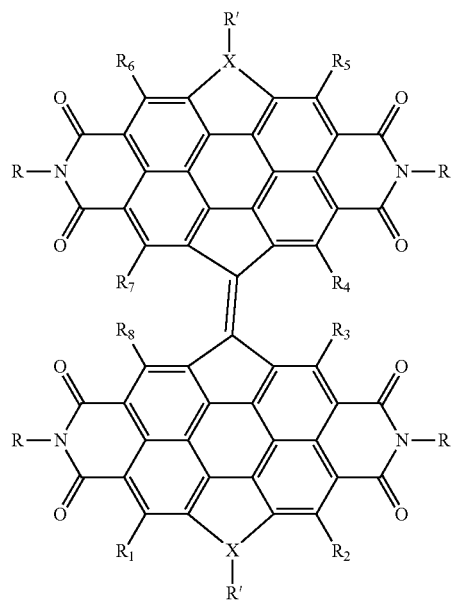
or
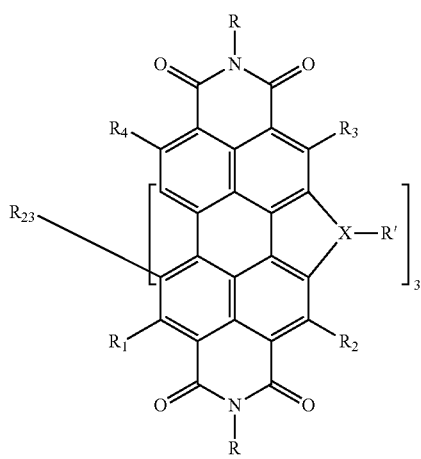
or
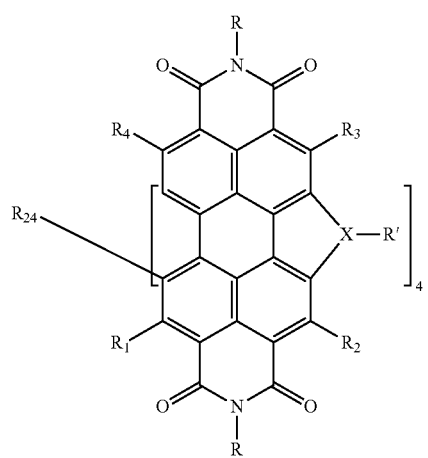
or

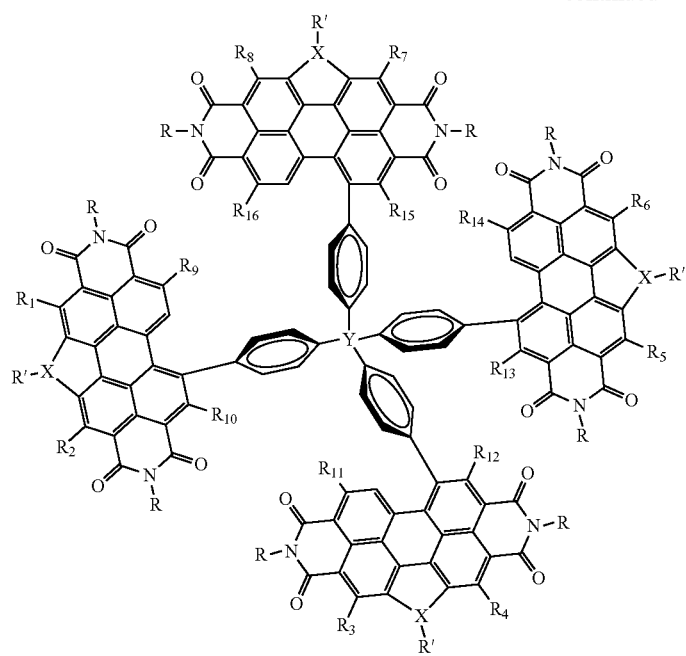
or
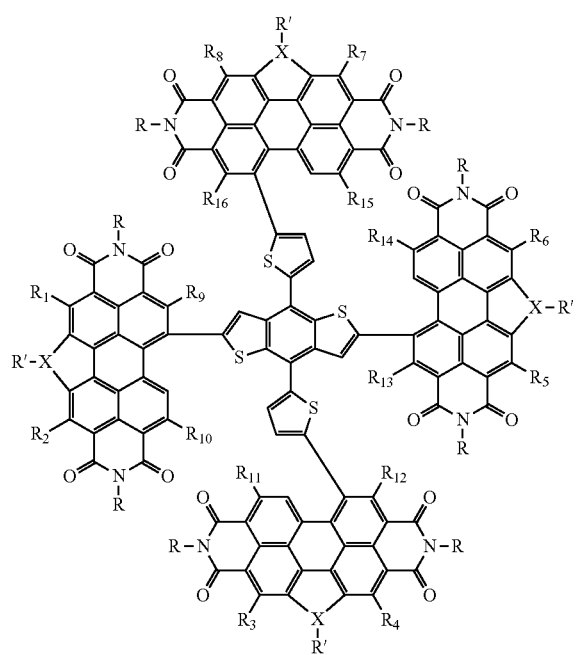
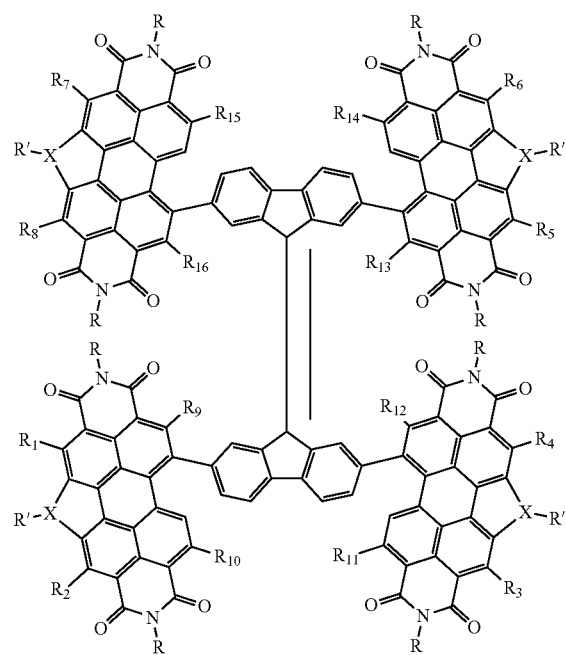
or

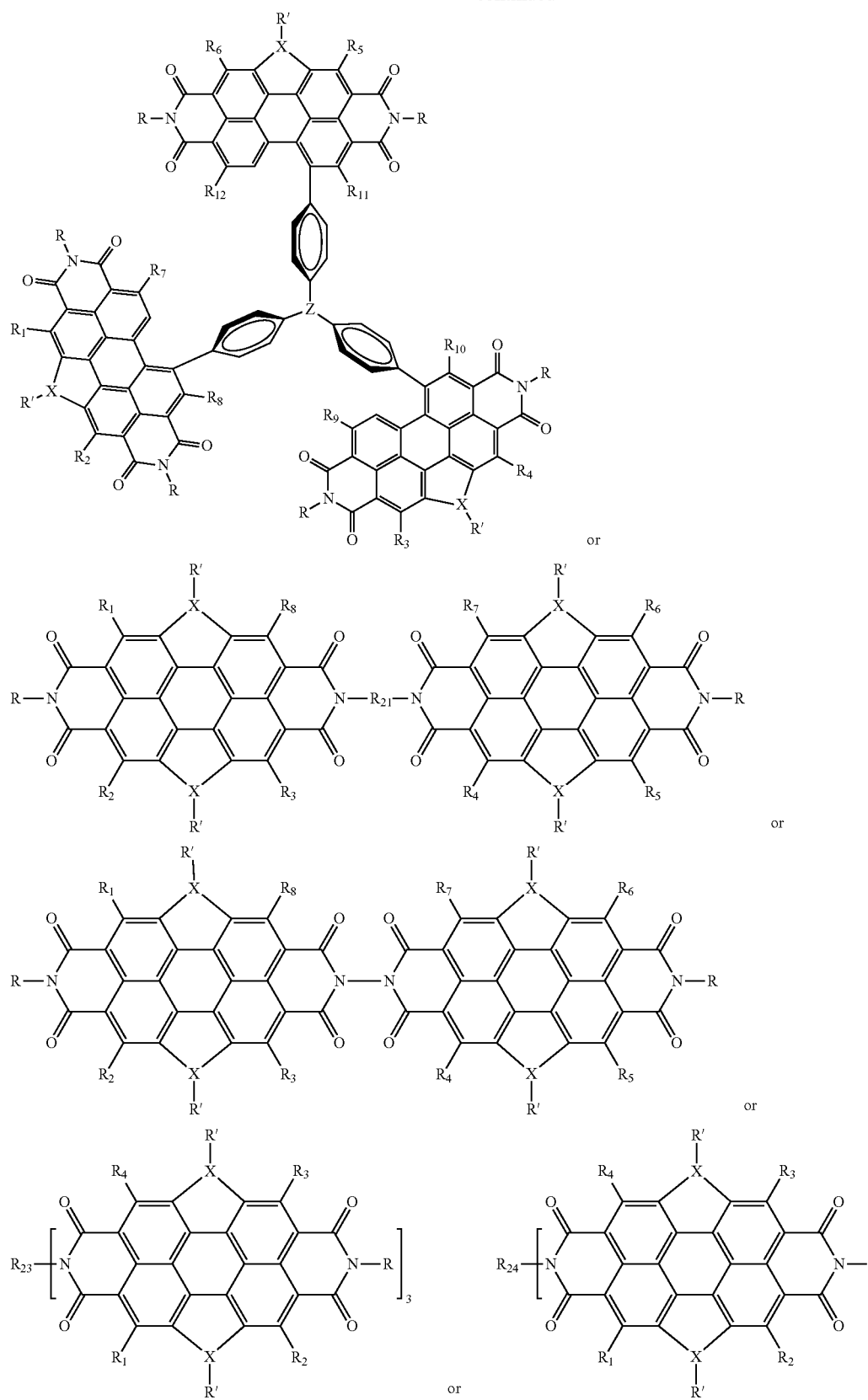

-continued
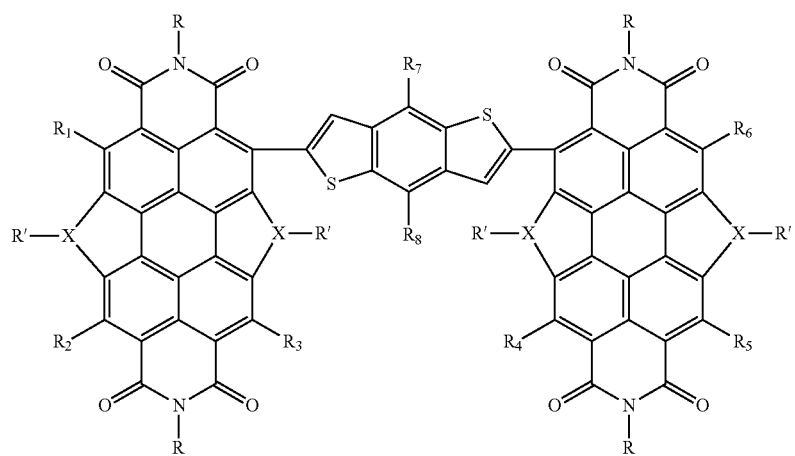
or
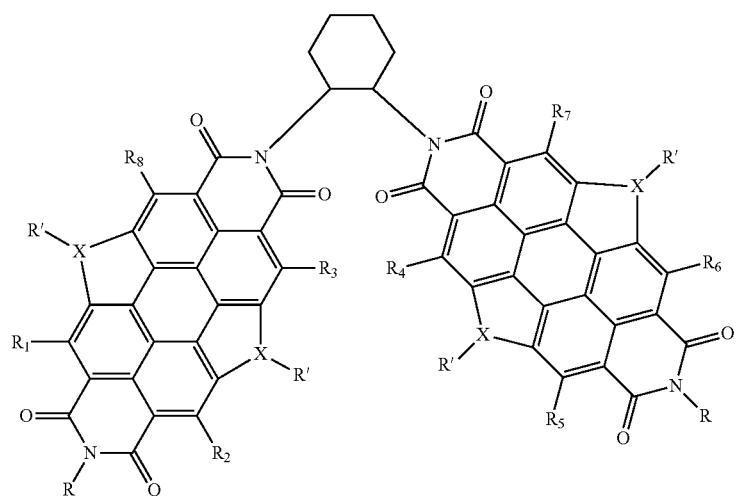
or
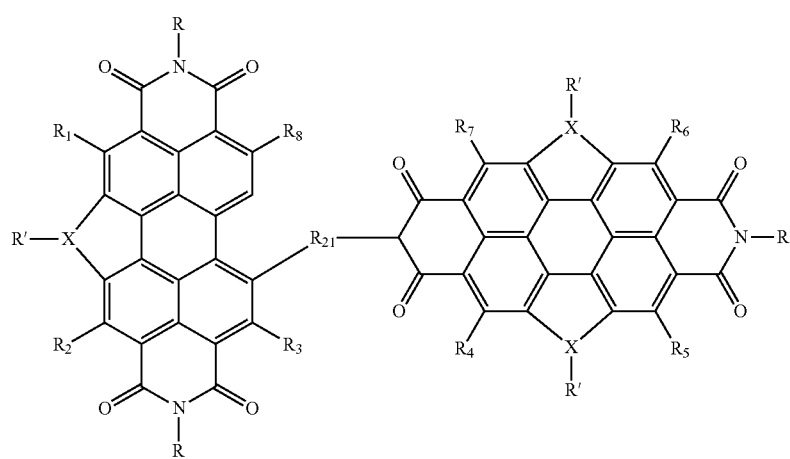

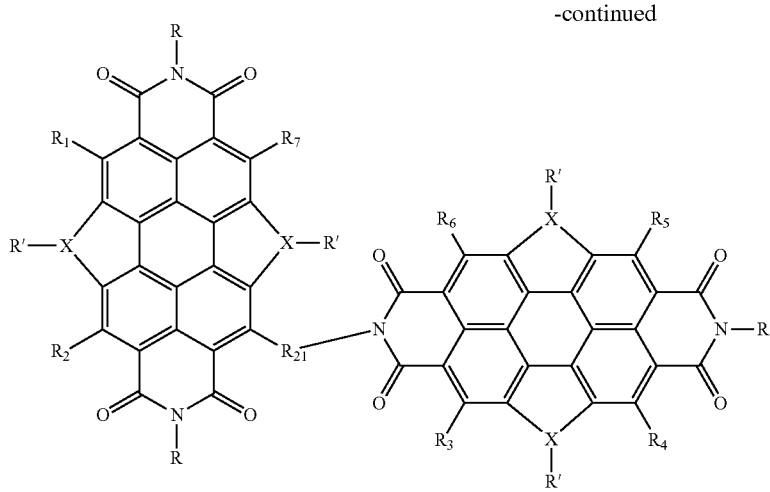

or

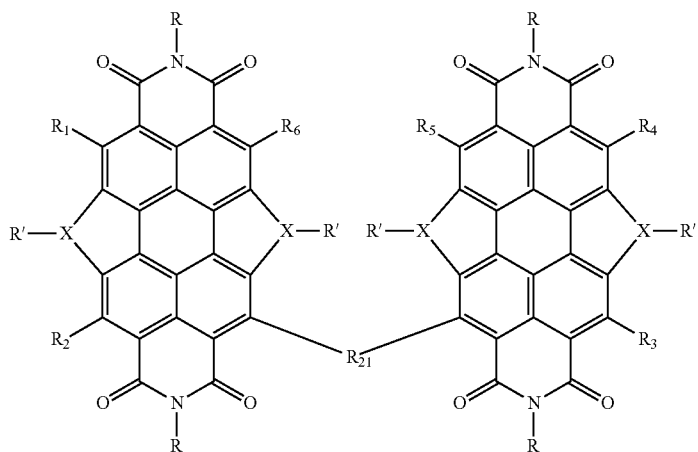

wherein:

the R are independently hydrogen, an alkyl group, an aryl group, or a solubilizing chain;

in each structure comprising X, at least one X is S-S, the other X is S or S-S, R' is nothing, Y is C, Si, or Ge; Z is N or P; $R_1$ to $R_{16}$ are each independently hydrogen, an alkyl group, or an aryl group ($R_1$ to $R_{16}$ can be the same or different); $R_{21}$ is nothing, an alkylene group, or an arylene group; $R_{23}$ is a trivalent aliphatic or a trivalent aromatic group; the $R_{24}$ are each independently a tetravalent aliphatic group or a tetravalent aromatic group; n=0 to 10; and if a substituent (Y, Z, R, R', $R_1$-$R_{24}$) occurs more than one time in a compound, it can be different or the same in each occurrence;

a cathode on the electron transport layer;

an active absorbing region between the electron transport layer and the anode interface/hole transport layer, the active absorbing region comprising an organic-inorganic hybrid perovskite (PVSK), wherein, in response to electromagnetic radiation absorbed in the PVSK, the active absorbing region:

outputs electrons through the electron transport layer to the cathode, and outputs holes through the hole interface/hole transport layer to the anode, so as to generate electric power.

15. The device of claim 14, wherein the compound comprises 2PDI-3S.

16. The device of claim 14, wherein the compound comprises 2PDI-4S.

17. The device of claim 14, wherein the compound in the electron transport layer has a composition such that a power conversion efficiency (PCE), short circuit current ($J_{SC}$) and/or fill factor (FF) of the device do not decrease after 400 hours of continuous operation of the device under 1 Sun illumination, as compared to after 1 minute of operation.

18. The device of claim 14, wherein the electron transport layer has a composition such that the PCE, $J_{SC}$ and/or fill factor of the device increase after the 400 hours of continuous operation, as compared to after 1 minute of operation.

19. The device of claim 14, wherein the electron transport layer has a composition such that the PCE, $J_{SC}$ and/or fill factor of the device increase after the device is heated to at least 100 degrees Celsius.

20. A method of making a composition of matter, comprising:

obtaining a diimide; and reacting the diimide with sulfur to obtain a compound including fused perylene diimides (PDIs) having the structure :

107
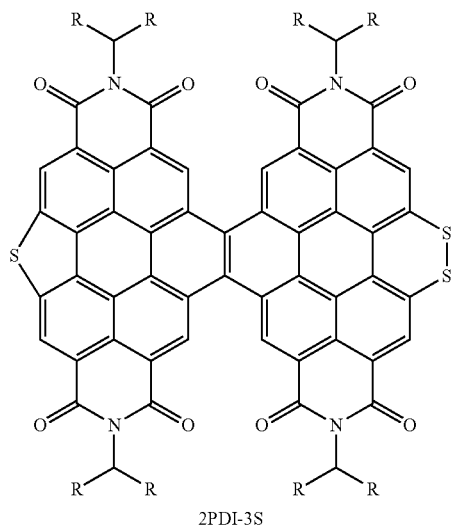
2PDI-3S
or
108
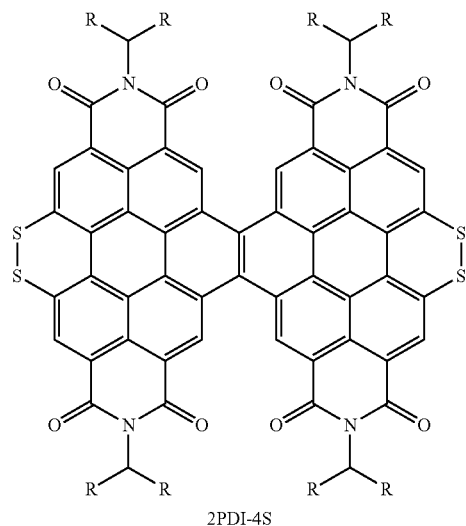
2PDI-4S
or
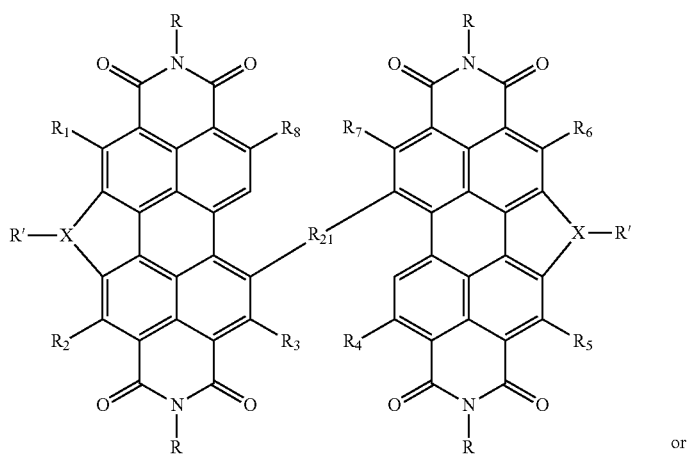
or
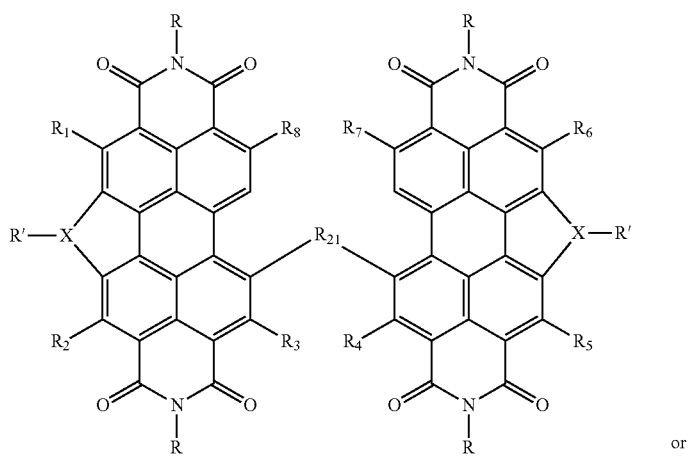
or -continued
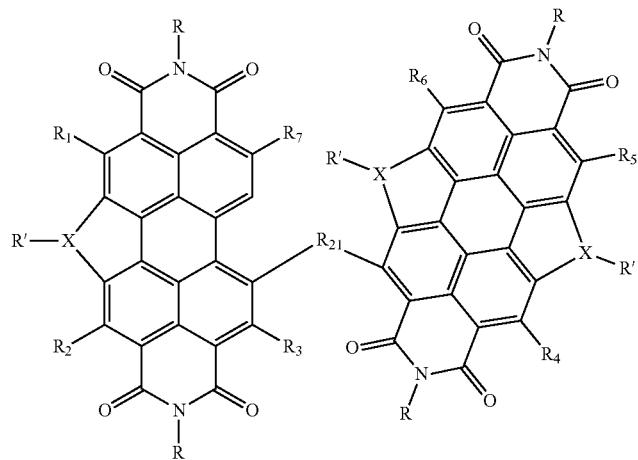
or
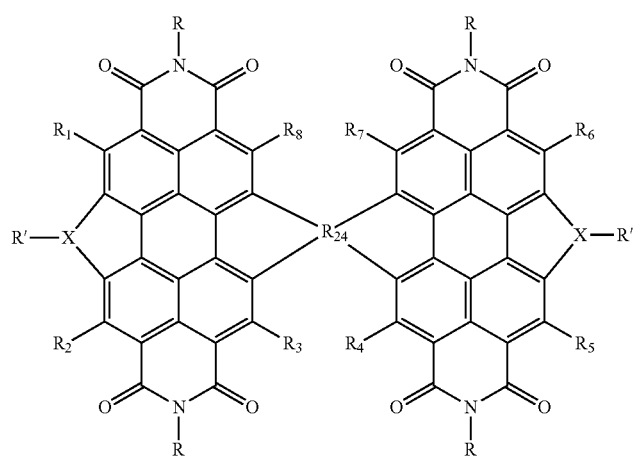
or
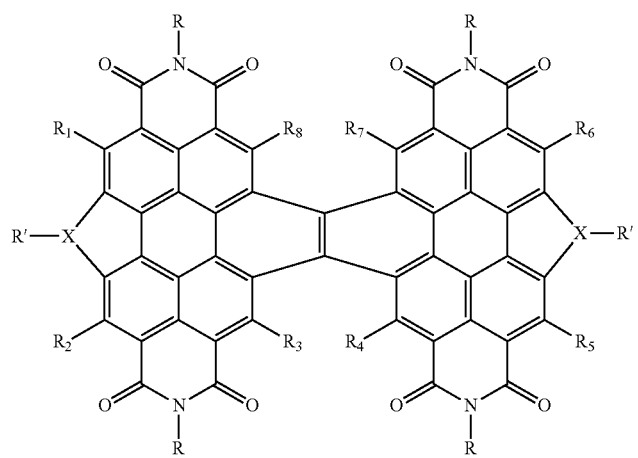
or -continued
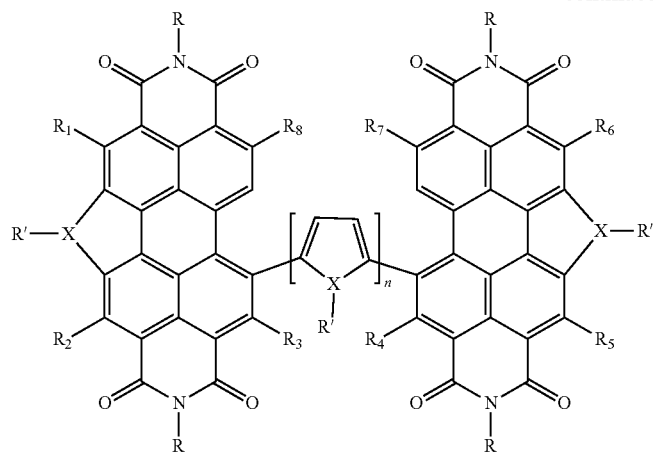
or
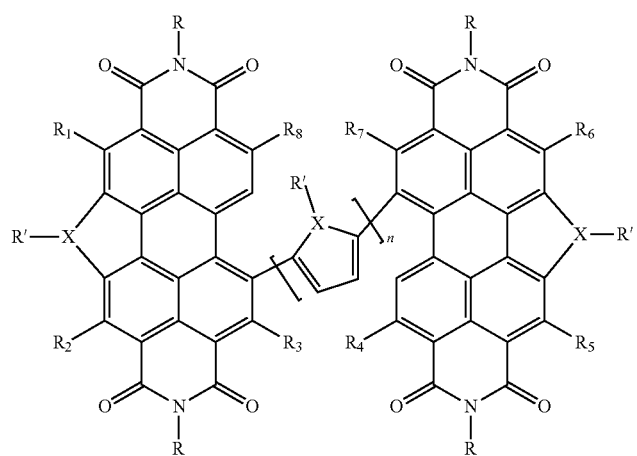
or
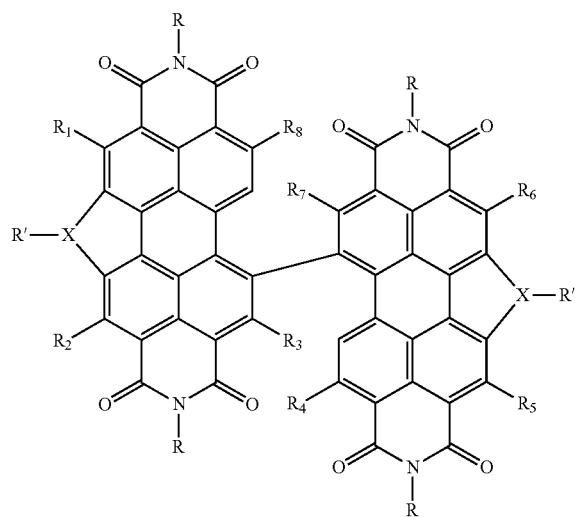
or -continued
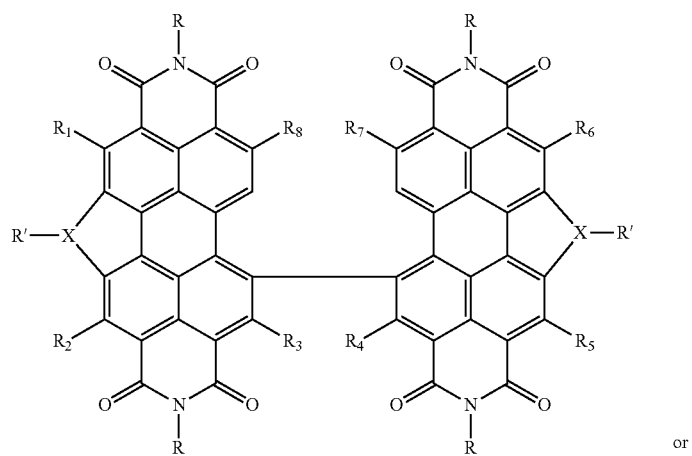
or
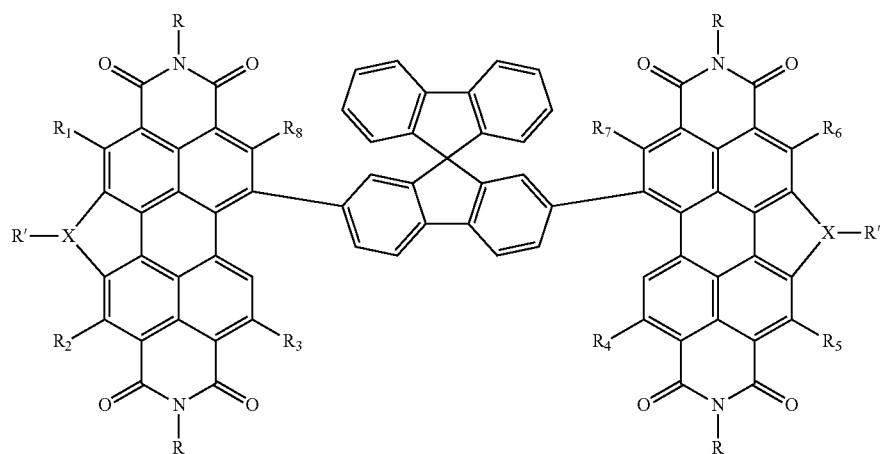
or
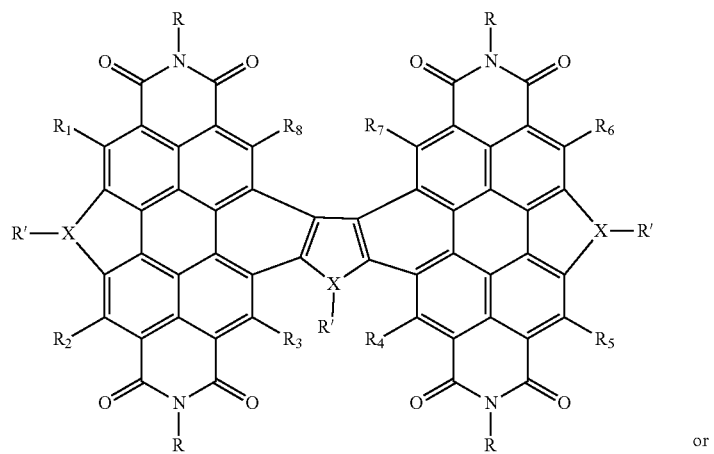
or -continued
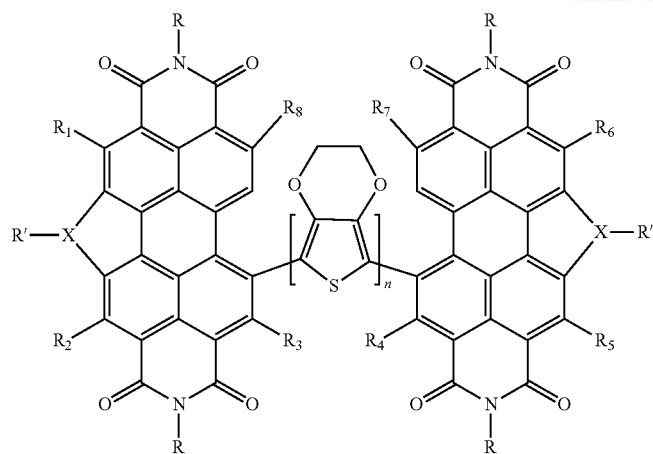
or
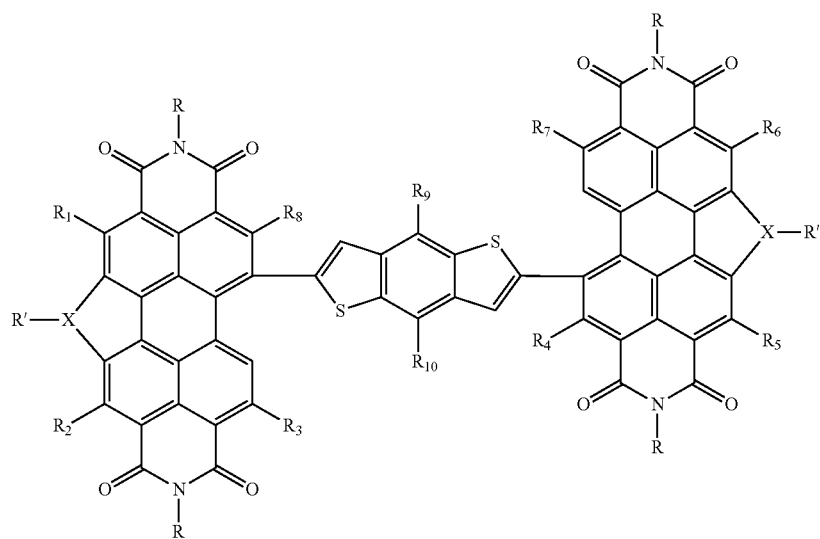
or
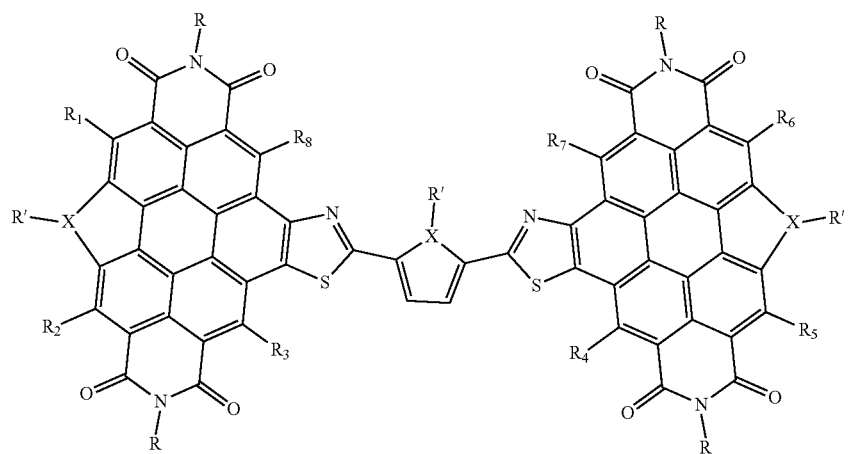
or -continued
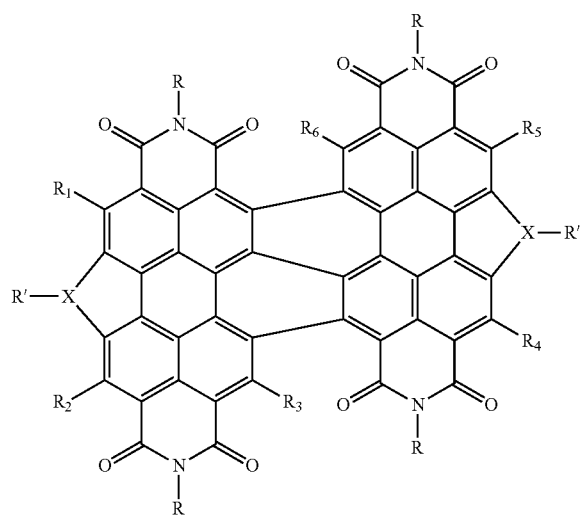
or
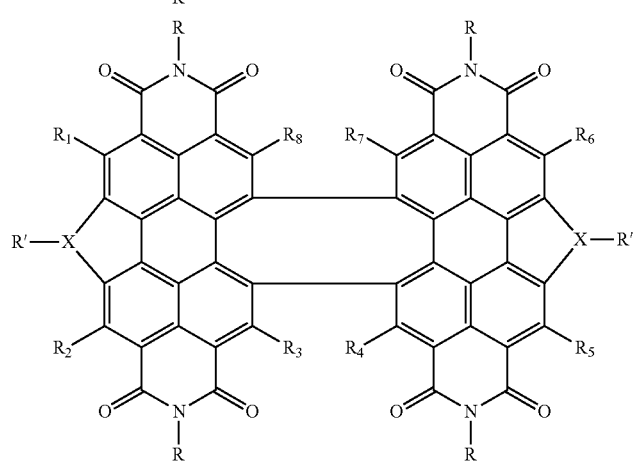
or
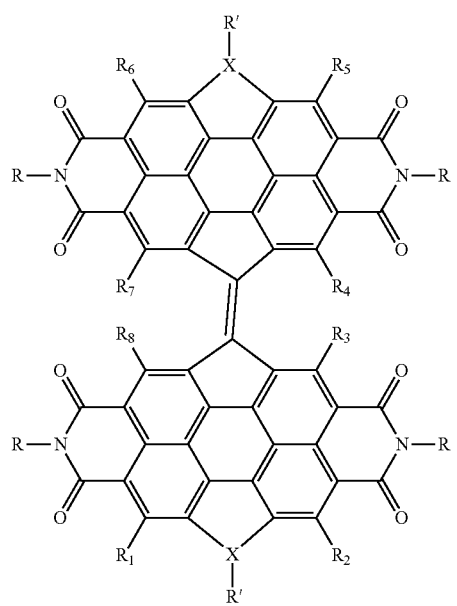
or
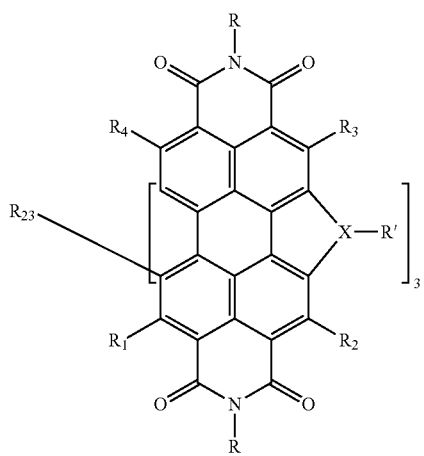
or -continued
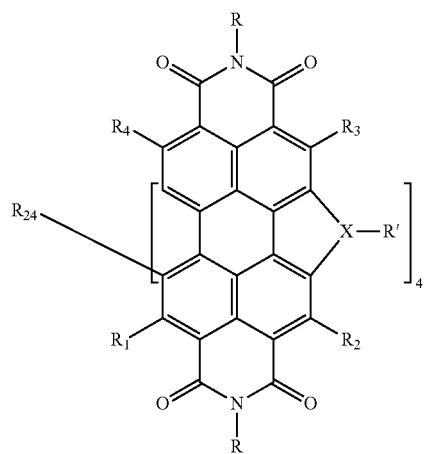
or
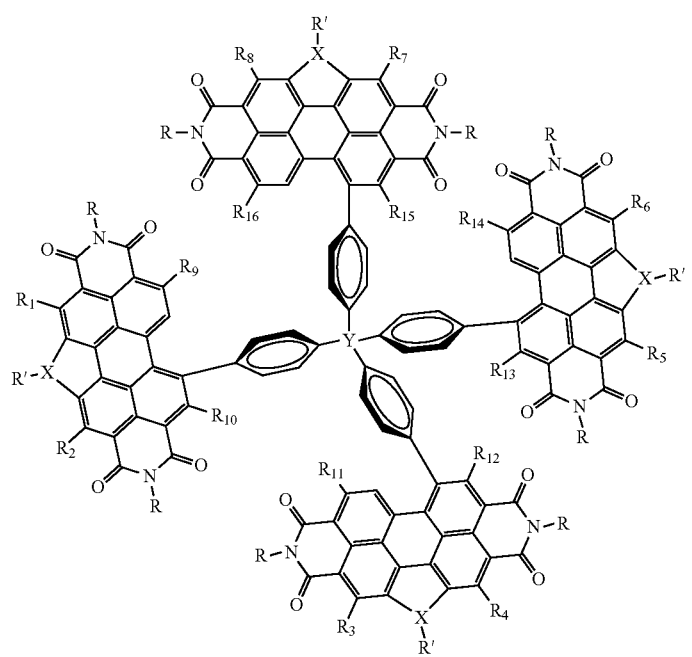
or -continued
121
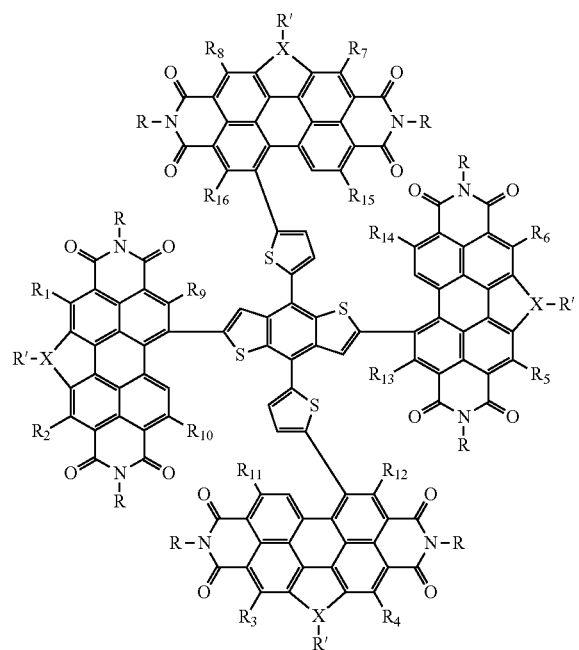
122
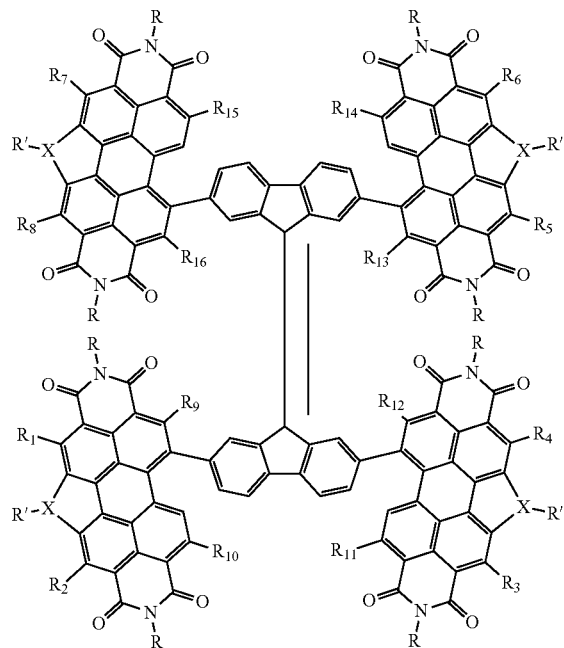
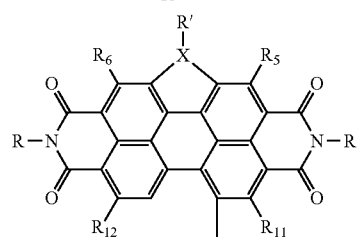
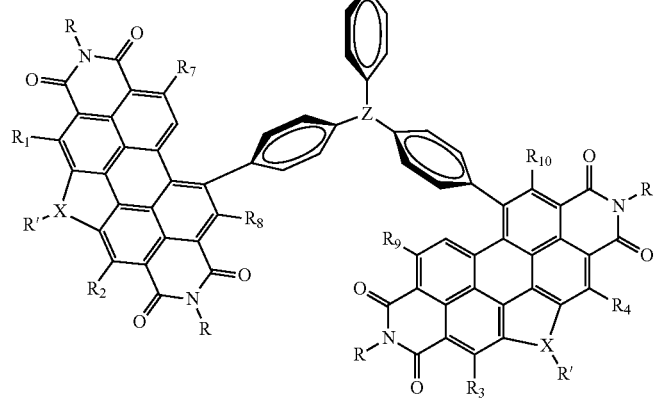
or
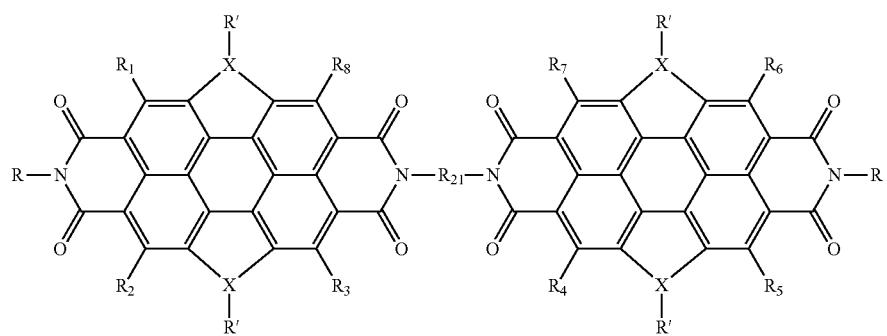
or -continued
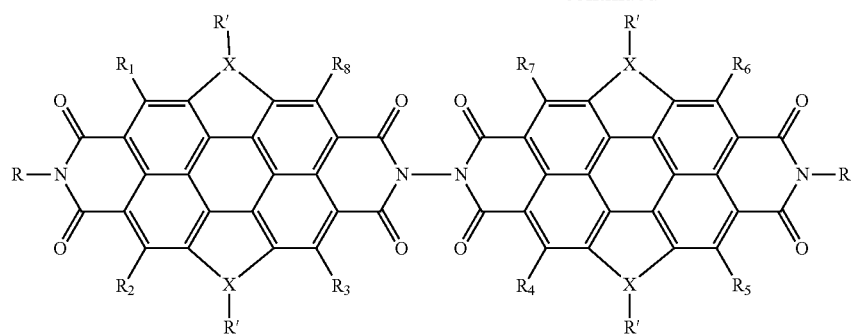
or
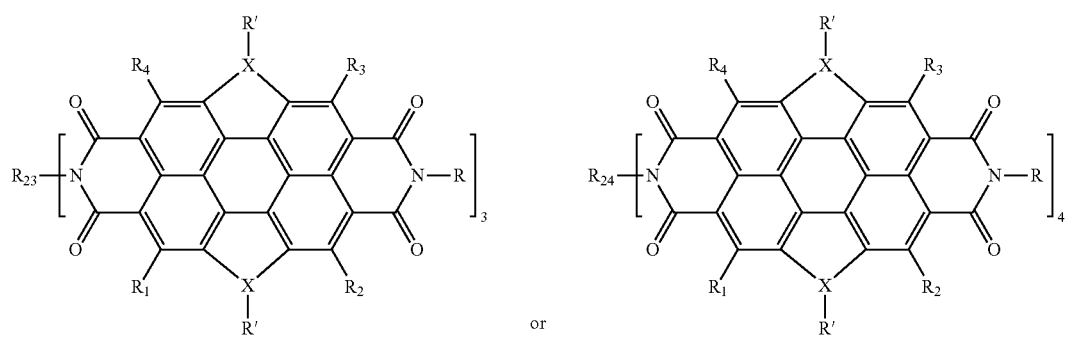
or
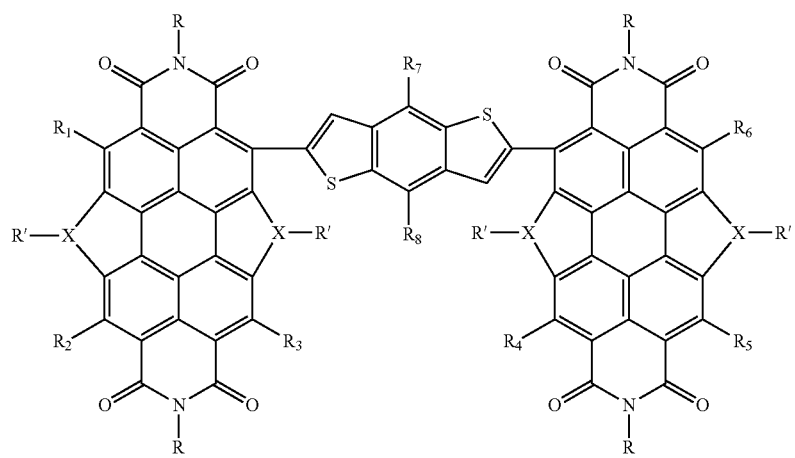
or
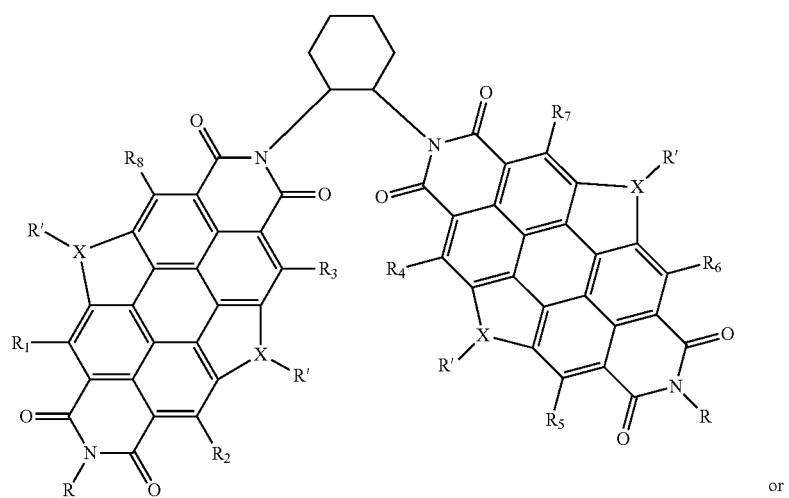
or -continued

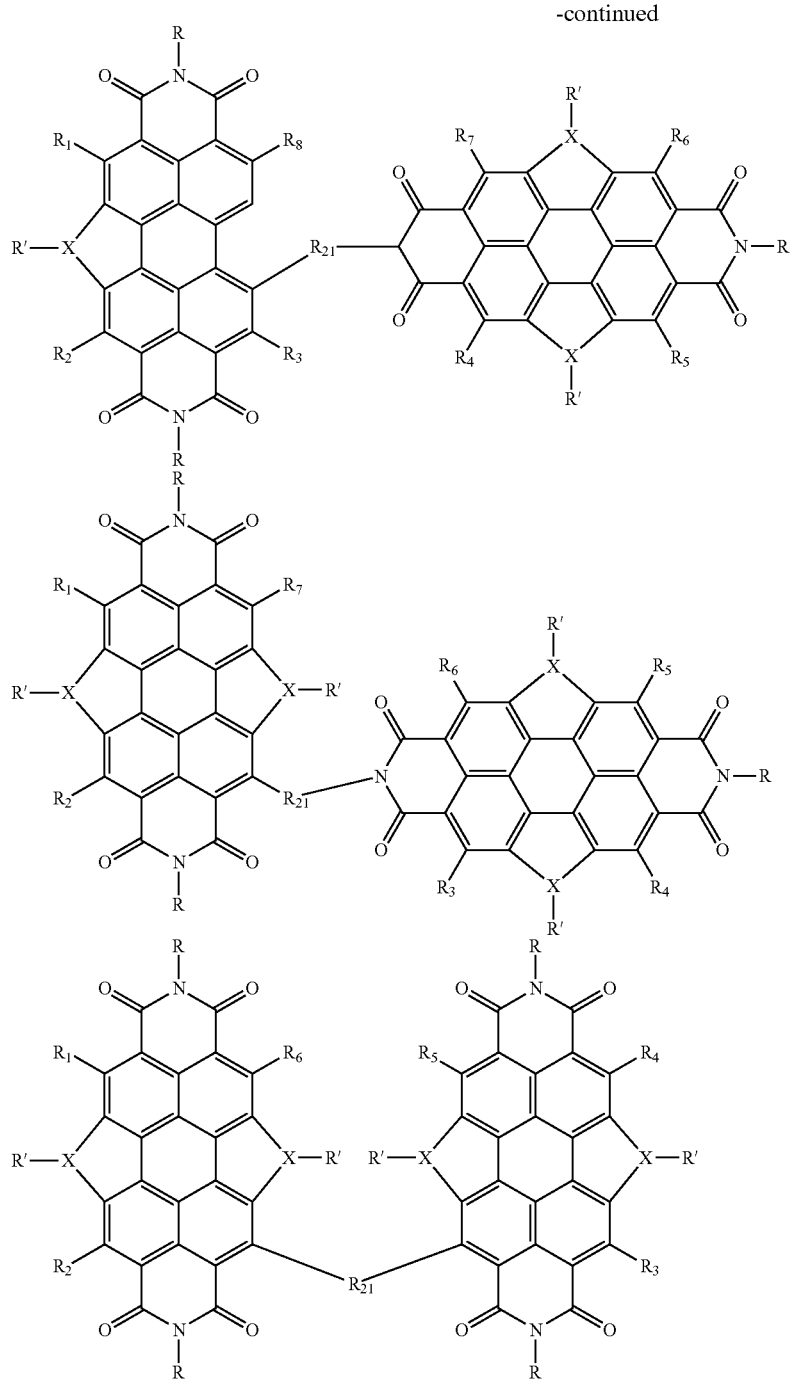

wherein:
the R are independently hydrogen, an alkyl group, an aryl group, or a solubilizing chain;
in each structure comprising X, at least one X is S-S, the other X is S or S-S, R' is nothing, Y is C, Si, or Ge; Z is N or P; $R_1$ to $R_{16}$ are each independently hydrogen, an alkyl group, or an aryl group ($R_1$ to $R_{16}$ can be the same or different); $R_{21}$ is nothing, an alkylene group, or an arylene group; $R_{23}$ is a trivalent aliphatic or a trivalent aromatic group; the $R_{24}$ are each independently a tetravalent aliphatic group or a tetravalent aromatic group; n=0 to 10; and
if a substituent (Y, Z, R, R', $R_1$-$R_{24}$) occurs more than one time in a compound, it can be different or the same in each occurrence.

21. The method of claim 20, wherein the compound comprises 2PDI-3S.

22. The method of claim 20, wherein the compound comprises 2PDI-4S.

* * * * *